(12) United States Patent
Kurokawa et al.

(10) Patent No.: US 12,532,536 B2
(45) Date of Patent: Jan. 20, 2026

(54) SEMICONDUCTOR DEVICE AND ELECTRONIC DEVICE

(71) Applicant: Semiconductor Energy Laboratory Co., Ltd., Atsugi (JP)

(72) Inventors: Yoshiyuki Kurokawa, Sagamihara (JP); Satoru Ohshita, Hadano (JP); Hidefumi Rikimaru, Tama (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 257 days.

(21) Appl. No.: 18/142,740

(22) Filed: May 3, 2023

(65) Prior Publication Data

US 2023/0369329 A1    Nov. 16, 2023

(30) Foreign Application Priority Data

May 16, 2022    (JP) .................................. 2022-080383

(51) Int. Cl.
*H01L 27/092*    (2006.01)
*H03M 1/72*    (2006.01)
*H10D 84/85*    (2025.01)

(52) U.S. Cl.
CPC .............. *H10D 84/85* (2025.01); *H03M 1/72* (2013.01)

(58) Field of Classification Search
CPC ............... H10D 84/85; H10D 30/6734; H10D 30/6755; H10D 30/6757; H10D 88/00; H03M 1/72; G06N 3/048; G06N 3/065

(Continued)

(56) References Cited

U.S. PATENT DOCUMENTS

| 3,727,196 A | 4/1973 | McKenny |
| 9,716,852 B2 | 7/2017 | Kurokawa |

(Continued)

FOREIGN PATENT DOCUMENTS

| JP | 10-078406 A | 3/1998 |
| JP | 2019-046374 A | 3/2019 |
| JP | 2019-047006 A | 3/2019 |

OTHER PUBLICATIONS

Gonugondla.S et al., "A 42pJ/Decision 3.12TOPS/W Robust In-Memory Machine Learning Classifier with On-Chip Training", ISSCC 2018 (Digest of Technical Papers. IEEE International Solid-State Circuits Conference), Feb. 14, 2018, pp. 490-491.

(Continued)

*Primary Examiner* — Tong-Ho Kim
(74) *Attorney, Agent, or Firm* — Eric J. Robinson; Robinson Intellectual Property Law Office, P.C.

(57) ABSTRACT

A semiconductor device with low power consumption is provided. The semiconductor device includes a first layer and a second layer. The first layer includes a first cell and a first to a third circuit, and the second layer includes a second cell and a fourth and a fifth circuit. The first, second, and fourth circuits each have a function of converting digital data into analog current. The first cell calculates a product of a value from the first current and a value from the second circuit and inputs a calculation result into a third circuit as current. The third circuit generates analog current from the input current. The second cell calculates a product of a value from the third circuit and a value from the fourth circuit and inputs a calculation result into the fifth circuit as current. The fifth circuit generates analog current from the input current.

6 Claims, 57 Drawing Sheets

(58) Field of Classification Search
USPC .......................................................... 257/368
See application file for complete search history.

(56) References Cited

U.S. PATENT DOCUMENTS

| | | | |
|---|---|---|---|
| 9,773,832 | B2 | 9/2017 | Kurokawa |
| 9,851,942 | B2 | 12/2017 | Kurokawa |
| 10,141,069 | B2 | 11/2018 | Ikeda et al. |
| 10,319,743 | B2 | 6/2019 | Kurokawa |
| 11,037,525 | B2 | 6/2021 | Shiokawa et al. |
| 11,556,771 | B2 | 1/2023 | Harada et al. |
| 2016/0293643 | A1 | 10/2016 | Kim et al. |
| 2017/0117283 | A1 | 4/2017 | Matsuzaki et al. |
| 2017/0317085 | A1 | 11/2017 | Kurokawa |
| 2018/0004881 | A1 | 1/2018 | Li et al. |
| 2018/0005588 | A1 | 1/2018 | Kurokawa |
| 2018/0102365 | A1 | 4/2018 | Van Houdt et al. |
| 2019/0206474 | A1 | 7/2019 | Van Houdt |
| 2019/0371802 | A1 | 12/2019 | Morris et al. |
| 2020/0043548 | A1 | 2/2020 | Ishizu et al. |
| 2020/0091156 | A1 | 3/2020 | Sharma et al. |
| 2022/0254401 | A1* | 8/2022 | Kurokawa ........... H10D 86/441 |

OTHER PUBLICATIONS

Mochida.R et al., "A 4M Synapses integrated Analog ReRAM based 66.5 TOPS/W Neural-Network Processor with Cell Current Controlled Writing and Flexible Network Architecture", 2018 Symposium on VLSI Technology : Digest of Technical Papers, Jun. 1, 2018, pp. 175-176.

Guo.X et al., "Fast, Energy-Efficient, Robust, and Reproducible Mixed-Signal Neuromorphic Classifier Based on Embedded NOR Flash Memory Technology", IEDM 17: Technical Digest of International Electron Devices Meeting, Dec. 2, 2017, pp. 151-154.

\* cited by examiner

100

FIG. 42A
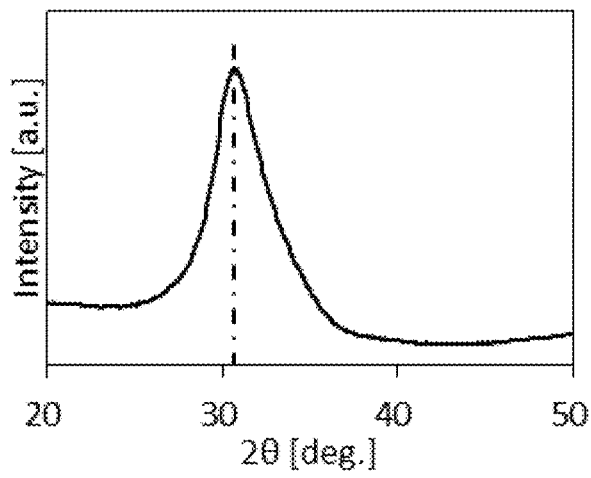
FIG. 42B
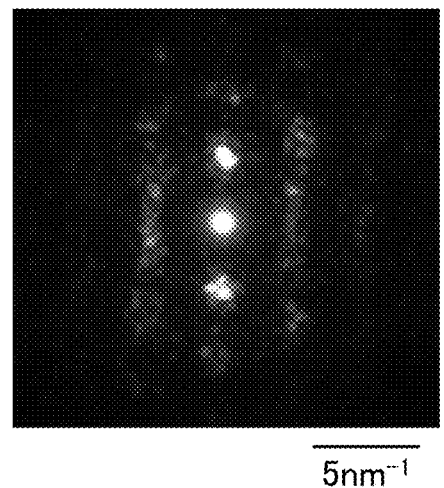
FIG. 42C

SEMICONDUCTOR DEVICE AND ELECTRONIC DEVICE

BACKGROUND OF THE INVENTION

1. Field of the Invention

One embodiment of the present invention relates to a semiconductor device and an electronic device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device (including a liquid crystal display device), a light-emitting device, a power storage device, an imaging device, a memory device, a signal processing device, a sensor, a processor, an electronic device, a system, a driving method thereof, a manufacturing method thereof, and a testing method thereof.

2. Description of the Related Art

Integrated circuits that imitate the mechanism of the human brain are currently under active development. The integrated circuits incorporate electronic circuits as the brain mechanism and include circuits corresponding to neurons and synapses of the human brain. Such integrated circuits may therefore be referred to as "neuromorphic", "brain-morphic", or "brain-inspired" circuits. The integrated circuits have a non-von Neumann architecture and are expected to be able to perform parallel processing with extremely low power consumption as compared with a von Neumann architecture, which consumes higher power with increasing processing speed.

An information processing model that imitates a biological neural network including neurons and synapses is referred to as an artificial neural network (ANN). By using an artificial neural network, inference with an accuracy as high as or higher than that of a human can be carried out. In an artificial neural network, the main arithmetic operation is the weighted sum operation of outputs from neurons, i.e., the product-sum operation.

Non-Patent Document 1 proposes a product-sum operation circuit including a nonvolatile memory element. Each memory element of the product-sum operation circuit outputs current corresponding to a product of data corresponding to a multiplier stored in each memory element and input data corresponding to a multiplicand by using operation in a subthreshold region of a transistor containing silicon in its channel formation region. With the sum of currents output from the memory elements in each column, the product-sum operation circuit acquires data corresponding to product-sum operation. The product-sum operation circuit includes memory elements therein, and thus does not need to read and write data from and to an external memory when carrying out multiplication and addition. Such a product-sum operation circuit needs only a small number of times of data transfer for reading, writing, and the like, and thus is expected to achieve low power consumption.

REFERENCE

Non-Patent Document

[Non-Patent Document 1] X. Guo et al., "Fast, Energy-Efficient, Robust, and Reproducible Mixed-Signal Neuromorphic Classifier Based on Embedded NOR Flash Memory Technology" IEDM2017, pp. 151-154.

SUMMARY OF THE INVENTION

The transistor characteristics and field-effect mobility of a transistor containing silicon in its channel formation region easily change due to a temperature change. In particular, when a product-sum operation circuit or the like is formed as an integrated circuit, the product-sum operation circuit operates to yield heat and the temperature of the integrated circuit rises, which makes characteristics of the transistors included in the integrated circuit change; thus, a normal arithmetic operation cannot be carried out in some cases.

In the case where a digital circuit executes product-sum operation, a digital multiplier circuit executes multiplication of multiplier digital data (multiplier data) and multiplicand digital data (multiplicand data). After that, a digital adder circuit executes the addition of digital data yielded by the multiplication (product data), so that digital data (product-sum data) is obtained as the product-sum operation results. The digital multiplication circuit and the digital addition circuit preferably have specifications that allow a multi-bit arithmetic operation. This requires a large digital multiplication circuit and a large digital addition circuit, whereby the circuit area is likely to expand (leading to an increase in the circuit area) and the power consumption may increase.

In a hierarchical artificial neural network model, for example, a product-sum operation and an arithmetic operation of a function system (e.g., a sigmoid function, a tanh function, a softmax function, a ReLU function, or a threshold function) are performed in each layer of the hierarchy, in some cases. When calculation of the artificial neural network model is performed with a circuit including one arithmetic circuit executing a product-sum operation and one arithmetic circuit of a function system, it is necessary to rewrite a weight coefficient for each hierarchical layer by the arithmetic circuit for executing a product-sum operation, which increases an amount of power needed for rewriting a weight coefficient. Thus, the preferred numbers of arithmetic circuits executing a product-sum operation and arithmetic circuits of a function system correspond to the number of layers forming a desired hierarchical artificial neural network. This, however, causes an increase in the circuit size along with an increase in the number of layers of the hierarchical artificial neural network.

A combination of an arithmetic circuit executing an artificial neural network arithmetic operation and a sensor sometimes enables electronic devices and the like to recognize various kinds of information. For example, an optical sensor (e.g., a photodiode) as a sensor is combined with the arithmetic circuit, whereby image data obtained by the optical sensor can be used for pattern recognition such as face recognition and image recognition.

An object of one embodiment of the present invention is to provide a semiconductor device capable of performing a product-sum operation. Another object of one embodiment of the present invention is to provide a semiconductor device with low power consumption. Another object of one embodiment of the present invention is to provide a semiconductor device whose circuits are scaled down. Another object of one embodiment of the present invention is to provide a semiconductor device which hardly declines operation performance due to heat.

Another object of one embodiment of the present invention is to provide a novel semiconductor device. Another object of one embodiment of the present invention is to provide an electronic device including the semiconductor device.

Note that the objects of one embodiment of the present invention are not limited to the objects listed above. The objects listed above do not preclude the existence of other objects. The other objects are objects that are not described in this section and are described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

(1) One embodiment of the present invention is a semiconductor device including a first layer and a second layer. The first layer is located below the second layer. The first layer includes a first cell, a first circuit, a second circuit, and a third circuit, and the first cell includes a first transistor. The second layer includes a second cell, a fourth circuit, and a fifth circuit, and the second cell includes a second transistor.

The first circuit is configured to convert a first data that is a digital data into a first analog current and configured to input the first analog current into the first cell. The second circuit is configured to convert a second data that is a digital data into a second analog current and configured to input the second analog current into the first cell. The fourth circuit is configured to convert a third data that is a digital data into a third analog current.

The first cell is configured to retain a first potential corresponding to the first analog current at a gate of the first transistor and configured to set a current flowing between a source and a drain of the first transistor to a first current corresponding to the first potential. The second cell is configured to retain a third potential corresponding to the third analog current at a gate of the second transistor and configured to set current flowing between a source and a drain of the second transistor to a third current corresponding to the third potential.

The second circuit is configured to change the first potential retained in the first cell into a second potential by inputting the second analog current into the first cell. The first cell is configured to change the first current flowing between the source and the drain of the first transistor into a second current in accordance with the change of the first potential into the second potential. The third circuit is configured to generate a fourth analog current corresponding to the second current and configured to input the fourth analog current into the second cell, so that the third potential retained in the second cell is changed into a fourth potential. The second cell is configured to change the third current flowing between the source and the drain of the second transistor into a fourth current in accordance with the change of the third potential into the fourth potential. The fifth circuit is configured to generate a fifth analog current corresponding to the fourth current.

(2) Another embodiment of the present invention is a semiconductor device, including a first layer, a second layer, and a third layer. The third layer is located above the first layer, and the first layer is located above the second layer. The first layer includes a first cell, a first circuit, and a third circuit, and the first cell includes a first transistor. The second layer includes a second cell, a fourth circuit, and a fifth circuit, and the second cell includes a second transistor. The third layer includes an optical sensor.

The first circuit is configured to convert a first data that is a digital data into a first analog current and configured to input the first analog current into the first cell. The optical sensor is configured to generate a second analog current when receiving light and configured to input the second analog current into the first cell. The fourth circuit is configured to convert a third data that is a digital data into a third analog current.

The first cell is configured to retain a first potential corresponding to the first analog current at a gate of the first transistor and configured to set a current flowing between a source and a drain of the first transistor to a first current corresponding to the first potential. The second cell is configured to retain a third potential corresponding to the third analog current at a gate of the second transistor and configured to a current flowing between a source and a drain of the second transistor to a third current corresponding to the third potential.

The optical sensor is configured to change the first potential retained in the first cell into a second potential when inputting the second analog current into the first cell. The first cell is configured to change the first current flowing between the source and the drain of the first transistor into a second current in accordance with the change of the first potential into the second potential. The third circuit is configured to generate a fourth analog current corresponding to the second current and configured to input the fourth analog current into the second cell, so that the third potential retained in the second cell is changed into a fourth potential. The second cell is configured to change the third current flowing between the source and the drain of the second transistor into a fourth current in accordance with the change of the third potential into the fourth potential. The fifth circuit is configured to generate a fifth analog current corresponding to the fourth current.

(3) Another embodiment of the present invention may have a structure in the above (1) or (2), where each of the first transistor and the second transistor includes an oxide semiconductor in a channel formation region. In particular, the oxide semiconductor preferably includes at least one of indium, zinc, and an element M.

The element M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, cobalt, magnesium, and antimony.

(4) Another embodiment of the present invention may have a structure in the above (3), where an amount of each of the first current and the second current is an amount of current flowing when the first transistor operates in a subthreshold region, and an amount of each of the third current and the fourth current is an amount of current flowing when the second transistor operates in a subthreshold region.

(5) Another embodiment of the present invention is an electronic device including the semiconductor device in the above (4) and a housing.

One embodiment of the present invention can provide a semiconductor device capable of performing a product-sum operation. Another embodiment of the present invention can provide a semiconductor device with low power consumption. Another embodiment of the present invention can provide a semiconductor device with a decreased circuit size. Another embodiment of the present invention can provide a semiconductor device which hardly declines operation performance due to heat.

Another embodiment of the present invention can provide a novel semiconductor device. Another embodiment of the present invention can provide an electronic device including the semiconductor device.

Note that the effects of one embodiment of the present invention are not limited to the effects mentioned above. The effects listed above do not preclude the existence of other effects. The other effects are the ones that are not described in this section and will be described below. The effects that are not described in this section will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BRIEF DESCRIPTION OF THE DRAWINGS

FIGS. 25A to 25C are schematic diagrams illustrating a structure example of a hand portion provided for a manipulator or the like.

FIGS. 26A and 26B are schematic diagrams illustrating a structure example of a hand portion provided for a manipulator or the like.

FIG. 42A shows classification of IGZO crystal structures, FIG. 42B shows an XRD spectrum of crystalline IGZO, and FIG. 42C shows a nanobeam electron diffraction pattern of the crystalline IGZO.

DETAILED DESCRIPTION OF THE INVENTION

Figure 1:
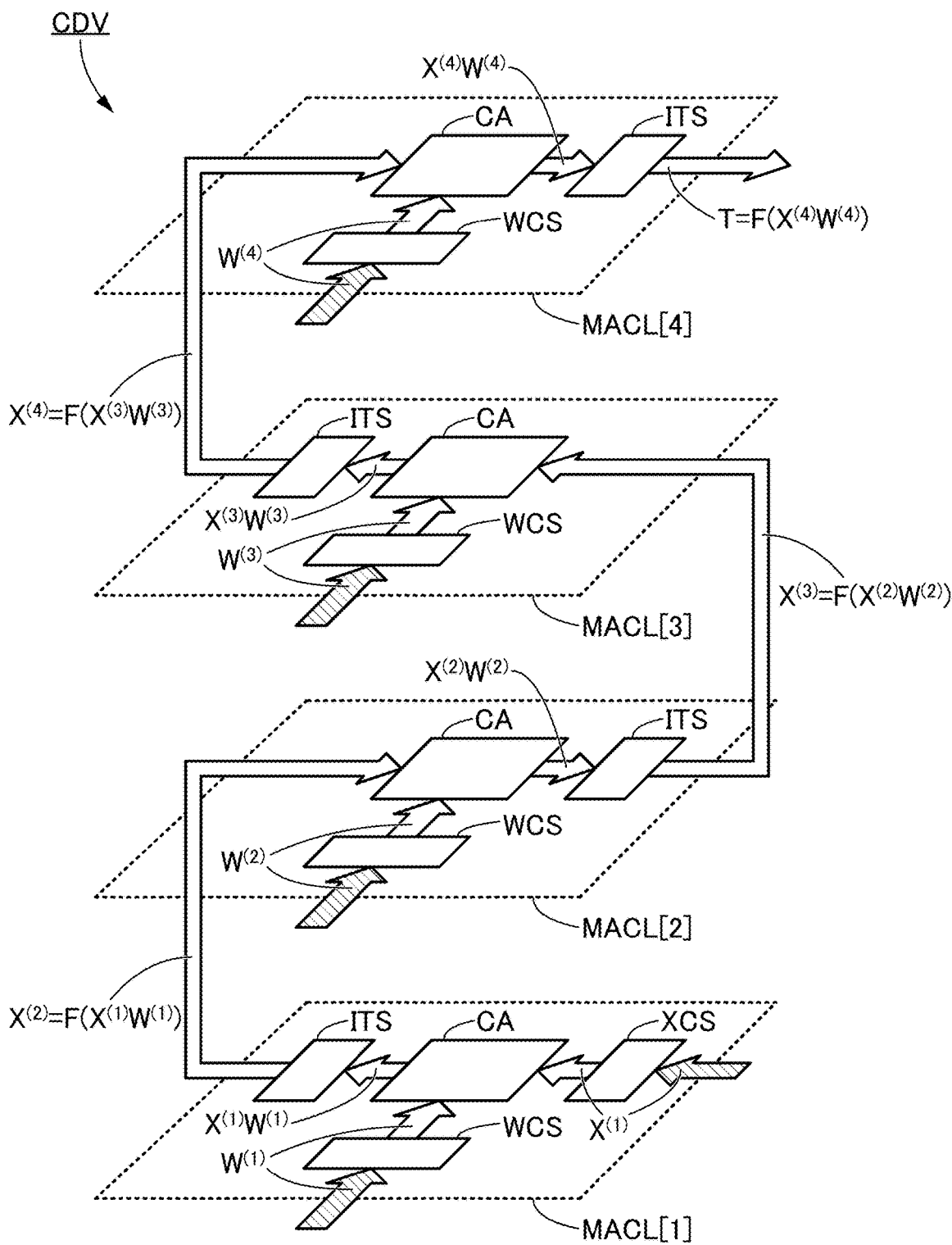
FIG. 1 is a block diagram illustrating a configuration example of a semiconductor device.

In this specification and the like, a semiconductor device means a device that utilizes semiconductor characteristics, and refers to a circuit including a semiconductor element (e.g., a transistor, a diode, or a photodiode), a device including the circuit, and the like. The semiconductor device also means devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves may be semiconductor devices or may each include a semiconductor device.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow(s) electrical connection between X and Y (e.g., a switch, a transistor, a capacitor element, an inductor, a resistor element, a diode, a display element, a light-emitting element, and a load) can be connected between X and Y. Note that a switch has a function of being controlled to be turned on or off. That is, the switch has a function of being in a conduction state (on state) or a non-conduction state (off state) to control whether a current flows or not.

For example, in the case where X and Y are functionally connected, one or more circuits that allow(s) functional connection between X and Y (e.g., a logic circuit (an inverter, a NAND circuit, a NOR circuit, or the like); a signal converter circuit (a digital-to-analog converter circuit, an analog-to-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of a current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are functionally connected when a signal output from X is transmitted to Y.

Note that an explicit description, X and Y are electrically connected, includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a "resistor" can be, for example, a circuit element or a wiring having a resistance higher than 0Ω. Therefore, in this specification and the like, a "resistor element" includes a wiring having a resistance, a transistor in which a current flows between its source and drain, a diode, and a coil. Thus, the term "resistor" can be replaced with the terms "resistance", "load", and "a region having a resistance", for example, and vice versa. The resistance can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance may be greater than or equal to 1Ω and less than or equal to $1\times10^9 \Omega$.

In this specification and the like, a "capacitor element" can be, for example, a circuit element having an electrostatic capacitance higher than 0 F, a region of a wiring having an electrostatic capacitance higher than 0 F, parasitic capacitance, or gate capacitance of a transistor. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", and "gate capacitance" can be replaced with the term "capacitance", for example, and vice versa. The term "a pair of electrodes" of a capacitor can be replaced with the terms "a pair of conductors", "a pair of conductive regions", and "a pair of regions", for example. Note that the electrostatic capacitance can be higher than or equal to 0.05 fF and lower than or equal to 10 pF, for example. For example, the electrostatic capacitance may be higher than or equal to 1 pF and lower than or equal to 10 μF.

In this specification and the like, a transistor includes three terminals called a gate, a source, and a drain. The gate is a control terminal for controlling the on/off state of the transistor. The two terminals functioning as the source and the drain are input/output terminals of the transistor. Functions of the two input/output terminals of the transistor depend on the conductivity type (n-channel type or p-channel type) of the transistor and the levels of potentials applied to the three terminals of the transistor, and one of the two terminals serves as a source and the other serves as a drain. Therefore, the terms "source" and "drain" can be used interchangeably in this specification and the like. In this specification and the like, the terms "one of a source and a drain" (or a first electrode or a first terminal) and "the other of the source and the drain" (or a second electrode or a second terminal) are used to describe the connection relation of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. In some cases, the terms "gate" and "back gate" can be replaced with each other in one transistor. In the case where a transistor includes three or more gates, the gates may be referred to as a first gate, a second gate, and a third gate, for example, in this specification and the like.

In this specification and the like, a node can be referred to as a terminal, a wiring, an electrode, a conductive layer, a conductor, an impurity region, and the like depending on the circuit configuration and the device structure. Furthermore, a terminal, a wiring, and the like can be referred to as a node.

In this specification and the like, "voltage" and "potential" can be replaced with each other as appropriate. The term "voltage" refers to a potential difference from a reference potential. When the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, a potential output from a circuit and the like, for example, are changed with a change of the reference potential.

In this specification and the like, the term "high-level potential" or "low-level potential" does not mean a particular potential. For example, in the case where two wirings are both described as "functioning as a wiring for supplying a high-level potential", the levels of the high-level potentials that these wirings supply are not necessarily equal to each other. Similarly, in the case where two wirings are both described as "functioning as a wiring for supplying a low-level potential", the levels of the low-level potentials that these wirings supply are not necessarily equal to each other.

A current means an electric charge transfer (electrical conduction); for example, the expression "electrical conduction of positively charged particles is caused" can be rephrased as "electrical conduction of negatively charged particles is caused in the opposite direction". Therefore, unless otherwise specified, a current in this specification and the like refers to an electric charge transfer (electrical conduction) caused by carrier movement. Examples of a carrier here include an electron, a hole, an anion, a cation, and a complex ion, and the type of carrier differs between current flow systems (e.g., a semiconductor, a metal, an electrolyte solution, and a vacuum). The direction of a current in a wiring or the like refers to the direction in which a carrier with a positive electric charge moves, and the amount of a current is expressed as a positive value. In other words, the direction in which a carrier with a negative electric charge moves is opposite to the direction of a current, and the amount of a current is expressed as a negative value. Thus, in the case where the polarity of a current (or the direction of a current) is not specified in this specification and the like, the expression "a current flows from an element A to an element B" can be replaced with "a current flows from an element B to an element A", for example. As another example, the expression "a current is input to an element A" can be replaced with "a current is output from an element A".

Ordinal numbers such as "first", "second", and "third" in this specification and the like are used in order to avoid confusion among components. Thus, the terms do not limit the number of components. The terms do not limit the order of components, either. For example, a "first" component in one embodiment in this specification and the like can be referred to as a "second" component in other embodiments or claims. For another example, a "first" component in one embodiment in this specification and the like can be omitted in other embodiments or claims.

In this specification and the like, terms for describing arrangement, such as "over", "above", "under", and "below", are sometimes used for convenience to describe the positional relation between components with reference to drawings. The positional relation between components is changed as appropriate in accordance with the direction from which each component is described. Thus, the positional relation is not limited to that described with a term used in this specification and the like and can be explained with another term as appropriate depending on the situation. For example, the expression "an insulator over (on) a top surface of a conductor" can be replaced with the expression "an insulator on a bottom surface of a conductor" when the direction of a diagram showing these components is rotated by 180°.

The term such as "over", "above", "under", or "below" does not necessarily mean that a component is placed directly on or under and directly in contact with another component. For example, the expression "electrode B over insulating layer A" does not necessarily mean that the electrode B is on and in direct contact with the insulating layer A and can mean the case where another component is provided between the insulating layer A and the electrode B.

In this specification and the like, the terms "film" and "layer" can be interchanged with each other depending on circumstances. For example, the term "conductive layer" can be changed into the term "conductive film" in some cases. Moreover, the term "insulating film" can be changed into the term "insulating layer" in some cases. Moreover, such terms can be replaced with a word not including the term "film" or "layer" depending on the case or circumstances. For example, the term "conductive layer" or "conductive film" can be changed into the term "conductor" in some cases. For example, in some cases, the term "insulating layer" or "insulating film" can be changed into the term "insulator" in some cases.

In this specification and the like, the terms "electrode", "wiring", and "terminal" do not have functional limitations. For example, an "electrode" is used as part of a "wiring" in some cases, and vice versa. Furthermore, the term "electrode" or "wiring" can also mean a combination of a plurality of electrodes or wirings provided in an integrated manner, for example. For another example, a "terminal" can be used as part of a wiring or an electrode, and a "wiring" and an "electrode" can be used as part of a terminal. Furthermore, the term "terminal" includes the case where a plurality of "electrodes", "wirings", "terminals", and the like are formed in an integrated manner. Therefore, for example, an "electrode" can be part of a wiring or a terminal, and a "terminal" can be part of a wiring or an electrode. Moreover, the term such as "electrode", "wiring", or "terminal" is sometimes replaced with the term "region", for example.

In this specification and the like, the terms "wiring", "signal line", "power supply line", and the like can be interchanged with each other depending on the case or in accordance with circumstances. For example, the term "wiring" can be changed into the term "signal line" in some cases. Also, for example, the term "wiring" can be changed into the term "power supply line" in some cases. Inversely, the term "signal line", "power supply line", or the like can be changed into the term "wiring" in some cases. The term "power supply line" can be changed into the term "signal line" in some cases. Inversely, the term "signal line" or the like can be changed into the term "power source line" or the like in some cases. The term "potential" that is applied to a wiring can be changed into the term "signal" or the like depending on the case or in accordance with circumstances. Conversely, the term "signal" or the like can be changed into the term "potential" in some cases.

In this specification and the like, an impurity in a semiconductor refers to, for example, elements other than the main components of a semiconductor layer. For instance, an element with a concentration lower than 0.1 atomic % is an impurity. When an impurity is contained, the density of defect states in the semiconductor may be increased, at least one of a decrease in the carrier mobility and a decrease in the crystallinity may occur. When the semiconductor is an oxide semiconductor, examples of impurities that change the characteristics of the semiconductor include Group 1 elements, Group 2 elements, Group 13 elements, Group 14 elements, Group 15 elements, and transition metals other than the main components of the oxide semiconductor. Specific examples are hydrogen (included also in water), lithium, sodium, silicon, boron, phosphorus, carbon, and nitrogen. Specifically, when the semiconductor is silicon, examples of impurities that change the characteristics of the semiconductor include Group 1 elements, Group 2 elements, Group 13 elements, and Group 15 elements (with the exception of oxygen and hydrogen).

In this specification and the like, a switch is in a conduction state (on state) or in a non-conduction state (off state) to control whether a current flows therethrough or not. Alternatively, a switch has a function of selecting and changing a current path. For example, an electrical switch or a mechanical switch can be used. That is, a switch is not limited to a certain element and can be any element capable of controlling a current.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined. In the case of using a transistor as a switch, the on state of the transistor refers to a state in which a source electrode and a drain electrode of the transistor are regarded as being electrically short-circuited. The non-conduction state of the transistor refers to a state in which the source electrode and the drain electrode of the transistor are regarded as being electrically disconnected. In the case where a transistor operates just as a switch, there is no particular limitation on the polarity (conductivity type) of the transistor.

An example of a mechanical switch is a switch using a microelectromechanical systems (MEMS) technology. Such a switch includes an electrode that can be moved mechanically, and its conduction and non-conduction is controlled with movement of the electrode.

In this specification, "parallel" indicates a state where the angle formed between two straight lines is greater than or equal to −10° and less than or equal to 10°. Thus, the case where the angle is greater than or equal to −5° and less than or equal to 5° is also included. The terms "approximately parallel" and "substantially parallel" indicate that the angle formed between two straight lines is greater than or equal to −30° and less than or equal to 30°. The term "perpendicular" indicates that the angle formed between two straight lines is greater than or equal to 80° and less than or equal to 100°.

Thus, the case where the angle is greater than or equal to 85° and less than or equal to 95° is also included. The terms "approximately perpendicular" and "substantially perpendicular" indicate that the angle formed between two straight lines is greater than or equal to 60° and less than or equal to 120°.

In an artificial neural network (hereinafter referred to as a neural network), the connection strength between synapses can be changed when existing data is given to the neural network. Such processing for determining connection strengths by providing a neural network with existing information is sometimes called learning.

When a neural network in which "learning" has been performed (connection strengths have been determined) is provided with some information, new information can be output on the basis of the connection strengths. Such processing for outputting new information on the basis of provided information and connection strengths in a neural network is sometimes called inference or recognition.

Examples of neural network models include a Hopfield neural network and a hierarchical neural network. Specifically, a multilayer neural network may be called a deep neural network (DNN), and machine learning using a deep neural network may be called deep learning.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is referred to as an oxide semiconductor in some cases. That is, a metal oxide included in a channel formation region of a transistor that has at least one of an amplifying function, a rectifying function, and a switching function can be referred to as a metal oxide semiconductor. In addition, an OS transistor is a transistor including a metal oxide or an oxide semiconductor.

In this specification and the like, a metal oxide containing nitrogen is also referred to as a metal oxide in some cases. In addition, a metal oxide containing nitrogen may be referred to as a metal oxynitride.

In this specification and the like, one embodiment of the present invention can be constituted with an appropriate combination of a structure shown in one embodiment and any of the structures shown in the other embodiments. In the case where a plurality of structure examples are described in one embodiment, some of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment (or each example), a content described in the embodiment is a content described with reference to a variety of diagrams or a content described with text in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

Embodiments disclosed in this specification will be described with reference to the drawings. Note that the embodiments can be implemented in many different modes, and it will be readily appreciated by those skilled in the art that modes and details can be changed in various ways without departing from the spirit and scope of the present invention. Therefore, the present invention should not be construed as being limited to the description of the embodiments. Note that in the structures of the invention described in the embodiments, the same portions or portions having similar functions are denoted by the same reference numerals in different drawings and the description of such portions is not repeated in some cases. In perspective views and the like, some of components might not be illustrated for clarity of the drawings.

In this specification, a plan view is sometimes used to explain a structure in each embodiment. A plan view is a diagram showing the appearance of a plane (section) of a structure cut in the horizontal direction, for example. Hidden lines (e.g., dashed lines) in a plan view can indicate the positional relation between a plurality of components included in a structure or the overlapping relation between the plurality of components. In this specification and the like, the term "plan view" can be replaced with the term "projection view", "top view", or "bottom view". A plane (section) of a structure cut in a direction other than the horizontal direction may be referred to as a plan view depending on circumstances.

In this specification, a cross-sectional view is sometimes used to explain a structure in each embodiment. A cross-sectional view is a diagram showing the appearance of a plane (section) of a structure cut in the vertical direction, for example. In this specification and the like, the term "cross-sectional view" can be replaced with the term "front view" or "side view". A plane (section) of a structure cut in a direction other than the vertical direction may be referred to as a cross-sectional view depending on circumstances.

In this specification and the like, when a plurality of components denoted by the same reference numerals need to be distinguished from each other, identification signs such as "_1", "[n]", and "[m, n]" are sometimes added to the reference numerals.

In the drawings of this specification, the size, the layer thickness, or the region is exaggerated for clarity in some cases. Therefore, the size, the layer thickness, or the region is not limited to the illustrated scale. The drawings are schematic views showing ideal examples, and embodiments of the present invention are not limited to shapes, values, or the like shown in the drawings. For example, the following can be included: a variation in a signal, a voltage, or a current due to noise or difference in timing.

Embodiment 1

In this embodiment, an example of a circuit capable of a product-sum operation and an arithmetic operation of a function system will be described as a semiconductor device which is one embodiment of the present invention.

FIG. 1 is a block diagram illustrating an example of an arithmetic circuit that can execute a product-sum operation and an arithmetic operation of a function system in succession. A circuit CDV illustrated in FIG. 1 includes, for example, arithmetic circuits MACL[1] to MACL[4]. Note that in this specification and the like, each of the arithmetic circuits MACL[1] to MACL[4] can also be referred to as a "layer", "arithmetic layer", or "circuit layer".

In the circuit CDV, the arithmetic circuit MACL[2] is located above the arithmetic circuit MACL[1], the arithmetic circuit MACL[3] is located above the arithmetic circuit MACL[2], and the arithmetic circuit MACL[4] is located above the arithmetic circuit MACL[3].

In FIG. 1, four arithmetic circuits MACL are stacked; however, as the structure of the circuit CDV, two or three arithmetic circuits MACL may be stacked. Alternatively, five or more arithmetic circuits MACL may be stacked as a structure of the circuit CDV.

Each of the arithmetic circuits MACL[1] to MACL[4] includes a cell array CA, a circuit WCS, and a circuit ITS. The arithmetic circuit MACL[1] includes a circuit XCS. Although FIG. 1 shows a structure where the circuit XCS is not provided for the arithmetic circuits MACL[2] to MACL[4], each of the arithmetic circuits MACL[2] to MACL[4] may include the circuit XCS.

The circuit WCS has a function of converting first data that is digital data supplied from the outside (the data corresponds to a weight coefficient in the case of an artificial neural network) into analog data (current), for example.

The circuit XCS has a function of converting second data that is digital data supplied from the outside (the data corresponds to input data in the case of an artificial neural network) into analog data (current), for example.

The cell array CA includes a plurality of arithmetic cells for performing multiplication, for example. The arithmetic cells are arranged in an array inside the cell array CA, for example. The cell array CA has a function of performing a product-sum operation of the first data and the second data and outputting an operation result as the amount of current.

The circuit ITS has a function of acquiring the result (current) of the product-sum operation output from the cell array CA and performing an arithmetic operation of a function system. In addition, the circuit ITS has a function of outputting an arithmetic result to the outside.

Details of the circuit WCS, the circuit XCS, the cell array CA, and the circuit ITS will be described later.

Next, data input to the circuit CDV, data subjected to arithmetic operation in the circuit CDV, and data output from the circuit CDV are described. In FIG. 1, hatched arrows each indicate digital data, and white arrows each indicate analog data.

In the arithmetic circuit MACL[1], first data $W^{(1)}$ that is digital data is input to the circuit WCS. Then, the circuit WCS inputs the first data $W^{(1)}$ to the cell array CA as analog data (e.g., a current signal). Note that $W^{(1)}$ can be a matrix.

Furthermore, in the arithmetic circuit MACL[1], second data $X^{(1)}$ that is digital data is input to the circuit XCS. Then, the circuit XCS inputs the second data $X^{(1)}$ to the cell array CA as analog data (e.g., a current signal). Note that $X^{(1)}$ can be a matrix.

The cell array CA in the arithmetic circuit MACL[1] executes a product-sum operation of the first data $W^{(1)}$ and the second data $X^{(1)}$ to output current the amount of which corresponds to $X^{(1)} \cdot W^{(1)}$. The current is input to the circuit ITS.

The circuit ITS in the arithmetic circuit MACL[1] acquires the current the amount of which corresponds to $X^{(1)} \cdot W^{(1)}$, thereby outputting current the amount of which corresponds to $F(X^{(1)} \cdot W^{(1)})$. Note that $F(x)$ represents a function for calculation performed in the circuit ITS and especially defined as $F(X^{(1)} \cdot W^{(1)}) = X^{(2)}$. Note that $X^{(2)}$ can be a matrix. The current the amount of which corresponds to $F(X^{(1)} \cdot W^{(1)}) = X^{(2)}$ flows through the cell array CA in the arithmetic circuit MACL[2]. $X^{(2)}$ is used as second data in the arithmetic circuit MACL[2].

In the arithmetic circuit MACL[2], first data $W^{(2)}$ that is digital data is input to the circuit WCS. Then, the circuit WCS inputs the first data $W^{(2)}$ to the cell array CA as analog data (e.g., a current signal). Note that $W^{(2)}$ can be a matrix.

The cell array CA in the arithmetic circuit MACL[2] executes a product-sum operation of the first data $W^{(2)}$ and the second data $X^{(2)}$ to output current the amount of which corresponds to $X^{(2)} \cdot W^{(2)}$. The current is input to the circuit ITS, and the circuit ITS outputs current the amount of which corresponds to $F(X^{(2)} \cdot W^{(2)}) = X^{(3)}$.

In the arithmetic circuit MACL[3], $W^{(3)}$ that is digital data is input to the circuit WCS, a product-sum operation of $X^{(3)} \cdot W^{(3)}$ is conducted in the cell array CA, and current the amount of which corresponds to $F(X^{(3)} \cdot W^{(3)}) = X^{(4)}$ is output from the circuit ITS, in a manner similar to those of the arithmetic circuits MACL[1] and MACL[2].

Also in the arithmetic circuit MACL[4], $W^{(4)}$ that is digital data is input to the circuit WCS, and a product-sum operation of $X^{(4)} \cdot W^{(4)}$ is conducted in the cell array CA, in a manner similar to those of the arithmetic circuits MACL[1] to MACL[3]. The circuit ITS in the arithmetic circuit MACL[4] outputs current the amount of which corresponds to $F(X^{(4)} \cdot W^{(4)}) = T$. Note that T is output data in the circuit CDV and can be a matrix.

The arithmetic circuits MACL[1] to MACL[4] are preferably formed using OS transistors described in Embodiment 6, for example. OS transistors can be formed more easily than Si transistors as long as they are formed over a film with high planarity; thus, OS transistors enable formation of a stacked structure of the arithmetic circuits MACL[1] to MACL[4] illustrated in FIG. 1.

The circuit CDV in FIG. 1 has a structure where arithmetic operations are performed successively from the arithmetic circuits MACL[1] to MACL[4], that is from below to above. However, the arithmetic operation sequence of the arithmetic circuits may be from above to below. In other words, the circuit CDV may have a structure such that the arithmetic circuit MACL[1] is located above the arithmetic circuit MACL[2], the arithmetic circuit MACL[2] is located above the arithmetic circuit MACL[3], and the arithmetic circuit MACL[3] is located above the arithmetic circuit MACL[4].

With the circuit CDV including the stacked arithmetic circuits MACL[1] to MACL[4], the semiconductor device whose circuits are scaled down is achieved. In the case where the circuit CDV is architected as a model of a hierarchical artificial neural network, weight coefficients appropriate for respective layers in the hierarchy are preferably written as the first data to the cell arrays CA in the arithmetic circuits MACL[1] to MACL[4]. As a result, there is no need to rewrite weight coefficients for the cell arrays CA in the respective arithmetic circuits MACL[1] to MACL[4] during the calculation of the artificial neural network. Therefore, the power consumption needed for calculation of the artificial neural network can be lower than that in conventional cases.

<Configuration Example 1 of Arithmetic Circuit>

Next, a configuration example of an arithmetic circuit applicable to each of the arithmetic circuits MACL[1] to MACL[4] is described.

Figure 2:
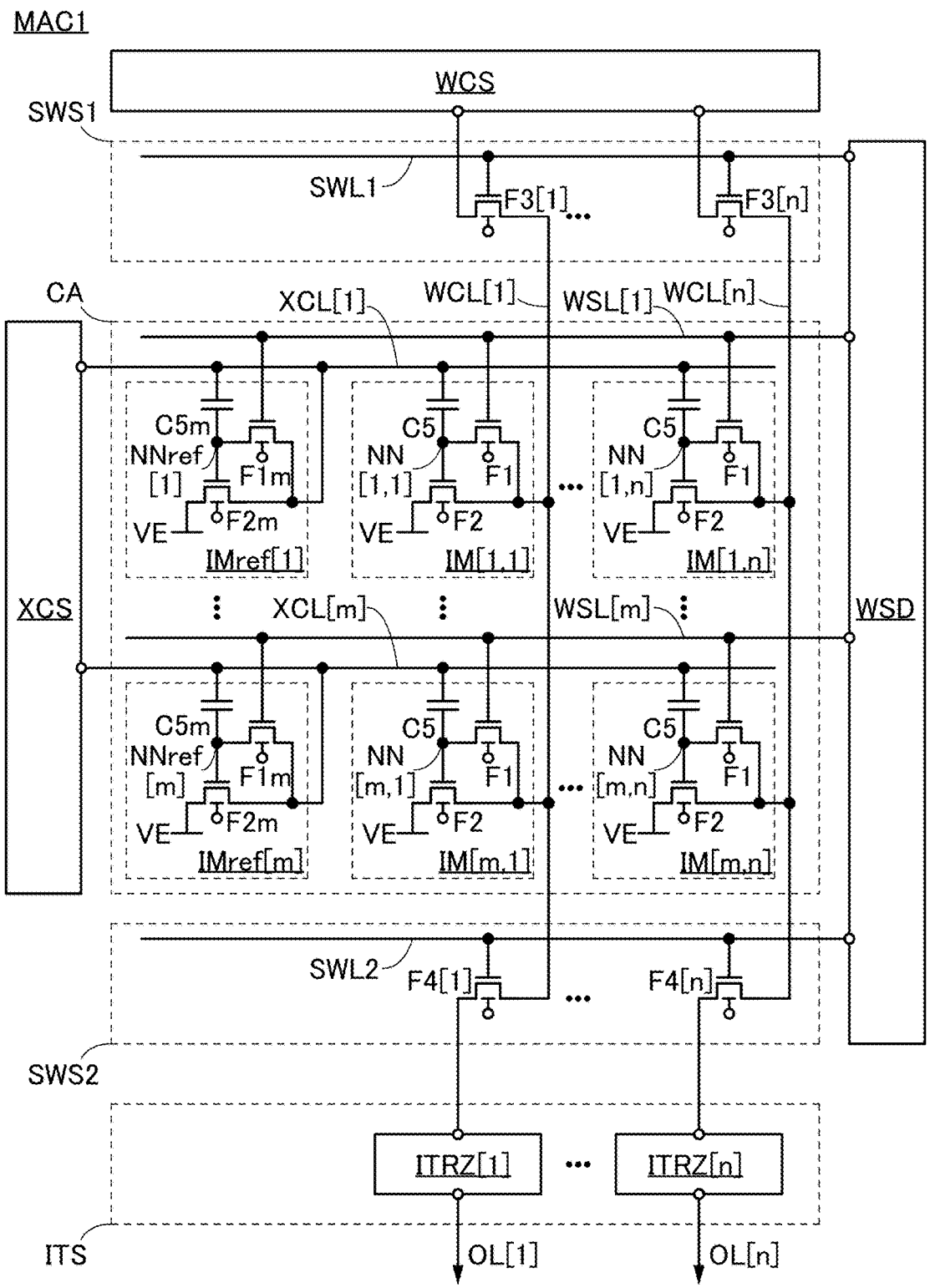
FIG. 2 is a block diagram illustrating a configuration example of a semiconductor device.

FIG. 2 shows a configuration example of an arithmetic circuit which performs a product-sum operation of positive or "0" first data and positive or "0" second data. An arithmetic circuit MAC1 illustrated in FIG. 2 is a circuit that performs a product-sum operation of the first data corresponding to a potential retained in each cell and the input second data, and performs an arithmetic operation of an activation function using the result of the product-sum operation. Note that the first data and the second data can be, for example, analog data or multilevel data (discrete data).

The arithmetic circuit MAC1 includes the circuit WCS, the circuit XCS, a circuit WSD, a circuit SWS1, a circuit SWS2, the cell array CA, and the circuit ITS.

The cell array CA includes cells IM[1, 1] to IM[m, n] (here, m is an integer greater than or equal to 1 and n is an integer greater than or equal to 1) and cells IMref[1] to IMref[m]. The cells IM[1, 1] to IM[m, n] have a function of retaining a potential corresponding to the current amount corresponding to the first data, and the cells IMref[1] to IMref[m] have a function of supplying a potential corresponding to the second data required for performing a product-sum operation with the retained first data to wirings XCL[1] to XCL[m], respectively.

Although cells are arranged in a matrix of n+1 rows and m columns in the cell array CA in FIG. 2, an acceptable structure of the cell array CA is such that cells are arranged in a matrix of two or more rows and one or more columns.

The cells IM[1, 1] to IM[m, n] each include a transistor F1, a transistor F2, and a capacitor C5, and the cells IMref[1] to IMref[m] each include a transistor F1$m$, a transistor F2$m$, and a capacitor C5$m$, for example.

In particular, the structures of the transistors F1 (including the channel length and the channel width) included in the cells IM[1, 1] to IM[m, n] are preferably equal to each other, and the structures of the transistors F2 included in the cells IM[1, 1] to IM[m, n] are preferably equal to each other. The structures of the transistors F1$m$ included in the cells IMref[1] to IMref[m] are preferably equal to each other, and the structures of the transistors F2$m$ included in the cells IMref[1] to IMref[m] are preferably equal to each other. The structure of the transistor F1 is preferably equal to that of the transistor F1$m$, and the structure of the transistor F2 is preferably equal to that of the transistor F2$m$.

By making the transistors have the same structure, the transistors can have substantially the same electrical characteristics. Thus, by making the transistors F1 included in the cell IM[1, 1] to the cell IM[m, n] have the same structure and the transistors F2 included in the cell IM[1, 1] to the cell IM[m, n] have the same structure, the cell IM[1, 1] to the cell IM[m, n] can perform almost the same operation when in the same conditions as each other. The same conditions mean that, for example, the transistors F1 have the same input potentials to the source, the drain, and the gate, the transistors F2 have the same input potential to the source, the drain, and the gate, and the same voltage is input to the cells IMref[1] to IMref[m]. By making the transistors F1$m$ included in the cells IM[1, 1] to IM[m, n] have the same structure and making the transistors F2$m$ included in the cells IMref[1] to IMref[m] have the same structure, the cells IMref[1] to IMref[m] can perform substantially the same operation to yield substantially the same results, for example. Specifically, the cells IMref[1] to IMref[m] can perform substantially the same operation when in the same conditions as each other. The same conditions mean that, for example, the transistors F1$m$ have the same input potential to the source, the drain, and the gate, the transistors F2$m$ have the same input potential to the source, the drain, and the gate, and the same voltage is input to the cells IMref[1] to IMref[m].

Unless otherwise specified, the transistor F1 and the transistor F1$m$ in an on state may operate in a linear region in the end. In other words, the gate voltage, the source voltage, and the drain voltage of each of the transistors may be within a range where the transistors operate in the linear region. Note that one embodiment of the present invention is not limited thereto. For example, the transistor F1 and the transistor F1$m$ in an on state may operate in a saturation region or may operate both in a linear region and in a saturation region.

Unless otherwise specified, the transistor F2 and the transistor F2$m$ may operate in a subthreshold region (i.e., a voltage between the gate and the source of the transistor F2 or the transistor F2$m$ may be lower than the threshold voltage, further preferably a drain current exponentially increases with respect to the voltage between the gate and the source). In other words, the gate voltage, the source voltage, and the drain voltage of each of the transistors may be within a range where the transistors operate in the subthreshold regions. Thus, the transistors F2 and the transistor F2$m$ may operate such that an off-state current flows between the source and the drain.

One or both of the transistor F1 and the transistor F1$m$ is/are preferably an OS transistor, for example. In addition, it is further preferable that a channel formation region in one or both of the transistor F1 and the transistor F1$m$ be an oxide containing at least one of indium, gallium, and zinc. Instead of the oxide, the channel formation region may be an oxide containing at least one of indium, an element M (as the element M, one or more selected from gallium, aluminum, silicon, boron, yttrium, tin, copper, vanadium, beryllium, boron, titanium, iron, nickel, germanium, zirconium, molybdenum, lanthanum, cerium, neodymium, hafnium, tantalum, tungsten, cobalt, magnesium, antimony, and the like can be used, for example), and zinc. It is further preferable that one or both of the transistor F1 and the transistor F1$m$ have a structure of a transistor described in Embodiment 6.

With use of an OS transistor as one or both of the transistor F1 and the transistor F1$m$, the leakage current of one or both of the transistor F1 and the transistor F1$m$ can be suppressed, so that the power consumption of the arithmetic circuit can be reduced. Specifically, in the case where one or both of the transistor F1 and the transistor F1$m$ is/are in a non-conduction state, the amount of a leakage current from a retention node to a write word line can be extremely small and the frequency of refresh operations for the potential of the retention node can be reduced. By reducing the frequency of refresh operations, the power consumption of the arithmetic circuit can be reduced. By making a leakage current from the retention node to a wiring WCL or the wiring XCL extremely small, cells can retain the potential of the retention node for a long time, so that the arithmetic operation accuracy of the arithmetic circuit can be high.

The use of an OS transistor also as one or both of the transistor F2 and the transistor F2$m$ enables driving with a wide range of current in the subthreshold region, leading to a reduction in the current consumption. The use of an OS transistor also as one or both of the transistor F2 and the transistor F2$m$ allows the transistor F2 and/or the transistor F2$m$ to be formed concurrently with the transistor F1 and/or the transistor F1$m$, leading to a reduction in the number of manufacturing steps for the arithmetic circuit, in some cases. One or both of the transistor F2 and the transistor F2$m$ can be, other than an OS transistor, a transistor including silicon in its channel formation region (hereinafter referred to as a Si transistor). As the silicon, amorphous silicon (referred to as hydrogenated amorphous silicon in some cases), microcrystalline silicon, polycrystalline silicon, single crystal silicon, or the like can be used, for example.

When a semiconductor device or the like is highly integrated into a chip or the like, the chip may generate heat when the circuit is driven. This heat makes the temperature of a transistor rise to change the characteristics of the transistor and the field-effect mobility thereof might change or the operation frequency thereof might decrease. Since an OS transistor has higher heat resistance than a Si transistor, the change in the field-effect mobility and the decrease in the operation frequency due to a change in temperature do not easily occur. Even when an OS transistor has a high temperature, it is likely to keep a property of the drain current increasing exponentially with respect to a gate-source voltage. With use of an OS transistor, even in a high temperature environment, an arithmetic operation, processing, or the like can be easily performed. Thus, to be highly resistant to heat due to driving, a semiconductor device preferably includes an OS transistor as its transistor.

In each of the cells IM[1, 1] to IM[m, n], a first terminal of the transistor F1 is electrically connected to the gate of the transistor F2. A first terminal of the transistor F2 is electrically connected to the wiring VE. A first terminal of the capacitor C5 is electrically connected to the gate of the transistor F2.

In each of the cells IMref[1] to IMref[m], a first terminal of the transistor F1m is electrically connected to a gate of the transistor F2m. A first terminal of the transistor F2m is electrically connected to the wiring VE. A first terminal of the capacitor C5m is electrically connected to the gate of the transistor F2m.

In FIG. 2, the back gates of the transistors F1, F2, F1m, and F2m are illustrated. The connection structures of the back gates are not illustrated, and the destinations to which the back gates are electrically connected can be determined at the design stage. For example, in a transistor including a back gate, a gate and the back gate may be electrically connected to each other to increase the on-state current of the transistor. For example, a gate and a back gate of the transistor F1 may be electrically connected, or a gate and a back gate of the transistor F1m may be electrically connected. Alternatively, for example, in a transistor including a back gate, a wiring for electrically connecting the back gate of the transistor to an external circuit or the like may be provided and a potential may be supplied to the back gate of the transistor with the external circuit or the like to change the threshold voltage of the transistor or to reduce the off-state current of the transistor.

The transistor F1 and the transistor F2 illustrated in FIG. 2 have back gates; however, the semiconductor device of one embodiment of the present invention is not limited thereto. For example, the transistor F1 and the transistor F2 illustrated in FIG. 2 may each have a structure not including a back gate, that is, a single-gate structure. It is also possible that some transistors include back gates and the other transistors do not include back gates.

The transistor F1 and the transistor F2 illustrated in FIG. 2 are n-channel transistors; however, the semiconductor device of one embodiment of the present invention is not limited thereto. For example, one or both of the transistors F1 and the transistors F2 may be replaced with p-channel transistors. When one or both of the transistors F1 and the transistors F2 are replaced with p-channel transistors, a voltage applied by a wiring, a potential of a node NN, a potential of a node NNref, and the like, which are described in this specification and the like, can be changed as appropriate for the sake of desired operations of the transistor F1 and the transistor F2.

The above-described examples of changes in the structure and the polarity of the transistor are not limited to the transistor F1 and the transistor F2. For example, the structures and the polarities of the transistor F1m and the transistor F2m, transistors F3[1] to F3[n] and transistors F4[1] to F4[n] which will be described later, a transistor described in other parts of the specification, and a transistor illustrated in other drawings can be changed.

The wiring VE functions as a wiring for supplying a current between the first terminal and a second terminal of the transistor F2 of each of the cell IM[1, 1], the cell IM[m, 1], the cell IM[1, n], and the cell IM[m, n] and a wiring for supplying a current between the first terminal and the second terminal of the transistor F2m of each of the cell IMref[1] and the cell IMref[m]. The wiring VE functions as a wiring for supplying a constant voltage, for example. The constant voltage can be, for example, a low-level potential, the ground potential, or the like.

In the cell IM[1, 1], a second terminal of the transistor F1 is electrically connected to a wiring WCL[1], and a gate of the transistor F1 is electrically connected to a wiring WSL[1]. The second terminal of the transistor F2 is electrically connected to the wiring WCL[1], and a second terminal of the capacitor C5 is electrically connected to the wiring XCL[1]. In FIG. 2, in the cell IM[1, 1], a connection portion of the first terminal of the transistor F1, the gate of the transistor F2, and the first terminal of the capacitor C5 is a node NN[1, 1].

In the cell IM[m, 1], the second terminal of the transistor F1 is electrically connected to the wiring WCL[1], and the gate of the transistor F1 is electrically connected to a wiring WSL[m]. The second terminal of the transistor F2 is electrically connected to the wiring WCL[1], and the second terminal of the capacitor C5 is electrically connected to the wiring XCL[m]. In FIG. 2, in the cell IM[m, 1], a connection portion of the first terminal of the transistor F1, the gate of the transistor F2, and the first terminal of the capacitor C5 is a node NN[m, 1].

In the cell IM[1, n], the second terminal of the transistor F1 is electrically connected to a wiring WCL[n], and the gate of the transistor F1 is electrically connected to the wiring WSL[1]. The second terminal of the transistor F2 is electrically connected to the wiring WCL[n], and the second terminal of the capacitor C5 is electrically connected to the wiring XCL[1]. In FIG. 2, in the cell IM[1, n], a connection portion of the first terminal of the transistor F1, the gate of the transistor F2, and the first terminal of the capacitor C5 is a node NN[1, n].

In the cell IM[m, n], the second terminal of the transistor F1 is electrically connected to the wiring WCL[n], and the gate of the transistor F1 is electrically connected to the wiring WSL[m]. The second terminal of the transistor F2 is electrically connected to the wiring WCL[n], and the second terminal of the capacitor C5 is electrically connected to the wiring XCL[m]. In FIG. 2, in the cell IM[m, n], a connection portion of the first terminal of the transistor F1, the gate of the transistor F2, and the first terminal of the capacitor C5 is a node NN[m, n].

In the cell IMref[1], a second terminal of the transistor F1m is electrically connected to the wiring XCL[1], and a gate of the transistor F1m is electrically connected to the wiring WSL[1]. A second terminal of the transistor F2m is electrically connected to the wiring XCL[1], and the second terminal of the capacitor C5 is electrically connected to the wiring XCL[1]. In FIG. 2, in the cell IMref[1], a connection portion of the first terminal of the transistor F1m, the gate of the transistor F2m, and the first terminal of the capacitor C5m is a node NNref[1].

In the cell IMref[m], the second terminal of the transistor F1m is electrically connected to the wiring XCL[m], and the gate of the transistor F1m is electrically connected to the wiring WSL[m]. The second terminal of the transistor F2m is electrically connected to the wiring XCL[m], and the second terminal of the capacitor C5 is electrically connected to the wiring XCL[m]. In FIG. 2, in the cell IMref[m], a connection portion of the first terminal of the transistor F1m, the gate of the transistor F2m, and the first terminal of the capacitor C5m is a node NNref[m].

The nodes NN[1, 1] to NN[m, n] and the nodes NNref[1] to NNref[m] function as retention nodes of the cells.

In the case where the transistor F1 is in an on state in the cells IM[1, 1] to IM[m, n], for example, the transistor F2 is a diode-connected transistor. When a constant voltage supplied by the wiring VE is a ground potential (GND), the transistor F1 is turned on, and a current with a current amount I flows from the wiring WCL to the second terminal of the transistor F2, the potential of the gate of the transistor F2 (node NN) depends on the current amount I. Since the transistor F1 is in an on state, the potential of the second terminal of the transistor F2 is ideally equal to that of the gate of the transistor F2 (node NN). By turning off the transistor F1, the potential of the gate of the transistor F2 (node NN) is retained. Accordingly, the transistor F2 can make a current with the current amount I, which is a current corresponding to the ground potential of the first terminal of the transistor F2 and the potential of the gate of the transistor F2 (node NN), flow between the source and the drain of the transistor F2. In this specification and the like, this operation is called "setting (programing) the amount of a current flowing between the source and the drain of the transistor F2 in the cell IM to I", for example.

For example, the circuit SWS1 includes the transistors F3[1] to F3[n]. A first terminal of the transistor F3[1] is electrically connected to the wiring WCL[1], a second terminal of the transistor F3[1] is electrically connected to the circuit WCS, and a gate of the transistor F3[1] is electrically connected to a wiring SWL1. A first terminal of the transistor F3[n] is electrically connected to the wiring WCL[n], a second terminal of the transistor F3[n] is electrically connected to the circuit WCS, and a gate of the transistor F3[n] is electrically connected to the wiring SWL1.

As each of the transistors F3[1] to F3[n], for example, a transistor which can be used as one or both of the transistor F1 and the transistor F2 can be used. It is particularly preferable to use an OS transistor as each of the transistors F3[1] to F3[n].

The circuit SWS1 functions as a circuit that establishes or breaks electrical continuity between the circuit WCS and each of the wirings WCL[1] to WCL[n].

For example, the circuit SWS2 includes the transistors F4[1] to F4[n]. A first terminal of the transistor F4[1] is electrically connected to the wiring WCL[1], a second terminal of the transistor F4[1] is electrically connected to an input terminal of a converter circuit ITRZ[1], and a gate of the transistor F4[1] is electrically connected to a wiring SWL2. A first terminal of the transistor F4[n] is electrically connected to the wiring WCL[n], a second terminal of the transistor F4[n] is electrically connected to an input terminal of a converter circuit ITRZ[n], and a gate of the transistor F4[n] is electrically connected to the wiring SWL2.

As each of the transistors F4[1] to F4[n], for example, a transistor which can be used as one of the transistor F1 and the transistor F2 can be used. It is particularly preferable to use an OS transistor as each of the transistors F4[1] to F4[n].

The circuit SWS2 functions as a circuit that establishes or breaks electrical continuity between the wiring WCL[1] and the converter circuit ITRZ[1] and between the wiring WCL[n] and the converter circuit ITRZ[n].

The circuit WCS has a function of transmitting data that is to be stored in each cell of the cell array CA.

The circuit XCS is electrically connected to the wirings XCL[1] to XCL[m]. The circuit XCS has a function of supplying a current with an amount corresponding to reference data (described later) or the second data to each of the cells IMref[1] to IMref[m] included in the cell array CA.

The circuit WSD is electrically connected to the wirings WSL[1] to WSL[m]. The circuit WSD has a function of selecting a row of the cell array CA to which the first data is written by supplying a predetermined signal to each of the wirings WSL[1] to WSL[m], when the first data is written to the cells IM[1, 1] to IM[m, n]. The wirings WSL[1] to WSL[m] function as write word lines.

For example, the circuit WSD is electrically connected to the wiring SWL1 and the wiring SWL2. The circuit WSD has a function of establishing or breaking electrical continuity between the circuit WCS and the cell array CA by supplying a predetermined signal to the wiring SWL1 and a function of establishing or breaking electrical continuity between the cell array CA and each of the converter circuits ITRZ[1] to ITRZ[n] by supplying a predetermined signal to the wiring SWL2.

The circuit ITS includes the converter circuit ITRZ[1] to the converter circuit ITRZ[n], for example.

The converter circuits ITRZ[1] to ITRZ[n] each include the input terminal and an output terminal, for example. For example, an output terminal of the converter circuit ITRZ[1] is electrically connected to a wiring OL[1], and an output terminal of the converter circuit ITRZ[n] is electrically connected to a wiring OL[n].

The converter circuits ITRZ[1] to ITRZ[n] each have a function of converting a current input to the input terminal into a voltage in accordance with the amount of the current and outputting the voltage from the output terminal. Examples of the voltage can be an analog voltage and a digital voltage. The converter circuits ITRZ[1] to ITRZ[n] may each include an arithmetic circuit of a function system. In that case, for example, the arithmetic circuit may perform an arithmetic operation of a function using the voltage obtained by the conversion and output the results to the wirings OL[1] to OL[n].

In the case of performing an arithmetic operation of the hierarchical neural network, a sigmoid function, a tanh function, a softmax function, a ReLU function, a threshold function, or the like can be used as the above-described function.

<<Circuit WCS and Circuit XCS>>

Here, specific examples of the circuit WCS and the circuit XCS are described.

Figure 3A:
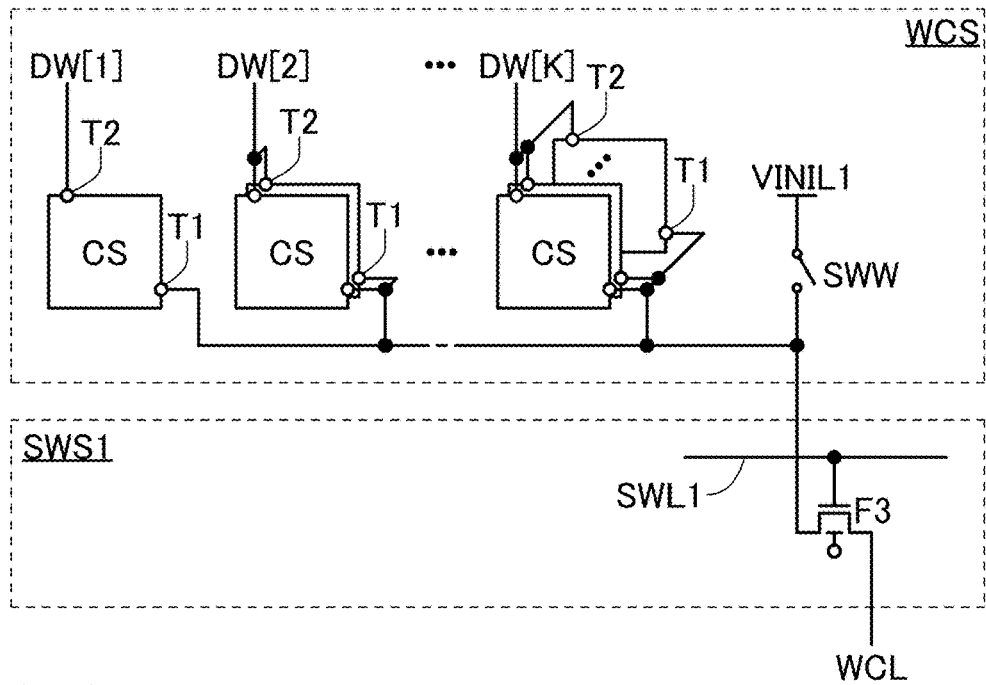
FIGS. 3A to 3C are block diagrams each illustrating a configuration example of a circuit included in a semiconductor device.

First, the circuit WCS is described. FIG. 3A is a block diagram showing an example of the circuit WCS. In FIG. 3A, the circuit SWS1, the transistor F3, the wiring SWL1, and the wiring WCL are illustrated to show the electrical connection between the circuit WCS and its nearby circuits. The transistor F3 is any one of the transistors F3[1] to F3[n] included in the arithmetic circuit MAC1 in FIG. 2, and the wiring WCL is any one of the wirings WCL[1] to WCL[n] included in the arithmetic circuit MAC1 in FIG. 2.

The circuit WCS illustrated in FIG. 3A includes a switch SWW, for example. A first terminal of the switch SWW is electrically connected to the second terminal of the transistor F3, and a second terminal of the switch SWW is electrically connected to a wiring VINIL1. The wiring VINIL1 functions as a wiring for supplying an initialization potential to the wiring WCL, and the initialization potential can be set to the ground potential (GND), a low-level potential, a high-level potential, or the like. The switch SWW is turned on only when the initialization potential is supplied to the wiring WCL; otherwise, the switch is in an off state.

As the switch SWW, an electrical with such as analog switch or a transistor can be used, for example. When a transistor is used as the switch SWW, for example, the transistor can have a structure similar to that of the transistor F1 or the transistor F2. A mechanical switch may be used other than the electrical switch.

The circuit WCS in FIG. 3A includes a plurality of current sources CS, for example. Specifically, the circuit WCS has a function of outputting K-bit first data ($2^K$ values) (K is an integer greater than or equal to 1) as the current amount, and the circuit WCS includes $2^K-1$ current sources CS at that time. The circuit WCS includes one current source CS which outputs data corresponding to the first bit value as a current, two current sources CS which output data corresponding to the second bit value as a current, and $2^{K-1}$ current sources CS which output data corresponding to the K-th bit value as a current.

Each current source CS in FIG. 3A includes a terminal T1 and a terminal T2. The terminal T1 of each of the current sources CS is electrically connected to the second terminal of the transistor F3 included in the circuit SWS1. The terminal T2 of the one current source CS is electrically connected to a wiring DW[1], the terminals T2 of the two current sources CS are electrically connected to a wiring DW[2], and the terminals T2 of the $2^{K-1}$ current sources CS are electrically connected to a wiring DW[K].

The plurality of current sources CS included in the circuit WCS have a function of outputting the constant currents in the same amount $I_{Wut}$ from the terminals T1. In actuality, when the arithmetic circuit MAC1 is manufactured, the transistors in the current sources CS may have different electrical characteristics; this may yield errors. The errors in the amount $I_{Wut}$ of the constant currents output from the terminals T1 of the plurality of current sources CS are preferably within 10%, further preferably within 5%, and still further preferably within 1%. In this embodiment, the description is made based on the assumption that there is no error in the amount $I_{Wut}$ of the constant currents output from the terminals T1 of the plurality of current sources CS included in the circuit WCS.

The wirings DW[1] to DW[K] which are electrically connected to the current sources CS function as wirings for transmitting control signals to make the current sources CS output a constant current in the amount $I_{Wut}$. Specifically, for example, when a high-level potential is supplied to the wiring DW[1], the current source CS electrically connected to the wiring DW[1] supplies a constant current in the amount $I_{Wut}$ to the second terminal of the transistor F3, and when a low-level potential is supplied to the wiring DW[1], $I_{Wut}$ is not output by the current source CS electrically connected to the wiring DW[1]. For example, when a high-level potential is supplied to the wiring DW[2], the two current sources CS electrically connected to the wiring DW[2] supply $2 \times I_{Wut}$, a constant current, in total to the second terminal of the transistor F3, and when a low-level potential is supplied to the wiring DW[2], $2 \times I_{Wut}$, a constant current, in total is not output by the current sources CS electrically connected to the wiring DW[2]. For example, when a high-level potential is supplied to the wiring DW[K], the $2^{K-1}$ current sources CS electrically connected to the wiring DW[K] supply $2^{K-1} \times I_{Wut}$, a constant current, in total to the second terminal of the transistor F3, and when a low-level potential is supplied to the wiring DW[K], $2^{K-1} \times I_{Wut}$, a constant current, in total is not output by the current sources CS electrically connected to the wiring DW[K].

The amount of the current flowing from the one current source CS electrically connected to the wiring DW[1] corresponds to the value of the first bit, the amount of the current flowing from the two current sources CS electrically connected to the wiring DW[2] corresponds to the value of the second bit, and the amount of the current flowing from the K current sources CS electrically connected to the wiring DW[K] corresponds to the value of the K-th bit. The circuit WCS with K of 2 is considered. For example, when the value of the first bit is "1" and the value of the second bit is "0", a high-level potential is supplied to the wiring DW[1], and a low-level potential is supplied to the wiring DW[2]. In this case, the constant current in the amount $I_{Wut}$ flows from the circuit WCS to the second terminal of the transistor F3 in the circuit SWS1. For example, when the value of the first bit is "0" and the value of the second bit is "1", a low-level potential is supplied to the wiring DW[1], and a high-level potential is supplied to the wiring DW[2]. In this case, a constant current in the amount $2 \times I_{Wut}$ flows from the circuit WCS to the second terminal of the transistor F3 in the circuit SWS1. For example, when the value of the first bit is "1" and the value of the second bit is "1", a high-level potential is supplied to the wiring DW[1] and the wiring DW[2]. In this case, the constant current in the amount $3 \times I_{Wut}$ flows from the circuit WCS to the second terminal of the transistor F3 in the circuit SWS1. For example, when the value of the first bit is "0" and the value of the second bit is "0", a low-level potential is supplied to the wiring DW[1] and the wiring DW[2]. In this case, no constant current flows from the circuit WCS to the second terminal of the transistor F3 in the circuit SWS1.

FIG. 3A shows the circuit WCS when K is an integer greater than or equal to 3; when K is 1, the current sources CS electrically connected to the wirings DW[2] to DW[K] are not provided in the circuit WCS in FIG. 3A. When K is 2, the current sources CS electrically connected to the wirings DW[3] to DW[K] are not provided in the circuit WCS in FIG. 3A.

Next, a specific configuration example of the current source CS is described.

Figure 4A:
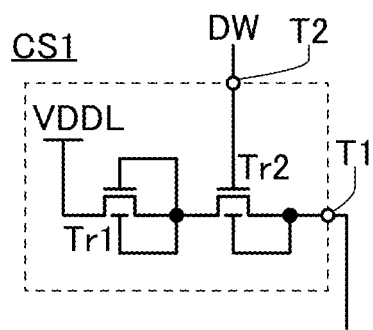
FIGS. 4A to 4D are circuit diagrams each illustrating a configuration example of a circuit included in a semiconductor device.

A current source CS1 illustrated in FIG. 4A can be used as the current source CS included in the circuit WCS in FIG. 3A; the current source CS1 includes a transistor Tr1 and a transistor Tr2.

A first terminal of the transistor Tr1 is electrically connected to a wiring VDDL, and a second terminal of the transistor Tr1 is electrically connected to a gate of the transistor Tr1, a back gate of the transistor Tr1, and a first terminal of the transistor Tr2. A second terminal of the transistor Tr2 is electrically connected to the terminal T1, and a gate of the transistor Tr2 is electrically connected to the terminal T2. The terminal T2 is electrically connected to the wiring DW.

The wiring DW is any one of the wirings DW[1] to DW[n] in FIG. 3A.

The wiring VDDL functions as a wiring for supplying a constant voltage. The constant voltage can be a high-level potential, for example.

When a constant voltage supplied by the wiring VDDL is set at a high-level potential, a high-level potential is input to the first terminal of the transistor Tr1. The potential of the second terminal of the transistor Tr1 is lower than the high-level potential. At this time, the first terminal of the transistor Tr1 functions as a drain, and the second terminal of the transistor Tr1 functions as a source. Since the gate of the transistor Tr1 is electrically connected to the second terminal of the transistor Tr1, the gate-source voltage of the transistor Tr1 is 0 V. When the threshold voltage of the transistor Tr1 is within an appropriate range, a current in the current range of a subthreshold region (drain current) flows between the first terminal and the second terminal of the transistor Tr1. The amount of the current is preferably smaller than or equal to $1.0 \times 10^{-8}$ A, further preferably smaller than or equal to $1.0 \times 10^{-12}$ A, and still further preferably smaller than or equal to $1.0 \times 10^{-15}$ A when the transistor Tr1 is an OS transistor. For example, the current is preferably within a range in which the current exponentially increases with respect to a gate-source voltage. That is, the transistor Tr1 functions as a current source for supplying a current within a current range of the transistor Tr1 operating in the subthreshold region. The current corresponds to the above-described $I_{Wut}$ or $I_{Xut}$ (described later).

The transistor Tr2 functions as a switching element. When the potential of the first terminal of the transistor Tr2 is higher than the potential of the second terminal of the transistor Tr2, the first terminal of the transistor Tr2 functions as a drain and the second terminal of the transistor Tr2 functions as a source. Since a back gate of the transistor Tr2 and the second terminal of the transistor Tr2 are electrically connected, the back gate-source voltage is 0 V. When the threshold voltage of the transistor Tr2 is within an appropriate range and a high-level potential is input to the gate of the transistor Tr2, the transistor Tr2 is turned on, and when a low-level potential is input to the gate of the transistor Tr2, the transistor Tr2 is turned off. Specifically, when the transistor Tr2 is in an on state, a current within the current range of the subthreshold region flows from the second terminal of the transistor Tr1 to the terminal T1, and when the transistor Tr2 is in an off state, the current within the current range of the subthreshold region does not flow from the second terminal of the transistor Tr1 to the terminal T1.

Figure 4B:
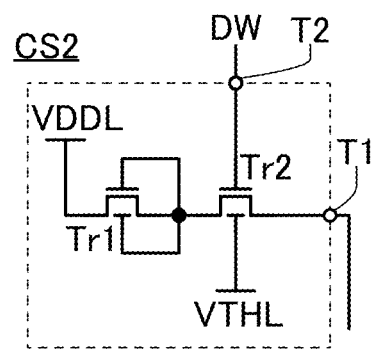

The circuit that can be used for the current source CS included in the circuit WCS in FIG. 3A is not limited to the current source CS1 in FIG. 4A. For example, in the current source CS1, the back gate of the transistor Tr2 and the second terminal of the transistor Tr2 are electrically connected, but the back gate of the transistor Tr2 may be electrically connected to another wiring. FIG. 4B illustrates such a configuration example. In a current source CS2 illustrated in FIG. 4B, the back gate of the transistor Tr2 is electrically connected to a wiring VTHL. When the wiring VTHL of the current source CS2 is electrically connected to an external circuit or the like, the external circuit or the like supplies a predetermined potential to the wiring VTHL and the back gate of the transistor Tr2 can be supplied with the predetermined potential. This can change the threshold voltage of the transistor Tr2. Specifically, the off-state current of the transistor Tr2 can be reduced by increasing the threshold voltage of the transistor Tr2.

Figure 4C:
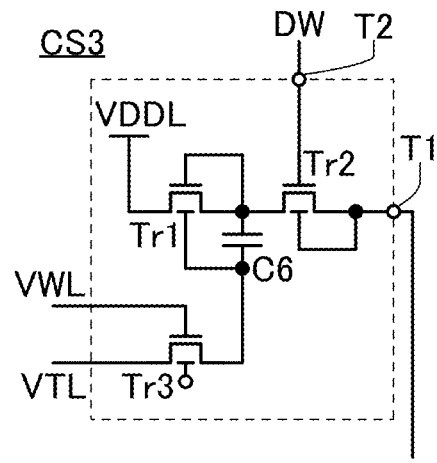

For example, in the current source CS1, the back gate of the transistor Tr1 and the second terminal of the transistor Tr1 are electrically connected; however, the voltage between the back gate and the second terminal of the transistor Tr2 may be retained with a capacitor. Such a configuration example is illustrated in FIG. 4C. A current source CS3 illustrated in FIG. 4C includes a transistor Tr3 and a capacitor C6 in addition to the transistor Tr1 and the transistor Tr2. The current source CS3 is different from the current source CS1 in that the second terminal of the transistor Tr1 and the back gate of the transistor Tr1 are electrically connected through the capacitor C6, and the back gate of the transistor Tr1 and a first terminal of the transistor Tr3 are electrically connected. In the current source CS3, a second terminal of the transistor Tr3 is electrically connected to a wiring VTL, and a gate of the transistor Tr3 is electrically connected to a wiring VWL. In the current source CS3, a high-level potential is supplied to the wiring VWL to turn on the transistor Tr3, so that the wiring VTL and the back gate of the transistor Tr1 can be in a conduction state. In this case, a predetermined potential can be input to the back gate of the transistor Tr1 from the wiring VTL. By supplying a low-level potential to the wiring VWL to turn off the transistor Tr3, a voltage between the second terminal of the transistor Tr1 and the back gate of the transistor Tr1 can be retained with the capacitor C6. That is, by setting the voltage supplied to the back gate of the transistor Tr1 by the wiring VTL, the threshold voltage of the transistor Tr1 can be changed and the threshold voltage of the transistor Tr1 can be fixed with the transistor Tr3 and the capacitor C6.

Figure 4D:
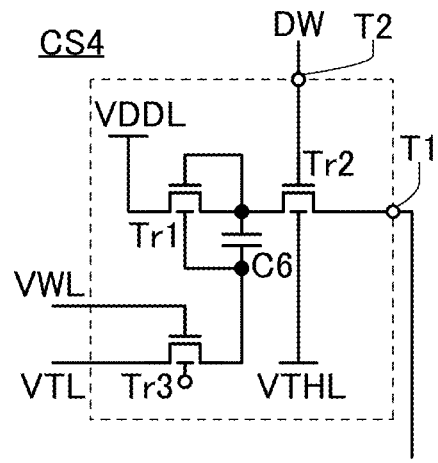

For example, a current source CS4 in FIG. 4D can be used as the current source CS included in the circuit WCS in FIG. 3A. In the current source CS4, the back gate of the transistor Tr2 is electrically connected not to the second terminal of the transistor Tr2 as in the current source CS3 in FIG. 4C but to the wiring VTHL. The current source CS4 can change the threshold voltage of the transistor Tr2 with the potential supplied by the wiring VTHL, as in the current source CS2 in FIG. 4B.

When a high current flows between the first terminal and the second terminal of the transistor Tr1 in the current source CS4, the on-state current of the transistor Tr2 needs to be increased to supply the current from the terminal T1 out of the current source CS4. In this case, in the current source CS4, a high-level potential is supplied to the wiring VTHL to decrease the threshold voltage of the transistor Tr2 and increase the on-state current of the transistor Tr2, whereby a high current flowing between the first terminal and the second terminal of the transistor Tr1 can be supplied from the terminal T1 out of the current source CS4.

By using any one of the current sources CS1 to CS4 illustrated in FIGS. 4A to 4D as the current sources CS included in the circuit WCS in FIG. 3A, the circuit WCS can output a current corresponding to the K-bit first data. The above-mentioned current amount can be the amount of the current flowing between the first terminal and the second terminal of the transistor F1 that operates within the subthreshold region.

Figure 3B:
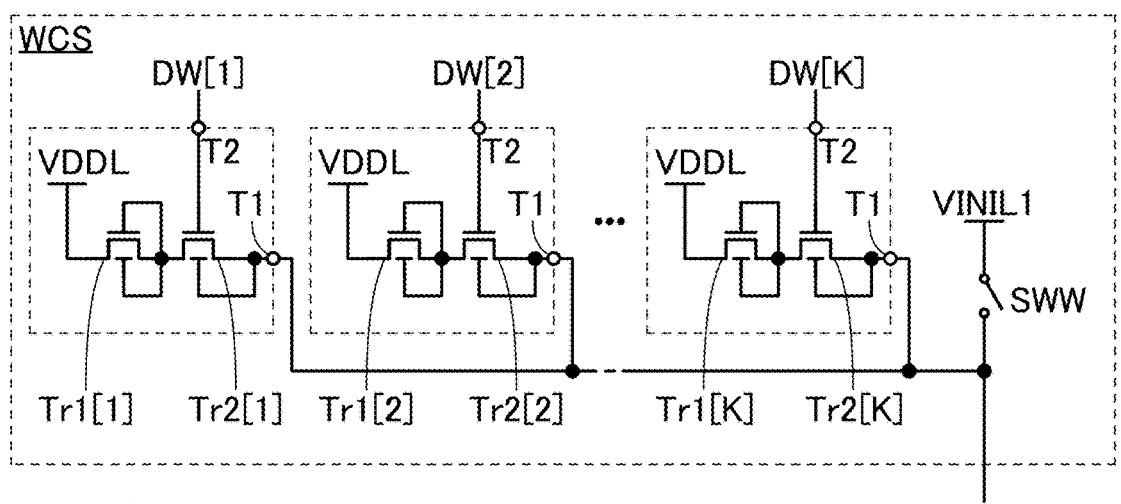

As the circuit WCS in FIG. 3A, the circuit WCS in FIG. 3B may be used. In the circuit WCS in FIG. 3B, one current source CS in FIG. 4A is connected to each of the wirings DW[1] to DW[K]. When the channel width of a transistor Tr1[1] is w[1], the channel width of a transistor Tr1[2] is w[2], and the channel width of a transistor Tr1 [K] is w[K], the ratio of the channel widths is $w[1]:w[2]:w[K]=1:2:2^{K-1}$. Since a current flowing between a source and a drain of a transistor that operates in the subthreshold region is proportional to the channel width, the circuit WCS illustrated in FIG. 3B can output a current corresponding to the K-bit first data like the circuit WCS in FIG. 3A.

As the transistor Tr1 (including the transistors Tr1[1] to Tr1 [K]), the transistor Tr2 (including the transistors Tr2[1] to Tr2[K]), and the transistor Tr3, a transistor which can be used as one or both of the transistor F1 and the transistor F2 can be used, for example. In particular, as the transistor Tr1 (including the transistors Tr1 [1] to Tr2[K]), the transistor Tr2 (including the transistors Tr2[1] to Tr2[K]), and the transistor Tr3, OS transistors are preferably used.

Next, a specific example of the circuit XCS is described.

Figure 3C:
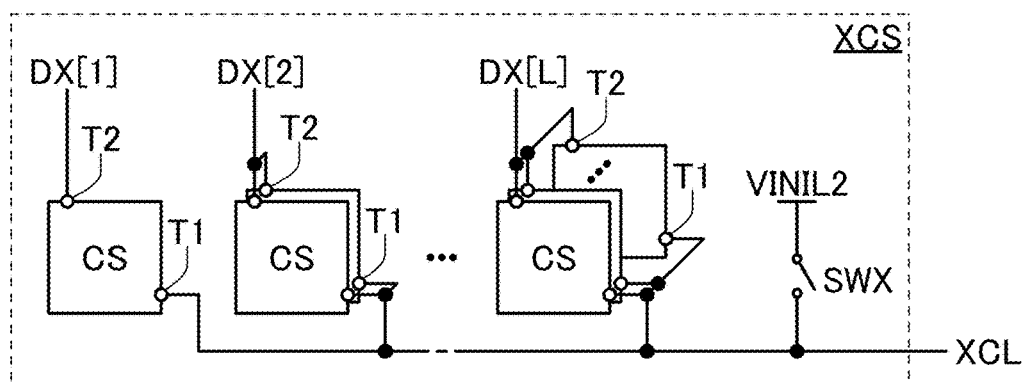

FIG. 3C is a block diagram showing an example of the circuit XCS. In FIG. 3C, to show the electrical connection between the circuit XCS and its nearby circuits, the wiring XCL is illustrated. The wiring XCL can be any one of the wirings XCL[1] to XCL[m] included in the arithmetic circuit MAC1 in FIG. 2.

The circuit XCS illustrated in FIG. 3C includes a switch SWX, for example. A first terminal of the switch SWX is electrically connected to the wiring XCL and a plurality of power sources CS, and a second terminal of the switch SWX is electrically connected to a wiring VINIL2. The wiring VINIL2 functions as a wiring for supplying an initialization potential to the wiring XCL, and the initialization potential can be set to the ground potential (GND), a low-level potential, a high-level potential, or the like. The initialization potential supplied by the wiring VINIL2 can be the same as the potential supplied by the wiring VINIL1. The switch SWX is turned on only when the initialization potential is supplied to the wiring XCL; otherwise, the switch is in an off state.

As the switch SWX, a switch that can be used as the switch SWW can be used, for example.

The circuit XCS in FIG. 3C can have substantially the same configuration as the circuit WCS in FIG. 4A. Specifically, the circuit XCS has a function of outputting reference data as the current amount, and a function of outputting L-bit second data ($2^L$ values) (L is an integer greater than or equal to 1) as the current amount, and the circuit XCS includes $2^L-1$ current sources CS at that time. The circuit XCS includes one current source CS which outputs data corresponding to the first bit value as a current, two current sources CS which output data corresponding to the second bit value as a current, and $2^{L-1}$ current sources CS which output data corresponding to the L-th bit value as a current.

The reference data output by the circuit XCS as a current can be data in which the first bit value is "1" and the second and subsequent bit values are "0", for example.

In FIG. 3C, the terminal T2 of the one current source CS is electrically connected to the wiring DX[1], the terminals T2 of the two current sources CS are electrically connected to the wiring DX[2], and the terminals T2 of the $2^{L-1}$ current sources CS are electrically connected to the wiring DX[L].

The plurality of current sources CS included in the circuit XCS have a function of outputting the constant currents with the same amount $I_{Xut}$ from the terminals T1. The wirings DX[1] to DX[L] which are electrically connected to the current sources CS function as wirings for transmitting control signals to make the current sources CS output a constant current in the amount $I_{Xut}$. In other words, the circuit XCS has a function of supplying the current amount corresponding to the L-bit data transmitted from the wirings DX[1] to DX[L] to the wiring XCL.

Specifically, the circuit XCS with L of 2 is considered. For example, when the value of the first bit is "1" and the value of the second bit is "0", a high-level potential is supplied to the wiring DX[1], and a low-level potential is supplied to the wiring DX[2]. In this case, the constant current with the amount $I_{Xut}$ flows from the circuit XCS to the wiring XCL. For example, when the value of the first bit is "0" and the value of the second bit is "1", a low-level potential is supplied to the wiring DX[1], and a high-level potential is supplied to the wiring DX[2]. In this case, the constant current with the amount of $2 \times I_{Xut}$ flows from the circuit XCS to the wiring XCL. For example, when the value of the first bit is "1" and the value of the second bit is "1", a high-level potential is supplied to the wiring DX[1] and the wiring DX[2]. In this case, the constant current with the amount of $3 \times I_{Xut}$ flows from the circuit XCS to the wiring XCL. For example, when the value of the first bit is "0" and the value of the second bit is "0", a low-level potential is supplied to the wiring DX[1] and the wiring DX[2]. In this case, no constant current flows from the circuit XCS to the wiring XCL. In this case, the expression "a current with the amount of 0 flows from the circuit XCS to the wiring XCL" is also sometimes used in this specification and the like. The current amount 0, $I_{Xut}$, $2 \times I_{Xut}$, $3 \times I_{Xut}$, or the like output from the circuit XCS can be the second data output from the circuit XCS; particularly, the current amount $I_{Xut}$ output from the circuit XCS can be the reference data output from the circuit XCS.

When the transistors in the current sources CS included in the circuit XCS have different electrical characteristics and this yields errors, the errors in the amount $I_{Xut}$ of the constant currents output from the terminals T1 of the plurality of current sources CS are preferably within 10%, further preferably within 5%, and still further preferably within 1%. In this embodiment, the description is made based on the assumption that there is no error in the amount $I_{Xut}$ of the constant currents output from the terminals T1 of the plurality of current sources CS included in the circuit XCS.

As the current source CS of the circuit XCS, any of the current sources CS1 to CS4 in FIGS. 4A to 4D can be used in a manner similar to that of the current source CS of the circuit WCS. In that case, the wiring DW in FIGS. 4A to 4D is replaced with the wiring DX. This allows the circuit XCS to make a current within the current range of the subthreshold region flow in the wiring XCL as the reference data or the L-bit second data.

For the circuit XCS in FIG. 3C, the circuit configuration similar to that of the circuit WCS illustrated in FIG. 3B can be used. In this case, the circuit WCS in FIG. 3B is replaced with the circuit XCS, the wiring DW[1] is replaced with the wiring DX[1], the wiring DW[2] is replaced with the wiring DX[2], the wiring DW[K] is replaced with the wiring DX[L], the switch SWW is replaced with the switch SWX, and the wiring VINIL1 is replaced with the wiring VINIL2.

<<Converter Circuit ITRZ[1] and Converter Circuit ITRZ [n]>>

Here, a specific example of a circuit that can be used as the converter circuits ITRZ[1] to the ITRZ[n] included in the arithmetic circuit MAC1 in FIG. 2 is described.

Figure 5A:
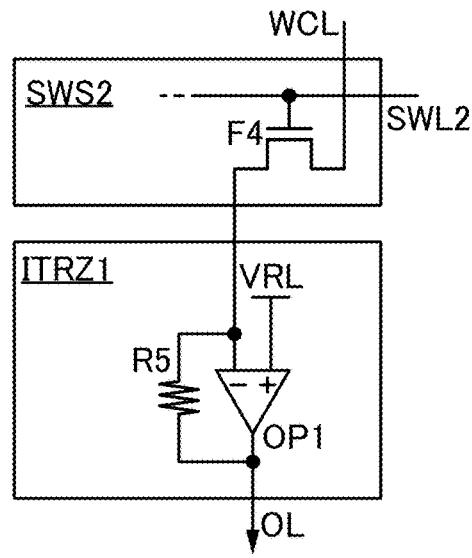
FIGS. 5A to 5D are circuit diagrams each illustrating a configuration example of a circuit included in a semiconductor device.

The converter circuit ITRZ1 illustrated in FIG. 5A is an example of a circuit that can be used as the converter circuits ITRZ[1] to ITRZ[n] in FIG. 2. FIG. 5A also illustrates the circuit SWS2, the wiring WCL, the wiring SWL2, and the transistor F4 to show the electrical connection between the converter circuit ITRZ1 and its peripheral circuits. The wiring WCL is any one of the wirings WCL[1] to WCL[n] included in the arithmetic circuit MAC1 in FIG. 2, and the transistor F4 is any one of the transistors F4[1] to F4[n] included in the arithmetic circuit MAC1 in FIG. 2.

The converter circuit ITRZ1 in FIG. 5A is electrically connected to the wiring WCL through the transistor F4. The converter circuit ITRZ1 is electrically connected to the wiring OL. The converter circuit ITRZ1 has a function of converting the amount of current flowing between the converter circuit ITRZ1 and the wiring WCL into an analog voltage and outputting the analog voltage to the wiring OL. That is, the converter circuit ITRZ1 includes a current-voltage converter circuit.

The converter circuit ITRZ1 in FIG. 5A includes a resistor R5 and an operational amplifier OP1, for example.

An inverting input terminal of the operational amplifier OP1 is electrically connected to a first terminal of the resistor R5 and a second terminal of the transistor F4. The non-inverting input terminal of the operational amplifier OP1 is electrically connected to a wiring VRL. An output terminal of the operational amplifier OP1 is electrically connected to a second terminal of the resistor R5 and the wiring OL.

The wiring VRL functions as a wiring for supplying a constant voltage. The constant voltage can be a ground potential (GND) or a low-level potential, for example.

The converter circuit ITRZ1 with the configuration in FIG. 5A can convert the amount of current, which flows between the wiring WCL and the converter circuit ITRZ1 through the transistor F4, into an analog voltage to output it to the wiring OL.

In particular, by setting the constant voltage applied from the wiring VRL to a ground potential (GND), the inverting input terminal of the operational amplifier OP1 is virtually grounded, and the analog voltage output to the wiring OL can be voltage with reference to the ground potential (GND).

Although the converter circuit ITRZ1 in FIG. 5A is configured to output an analog voltage, the converter circuits ITRZ[1] to ITRZ[n] in FIG. 2 may be configured to output an analog current. In particular, for the circuit CDV illustrated in FIG. 1, it is preferable that the converter circuits ITRZ[1] to ITRZ[n] included in the circuit ITS output an analog circuit.

Figure 5B:
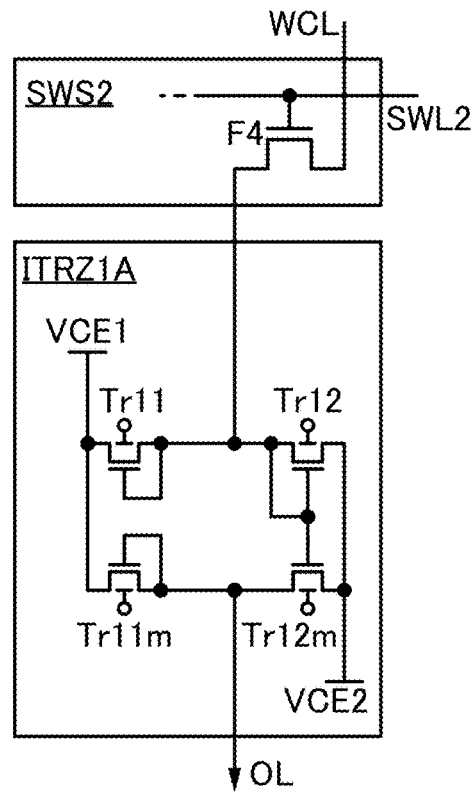

A converter circuit ITRZ1A in FIG. 5B is a circuit for supplying the wiring OL with a current with the same amount as the analog current flowing through the wiring WCL. The converter circuit ITRZ1A includes a transistor Tr11, a transistor Tr11$m$, a transistor Tr12, and a transistor Tr12$m$.

For each of the transistors Tr11, Tr11$m$, Tr12, and Tr12$m$, a transistor applicable to the transistor F1, F2, F3, or F4 can be used, for example.

A first terminal of the transistor Tr11 is electrically connected to a wiring VCE1. A second terminal of the transistor Tr11 is electrically connected to a gate of the transistor Tr11, a first terminal of the transistor Tr12, a gate of the transistor Tr12, a gate of the transistor Tr12$m$, and a second terminal of the transistor F4 in the circuit SWS2. A second terminal of the transistor Tr12 is electrically connected to a wiring VCE2.

A first terminal of the transistor Tr11$m$ is electrically connected to the wiring VCE1. A second terminal of the transistor Tr11$m$ is electrically connected to a gate of the transistor Tr11$m$, a first terminal of the transistor Tr12$m$, and the wiring OL. A second terminal of the transistor Tr12$m$ is electrically connected to the wiring VCE2.

The wiring VCE1 functions as a wiring supplying a constant potential to the first terminals of the transistor Tr11 and the transistor Tr11$m$. The constant potential can be a high-level potential, for example.

The wiring VCE2 functions as a wiring supplying a constant potential to the second terminals of the transistor Tr12 and the transistor Tr12$m$. The constant potential can be a ground potential, a low-level potential, or a negative potential, for example.

The gate and the second terminal are electrically connected to each other in the transistor Tr11 and the transistor Tr11$m$, and their first terminals and the wiring VCE1 supplying a high-level potential are electrically connected to each other. Thus, the gate-source voltage of each of the transistor Tr11 and the transistor Tr11$m$ is 0 V, and when the threshold voltages of the transistor Tr11 and the transistor Tr11$m$ are within an appropriate range, a subthreshold current flows between the first terminal and the second terminal of each of the transistor Tr11 and the transistor Tr11$m$. In other words, the transistor Tr11 and the transistor Tr11$m$ function as constant current sources.

In FIG. 5B, the first terminal of the transistor Tr12 is electrically connected to the gate of the transistor Tr12 and the gate of the transistor Tr12$m$; thus, the connection between the transistors Tr12 and Tr12$m$ forms a current mirror circuit. In other words, the amount of source-drain current of the transistor Tr12 is ideally equated with the amount of source-drain current of the transistor Tr12$m$.

The current mirror circuit formed with the connection between the transistors Tr12 and Tr12$m$ in FIG. 5B may be replaced with a current mirror circuit with a cascode connection (not illustrated).

Assuming that the amount of source-drain current of each of the transistors Tr11 and Tr11$m$ is denoted by $I_{SC}$ and the amount of current flowing from the converter circuit ITRZ1A to the wiring WCL is denoted by $I_{OP}$ in a state where the transistor F4 is in an on state, the amount of source-drain current of the transistor Tr12 is denoted by $I_{SC}-I_{OP}$. Accordingly, the amount of source-drain current of the transistor Tr11$m$ corresponds to $I_{SC}-I_{OP}$. Hence, the amount of current flowing from the converter circuit ITRZ1A to the wiring OL is $I_{SC}-(I_{SC}-I_{OP})=I_{OP}$. With such a configuration, the converter circuit ITRZ1A can output current with the amount equated with the amount of current flowing through the wiring WCL, to the wiring OL.

Figure 5C:
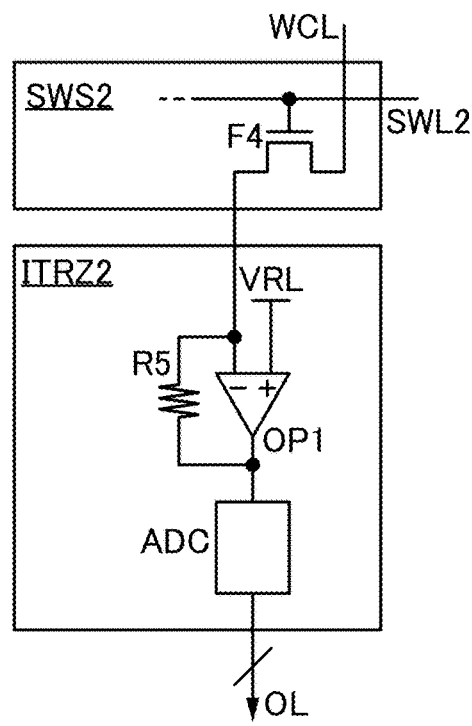

The circuit configuration applicable to the converter circuits ITRZ[1] to ITRZ[n] in FIG. 2 is not limited to the configuration of the converter circuit ITRZ1 outputting an analog voltage in FIG. 5A and the converter circuit ITRZ1A outputting an analog current in FIG. 5B. For example, the converter circuit ITRZ1 may include an analog-digital converter circuit ADC as illustrated in FIG. 5C. Specifically, in a converter circuit ITRZ2 in FIG. 5C, an input terminal of the analog-digital converter circuit ADC is electrically connected to the output terminal of the operational amplifier OP1 and the second terminal of the resistor R5, and an output terminal of the analog-digital converter circuit ADC is electrically connected to the wiring OL. With such a configuration, the converter circuit ITRZ2 in FIG. 5C can output a digital signal to the wiring OL.

Figure 5D:
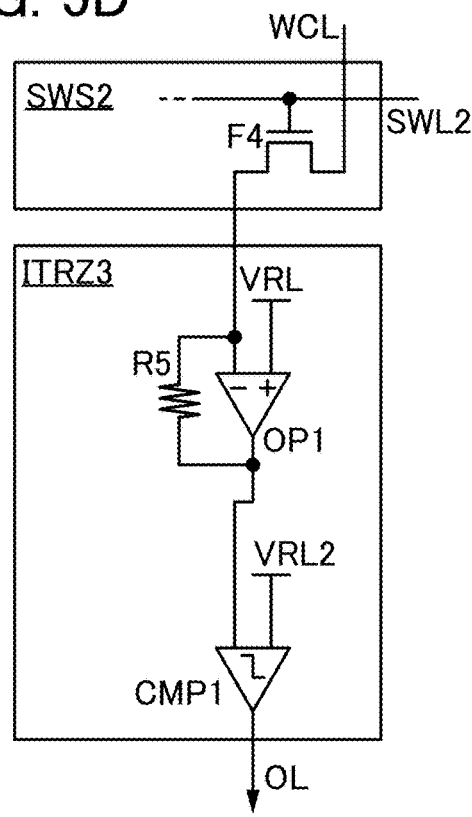

When the digital signal output to the wiring OL is 1 bit (binary) in the converter circuit ITRZ2, the converter circuit ITRZ2 may be replaced with a converter circuit ITRZ3 illustrated in FIG. 5D. The converter circuit ITRZ3 in FIG. 5D has a structure in which a comparator CMP1 is provided in the converter circuit ITRZ1 in FIG. 5A. Specifically, the converter circuit ITRZ3 has a structure in which a first input terminal of the comparator CMP1 is electrically connected to the output terminal of the operational amplifier OP1 and the second terminal of the resistor R5, a second input terminal of the comparator CMP1 is electrically connected to a wiring VRL2, and an output terminal of the comparator CMP1 is electrically connected to the wiring OL. The wiring VRL2 functions as a wiring supplying a potential to be compared with the potential of the first terminal of the comparator CMP1. With such a configuration, the converter circuit ITRZ3 in FIG. 5D can output a low-level potential or a high-level potential (a binary digital signal) to the wiring OL in accordance with the magnitude relationship between the voltage converted with the current-voltage converter circuit from current flowing between the source and the drain of the transistor F4 and the voltage supplied from the wiring VRL2.

The converter circuits ITRZ[1] to ITRZ[n] which can be used for the arithmetic circuit MAC1 in FIG. 2 are not limited to the converter circuits ITRZ1 to ITRZ3 illustrated in FIG. 5A to FIG. 5D. When the arithmetic circuit MAC1 is used for arithmetic operation of the hierarchical neural network, for example, the converter circuits ITRZ1 to ITRZ3 preferably have arithmetic circuits of a function system. As an arithmetic circuit of a function system, an arithmetic circuit with a sigmoid function, a tanh function, a softmax function, a ReLU function, a threshold function, or the like can be used.

Figure 6:
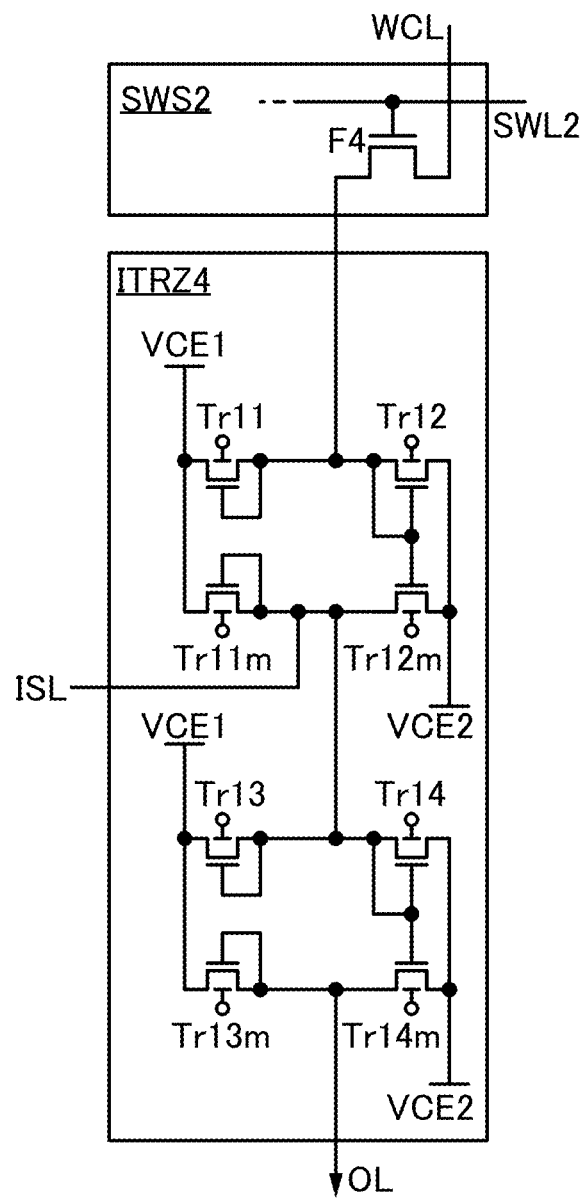
FIG. 6 is a circuit diagram illustrating a configuration example of a circuit included in a semiconductor device.

For example, when a ReLU function is employed for an arithmetic circuit of a function system, a converter circuit ITRZ4 illustrated in FIG. 6 may be used as each of the converter circuits ITRZ[1] to ITRZ[n].

The converter circuit ITRZ4 is a variation example of the converter circuit ITRZ1A in FIG. 5B. The converter circuit ITRZ4 includes a transistor Tr13, a transistor Tr13m, a transistor Tr14, and a transistor Tr14m, in addition to the transistor Tr11, the transistor Tr11m, the transistor Tr12, and the transistor Tr12m.

For each of the transistors Tr13, Tr13m, Tr14, and Tr14m, a transistor applicable to the transistor F1, F2, F3, or F4 can be used, for example.

A first terminal of the transistor Tr13 is electrically connected to the wiring VCE1. A second terminal of the transistor Tr13 is electrically connected to a gate of the transistor Tr13, a first terminal of the transistor Tr14, a gate of the transistor Tr14, a gate of the transistor Tr14m, the second terminal of the transistor Tr11m, the gate of the transistor Tr11m, the first terminal of the transistor Tr12m, and a wiring ISL. A second terminal of the transistor Tr14 is electrically connected to the wiring VCE2.

A first terminal of the transistor Tr13m is electrically connected to the wiring VCE1. A second terminal of the transistor Tr13m is electrically connected to a gate of the transistor Tr13m, a first terminal of the transistor Tr14m, and the wiring OL. A second terminal of the transistor Tr14m is electrically connected to the wiring VCE2.

In other words, the transistors Tr13 and Tr13m in the converter circuit ITRZ4 function as constant current sources, like the transistors Tr11 and Tr11m. The transistors Tr14 and Tr14m in the converter circuit ITRZ4 function as a current mirror circuit, like the transistors Tr12 and Tr12m.

The wiring ISL functions as a wiring discharging a constant current with a current amount Ism from the converter circuit ITRZ4. $I_{STD}$ corresponds to a reference value of a ReLU function in the converter circuit ITRZ4.

When the current with the amount $I_{OP}$ is output from the converter circuit ITRZ4 to the wiring WCL, the converter circuit ITRZ4 outputs the current with the amount $I_{OP}-I_{STD}$ to the wiring OL as long as $I_{OP}>I_{STD}$. Meanwhile, the converter circuit ITRZ4 does not output current to the wiring OL as long as $I_{OP} \leq I_{STD}$.

One embodiment of the present invention is not limited to the circuit configuration of the arithmetic circuit MAC1 described in this embodiment. The circuit configuration of the arithmetic circuit MAC1 can be changed depending on circumstances.

Figure 7:
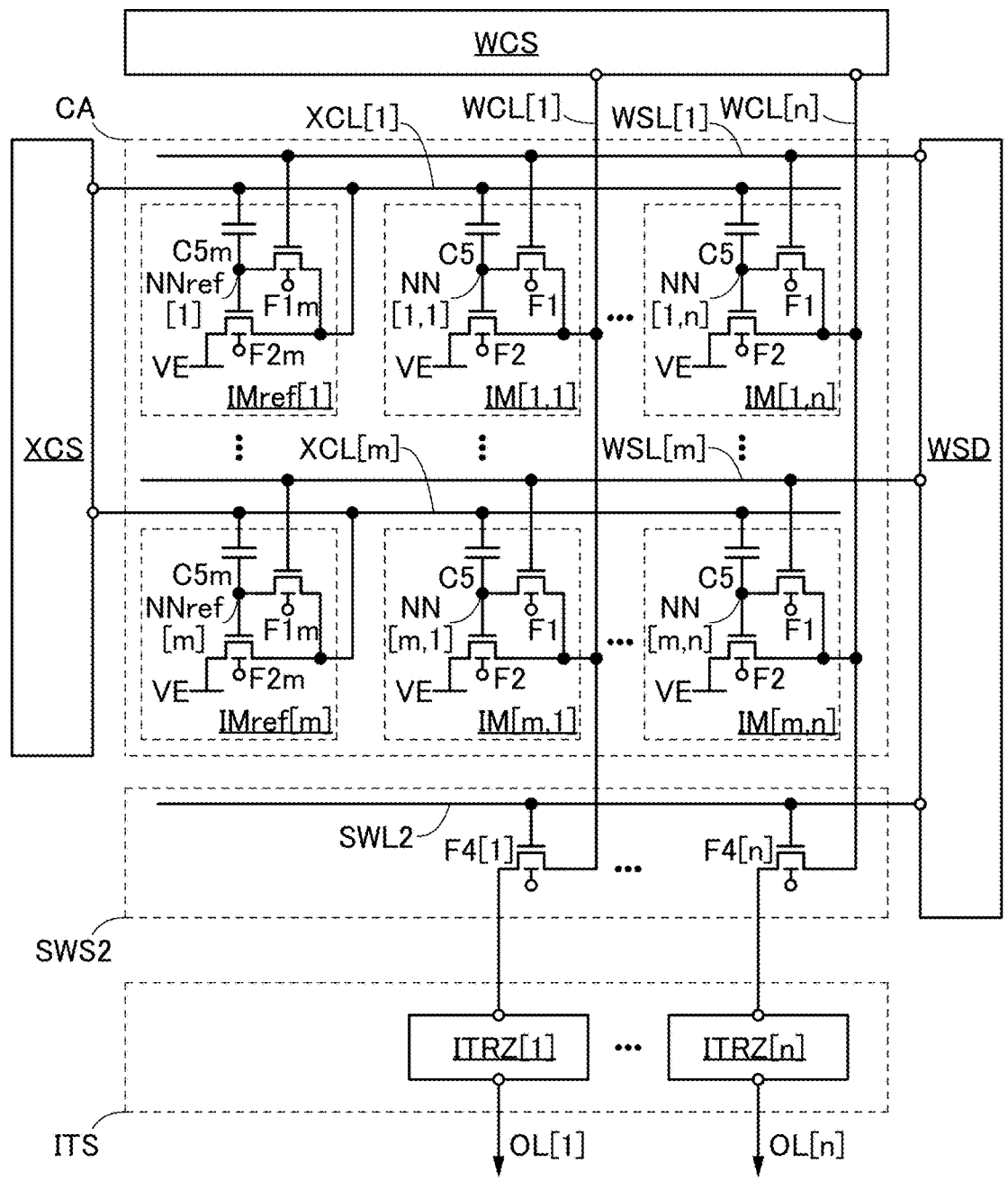
FIG. 7 is a block diagram illustrating a configuration example of a semiconductor device.

For example, the arithmetic circuit MAC1 may be changed to a structure without the circuit SWS1, like an arithmetic circuit MAC1A illustrated in FIG. 7. The arithmetic circuit MAC1 can stop current flowing from the circuit WCS to the wirings WCL[1] to WCL[n] with the circuit SWS1; the arithmetic circuit MAC1A stops current flowing from the circuit WCS to the wirings WCL[1] to WCL[n] with the circuit WCS. Specifically, when the circuit WCS in FIG. 3A is used as the circuit WCS included in the arithmetic circuit MAC1A and the current source CS1 in FIG. 4A is used as the current source CS, a low-level potential is input to the wirings DW[1] to DW[K] and the switch SWW is turned off. By performing operations of the circuit WCS in this manner, a current flowing from the circuit WCS to the wirings WCL[1] to WCL[n] can be stopped. In this manner, a current flowing from the circuit WCS to the wirings WCL[1] to WCL[n] is stopped with the circuit WCS, whereby the arithmetic circuit MAC1A can be used instead of the arithmetic circuit MAC1 for an arithmetic operation.

Figure 8:
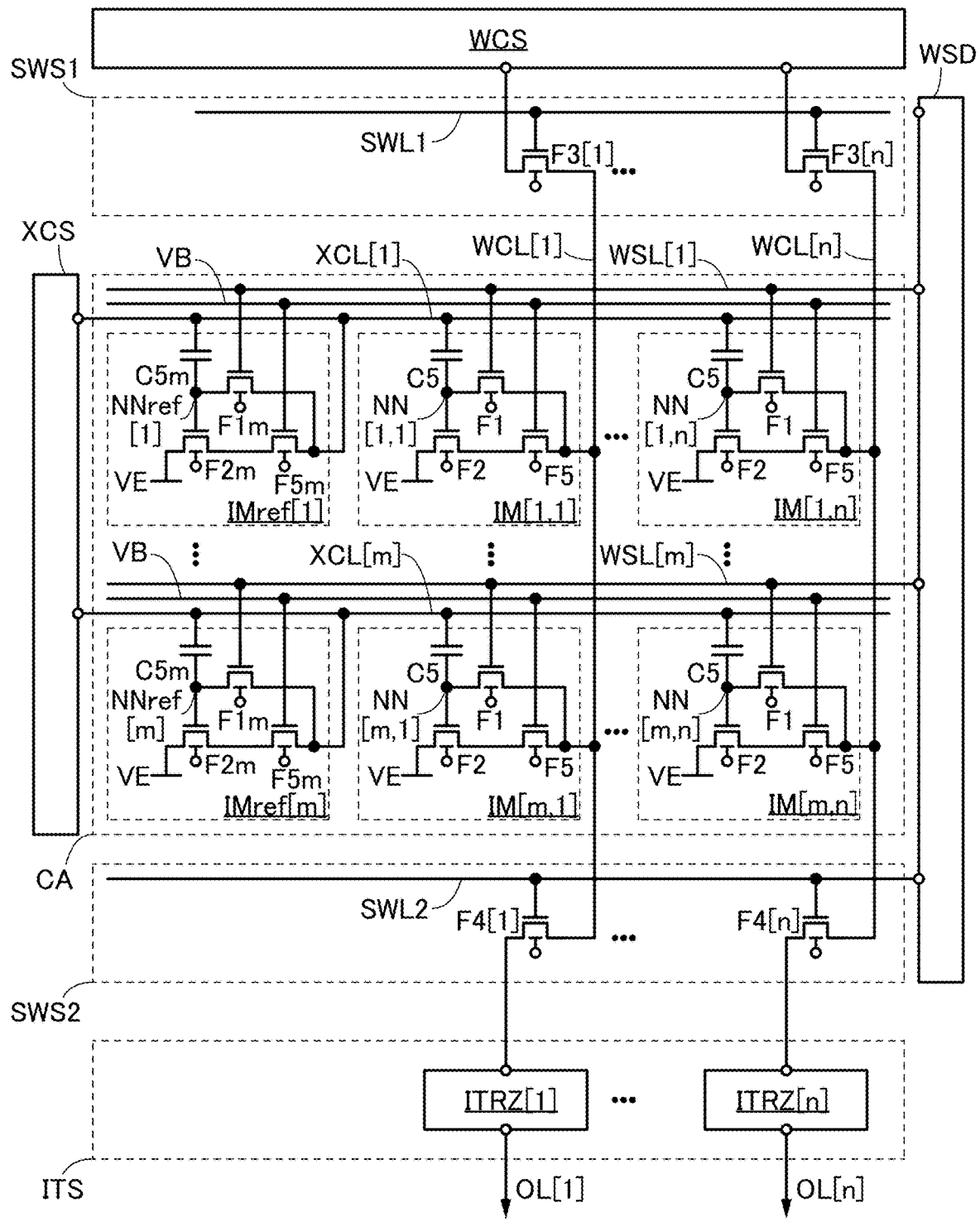
FIG. 8 is a block diagram illustrating a configuration example of a semiconductor device.

Alternatively, the arithmetic circuit MAC1 may include a transistor F5 and a transistor F5m (the former transistor is provided between the transistor F2 and the wiring WCL in each of the cells IM; the latter transistor is provided between the transistor F2m and the wiring XCL in each of the cells IMref), for example, like an arithmetic circuit MAC1B shown in FIG. 8. Each of the transistor F5 and the transistor F5m functions as a clamp transistor (also called a clamp FET in some cases), for example. Thus, a constant potential is preferably supplied to the gates of the transistors F5 and F5m. In FIG. 8, a wiring VB is electrically connected to the gates of the transistors F5 and F5m, and as described above, the wiring VB is preferably supplied with a constant potential. With the transistor F5 (transistor F5m), drain-induced barrier lowering (DIBL) in the transistor F2 (transistor F2m) can be inhibited.

<Operation Example 1 of Arithmetic Circuit>

Next, an operation example of the arithmetic circuit MAC1 is described.

Figure 9:
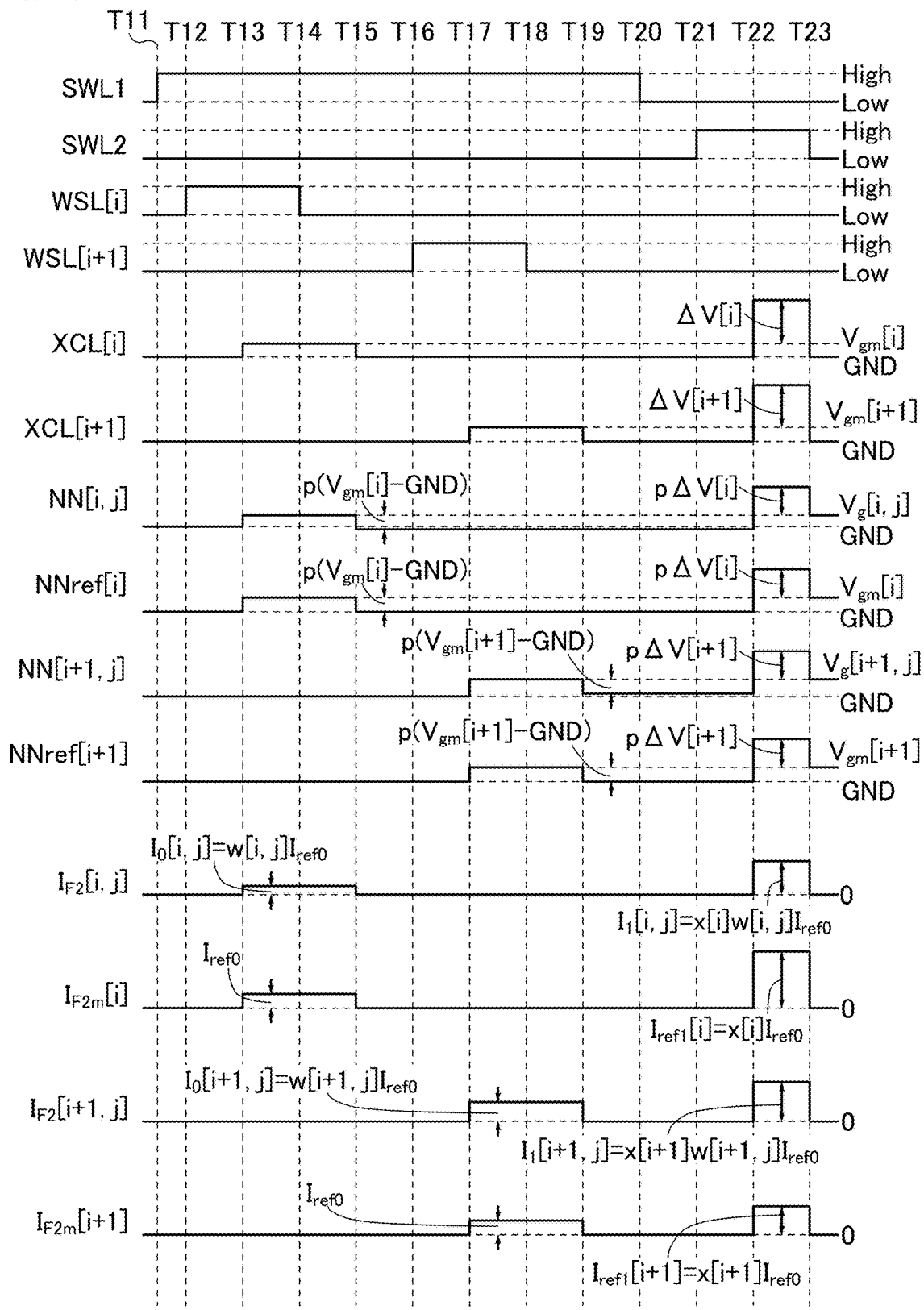
FIG. 9 is a timing chart showing an operation example of a semiconductor device.

FIG. 9 shows a timing chart of the operation example of the arithmetic circuit MAC1. The timing chart in FIG. 9 shows changes in the potentials of the wiring SWL1, the wiring SWL2, the wiring WSL[i] (i is an integer greater than or equal to 1 and less than or equal to m−1), the wiring WSL[i+1], the wiring XCL[i], the wiring XCL[i+1], the node NN[i, j] (j is an integer greater than or equal to 1 and less than or equal to n−1), the node NN[i+1, j], the node NNref[i], and the node NNref[i+1] in the period from Time T11 to Time T23 and around the period. The timing chart in FIG. 9 also shows changes in the amount of current $I_{F2}[i, j]$ flowing between the first terminal and the second terminal of the transistor F2 included in the cell IM[i, j]; the amount of current $I_{F2m}[i]$ flowing between the first terminal and the second terminal of the transistor F2m included in the cell IMref[i]; the amount of current $I_{F2}[i+1, j]$ flowing between the first terminal and the second terminal of the transistor F2 included in the cell IM[i+1/]; and the amount of current $I_{F2m}[i+1]$ flowing between the first terminal and the second terminal of the transistor F2m included in the cell IMref[i+1].

The circuit WCS in FIG. 3A is used as the circuit WCS of the arithmetic circuit MAC1, and the circuit XCS in FIG. 3C is used as the circuit XCS of the arithmetic circuit MAC1.

Note that in this operation example, the potential of the wiring VE is the ground potential GND. Before Time T11, the potential of each of the node NN[i, j], the node NN[i+1/], the node NNref[i], and the node NNref[i+1] is the ground potential GND as the initial setting. Specifically, for example, the initialization potential of the wiring VINIL1 in FIG. 3A is set to the ground potential GND, and the switch SWW, the transistor F3, and the transistor F1 included in each of the cell IM[i, j] and the cell IM[i+1, j] are turned on, whereby the potentials of the node NN[i, j] and the node NN[i+1, j] can be set to the ground potential GND. For example, the initialization potential of the wiring VINIL2 in FIG. 3C is set to the ground potential GND, and the switch SWX and the transistor F1m included in each of the cell IMref[i, j] and the cell IMref[i+1, j] are turned on, whereby the potentials of the node NNref[i, j] and the node NNref[i+1, j] can be set to the ground potential GND.

<<From Time T11 to Time T12>>

In the period from Time T11 to Time T12, a high-level potential (denoted with High in FIG. 9) is applied to the wiring SWL1, and a low-level potential (denoted with Low in FIG. 9) is applied to the wiring SWL2. Accordingly, a high-level potential is applied to each of the gates of the transistors F3[1] to F3[n] to turn on the transistors F3[1] to F3[n], and a low-level potential is applied to each of the gates of the transistors F4[1] to F4[n] to turn off the transistors F4[1] to F4[n].

In the period from Time T11 to Time T12, a low-level potential is applied to each of the wirings WSL[i] and WSL[i+1]. Accordingly, in the i-th row of the cell array CA, a low-level potential is applied to each of the gates of the transistors F1 included in the cells IM[i, 1] to IM[i, n] and the gate of the transistor F1m included in the cell IMref[i], so that the transistors F1 and F1m are turned off. Accordingly, in the i+1-th row of the cell array CA, a low-level potential is applied to each of the gates of the transistors F1 included in the cells IM[i+1,1] to IM[i+1, n] and the gate of the transistor F1m included in the cell IMref[i+1], so that the transistors F1 and F1m are turned off.

In the period from Time T11 to Time T12, the ground potential GND is applied to the wirings XCL[i] and XCL[i+1]. Specifically, for example, when the wiring XCL illustrated in FIG. 3C is the wiring XCL[i] and the wiring XCL[i+1], the initialization potential of the wiring VINIL2 is set to the ground potential GND, and the switch SWX is turned on, the potentials of the wiring XCL[i] and the wiring XCL[i+1] can be set to the ground potential GND.

In the period from Time T11 to Time T12, when the wiring WCL illustrated in FIG. 3A is the wirings WCL[1] to WCL[K], the first data is not input to the wirings DW[1] to DW[K]. When the wiring XCL in FIG. 3C is the wirings XCL[1] to XCL[K], the second data is not input to the wirings DX[1] to DX[L]. In this case, in the circuit WCS in FIG. 3A, a low-level potential is input to the wirings DW[1] to DW[K], and in the circuit XCS in FIG. 3C, a low-level potential is input to the wirings DX[1] to DX[L].

In the period from Time T11 to Time T12, no current flows in the wiring WCL[j], the wiring XCL[i], or the wiring XCL[i+1]. Therefore, $I_{F2}[i, j]$, $I_{F2m}[i]$, $I_{F2}[i+1, j]$, and $I_{F2m}[i+1]$ are each 0.

<<From Time T12 to Time T13>>

In the period from Time T12 to Time T13, a high-level potential is applied to the wiring WSL[i]. Accordingly, in the i-th row of the cell array CA, a high-level potential is applied to each of the gates of the transistors F1 included in the cells IM[i, 1] to IM[i, n] and the gate of the transistor F1m included in the cell IMref[i], so that the transistors F1 and F1m are turned on. Furthermore, in the period from Time T12 to Time T13, a low-level potential is applied to each of the wirings WSL[1] to WSL[m] except the wiring WSL[i], so that in the rows other than the i-th row of the cell array CA, the transistors F1 included in the cells IM[1, 1] to IM[m, n] and the transistors F1m included in the cells IMref[1] to IMref[m] are in an off state.

The ground potential GND has been applied to the wirings XCL[1] to XCL[m] since before Time T12.

<<From Time T13 to Time T14>>

In the period from Time T13 to Time T14, current with a current amount $I_0[i, j]$ flows as the first data from the circuit WCS to the cell array CA through the transistor F3[j]. Specifically, when the wiring WCL illustrated in FIG. 3A is the wiring WCL[j], signals corresponding to the first data are input to the wirings DW[1] to DW[K], whereby the current $I_0[i, j]$ flows from the circuit WCS to the second terminal of the transistor F3[j]. That is, when the value of the K-bit signal input as the first data is $\alpha[i, j]$ ($\alpha[i, j]$ is an integer greater than or equal to 0 and less than or equal to $2^K-1$), $I_0[i, j]$ is equal to $\alpha[i, j] \times I_{Wut}$.

When $\alpha[i, j]$ is 0, $I_0[i, j]$ is equal to 0; in a strict sense, a current does not flow from the circuit WCS to the cell array CA through the transistor F3[j], but in this specification and the like, it may be referred to as "the current with $I_0[i, j]=0$ flows" or the like.

In the period from Time T13 to Time T14, a conduction state is established between the wiring WCL[j] and the first terminal of the transistor F1 included in the cell IM[i, j] in the i-th row of the cell array CA, and a non-conduction state is established between the wiring WCL[j] and the first terminals of the transistors F1 included in the cells IM[1, j] to IM[m, j] in the rows other than the i-th row of the cell array CA. Thus, the current with the amount $I_0[i, j]$ flows from the wiring WCL[j] to the cell IM[i, j].

When the transistor F1 included in the cell IM[i, j] is turned on, the transistor F2 included in the cell IM[i, j] has a diode-connected structure. Therefore, when a current flows from the wiring WCL[j] to the cell IM[i, j], the potentials of the gate of the transistor F2 and the second terminal of the transistor F2 are substantially equal to each other. The potentials are determined with the amount of a current flowing from the wiring WCL[j] to the cell IM[i, j], the potential of the first terminal of the transistor F2 (here, the ground potential GND), and the like. In this operation example, a current with the amount $I_0[i, j]$ flows from the wiring WCL[j] to the cell IM[i, j], whereby the potential of the gate of the transistor F2 (the node NN[i, j]) becomes $V_g[i, j]$. That is, a voltage between the gate and the source of the transistor F2 is $V_g[i, j]$–GND, and the current amount $I_0[i, j]$ is set as the amount of a current flowing between the first terminal and the second terminal of the transistor F2.

Here, the current amount $I_0[i, j]$ in the case where the threshold voltage of the transistor F2 is $V_{th}[i, j]$ and the transistor F2 operates in a subthreshold region can be expressed by the following formula.

$$I_0[i,j]=I_a\exp\{J(V_g[i,j]-V_{th}[i,j])\} \quad (1.1)$$

Note that $I_a$ is a drain current for the case where $V_g[i, j]$ is $V_{th}[i, j]$, and J is a correction coefficient determined with the temperature, the device structure, and the like.

In the period from Time T13 to Time T14, a current with an amount $I_{ref0}$ flows as the reference data from the circuit XCS to the wiring XCL[i]. Specifically, when the wiring XCL illustrated in FIG. 3C is the wiring XCL[i], a high-level potential is input to the wiring DX[1], a low-level potential is input to the wirings DX[2] to DX[K], and the current $I_{ref0}$ flows from the circuit XCS to the wiring XCL[i]. In other words, $I_{ref0}=I_{Xut}$ is satisfied.

In the period from Time T13 to Time T14, since a conduction state is established between the first terminal of the transistor F1m included in the cell IMref[i] and the wiring XCL[i], a current with the amount $I_{ref0}[i]$ flows from the wiring XCL[i] to the cell IMref[i].

As in the cells IM[i, j], when the transistor F1m included in the cell IMref[i] is turned on, the transistor F2m included in the cell IMref[i] has a diode-connected structure. Therefore, when a current flows from the wiring XCL[i] to the cell IMref[i], the potentials of the gate of the transistor F2m and the second terminal of the transistor F2m are substantially equal to each other. The potentials are determined with the amount of a current flowing from the wiring XCL[i] to the cell IMref[i], the potential of the first terminal of the transistor F2m (here, the ground potential GND), and the like. In this operation example, a current with the amount $I_{ref0}[i]$ flows from the wiring XCL[i] to the cell IMref[i], whereby the potential of the gate of the transistor F2 (the node NNref[i]) becomes $V_{gm}[i]$, and the potential of the wiring XCL[i] at this time is also $V_{gm}[i]$. That is, a voltage between the gate and the source of the transistor F2m is $V_{gm}[i]$–GND, and the current amount $I_{ref0}[i]$ is set as the amount of a current flowing between the first terminal and the second terminal of the transistor F2m.

Here, the current amount $I_{ref0}$ in the case where the threshold voltage of the transistor F2m is $V_{thm}[i]$ and the transistor F2m operates in a subthreshold region can be expressed by the following formula. Note that the correction coefficient J is the same as that of the transistor F2 included in the cell IM[i, j]. For example, the same device structure (including the channel length and the channel width) are used for the transistors. In addition, although the correction coefficient J of each transistor varies due to a variation in manufacture, the variation is suppressed so that the following arguments make sense with sufficient accuracy for practical use.

$$I_{ref0}=I_a\exp\{J(V_{gm}[i]-V_{thm}[i])\} \quad (1.2)$$

Here, a weight coefficient w[i, j] that is the first data is defined as follows.

$$w[i,j]=\exp\{J(V_g[i,j]-V_{th}[i,j]-V_{gm}[i]+V_{thm}[i])\} \quad (1.3)$$

Therefore, Formula (1.1) can be rewritten into the following formula with use of Formula (1.3), Formula (1.4), $I_0[i, j]=\alpha[i, j]\times I_{Wut}$, and $I_{ref0}[i]=I_{Xut}$.

$$I_0[i,j]=w[i,j]I_{ref0}\leftrightarrow\alpha[i,j]I_{Wut}=w[i,j]I_{Xut} \quad (1.4)$$

When the current $I_{Wut}$ output from the current source CS of the circuit WCS in FIG. 3A and the current $I_{Xut}$ output from the current source CS of the circuit XCS in FIG. 3C are equal, w[i, j] is equal to α[i, j]. That is, when $I_{Wut}$ is equal to $I_{Xut}$, α[i, j] corresponds to the value of the first data; thus, $I_{Wut}$ and $I_{Xut}$ are preferably equal to each other.

<<From Time T14 to Time T15>>

In the period from Time T14 to Time T15, a low-level potential is applied to the wiring WSL[i]. Accordingly, in the i-th row of the cell array CA, a low-level potential is applied to each of the gates of the transistors F1 included in the cells IM[i, 1] to IM[i, n] and the gate of the transistor F1m included in the cell IMref[i], so that the transistors F1 and F1m are turned off.

When the transistor F1 included in the cell IM[i, j] is turned off, $V_g[i, j]-V_{gm}[i]$, which is the difference between the potential of the gate of the transistor F2 (the node NN[i, j]) and the potential of the wiring XCL[i], is retained in the capacitor C5. When the transistor F1m included in the cell IMref[i] is turned off, 0, which is the difference between the potential of the gate of the transistor F2m (the node NNref [i]) and the potential of the wiring XCL[i], is retained in the capacitor C5m. In the operation from Time T13 to Time T14, the voltage retained in the capacitor C5m might be a voltage that is not 0 (e.g., Vas) depending on the transistor characteristics of the transistor F1m and the transistor F2m. In this case, the node NNref[i] can be regarded as having a potential obtained by adding Vas to the potential of the wiring XCL[i].

<<From Time T15 to Time T16>>

In the period from Time T15 to Time T16, the ground potential GND is applied to the wiring XCL[i]. Specifically, for example, when the wiring XCL illustrated in FIG. 3C is the wiring XCL[i], the initialization potential of the wiring VINIL2 is set to the ground potential GND, and the switch SWX is turned on, the potential of the wiring XCL[i] can be set to the ground potential GND.

Thus, the potentials of the nodes NN[i, 1] to NN[i, n] change because of capacitive coupling of the capacitors C5 included in the cells IM[i, 1] to IM[i, n] in the i-th row, and the potential of the node NNref[i] changes because of capacitive coupling of the capacitor C5m included in the cell IMref[i].

The amount of change in the potentials of the nodes NN[i, 1] to NN[i, n] is a potential obtained by multiplying the amount of change in the potential of the wiring XCL[i] by the capacitive coupling coefficient that is determined by the configurations of the cells IM[i, 1] to IM[i, n] included in the cell array CA. The capacitive coupling coefficient is calculated on the basis of the capacitance of the capacitor C5, the gate capacitance of the transistor F2, and the parasitic capacitance. When the capacitive coupling coefficient due to the capacitor C5 is p in each of the cells IM[i, 1] to IM[i, n], the potential of the node NN[i, j] in the cell IM[i, j] decreases by $p(V_{gm}[i]-GND)$ from the potential in the period from Time T14 to Time T15.

Similarly, when the potential of the wiring XCL[i] changes, the potential of the node NNref[i] also changes because of capacitive coupling of the capacitor C5m included in the cell IMref[i]. In the case where the capacitive coupling coefficient due to the capacitor C5m is p like that due to the capacitor C5, the potential of the node NNref[i] of the cell IMref[i] decreases from the potential in the period from Time T14 to Time T15 by $p(V_{gm}[i]-GND)$. In the timing chart in FIG. 9, p is 1, for example. Thus, the potential of the node NNref[i] is the ground potential GND in the period from Time T15 to Time T16.

Accordingly, the potential of the node NN[i, j] of the cell IM[i, j] decreases, so that the transistor F2 is turned off; similarly, the potential of the node NNref[i] of the cell IMref[i] decreases, so that the transistor F2m is also turned off. Therefore, $I_{F2}[i, j]$ and $I_{F2m}[i]$ are each 0 in the period from Time T15 to Time T16.

<<From Time T16 to Time T17>>

In the period from Time T16 to Time T17, a high-level potential is applied to the wiring WSL[i+1]. Accordingly, in the i+1-th row of the cell array CA, a high-level potential is applied to each of the gates of the transistors F1 included in the cells IM[i+1,1] to IM[i+1, n] and the gate of the transistor F1m included in the cell IMref[i+1], so that the transistors F1 and F1m are turned on. Furthermore, in the period from Time T16 to Time T17, a low-level potential is applied to each of the wirings WSL[1] to WSL[m] except the wiring WSL[i+1], so that in the rows other than the i+1-th row of in the cell array CA, the transistors F1 included in the cells IM[1, 1] to IM[m, n] and the transistors F1m included in the cells IMref[1] to IMref[m] are in an off state.

The ground potential GND has been applied to the wirings XCL[1] to XCL[m] since before Time T16.

<<From Time T17 to Time T18>>

In the period from Time T17 to Time T18, a current with a current amount $I_0[i+1, j]$ flows as the first data from the circuit WCS to the cell array CA through the transistor F3[j]. Specifically, when the wiring WCL illustrated in FIG. 3A is the wiring WCL[j+1], signals corresponding to the first data are input to the wirings DW[1] to DW[K], whereby the current $I_0[i+1, j]$ flows from the wiring WCS to the second terminal of the transistor F3[j]. That is, when the value of the K-bit signal input as the first data is α[i+1, j] (α[i+1, j] is an integer greater than or equal to 0 and less than or equal to $2^K-1$), $I_0[i+1, j]$ is equal to $\alpha[i+1, j] \times I_{Wut}$.

When $\alpha[i+1, j]$ is 0, $I_0[i+1, j]$ is 0; in a strict sense, a current does not flow from the circuit WCS to the cell array CA through the transistor F3[j] but in this specification and the like, it may be referred to as "the current with $I_0[i+1, j]=0$ flows" or the like as in the case of $I_0[i, j]=0$.

At this time, a conduction state is established between the wiring WCL[j] and the first terminal of the transistor F1 included in the cell IM[i+1, j] in the i+1-th row of the cell array CA, and a non-conduction state is established between the wiring WCL[j] and the first terminals of the transistors F1 included in the cells IM[1, j] to IM[m, j] in the rows other than the i+1-th row of the cell array CA. Accordingly, a current with the amount $I_0[i+1, j]$ flows from the wiring WCL[j] to the cell IM[i+1, j].

When the transistor F1 included in the cell IM[i+1, j] is turned on, the transistor F2 included in the cell IM[i+1, j] has a diode-connected structure. Therefore, when a current flows from the wiring WCL[j] to the cell IM[i+1, j], the potentials of the gate of the transistor F2 and the second terminal of the transistor F2 are substantially equal to each other. The potentials are determined with the amount of a current flowing from the wiring WCL[j] to the cell IM[i+1, j], the potential of the first terminal of the transistor F2 (here, the ground potential GND), and the like. In this operation example, a current with the amount $I_0[i+1, j]$ flows from the wiring WCL[j] to the cell IM[i+1, j], whereby the potential of the gate of the transistor F2 (the node NN[i+1, j]) becomes $V_g[i+1, j]$. That is, a voltage between the gate and the source of the transistor F2 is $V_g[i+1, j]$-GND, and a current with the amount $I_0[i+1, j]$ is set as a current flowing between the first terminal and the second terminal of the transistor F2.

Here, the current amount $I_0[i+1, j]$ in the case where the threshold voltage of the transistor F2 is $V_{th}[i+1, j]$ and the transistor F2 operates in a subthreshold region can be expressed by the following formula. Note that the correction coefficient is J, which is the same as those of the transistor F2 included in the cell IM[i, j] and the transistor F2m included in the cell IMref[i].

$$I_0[i+1,j]=I_a\exp\{J(V_g[i+1,j]-V_{th}[i-1,j])\} \quad (1.5)$$

In the period from Time T17 to Time T18, a current with an amount $I_{ref0}[i+1]$ flows as the reference data from the circuit XCS to the wiring XCL[i+1]. Specifically, as in the period from Time T13 to Time T14, when the wiring XCL illustrated in FIG. 3C is the wiring XCL[i+1], a high-level potential is input to the wiring DX[1], a low-level potential is input to the wirings DX[2] to DX[K], and the current $I_{ref0}=I_{Xut}$ flows from the circuit XCS to the wiring XCL[i+1].

In the period from Time T17 to Time T18, since a conduction state is established between the first terminal of the transistor F1m included in the cell IMref[i+1] and the wiring XCL[i+1], a current with the amount $I_{ref0}[i+1]$ flows from the wiring XCL[i+1] to the cell IMref[i+1].

As in the cells IM[i+1, j], when the transistor F1m included in the cell IMref[i+1] is turned on, the transistor F2m included in the cell IMref[i+1, j] has a diode-connected structure. Therefore, when a current flows from the wiring XCL[i+1] to the cell IMref[i+1], the potentials of the gate of the transistor F2m and the second terminal of the transistor F2m are substantially equal to each other. The potentials are determined with the amount of a current flowing from the wiring XCL[i+1] to the cell IMref[i+1], the potential of the first terminal of the transistor F2m (here, the ground potential GND), and the like. In this operation example, a current with the amount Item flows from the wiring XCL[i+1] to the cell IMref[i+1], whereby the potential of the gate of the transistor F2 (the node NNref[i+1]) becomes $V_{gm}[i+1]$, and the potential of the wiring XCL[i+1] at this time is also $V_{gm}[i+1]$. That is, a voltage between the gate and the source of the transistor F2m is $V_{gm}[i+1]$-GND, and the current amount $I_{ref0}$ is set as the amount of a current flowing between the first terminal and the second terminal of the transistor F2m.

Here, the current amount Item in the case where the threshold voltage of the transistor F2m is $V_{thm}[i+1, j]$ and the transistor F2m operates in a subthreshold region can be expressed by the following formula. Note that the correction coefficient J is the same as that of the transistor F2 included in the cell IM[i+1, j].

$$I_{ref0}=I_a\exp\{J(V_{gm}[i+1]-V_{thm}[i+1])\} \quad (1.6)$$

Here, a weight coefficient w[i+1, j] that is the first data is defined as follows.

$$w[i+1,j]=\exp\{J(V_g[i+1,j]-V_{th}[i+1,j]-V_{gm}[i+1]+V_{thm}[i+1])\} \quad (1.7)$$

Therefore, Formula (1.5) can be rewritten into the following formula with use of Formula (1.3), Formula (1.6), $I_{0r}[i, j]=\alpha[i, j] \times I_{Wut}$, and $I_{ref0}[i]=I_{Xut}$.

$$I_0[i+1,j]=w[i+1,j]I_{ref0}\leftrightarrow\alpha[i+1,j]I_{Wut}=w[i+1,j]I_{Xut} \quad (1.8)$$

When the current $I_{Wut}$ output from the current source CS of the circuit WCS in FIG. 3A and the current $I_{Xut}$ output from the current source CS of the circuit XCS in FIG. 3C are equal, w[i+1, j] is equal to $\alpha[i+1, j]$. That is, when $I_{Wut}$ is equal to $I_{Xut}$, $\alpha[i+1, j]$ corresponds to the value of the first data; accordingly, $I_{Wut}$ and $I_{Xut}$ are preferably equal to each other.

<<From Time T18 to Time T19>>

In the period from Time T18 to Time T19, a low-level potential is applied to the wiring WSL[i+1]. Accordingly, in the i+1-th row of the cell array CA, a low-level potential is applied to each of the gates of the transistors F1 included in the cells IM[i+1,1] to IM[i+1, n] and the gate of the transistor F1m included in the cell IMref[i+1], so that the transistors F1 and F1m are turned off.

When the transistor F1 included in the cell IMr[i+1, j] is turned off, $V_g[i+1, j]-V_{gm}[i+1]$, which is the difference between the potential of the gate of the transistor F2 (the node NNr[i+1, j]) and the potential of the wiring XCL[i+1], is retained in the capacitor C5. When the transistor F1 included in the cell IMref[i+1] is turned off, 0, which is the difference between the potential of the gate of the transistor F2m (the node NNref[i+1]) and the potential of the wiring XCL[i+1], is retained in the capacitor C5m. In the operation from Time T18 to Time T19, the voltage retained in the capacitor C5m might be a voltage that is not 0 (e.g., Vas) depending on the transistor characteristics of the transistor F1m or the transistor F2m and the like. In this case, the node NNref[i+1] can be regarded as having a potential obtained by adding Vas to the potential of the wiring XCL[i+1].

<<From Time T19 to Time T20>>

In the period from Time T19 to Time T20, the ground potential GND is applied to the wiring XCL[i+1]. Specifically, for example, when the wiring XCL illustrated in FIG. 3C is the wiring XCL[i+1], the potential of the wiring XCL[i+1] can be set to the ground potential GND by setting the initialization potential of the wiring VINIL2 to the ground potential GND and turning on the switch SWX.

Thus, the potentials of the node NN[i, 1] to the node NN[i+1, n] change because of capacitive coupling of the capacitors C5 included in the cells IM[i+1,1] to IM[i+1, n] in the i+1-th row, and the potential of the node NNref[i+1] changes because of capacitive coupling of the capacitor C5m included in the cell IMref[i+1].

The amount of change in the potentials of the nodes NN[i+1,1] to NN[i+1, n] is a potential obtained by multiplying the amount of change in the potential of the wiring XCL[i+1] by the capacitive coupling coefficient that is determined by the configurations of the cells IM[i+1,1] to IM[i+1, n] included in the cell array CA. The capacitive coupling coefficient is calculated on the basis of the capacitance of the capacitor C5, the gate capacitance of the transistor F2, the parasitic capacitance, and the like. In the case where the capacitive coupling coefficient due to the capacitor C5 in each of the cells IM[i+1,1] to IM[i+1, n] is p like that due to the capacitor C5 in each of the cells IM[i, 1] to the potential of the node NN[i+1, j] in the cell IM[i+1, j] decreases from the potential in the period from Time T18 to Time T19 by $p(V_{gm}[i+1]-GND)$.

Similarly, when the potential of the wiring XCL[i+1] changes, the potential of the node NNref[i+1] also changes because of capacitive coupling of the capacitor C5m included in the cell IMref[i+1]. In the case where the capacitive coupling coefficient due to the capacitor C5m is p like that due to the capacitor C5, the potential of the node NNref[i+1] in the cell IMref[i+1] decreases from the potential in the period from Time T18 to Time T19 by $p(V_{gm}[i+1]-GND)$. In the timing chart in FIG. 9, p is 1, for example. Thus, the potential of the node NNref[i+1] is the ground potential GND in the period from Time T20 to Time T21.

Accordingly, the potential of the node NN[i+1, j] of the cell IM[i+1, j] decreases, so that the transistor F2 is turned off; similarly, the potential of the node NNref[i+1] of the cell IMref[i+1] decreases, so that the transistor F2m is also turned off. Therefore, $I_{F2}[i+1, j]$ and $I_{F2m}[i+1]$ are each 0 in the period from Time T19 to Time T20.

<<From Time T20 to Time T21>>

In the period from Time T20 to Time T21, a low-level potential is applied to the wiring SWL1. Accordingly, a low-level potential is applied to each of the gates of transistors F3[1] to F3[n], whereby the transistors F3[1] to F3[n] are turned off.

<<From Time T21 to Time T22>>

In the period from Time T21 to Time T22, a high-level potential is applied to the wiring SWL2. Accordingly, a high-level potential is applied to each of the gates of the transistors F4[1] to F4[n], whereby the transistors F4[1] to F4[n] are turned on.

<<From Time T22 to Time T23>>

In the period from Time T22 to Time T23, a current with an amount $x[i] \cdot I_{ref0}[i]$, i.e., x[i] times the current amount $I_{ref0}[i]$, flows from the circuit XCS to the wiring XCL[i] as the second data. Specifically, for example, when the wiring XCL illustrated in FIG. 3C is the wiring XCL[i], a high-level potential or a low-level potential is input to the wiring DX[1] to the wiring DX[K] in accordance with the value of x[i], and the current with the amount $x[i]I_{ref0}=x[i]I_{Xut}$ flows from the circuit XCS to the wiring XCL[i]. In this operation example, x[i] corresponds to the value of the second data. At this time, the potential of the wiring XCL[i] changes from 0 to $V_{gm}[i]+\Delta V[i]$.

When the potential of the wiring XCL[i] changes, the potentials of the nodes NN[i, 1] to NN[i, n] also change because of the capacitive coupling of the capacitors C5 included in the cells IM[i, 1] to IM[i, n] in the i-th row of the cell array CA. Thus, the potential of the node NN[i, j] in the cell IM[i, j] becomes $V_g[i, j]+p\Delta V[i]$.

Similarly, when the potential of the wiring XCL[i] changes, the potential of the node NNref[i] also changes because of capacitive coupling of the capacitor C5m included in the cell IMref[i]. Thus, the potential of the node NNref[i] of the cell IMref[i] becomes $V_{gm}[i]+p\Delta V[i]$.

Accordingly, an amount of a current flowing between the first terminal and the second terminal of the transistor F2 and an amount $I_{ref1}[i]$ of a current flowing between the first terminal and the second terminal of the transistor F2m in the period from Time T22 to Time T23 can be expressed as follows.

$$I_1[i, j] = I_a\exp\{J(V_g[i, j] + p\Delta V[i] - V_{th}[i, j])\} \quad (1.9)$$
$$= I_0[i, j]\exp(Jp\Delta V[i])$$
$$I_{ref1}[i] = I_a\exp\{J(V_{gm}[i] + p\Delta V[i] - V_{thm}[i])\} \quad (1.10)$$
$$= x[i]I_{ref0}$$

According to Formula (1.9) and Formula (1.10), x[i] can be expressed by the following formula.

$$x[i]=\exp(Jp\Delta V[i]) \quad (1.11)$$

Therefore, Formula (1.9) can be rewritten to the following formula.

$$I_1[i,j]=x[i]w[i,j]I_{ref0} \quad (1.12)$$

That is, the amount of a current flowing between the first terminal and the second terminal of the transistor F2 included in the cell IM[i, j] is proportional to the product of w[i, j] that is the first data and x[i] that is the second data.

In the period from Time T22 to Time T23, a current with an amount $x[i+1] \cdot I_{ref0}[i+1]$, i.e., x[i+1] times the current amount $I_{ref0}[i+1]$, flows from the circuit XCS to the wiring XCL[i+1] as the second data. Specifically, for example, when the wiring XCL illustrated in FIG. 3C is the wiring XCL[i+1], a high-level potential or a low-level potential is input to the wiring DX[1] to the wiring DX[K] in accordance with the value of x[i+1], and the current with the amount $x[i+1]I_{ref0}=x[i+1]I_{Xut}$ flows from the circuit XCS to the wiring XCL[i+1]. In this operation example, x[i+1] corresponds to the value of the second data. At this time, the potential of the wiring XCL[i+1] changes from 0 to $V_{gm}[i+1]+\Delta V[i+1]$.

When the potential of the wiring XCL[i+1] changes, the potentials of the nodes NN[i+1,1] to NN[i+1, n] also change because of the capacitive coupling of the capacitors C5 included in the cells IM[i+1,1] to IM[i+1, n] in the i+1-th row of the cell array CA. Thus, the potential of the node NNr[i+1, j] of the cell IMr[i+1, j] becomes $V_g[i+1]+p\Delta V[i+1]$.

Similarly, when the potential of the wiring XCL[i+1] changes, the potential of the node NNref[i−1] also changes because of capacitive coupling of the capacitor C5m included in the cell IMref[i+1]. Thus, the potential of the node NNref[i+1] of the cell IMref[i+1] becomes $V_{gm}[i+1]+p\Delta V[i−1]$.

Accordingly, an amount hr[i+1, j] of a current flowing between the first terminal and the second terminal of the transistor F2 and an amount $I_{ref1}[i+1, j]$ of a current flowing between the first terminal and the second terminal of the transistor F2m in the period from Time T22 to Time T23 can be expressed as follows.

$$I_1[i+1, j] = I_a \exp\{J(V_g[i+1, j] + p\Delta V[i+1] - V_{th}[i+1, j])\} \quad (1.13)$$
$$= I_0[i+1, j]\exp(Jp\Delta V[i+1])$$

$$I_{ref1}[i+1] = I_a \exp\{J(V_{gm}[i+1] + p\Delta V[i+1] - V_{thm}[i+1])\} \quad (1.14)$$
$$= x[i+1]I_{ref0}$$

According to Formula (1.13) and Formula (1.14), x[i+1] can be expressed by the following formula.

$$x[i+1] = \exp(Jp\Delta V[i+1]) \quad (1.15)$$

Therefore, Formula (1.13) can be rewritten to the following formula.

$$I_1[i+1, j] = x[i+1]w[i+1, j]I_{ref0} \quad (1.16)$$

That is, the amount of a current flowing between the first terminal and the second terminal of the transistor F2 included in the cell IM[i+1, j] is proportional to the product of w[i+1, j] that is the first data and x[i+1] that is the second data.

Here, the sum of the amounts of current flowing from the converter circuit ITRZ[j] to the cell IM[i, j] and the cell IM[i+1, j] through the transistor F4[j] and the wiring WCL[j] is considered. According to Formula (1.12) and Formula (1.16), when the sum of the amounts of current is $I_S[j]$, $I_S[j]$ can be expressed by the following formula.

$$I_S[j] = I_1[i, j] + I_1[i+1, j] \quad (1.17)$$
$$= I_{ref0}(x[i]w[i, j] + x[i+1]w[i+1, j])$$

Thus, the amount of current output from the converter circuit ITRZ[j] is the amount of current proportional to the sum of products of the weight coefficients w[i, j] and w[i+1, j] that are the first data and the values x[i] and x[i+1] of the signals of the neurons that are the second data.

Although in the above-described operation example, the sum of the amounts of currents flowing in the cells IM[i, j] and IM[i+1, j] is described, the sum of the amounts of currents flowing in a plurality of cells, i.e., the cells IM[1, j] to IM[m, j], may be described. In this case, Formula (1.17) can be rewritten into the following formulae.

$$I_S[j] = I_{ref0} \sum_{i=1}^{m} x[i]w[i, j] \quad (1.18)$$

Thus, even in the case of the arithmetic circuit MAC1 including the cell array CA including three or more rows and two or more columns, a product-sum operation can be performed in the above-described manner. In the arithmetic circuit MAC1 of such a case, cells in one (the i-th column) of a plurality of columns retain the current amounts $I_{ref0}[i]$ and $x[i] \cdot I_{ref0}[i]$, whereby product-sum operations, the number of which corresponds to the number of the rest of the columns among the plurality of columns, can be executed concurrently. That is, when the number of columns in a memory cell array is increased, a semiconductor device that achieves a high-speed product-sum operation can be provided.

The above operation example of the arithmetic circuit MAC1 is suitable when product-sum operation of the positive first data and the positive second data is performed.

Embodiment 2 will describe an operation example in which product-sum operation of the positive or the negative first data and the positive second data is performed, and an operation example in which product-sum operation of the positive or the negative first data and the positive or the negative second data is performed.

Although this embodiment describes the case where the transistors included in the arithmetic circuit MAC1 are OS transistors or Si transistors, one embodiment of the present invention is not limited thereto. As the transistors included in the arithmetic circuit MAC1, a transistor including germanium (Ge) or the like in a channel formation region, a transistor including a compound semiconductor, such as zinc selenide (ZnSe), cadmium sulfide (CdS), gallium arsenide (GaAs), indium phosphide (InP), gallium nitride (GaN), or silicon germanium (SiGe), in a channel formation region, a transistor including carbon nanotube in a channel formation region, or a transistor including an organic semiconductor in a channel formation region can be used.

Note that this embodiment can be combined with any of the other embodiments in this specification as appropriate.

Embodiment 2

In this embodiment, an arithmetic circuit that can perform product-sum operation of the positive, negative, or "0" first data and the positive or "0" second data, and product-sum operation of the positive, negative, or "0" first data and the positive, negative, or "0" second data will be described, whereas Embodiment 1 described the arithmetic circuit that performs the product-sum operation of the positive or "0" first data and the positive or "0" second data and its operation example are described.

<Configuration Example 1 of Arithmetic Circuit>

Figure 10:
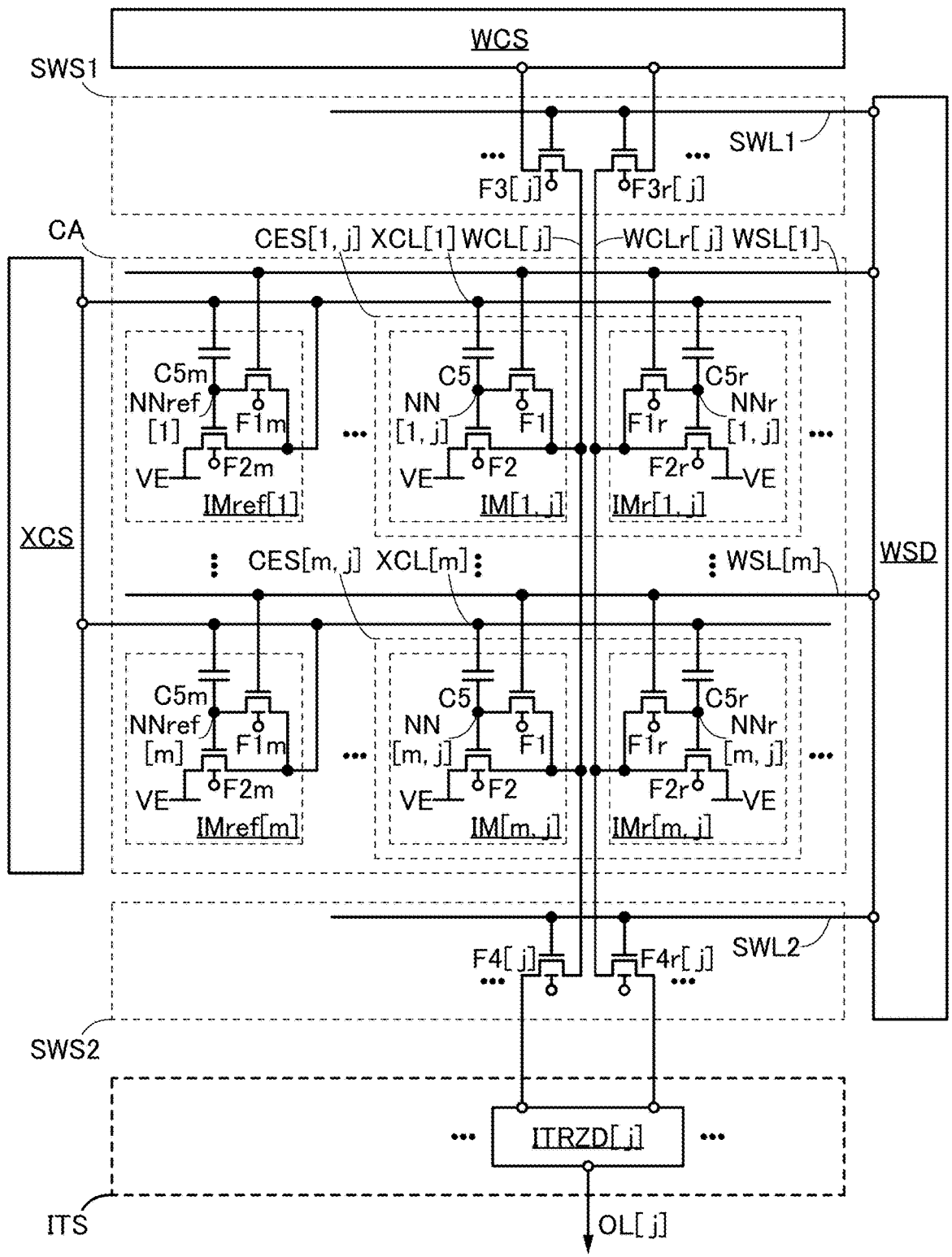
FIG. 10 is a block diagram illustrating a configuration example of a semiconductor device.

FIG. 10 shows a configuration example of an arithmetic circuit which performs a product-sum operation of positive, negative, or "0" first data and positive or "0" second data. An arithmetic circuit MAC2 illustrated in FIG. 10 has a configuration in which the arithmetic circuit MAC1 in FIG. 2 is changed. Thus, the portions in the arithmetic circuit MAC2 that are the same as those in the arithmetic circuit MAC1 are not described.

The cell array CA illustrated in FIG. 10 includes a circuit CES[1, j] to a circuit CES[m, j], the circuit CES[1, j] includes the cell IM[1, j] and a cell IMr[1, j], and the circuit CES[m, j] includes the cell IM[m, j] and a cell IMr[m, j]. FIG. 10 selectively illustrates the circuit CES[1, j] and the circuit CES[m, j]. In this specification and the like, when the circuit CES[1, j] to the circuit CES[m, j], the cell IM[1, j], the cell IMr[1, j], the cell IM[m, j], the cell IMr[m, j], and the like are described, [m, n] and the like added to reference numerals are sometimes omitted.

The cells IM can have a structure similar to that of the cells IM[1, 1] to IM[m, n] included in the cell array CA in the arithmetic circuit MAC1 in FIG. 2.

The cell IMr can have a configuration similar to that of the cell IM. FIG. 10 shows the cell IMr having a configuration similar to that of the cell IM, for example. To distinguish the transistors, the capacitors, and the like included in the cell IM and the cell IMr, "r" is added to the reference numerals representing the transistors and the capacitor included in the cell IMr.

Specifically, the cells IMr each include a transistor F1r, a transistor F2r, and a capacitor C5r. The transistor F1r corresponds to the transistor F1 in the cell IM, the transistor F2r corresponds to the transistor F2 in the cell IM, and the capacitor C5r corresponds to the capacitor C5 in the cell IM.

Thus, for the electrical connection structure between the transistor F1r, the transistor F2r, and the capacitor C5r, refer to the description of IM[1, 1] to the cell IM[m, n] in Embodiment 1.

In the cell IMr, a connection portion of the first terminal of the transistor F1r, the gate of the transistor F2r, and the first terminal of the capacitor C5r is a node NNr.

In the circuit CES[1, j], the second terminal of the capacitor C5 is electrically connected to the wiring XCL[1], the gate of the transistor F1 is electrically connected to the wiring WSL[1], and the second terminal of the transistor F1 and the second terminal of the transistor F2 are electrically connected to the wiring WCL[1]. A second terminal of the capacitor C5r is electrically connected to the wiring XCL[1], a gate of the transistor F1r is electrically connected to the wiring WSL[1], and a second terminal of the transistor F1r and a second terminal of the transistor F2r are electrically connected to a wiring WCLr[j].

Similarly, in the circuit CES[m, j], the second terminal of the capacitor C5 is electrically connected to the wiring XCL[m], the gate of the transistor F1 is electrically connected to the wiring WSL[m], and the second terminal of the transistor F1 and the second terminal of the transistor F2 are electrically connected to the wiring WCL[j]. The second terminal of the capacitor C5r is electrically connected to the wiring XCL[m], the gate of the transistor F1r is electrically connected to the wiring WSL[m], and the second terminal of the transistor F1r and the second terminal of the transistor F2r are electrically connected to the wiring WCLr[j].

The wiring WCL[j] and the wiring WCLr[j] function as, for example, wirings that supply current from the circuit WCS to the cells IM and the cells IMr included in the circuits CES, like the wiring WCL[1] to the wiring WCL[n] described in Embodiment 1. For example, the wiring WCL[j] and the wiring WCLr[j] function as wirings that supply current from a converter circuit ITRZD[j] to the cells IM and the cells IMr included in the circuits CES.

In the arithmetic circuit MAC2 in FIG. 10, the circuit SWS1 includes the transistor F3[j] and a transistor F3r[j]. A first terminal of the transistor F3[j] is electrically connected to the wiring WCL[j], a second terminal of the transistor F3[j] is electrically connected to the circuit WCS, and a gate of the transistor F3[j] is electrically connected to a wiring SWL1. A first terminal of the transistor F3r[j] is electrically connected to the wiring WCLr[j], a second terminal of the transistor F3r[j] is electrically connected to the circuit WCS, and a gate of the transistor F3r[j] is electrically connected to the wiring SWL1.

In the arithmetic circuit MAC2 in FIG. 10, the circuit SWS2 includes the transistor F4[j] and a transistor F4r[j]. A first terminal of the transistor F4[j] is electrically connected to the wiring WCL[j], a second terminal of the transistor F4[j] is electrically connected to a converter circuit ITRZD[j] which is described later, and a gate of the transistor F4[j] is electrically connected to a wiring SWL2. A first terminal of the transistor F4r[j] is electrically connected to the wiring WCLr[j], a second terminal of the transistor F4r[j] is electrically connected to the converter circuit ITRZD[j], and a gate of the transistor F4r[j] is electrically connected to the wiring SWL2.

The converter circuit ITRZD[j] is a circuit corresponding to the converter circuit ITRZ[1] to the converter circuit ITRZ[n] in the arithmetic circuit MAC1; for example, the converter circuit ITRZD[j] has a function of generating voltage corresponding to the difference between the amount of current flowing from the converter circuit ITRZD[j] to the wiring WCL[j] and the amount of current flowing from the converter circuit ITRZD[j] to the wiring WCLr[j] and outputting the voltage to the wiring OL[j].

Figure 11A:
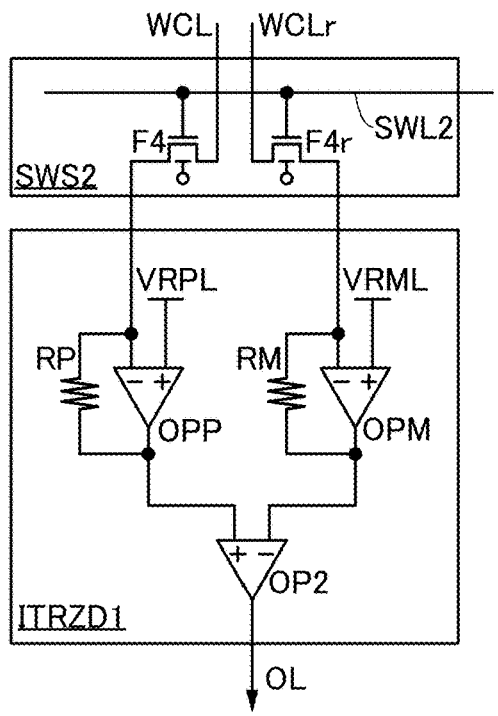
FIGS. 11A to 11C are diagrams each illustrating a configuration example of a circuit included in a semiconductor device.

FIG. 11A illustrates a specific configuration example of the converter circuit ITRZD[j]. A converter circuit ITRZD1 illustrated in FIG. 11A is an example of a circuit that can be used as the converter circuit ITRZD[j] in FIG. 10. FIG. 11A also illustrates the circuit SWS2, the wiring WCL, the wiring WCLr, the wiring SWL2, the transistor F4, and the transistor F4r to show the electrical connection between the converter circuit ITRZD1 and its peripheral circuits. The wiring WCL[j] and the wiring WCLr[j] included in the arithmetic circuit MAC2 in FIG. 10 can be respectively used as the wiring WCL and the wiring WCLr, for example, and the transistor F4[j] and the transistor F4r[j] included in the arithmetic circuit MAC2 in FIG. 10 can be respectively used as the transistor F4 and the transistor F4r, for example.

The converter circuit ITRZD1 in FIG. 11A is electrically connected to the wiring WCL through the transistor F4. The converter circuit ITRZD1 is electrically connected to the wiring WCLr through the transistor F4r. The converter circuit ITRZD1 is electrically connected to the wiring OL. The converter circuit ITRZD1 has a function of converting the amount of current flowing between the converter circuit ITRZD1 and the wiring WCL into a first voltage, a function of converting the amount of current flowing between the converter circuit ITRZD1 and the wiring WCLr into a second voltage, and a function of outputting, to the wiring OL, an analog voltage corresponding to the difference between the first voltage and the second voltage.

The converter circuit ITRZD1 in FIG. 11A includes a resistor RP, a resistor RM, an operational amplifier OPP, an operational amplifier OPM, and an operational amplifier OP2, for example.

An inverting input terminal of the operational amplifier OPP is electrically connected to a first terminal of the resistor RP and the second terminal of the transistor F4. The non-inverting input terminal of the operational amplifier OPP is electrically connected to the wiring VRPL. An output terminal of the operational amplifier OPP is electrically connected to a second terminal of the resistor RP and a non-inverting input terminal of the operational amplifier OP2. An inverting input terminal of the operational amplifier OPM is electrically connected to a first terminal of the resistor RM and the second terminal of the transistor F4r. A non-inverting input terminal of the operational amplifier OPM is electrically connected to a wiring VRML. An output terminal of the operational amplifier OPM is electrically connected to a second terminal of the resistor RM and an inverting input terminal of the operational amplifier OP2. An output terminal of the operational amplifier OP2 is electrically connected to the wiring OL.

The wiring VRPL functions as a wiring for supplying a constant voltage. The constant voltage can be a ground potential (GND) or a low-level potential, for example. The wiring VRML functions as a wiring for supplying a constant voltage. The constant voltage can be a ground potential (GND) or a low-level potential, for example. The constant voltages supplied from the wiring VRPL and the wiring VRML may be equal to each other or different from each other. In particular, by setting the constant voltages supplied from the wiring VRPL and the wiring VRML to ground potentials (GND), the inverting input terminal of the operational amplifier OPP and the inverting input terminal of the operational amplifier OPM can be virtually grounded.

The converter circuit ITRZD1 with the configuration in FIG. 11A can convert the amount of current flowing between the wiring WCL and the converter circuit ITRZD1 through the transistor F4 into the first voltage. The converter circuit ITRZD1 can convert the amount of current flowing between the wiring WCLr and the converter circuit ITRZD1 through the transistor F4r into the second voltage. Then, the converter circuit ITRZD1 can output, to the wiring OL, an analog voltage corresponding to the difference between the first voltage and the second voltage.

Figure 11B:
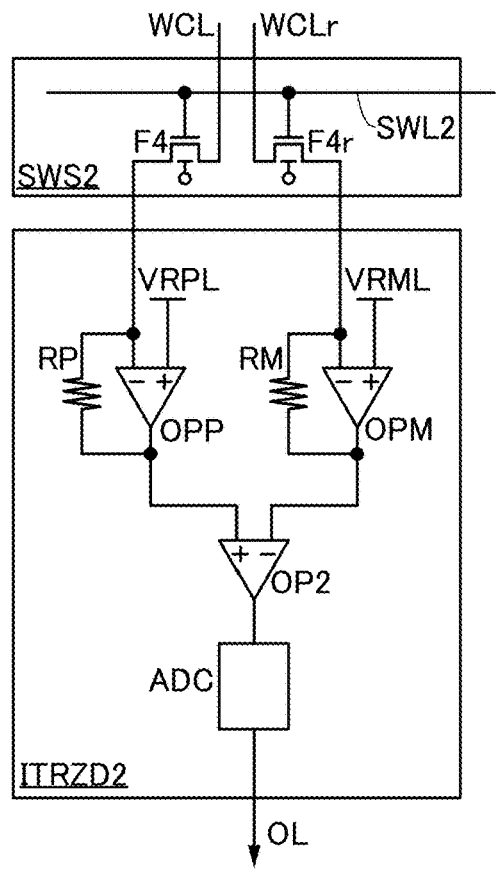

The converter circuit ITRZD1 in FIG. 11A outputs an analog voltage; however, the circuit configuration that can be used for the converter circuit ITRZD[j] in FIG. 10 is not limited thereto. For example, the converter circuit ITRZD1 may include, as in FIG. 5B, the analog-digital converter circuit ADC as illustrated in FIG. 11B. Specifically, in a converter circuit ITRZD2 in FIG. 11B, the input terminal of the analog-digital converter circuit ADC is electrically connected to the output terminal of the operational amplifier OP2, and the output terminal of the analog-digital converter circuit ADC is electrically connected to the wiring OL. With such a configuration, the converter circuit ITRZD2 in FIG. 11B can output a digital signal to the wiring OL.

Figure 11C:
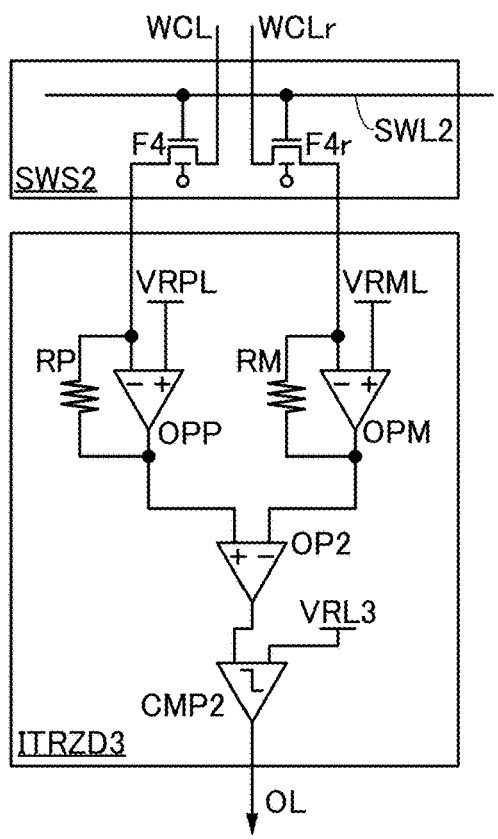

When the digital signal output to the wiring OL is 1 bit (binary) in the converter circuit ITRZD2, the converter circuit ITRZ2 may be replaced with a converter circuit ITRZD3 illustrated in FIG. 11C. The converter circuit ITRZ3 in FIG. 11C has a configuration in which a comparator CMP2 is provided in the converter circuit ITRZD1 in FIG. 11A, as in FIG. 5C. Specifically, the converter circuit ITRZD3 has a configuration in which a first input terminal of the comparator CMP2 is electrically connected to the output terminal of the operational amplifier OP2, a second input terminal of the comparator CMP2 is electrically connected to a wiring VRL3, and an output terminal of the comparator CMP2 is electrically connected to the wiring OL. The wiring VRL3 functions as a wiring for supplying a potential to be compared with the potential of the first terminal of the comparator CMP2. With such a configuration, the converter circuit ITRZD3 in FIG. 11C can output, to the wiring OL, a low-level potential or a high-level potential (a binary digital signal) in accordance with the magnitude relationship between the voltage supplied from the wiring VRL3 and the difference between the first voltage converted from the amount of current flowing between the source and the drain of the transistor F4 and the second voltage converted from the amount of current flowing between the source and the drain of the transistor F4r.

<<Example of First Data Retention>>

Next, an example of the circuit CES in the arithmetic circuit MAC2 in FIG. 10 that retains the first data for performing product-sum operation of the positive, the negative, or "0" first data and the positive or "0" second data is described.

Since the circuit CES includes the cell IM and the cell IMr, the circuit CES can use the two circuits, the cell IM and the cell IMr, to retain the first data. Two current amounts are set for the circuit CES and potentials corresponding to the current amounts can be retained in the cell IM and the cell IMr. The first data can thus be represented with the current amount set in the cell IM and the current amount set in the cell IMr. The positive first data, the negative first data, or the "0" first data to be retained in the circuit CES is defined as follows.

To retain the positive first data in the circuit CES[1, j], the cell IM[1, j] is set such that current with an amount corresponding to the absolute value of the positive first data flows between the first terminal and the second terminal of the transistor F2 in the cell IM[1, j], for example. Specifically, a potential corresponding to the current amount is retained in the gate of the transistor F2 (the node NN[1, j]). By contrast, the cell IMr[i, j] is set such that current does not flow between the first terminal and the second terminal of the transistor F2r in the cell IMr[1, j], for example. Specifically, the gate of the transistor F2r (node NNr[1, j]) retains the potential supplied by the wiring VE or the initialization potential supplied by the wiring VINIL1 of the circuit WCS in FIG. 3A, for example.

To retain the negative first data in the circuit CES[i, j], the cell IMr[1, j] is set such that current with an amount corresponding to the absolute value of the negative first data flows through the transistor F2r in the cell IMr[1, j], for example. Specifically, a potential corresponding to the current amount is retained in the gate of the transistor F2r (the node NNr[1, j]. By contrast, the cell IM[1, j] is set such that current does not flow through the transistor F2 in the cell IM[1, j], for example. Specifically, the gate of the transistor F2 (node NN[1, j]) stores the potential supplied by the wiring VE or the initialization potential supplied by the wiring VINIL1 of the circuit WCS in FIG. 3A, for example.

To retain the "0" first data in the circuit CES[1, j], current is set not to flow through the transistor F2 in the cell IM[1, j] and the transistor F2r in the cell IMr[1, j], for example. Specifically, the gate of the transistor F2 (node NN[1, j]) and the gate of the transistor F2r (node NNr[1, j]) retains the potential supplied by the wiring VE or the initialization potential supplied by the wiring VINIL1 of the circuit WCS in FIG. 3A, for example.

To retain the positive first data or the negative first data in another circuit CES, current with an amount corresponding to the first data is set to flow through one of the path between the cell IM and the wiring WCL and the path between the cell IMr and the wiring WCLr while current is set not to flow through the other of the path between the cell IM and the wiring WCL and the path between the cell IMr and the wiring WCLr, as in the circuit CES[1, j]. To retain the "0" first data in another circuit CES, current is set not to flow between the cell IM and the wiring WCL and between the cell IMr and the wiring WCLr, as in the circuit CES[1, j].

For example, to retain each case of "+3", "+2", "+1", "0", "−1", "−2", and "−3" in the circuit CES as the first data, the amount of current flowing from the wiring WCL to the cell IM and the amount of current flowing from the wiring WCLr to the cell IMr are set as described above, whereby each of "+3", "+2", "+1", "0", "−1", "−2", and "−3" as the first data can be defined as illustrated in the following table.

TABLE 1

| First data | Current flowing from wiring WCL to cell IM | Current flowing from wiring WCLr to cell IMr |
| --- | --- | --- |
| +3 | $3I_{Wut}$ | 0 |
| +2 | $2I_{Wut}$ | 0 |
| +1 | $1I_{Wut}$ | 0 |
| 0 | 0 | 0 |
| −1 | 0 | $1I_{Wut}$ |
| −2 | 0 | $2I_{Wut}$ |
| −3 | 0 | $3I_{Wut}$ |

Here, the case is considered in which each of the circuit CES[1, j] to the circuit CES[m, j] retains the first data, and each of the wiring XCL[1] to the wiring XCL[m] is supplied with the second data in the arithmetic circuit MAC2 in FIG. 10. In that case, a low-level potential is supplied to the wiring SWL1 to turn off the transistor F3[j] and the transistor F3r[j], and a high-level potential is supplied to the wiring SWL2 to turn on the transistor F4[j] and the transistor F4r[j]. Electrical continuity is thus established between the converter circuit ITRZD[j] and the wiring WCL[j], and current sometimes flows from the converter circuit ITRZD [j] to the wiring WCL[j]. In addition, electrical continuity is established between the converter circuit ITRZD[j] and the wiring WCLr[j], and current sometimes flows from the converter circuit ITRZD[j] to the wiring WCLr[j]. When the sum of the amounts of current flowing from the converter circuit ITRZD[j] to the wiring WCL[j] is $I_S[j]$ and the sum of the amounts of current flowing from the converter circuit ITRZD[j] to the wiring WCLr[j] is $I_{Sr}[j]$, $I_S[j]$ and $I_{Sr}[j]$ can be expressed by the following formulae, according to the operation example of the arithmetic circuit MAC1 described in Embodiment 1.

$$I_S[j] = I_{ref0} \sum_{i=1}^{m} x[i]w[i, j] \quad (2.1)$$

$$I_{Sr}[j] = I_{ref0} \sum_{i=1}^{m} x[i]w_r[i, j] \quad (2.2)$$

Note that w[i, j] shown in Formula (2.1) is the value of the first data written to the cell IM[i, j] and $w_r[i, j]$ shown in Formula (2.2) is the value of the first data written to the cell IMr[i, j]. When the value of one of w[i, j] and $w_r[i, j]$ is not "0", the other of w[i, j] and $w_r[i, j]$ is set to the value of "0", whereby the first data retained in the circuit CES[i, j] can follow the definition shown in Table 1, for example.

The converter circuit ITRZD[j] converts the sum $I_S[j]$ of the amounts of current flowing through the wiring WCL into the first voltage, and the sum $I_{Sr}[j]$ of the amounts of current flowing through the wiring WCLr into the second voltage, for example. Then, the converter circuit ITRZD[j] can output voltage corresponding to the difference between the first voltage and the second voltage to the wiring OL.

The converter circuit ITRZD1 to the converter circuit ITRZD3 illustrated in FIG. 11A to FIG. 11C each have a circuit configuration that outputs voltage to the wiring OL; however, one embodiment of the present invention is not limited thereto. For example, the converter circuit ITRZD[j] included in the arithmetic circuit MAC2 in FIG. 10 may have a circuit configuration that outputs current.

Figure 12:
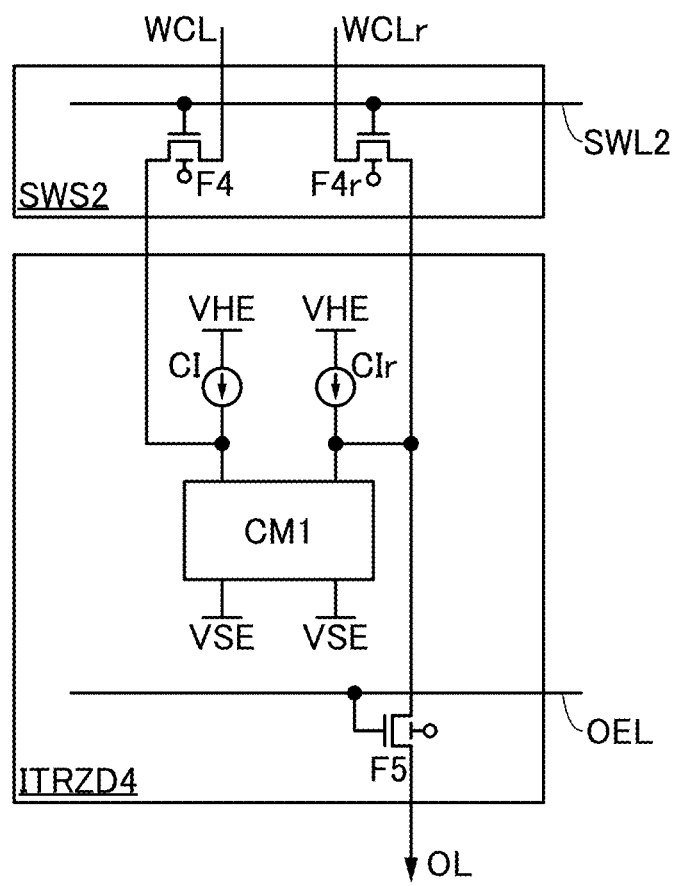
FIG. 12 is a block diagram illustrating a configuration example of a circuit included in a semiconductor device.

A converter circuit ITRZD4 illustrated in FIG. 12 is a circuit that can be used as the converter circuit ITRZD[j] included in the arithmetic circuit MAC2 in FIG. 10 and has a circuit configuration that outputs the results of product-sum operation and activation function operation as a current amount.

FIG. 12 also illustrates the circuit SWS2, the wiring WCL, the wiring WCLr, the wiring OL, the transistor F4, and the transistor F4r to show the electrical connection between the converter circuit ITRZD4 and its peripheral circuits. The wiring WCL[j] and the wiring WCLr[j] included in the arithmetic circuit MAC2 in FIG. 10 can be respectively used as the wiring WCL and the wiring WCLr, for example, and the transistor F4[j] and the transistor F4r[j] included in the arithmetic circuit MAC2 in FIG. 10 can be respectively used as the transistor F4 and the transistor F4r, for example.

The converter circuit ITRZD4 in FIG. 12 is electrically connected to the wiring WCL through the transistor F4. The converter circuit ITRZD4 is electrically connected to the wiring WCLr through the transistor F4r. The converter circuit ITRZD4 is electrically connected to the wiring OL. The converter circuit ITRZD4 has a function of obtaining the difference current between one of the amount of current flowing from the converter circuit ITRZD4 to the wiring WCL and the amount of current flowing from the wiring WCL to the converter circuit ITRZD4, and one of the amount of current flowing from the converter circuit ITRZD4 to the wiring WCLr and the amount of current flowing from the wiring WCLr to the converter circuit ITRZD4. The converter circuit ITRZD4 has a function of making the difference current flow between the converter circuit ITRZD4 and the wiring OL.

The converter circuit ITRZD4 in FIG. 12 includes, for example, the transistor F5, a current source CI, a current source CIr, and a current mirror circuit CM1.

The second terminal of the transistor F4 is electrically connected to a first terminal of the current mirror circuit CM1 and an output terminal of the current source CI, and the second terminal of the transistor F4r is electrically connected to a second terminal of the current mirror circuit CM1, an output terminal of the current source CIr, and a first terminal of the transistor F5. An input terminal of the current source CI is electrically connected to a wiring VHE, and an input terminal of the current source CIr is electrically connected to the wiring VHE. A third terminal of the current mirror circuit CM1 is electrically connected to a wiring VSE, and a fourth terminal of the current mirror circuit CM1 is electrically connected to the wiring VSE.

A second terminal of the transistor F5 is electrically connected to the wiring OL and a gate of the transistor F5 is electrically connected to a wiring OEL.

The current mirror circuit CM1 has, for example, a function of making current with an amount corresponding to the potential of the first terminal of the current mirror circuit CM1 flow between the first terminal and the third terminal of the current mirror circuit CM1 and between the second terminal and the fourth terminal of the current mirror circuit CM1.

The wiring VHE functions as a wiring for supplying a constant voltage, for example. Specifically, the constant voltage can be a high-level potential or the like, for example.

The wiring VSE functions as a wiring for supplying a constant voltage, for example. Specifically, the constant voltage can be, for example, a low-level potential, the ground potential, or the like.

The wiring OEL functions as, for example, a wiring for transmitting a signal to switch the on state and the off state of the transistor F5. Specifically, for example, a high-level potential or a low-level potential is input to the wiring OEL.

The current source CI has a function of making a constant current flow between the input terminal and the output terminal of the current source CI. The current source CIr has a function of making a constant current flow between the input terminal and the output terminal of the current source CIr. The amount of current flowing from the current source CI and the amount of current flowing from the current source CIr are preferably equal to each other in the converter circuit ITRZD4 in FIG. 12.

An operation example of the converter circuit ITRZD4 in FIG. 12 is described here.

First, the amount of current flowing from the converter circuit ITRZD4 to the wiring WCL through the transistor F4 is set to $I_S$, and the amount of current flowing from the converter circuit ITRZD4 to the wiring WCLr through the transistor F4r is set to $I_{Sr}$. The amount of current flowing from each of the current source CI and the current source CIr is set to $I_0$.

In the arithmetic circuit MAC2 in FIG. 10, $I_S$ is the sum of the amounts of current flowing through the cell IM[1, j]

to the cell IM[m, j] positioned in the j-th row, for example. In the arithmetic circuit MAC2 in FIG. 10, $I_{Sr}$ is the sum of the amounts of current flowing through the cell IMr[1, j] to the cell IMr[m, j] positioned in the j-th row, for example.

When a high-level potential is input to the wiring SWL2, the transistor F4 and the transistor F4r are turned on. Accordingly, the amount of current flowing from the first terminal to the third terminal of the current mirror circuit CM1 becomes $I_0-I_S$. Due to the current mirror circuit CM1, the current with the amount $I_0-I_S$ flows from the second terminal to the second terminal of the current mirror circuit CM1.

Next, a high-level potential is input to the wiring OEL to turn on the transistor F5. When the amount of current flowing through the wiring OL is $I_{out}$, $I_{out}$ is $I_0-(I_0-I_S)-I_{Sr}=I_S-I_{Sr}$.

For retention of the first data in the circuit CES to perform product-sum operation of the positive, the negative, or "0" first data and the positive or "0" second data in the arithmetic circuit MAC2 in FIG. 10, refer to the above example of retaining the first data.

That is, to retain the positive first data in the circuit CES[i, j], the cell IM[i, j] is set such that the current with the amount corresponding to the absolute value of the positive first data flows between the first terminal and the second terminal of the transistor F2 in the cell IM[i, j], and the cell IMr[i, j] is set such that current does not flow between the first terminal and the second terminal of the transistor F2r in the cell IMr[i, j]. To retain the negative first data in the circuit CES[i, j], the cell IM[i, j] is set such that current does not flow between the first terminal and the second terminal of the transistor F2 in the cell IM[i, j], and the cell IMr[i, j] is set such that the current with the amount corresponding to the absolute value of the negative first data flows between the first terminal and the second terminal of the transistor F2r in the cell IMr[i, j]. To retain the "0" first data in the circuit CES[i, j], the cell IM[i, j] is set such that current does not flow between the first terminal and the second terminal of the transistor F2 in the cell IM[i, j], and the cell IMr[i, j] is set such that current does not flow between the first terminal and the second terminal of the transistor F2r in the cell IMr[i, j].

Here, in the case where the second data is input to each of the wiring XCL[1] to the wiring XCL[m] of the arithmetic circuit MAC2 in FIG. 10, the current with the amount flowing between the first terminal and the second terminal of the transistor F2 in the cell IM[i, j] and the current with the amount flowing between the first terminal and the second terminal of the transistor F2 in the cell IMr[i, j] are each proportional to the second data.

$I_S$ is the sum of the amounts of current flowing through the cell IM[1, j] to the cell IM[m, j] positioned in the j-th row. Thus, $I_S$ is the sum of the amounts of current flowing through the cells IM included in the circuits CES in which the positive first data is retained out of the circuit CES[1, j] to the circuit CES[m, j]; for example, $I_S$ can be expressed as in Formula (2.1). That is, $I_S$ corresponds to the result of product-sum operation of the absolute value of the positive first data and the second data. $I_{Sr}$ is the sum of the amounts of current flowing through the cell IMr[1, j] to the cell IMr[m, j] positioned in the j-th row. Thus, $I_{Sr}$ is the sum of the amounts of current flowing through the cells IMr included in the circuits CES in which the negative first data is retained out of the circuit CES[1, j] to the circuit CES[m, j]; for example, $I_{Sr}$ can be expressed as in Formula (2.2). That is, $I_{Sr}$ corresponds to the result of product-sum operation of the absolute value of the negative first data and the second data.

Thus, the current with the amount $I_{out}=I_S-I_{Sr}$ flowing to the wiring OL corresponds to the difference between the result of the product-sum operation of the absolute value of the positive first data and the second data and the result of the product-sum operation of the absolute value of the negative first data and the second data. That is, $I_{out}=I_S-I_{Sr}$ corresponds to the result of the product-sum operation of the negative, "0", or positive first data retained in the circuit CES[1, j] to the circuit CES[m, j] and the second data input to each of the wiring XCL[1] to the wiring XCL[m].

When the sum of the amounts of current flowing through the cell IM[1, j] to the cell IM[m, j] is larger than the sum of the amounts of current flowing through the cell IMr[1, j] to the cell IMr[m, j], i.e., $I_S$ is larger than $I_{Sr}$, $I_{out}$ is the current amount larger than 0 and flows from the converter circuit ITRZD4 to the wiring OL. By contrast, when the sum of the amounts of current flowing through the cell IM[1, j] to the cell IM[m, j] is smaller than the sum of the amounts of current flowing through the cell IMr[1, j] to the cell IMr[m, j], i.e., $I_S$ is smaller than $I_{Sr}$, current does not flow from the wiring OL to the converter circuit ITRZD4 in some cases. That is, when $I_S$ is smaller than $I_{Sr}$, $I_{out}$ can be approximately 0. The 0406 refore, the converter circuit ITRZD4 can be regarded as a ReLU function, for example.

A ReLU function can be used as an activation function of a neural network, for example. In the arithmetic operation of the neural network, calculation of a product sum of the signal values (e.g., second data) from the neurons in the previous layer and the corresponding weight coefficient (e.g., first data) is required. In response to the result of the product sum, the value of an activation function needs to be calculated. Thus, when the activation function of the neural network is the ReLU function, the arithmetic operation of the neural network can be performed using the arithmetic circuit MAC2 including the converter circuit ITRZD4.

The hierarchical neural network will be described in Embodiment 5.

Next, a specific circuit configuration example of the converter circuit ITRZD4 in FIG. 12 is described.

Figure 13A:
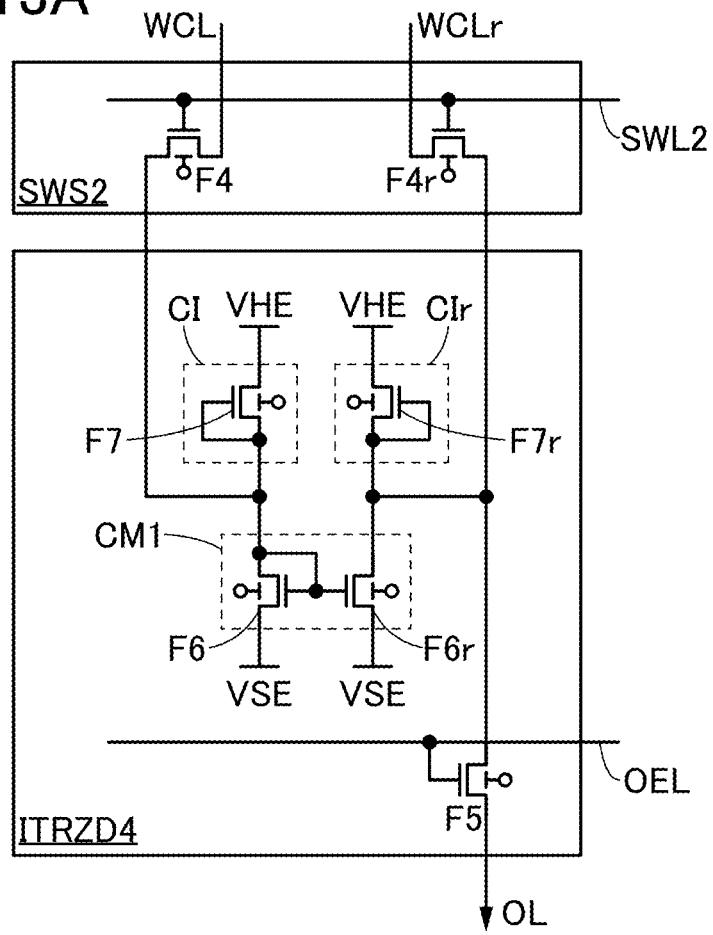
FIG. 13A is a circuit diagram illustrating a configuration example of a circuit included in a semiconductor device.

The converter circuit ITRZD4 illustrated in FIG. 13A is an example of the converter circuit ITRZD4 in FIG. 12. Specifically, FIG. 13A illustrates configuration examples of the current mirror circuit CM1, the current source CI, and the current source CIr.

In the converter circuit ITRZD4 in FIG. 13A, the current mirror circuit CM1 includes a transistor F6 and a transistor F6r, the current source CI includes a transistor F7, and the current source CIr includes a transistor F7r, for example. The transistor F6, the transistor F6r, the transistor F7, and the transistor F7r are n-channel transistors.

For example, the first terminal of the current mirror circuit CM1 is electrically connected to a first terminal of the transistor F6, a gate of the transistor F6, and a gate of the transistor F6r, and the third terminal of the current mirror circuit CM1 is electrically connected to a second terminal of the transistor F6. The second terminal of the current mirror circuit CM1 is electrically connected to a first terminal of the transistor F6r, and the fourth terminal of the current mirror circuit CM1 is electrically connected to a second terminal of the transistor F6r.

The output terminal of the current source CI is electrically connected to a first terminal of the transistor F7 and a gate of the transistor F7, and the input terminal of the current source CI is electrically connected to a second terminal of the transistor F7, for example.

The output terminal of the current source CIr is electrically connected to a first terminal of the transistor F7r and a gate of the transistor F7r, and the input terminal of the current source CIr is electrically connected to a second terminal of the transistor F7r, for example.

The gate and the first terminal are electrically connected to each other in the transistor F7 and the transistor F7r, and their second terminals and the wiring VHE are electrically connected to each other. Thus, the gate-source voltage of each of the transistor F7 and the transistor F7r is 0 V, and when the threshold voltages of the transistor F7 and the transistor F7r are within an appropriate range, a subthreshold current flows between the first terminal and the second terminal of each of the transistor F7 and the transistor F7r. In other words, the transistor F7 and the transistor F7r function as constant current sources.

The structures of the current source CI and the current source CIr included in the converter circuit ITRZD4 in FIG. 12 are not limited to those of the current source CI and the current source CIr illustrated in FIG. 13A. The structures of the current source CI and the current source CIr included in the converter circuit ITRZD4 may be changed depending on circumstances.

Figure 13B:
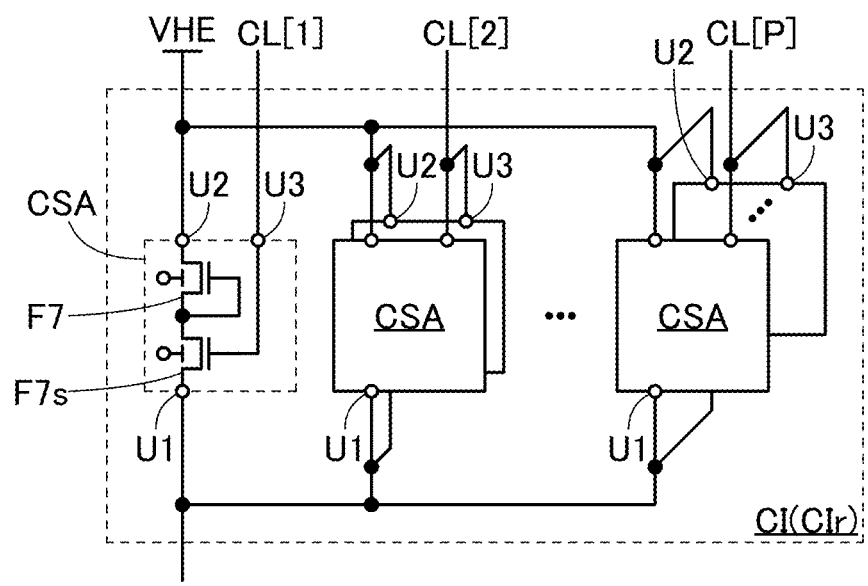
FIG. 13B is a block diagram illustrating a configuration example of a circuit included in the semiconductor device.

For example, the current source CI (current source CIr) illustrated in FIG. 13B may be used as the current source CI and the current source CIr included in the converter circuit ITRZD4 in FIG. 12.

The current source CI (current source CIr) in FIG. 13B includes a plurality of current sources CSA, for example. Each of the plurality of current sources CSA includes the transistor F7, a transistor F7s, a terminal U1, a terminal U2, and a terminal U3.

For example, the current sources CSA each have a function of making current with an amount $I_{CSA}$ flow between the terminal U2 and the terminal U1. When the current source CI (current source CIr) includes $2^P-1$ current source(s) CSA (P is an integer greater than or equal to 1), the current source CI (current source CIr) can make current with an amount $s \times I_{CSA}$ (s is an integer greater than or equal to 0 and less than or equal to $2^P-1$) flow to the output terminal.

In actuality, when the current source CI (current source CIr) is manufactured, the transistors in the current sources CSA may have different electrical characteristics; this may yield errors. The errors in the amount $I_{CSA}$ of the constant currents output from the terminals U1 of the plurality of current sources CSA are preferably within 10%, further preferably within 5%, and still further preferably within 1%. In this embodiment, the description is made based on the assumption that there is no error in the amount $I_{CSA}$ of the constant currents output from the terminals U1 of the plurality of current sources CSA included in the current source CI (current source CIr).

In one of the plurality of current sources CSA, a first terminal of the transistor F7s is electrically connected to the terminal U1, and a gate of the transistor F7s is electrically connected to the terminal U3. The first terminal of the transistor F7 is electrically connected to the gate of the transistor F7 and a second terminal of the transistor F7s. The second terminal of the transistor F7 is electrically connected to the terminal U2.

Each of the terminals U1 of the plurality of current sources CSA is electrically connected to the output terminal of the current source CI (current source CIr). Each of the terminals U2 of the plurality of current sources CSA is electrically connected to the input terminal of the current source CI (current source CIr). That is, electrical continuity is established between each of the terminals U2 of the plurality of current sources CSA and the wiring VHE.

The terminal U3 of the one current source CSA is electrically connected to a wiring CL[1], the terminals U3 of the two current sources CSA are electrically connected to a wiring CL[2], and the terminals U3 of the $2^{P-1}$ current sources CSA are electrically connected to a wiring CL[P].

The wirings CL[1] to CL[P] which are electrically connected to the current sources CSA function as wirings for transmitting control signals to make the current sources CSA output a constant current in the amount $I_{CSA}$. Specifically, for example, when a high-level potential is supplied to the wiring CL[1], the current source CSA electrically connected to the wiring CL[1] supplies a constant current with the amount $I_{CSA}$ to the terminal U1, and when a low-level potential is supplied to the wiring CL[1], $I_{CSA}$ is not output by the current source CSA electrically connected to the wiring CL[1]. For example, when a high-level potential is supplied to the wiring CL[2], the two current sources CSA electrically connected to the wiring CL[2] supply $2 \cdot I_{CSA}$, a constant current, in total to the terminal U1, and when a low-level potential is supplied to the wiring CL[2], $2 \cdot I_{CSA}$, a constant current, in total is not output by the current sources CSA electrically connected to the wiring CL[2]. For example, when a high-level potential is supplied to the wiring CL[P], the $2^{P-1}$ current sources CSA electrically connected to the wiring CL[P] supply $2^{P-1} I_{CSA}$, a constant current, in total to the terminal U1, and when a low-level potential is supplied to the wiring CL[P], $2^{P-1} I_{CSA}$, a constant current, in total is not output by the current sources CSA electrically connected to the wiring CL[P].

Accordingly, when one or more wirings selected from the wiring CL[1] to the wiring CL[P] are supplied with a high-level potential, the current source CI (current source CIr) can make current flow to the output terminal of the current source CI (current source CIr). The current amount can be determined by the combination of one or more wirings that are selected from the wiring CL[1] to the wiring CL[P] and supplied with a high-level potential. For example, when a high-level potential is supplied to the wiring CL[1] and the wiring CL[2] and a low-level potential is supplied to the wiring CL[3] to the wiring CL[P], the current source CI (current source CIr) can make currents with $3 \cdot I_{CSA}$ in total flow to the output terminal of the current source CI (current source CIr).

As described above, with use of the current source CI (current source CIr) in FIG. 13B, the amount of current supplied from the current source CI (current source CIr) to its output terminal can be changed depending on circumstances.

When the converter circuit ITRZD4 in FIG. 12 is used as the converter circuit ITRZD4 in FIG. 13A, all the transistors included in the converter circuit ITRZD4 can be OS transistors. The cell array CA, the circuit WCS, the circuit XCS, and the like in the arithmetic circuit MAC2 can be formed using only OS transistors; thus, the converter circuit ITRZD4 can be formed concurrently with the cell array CA, the circuit WCS, the circuit XCS, and the like. Thus, the manufacturing process of the arithmetic circuit MAC2 can be shortened in some cases. The same applies to the case where the current source CI (current source CIr) in FIG. 13B is used as the current source CI and the current source CIr of the converter circuit ITRZD4 in FIG. 13A.

For example, since the current source CI and the current source CIr included in the converter circuit ITRZD4 in FIG.

12 need to supply the same current, the current source CI and the current source CIr may be replaced with a current mirror circuit.

Figure 14A:
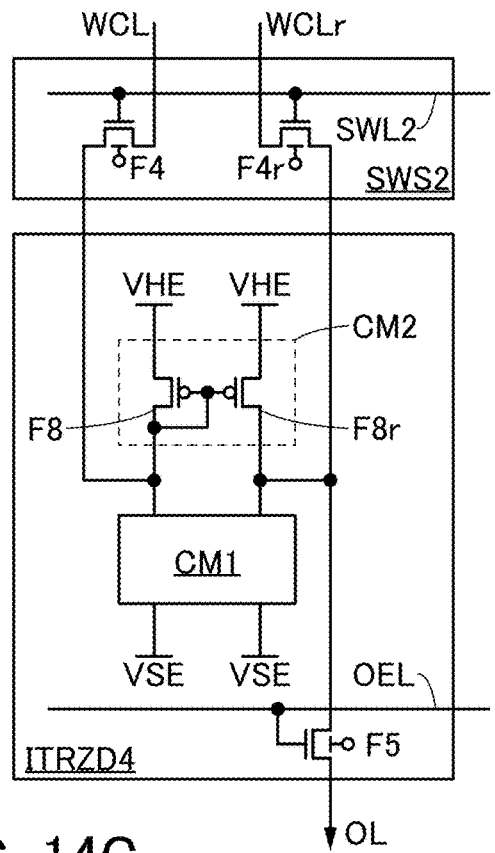
FIGS. 14A and 14B are block diagrams each illustrating a configuration example of a circuit included in a semiconductor device.

The converter circuit ITRZD4 illustrated in FIG. 14A has a configuration in which the current source CI and the current source CIr included in the converter circuit ITRZD4 in FIG. 12 are replaced with a current mirror circuit CM2. The current mirror circuit CM2 includes a transistor F8 and a transistor F8r, for example. Note that the transistor F8 and the transistor F8r are p-channel transistors.

A first terminal of the transistor F8 is electrically connected to a gate of the transistor F8, a gate of the transistor F8r, the second terminal of the transistor F4, and the first terminal of the current mirror circuit CM1. A second terminal of the transistor F8 is electrically connected to the wiring VHE. A first terminal of the transistor F8r is electrically connected to the second terminal of the transistor F4r and the second terminal of the current mirror circuit CM1. A second terminal of the transistor F8r is electrically connected to the wiring VHE.

As in the converter circuit ITRZD4 in FIG. 14A, the current source CI and the current source CIr included in the converter circuit ITRZD4 in FIG. 12 are replaced with the current mirror circuit CM2, whereby currents with substantially the same amounts can flow through the connection point of the second terminal of the transistor F4 and the first terminal of the current mirror circuit CM1 and the connection point of the second terminal of the transistor F4r, the second terminal of the current mirror circuit CM1, and the first terminal of the transistor F5.

The current mirror circuit CM2 in FIG. 14A includes the transistor F8 and the transistor F8r; however, the circuit configuration of the current mirror circuit CM2 is not limited thereto. For example, as in FIG. 14C described later, the current mirror circuit CM2 may have a configuration in which the transistors included in the current mirror circuit CM2 have a cascode connection. As described above, the circuit configuration of the current mirror circuit CM2 in FIG. 14A may be changed depending on circumstances.

Figure 14B:
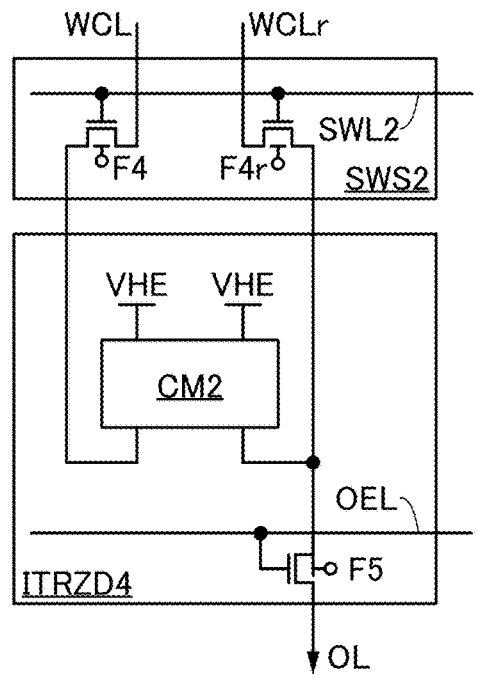

As in the configuration of the converter circuit ITRZD4 illustrated in FIG. 14B, the converter circuit ITRZD4 in FIG. 14A does not necessarily include the current mirror circuit CM1. In the converter circuit ITRZD4 illustrated in FIG. 14B, the amount of current flowing from the first terminal of the current mirror circuit CM2 to the second terminal of the transistor F4 can be substantially equal to the amount of current flowing from the second terminal of the current mirror circuit CM2 to the connection point of the second terminal of the transistor F4r and the first terminal of the transistor F5. Therefore, in the case where $I_S$ is larger than $I_{Sr}$, the amount of current $I_{out}$ flowing through the wiring OL in FIG. 14B can be $I_S-I_{Sr}$ as in the converter circuit ITRZD4 in FIG. 12.

The converter circuit ITRZD4 in FIG. 14B does not include the current mirror circuit CM1, and thus can have a circuit area smaller than that of the converter circuit ITRZD4 in FIG. 14A. Since no constant current flows from the current mirror circuit CM2 to the current mirror circuit CM1, the converter circuit ITRZD4 in FIG. 14B can have lower power consumption than the converter circuit ITRZD4 in FIG. 14A.

FIG. 14B does not illustrate the transistor F8 and the transistor F8r but illustrates the current mirror circuit CM2 as a block diagram. Thus, the configuration of the current mirror circuit CM2 in FIG. 14B can be determined depending on circumstances, as in the current mirror circuit CM2 in FIG. 14A.

The current mirror circuit CM1 included in the converter circuit ITRZD4 in FIG. 12 is not limited to the current mirror circuit CM1 illustrated in FIG. 13A. The configuration of the current mirror circuit CM1 included in the converter circuit ITRZD4 in FIG. 13A may be changed depending on circumstances.

Figure 14C:
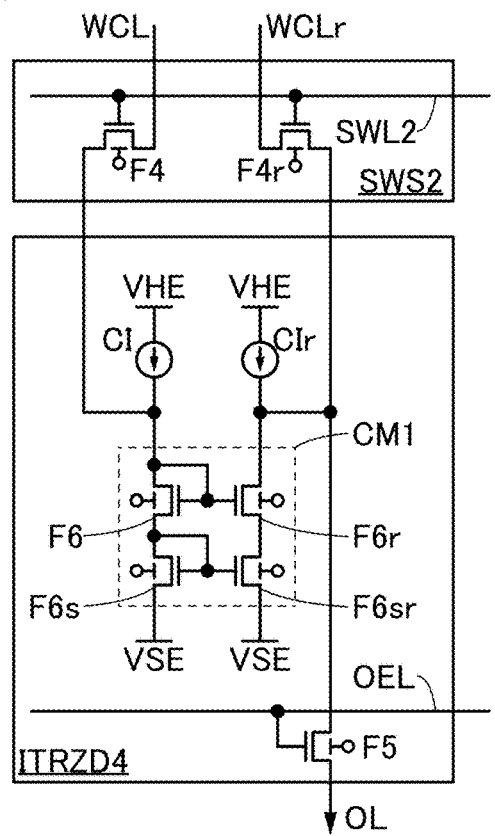
FIG. 14C is a circuit diagram illustrating a configuration example of a circuit included in the semiconductor device.

For example, the current mirror circuit CM1 illustrated in FIG. 14C can be used as the current mirror circuit CM1 included in the converter circuit ITRZD4 in FIG. 12. In the current mirror circuit CM1 illustrated in FIG. 14C, an n-channel transistor F6s and an n-channel transistor F6sr are further provided in the current mirror circuit CM1 in FIG. 13A; the transistor F6 and the transistor F6s are cascode-connected, and the transistor F6r and the transistor F6sr are cascode-connected. The transistors included in the current mirror circuit are cascode-connected as in FIG. 14C, whereby the operation of the current mirror circuit can be more stable.

<Configuration Example 2 of Arithmetic Circuit>

Figure 15:
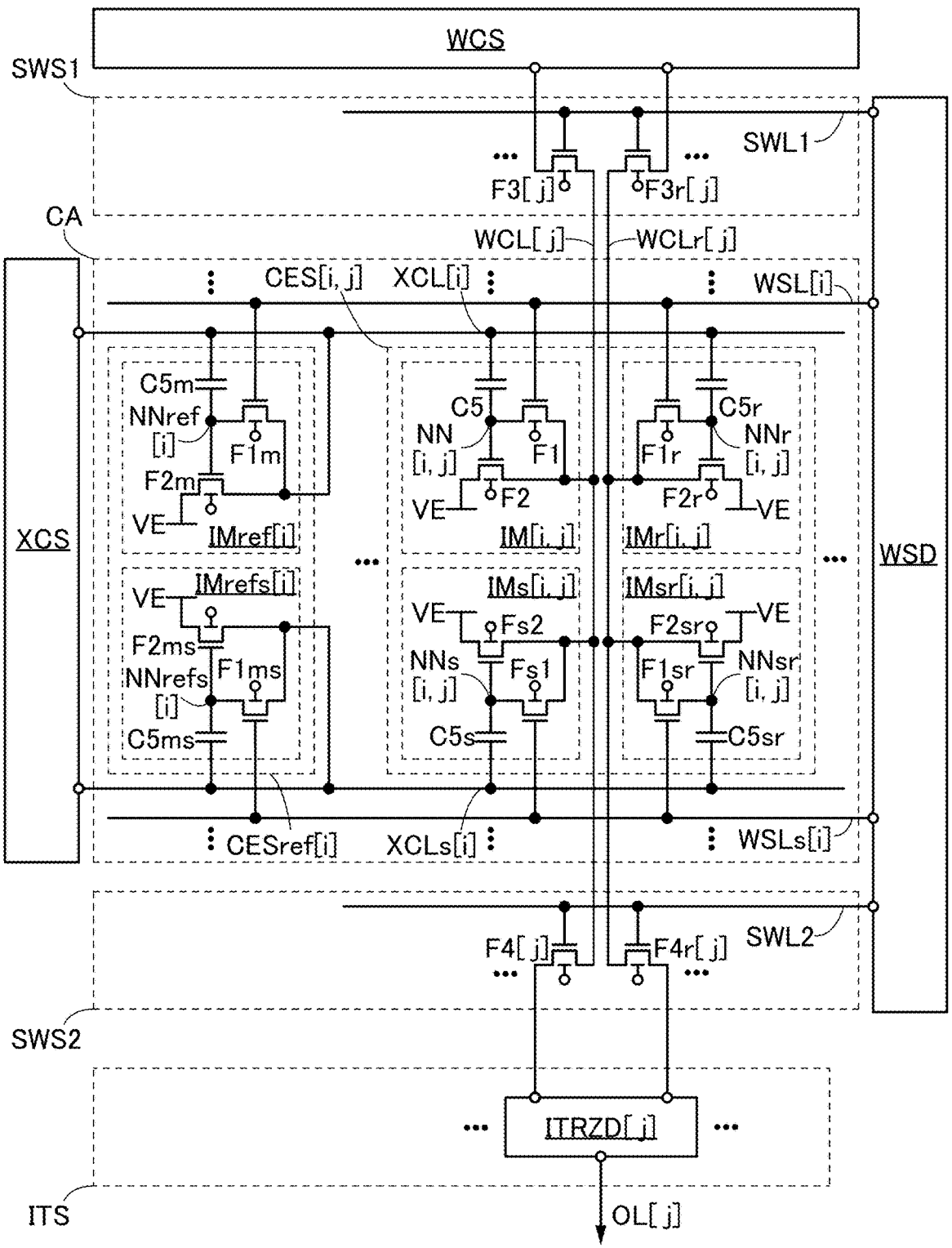
FIG. 15 is a block diagram illustrating a configuration example of a semiconductor device.

FIG. 15 shows a configuration example of an arithmetic circuit which performs a product-sum operation of positive, negative, or "0" first data and positive, negative, or "0" second data. An arithmetic circuit MAC3 illustrated in FIG. 15 has a configuration in which the arithmetic circuit MAC2 in FIG. 10 is changed. Thus, the portions in the arithmetic circuit MAC3 that are the same as those in the arithmetic circuit MAC1 and the arithmetic circuit MAC2 are not described.

The circuit CES[i, j] illustrated in FIG. 15 includes a cell IMs[i, j] and a cell IMsr[i, j] in addition to the cell IM[i, j] and the cell IMr[i, j]. In FIG. 15, the circuit CES[i, j] is illustrated, and the other circuit CES are omitted. In this specification and the like, when the circuit CES[i, j], the cell IM[i, j], the cell IMr[i, j], the cell IMs[i, j], the cell IMsr[i, j], and the like are described, [i, j] and the like that are added to the reference numerals are sometimes omitted.

The cells IMs and IMsr can each have a configuration similar to that of the cell IM. FIG. shows the cells IMs and IMsr having a configuration similar to that of the cell IM, for example. To distinguish the transistors, the capacitors, and the like included in the cell IM, the cell IMs, and the cell IMsr, "s" is added to the reference numerals representing the transistors and the capacitor included in the cell IMs, and "sr" is added to the reference numerals representing the transistors and the capacitor included in the cell IMsr.

Specifically, the cell IMs includes a transistor F1s, a transistor F2s, and a capacitor C5s. The transistor F1s corresponds to the transistor F1 in the cell IM, the transistor F2s corresponds to the transistor F2 in the cell IM, and the capacitor C5s corresponds to the capacitor C5 in the cell IM. Thus, for the electrical connection structure between the transistor F1s, the transistor F2s, and the capacitor C5s, refer to the description of IM[1, 1] to the cell IM[m, n] in Embodiment 1.

Furthermore, the cell IMsr includes a transistor F1sr, a transistor F2sr, and a capacitor C5sr. The transistor F1sr corresponds to the transistor F1 in the cell IM, the transistor F2sr corresponds to the transistor F2 in the cell IM, and the capacitor C5sr corresponds to the capacitor C5 in the cell IM. Thus, for the electrical connection structure between the transistor F1sr, the transistor F2sr, and the capacitor C5sr, refer to the description of IM[1, 1] to the cell IM[m, n] in Embodiment 1, as in the case of the cell IMs.

In the cell IMs, a connection portion of a first terminal of the transistor F1s, a gate of the transistor F2s, and a first terminal of the capacitor C5s is a node NNs, and in the cell IMsr, a connection portion of a first terminal of the transistor F1sr, a gate of the transistor F2sr, and a first terminal of the capacitor C5sr is a node NNsr.

In the circuit CES[i, j], the second terminal of the capacitor C5 is electrically connected to the wiring XCL[i], the gate of the transistor F1 is electrically connected to the wiring WSL[i], and the second terminal of the transistor F1 and the second terminal of the transistor F2 are electrically connected to the wiring WCL[j]. The second terminal of the capacitor C5r is electrically connected to the wiring XCL[i], the gate of the transistor F1r is electrically connected to the wiring WSL[i], and the second terminal of the transistor F1r and the second terminal of the transistor F2r are electrically connected to the wiring WCLr[j].

A second terminal of the capacitor C5s is electrically connected to a wiring XCLs[i], a gate of the transistor F1s is electrically connected to a wiring WSLs[i], and a second terminal of the transistor F1s and a second terminal of the transistor F2s are electrically connected to the wiring WCL[j]. A second terminal of the capacitor C5sr is electrically connected to the wiring XCLs[m], a gate of the transistor F1sr is electrically connected to the wiring WSLs[m], and a second terminal of the transistor F1sr and a second terminal of the transistor F2sr are electrically connected to the wiring WCLr[j].

The circuit CESref[i] illustrated in FIG. 15 includes a cell IMrefs[i] in addition to the cell IMref[i]. In FIG. 15, the circuit CESref[i] is illustrated, and the other circuits CESref are omitted. In this specification and the like, when the circuit CESref[i], the cell IMref[i], the cell IMrefs[i], and the like are described, [i] and the like that are added to the reference numerals are sometimes omitted.

The cell IMrefs can have a configuration similar to that of the cell IMref. FIG. 15 shows the cell IMrefs having a configuration similar to that of the cell IMref, for example. To distinguish the transistors, the capacitors, and the like included in the cell IMref and the cell IMrefs, "s" is added to the reference numerals representing the transistors and the capacitor included in the cell IMrefs.

Specifically, the cell IMrefs includes a transistor F1ms, a transistor F2ms, and a capacitor C5ms. The transistor F1ms corresponds to the transistor F1m in the cell IMref, the transistor F2ms corresponds to the transistor F2m in the cell IMref, and the capacitor C5ms corresponds to the capacitor C5m in the cell IMref. Thus, for the electrical connection structure between the transistor F1ms, the transistor F2ms, and the capacitor C5ms, refer to the description of IMref[1] to the cell IMref[m] in Embodiment 1.

In the cell IMrefs, a connection portion of the first terminal of the transistor F1ms, the gate of the transistor F2ms, and the first terminal of the capacitor C5ms is a node NNrefs.

In the circuit CESref[i], the second terminal of the capacitor C5m is electrically connected to the wiring XCL[i], the gate of the transistor F1m is electrically connected to the wiring WSL[i], and the second terminal of the transistor F1m and the second terminal of the transistor F2m are electrically connected to the wiring XCL[i]. A second terminal of the capacitor C5ms is electrically connected to the wiring XCLs[i], a gate of the transistor F1ms is electrically connected to the wiring WSLs[i], and a second terminal of the transistor F1ms and a second terminal of the transistor F2ms are electrically connected to the wiring XCLs[i].

Like the wiring XCL[1] to the wiring XCL[n] described in Embodiment 1, the wiring XCL[i] and the wiring XCLs[i] function as wirings that supply current from the circuit XCS to the cell IM, the cell IMr, the cell IMs, and the cell IMsr included in the circuit CES, and as wirings that supply current from the circuit XCS to the cell IMref[i] and the cell IMrefs[i] included in the circuit CESref, for example.

The wiring WSL[i] and the wiring WSLs[i] function as, for example, wirings that transmit a selection signal for writing the first data from the circuit WSD to the cells IM and the cells IMr included in the circuits CES, like the wiring WSL[1] to the wiring WSL[m] described in Embodiment 1. Alternatively, the wiring WSL[i] and the wiring WSLs[i] function as, for example, wirings that transmit a selection signal for writing the reference data from the circuit WSD to the cells IMref and the cells IMrefs included in the circuits CES.

As the converter circuit ITRZD[j] included in the arithmetic circuit MAC3 in FIG. 15, a circuit that can be used as the converter circuit ITRZD[j] included in the arithmetic circuit MAC2 in FIG. 10 can be used. In other words, as the converter circuit ITRZD[j] included in the arithmetic circuit MAC3, the converter circuit ITRZD1 to the converter circuit ITRZD3 illustrated in FIG. 11A to FIG. 11C can be used, for example.

Next, an example of retaining the first data in the circuit CES and an example of inputting the second data to the circuit CES, which are for performing a product-sum operation of the positive, negative, or "0" first data and the positive, negative, or "0" second data in the arithmetic circuit MAC3 in FIG. 15, are described.

Since the circuit CES includes the cell IM, the cell IMr, the cell IMs, and the cell IMsr, the circuit CES can use the four circuits, the cell IM, the cell IMr, the cell IMs, and the cell IMsr, to retain the first data. In other words, the circuit CES can set four current amounts, and potentials corresponding to the current amounts can be retained in the cell IM, the cell IMr, the cell IMs, and the cell IMsr. Thus, the first data can be represented with the current amount set in the cell IM, the current amount set in the cell IMr, the current amount set in the cell IMs, and the current amount set in the cell IMsr. The positive first data, the negative first data, or the "0" first data to be retained in the circuit CES is defined as follows.

To retain the positive first data in the circuit CES[i, j], the cell IM[i, j] is set such that the current with the amount corresponding to the absolute value of the positive first data flows through the transistor F2, and the cell IMsr[i, j] is set such that the current with the amount corresponding to the absolute value of the positive first data flows through the transistor F2sr for example. Specifically, the potential corresponding to the current amount is retained in the gate of the transistor F2 (the node NN[i, j]) and the gate of the transistor F2sr (the node NNsr[i, j]). The cell IMr[i, j] is set such that a current does not flow through the transistor F2r in the cell IMr[i, j], and the cell IMs[i, j] ise set such that a current does not flow through the transistor F2s in the cell IMs[i, j]. Specifically, the gate of the transistor F2r (node NNr[i, j]) and the gate of the transistor F2s (node NNs[i, j]) retain the potential supplied by the wiring VE or the initialization potential supplied by the wiring VINIL1 of the circuit WCS in FIG. 3B, for example.

To retain the negative first data in the circuit CES[i, j], the cell IMr[i, j] is set such that the current with the amount corresponding to the absolute value of the negative first data flows through the transistor F2r, and the cell IMs[i, j] is set such that the current with the amount corresponding to the absolute value of the negative first data flows through the transistor F2s, for example. Specifically, the potential corresponding to the current amount is retained in the gate of the transistor F2r (the node NNr[i, j]) and the gate of the transistor F2s (the node NNs[i, j]). The cell IM[i, j] is set such that a current does not flow through the transistor F2 in the cell IM[i, j], and the cell IMsr[i, j] is set such that a current does not flow through the transistor F2*sr* in the cell IMsr[i, j]. Specifically, the gate of the transistor F2 (node NN[i, j]) and the gate of the transistor F2*sr* (node NNsr[i, j]) retains the potential supplied by the wiring VE or the initialization potential supplied by the wiring VINIL1 of the circuit WCS in FIG. 3, for example.

To retain the "0" first data in the circuit CES[i, j], current is set not to flow through the transistor F2 of the cell IM[i, j], the transistor F2*r* of the cell IMr[i, j], the transistor F2*s* of the cell IMs[i, j], and the transistor F2*sr* of the cell IMsr[i, j], for example. Specifically, the gate of the transistor F2 (node NN[i, j]), the gate of the transistor F2*r* (node NNr[i, j]), the gate of the transistor F2*s* (node NNs[i, j]), and the gate of the transistor F2*sr* (node NNsr[i, j]) retain the potential supplied by the wiring VE or the initialization potential supplied by the wiring VINIL1 of the circuit WCS in FIG. 3, for example.

To retain the positive first data or the negative first data in another circuit CES, the current with the amount corresponding to the first data is set to flow through one of the following pairs of the paths: a pair of the paths between the cell IM and the wiring WCL and between the cell IMsr and the wiring WCLr and a pair of the paths between the cell IMr and the wiring WCLr and between the cell IMs and the wiring WCL while current is set not to flow between the other pair of the paths, as in the circuit CES[i, j] described above. To retain the "0" first data in another circuit CES, current is set not to flow between the cell IM and the wiring WCL, between the cell IMr and the wiring WCLr, between the cell IMs and the wiring WCL, and between the cell IMsr and the wiring WCLsr, as in the circuit CES[i, j] described above.

To retain each of "+3", "+2", "+1", "0", "−1", "−2", and "−3" in the circuit CES as the first data, for example, the amount of current flowing from the wiring WCL to the cell IM, the amount of current flowing from the wiring WCLr to the cell IMr, the amount of current flowing from the wiring WCL to the cell IMs, and the amount of current flowing from the wiring WCLsr to the cell IMsr are set as described above, whereby each "+3", "+2", "+1", "0", "−1", "−2", and "−3" as the first data can be defined as illustrated in the following table.

To input the positive second data in the circuit CES[i, j], the cell IMref[i] is set such that the current amount corresponding to the absolute value of the positive second data flows through the transistor F2*m* in the cell IMref[i], for example. Specifically, the potential corresponding to the current amount is retained in the gate of the transistor F2*m* (the node NNref[i]). In contrast, the cell IMrefs[i] is set such that a current does not flow through the transistor F2*ms* in the cell IMrefs[i]. Specifically, the gate of the transistor F2*ms* (the node NNrefs[i]) retains the potential supplied from the wiring VE, the initialization potential supplied from the wiring VINIL2 of the circuit XCS in FIG. 3C, or the like.

To input the negative second data to the circuit CES[i, j], the cell IMrefs[i] is set such that the current with the amount corresponding to the absolute value of the negative second data flows through the transistor F2*ms* in the cell IMrefs[i], for example. Specifically, the potential corresponding to the current amount is retained in the gate of the transistor F2*ms* (the node NNrefs[i]). In contrast, the cell IMref[i] is set such that a current does not flow through the transistor F2*m* in the cell IMref[i]. Specifically, the gate of the transistor F2*m* (the node NNref[i]) retains the potential supplied from the wiring VE, the initialization potential supplied from the wiring VINIL2 of the circuit XCS in FIG. 3C, or the like.

To input the "0" second data to the circuit CES[i, j], current is set not to flow through the transistor F2*m* of the cell IMref[i] and the transistor F2*ms* of the cell IMrefs[1], for example. Specifically, the gate of the transistor F2*m* (node NNref[i]) and the gate of the transistor F2*ms* (node NNrefs[i]) retains the potential supplied by the wiring VE or the initialization potential supplied by the wiring VINIL2 of the circuit XCS in FIG. 3C, for example.

To input the positive second data or the negative second data to another circuit CES, the current with the amount corresponding to the second data is set to flow through one of the path between the cell IMref and the wiring XCL and the path between the cell IMrefs and the wiring XCLs while current is set not to flow through the other of the path between the cell IMref and the wiring XCL and the path between the cell IMrefs and the wiring XCLs, as in the circuit CESref[i]. To input the "0" second data to another circuit CES, current is set not to flow between the cell IMref

TABLE 2

| First data | Current flowing from wiring WCL to cell IM | Current flowing from wiring WCLr to cell IMr | Current flowing from wiring WCL to cell IMs | Current flowing from wiring WCLr to cell IMsr |
|---|---|---|---|---|
| +3 | $3I_{Wut}$ | 0 | 0 | $3I_{Wut}$ |
| +2 | $2I_{Wut}$ | 0 | 0 | $2I_{Wut}$ |
| +1 | $I_{Wut}$ | 0 | 0 | $I_{Wut}$ |
| 0 | 0 | 0 | 0 | 0 |
| −1 | 0 | $I_{Wut}$ | $I_{Wut}$ | 0 |
| −2 | 0 | $2I_{Wut}$ | $2I_{Wut}$ | 0 |
| −3 | 0 | $3I_{Wut}$ | $3I_{Wut}$ | 0 |

On the other hand, as a wiring for inputting the second data, the wiring XCL and the wiring XCLs are electrically connected to the circuit CES. Thus, two signals can be input as the second data to the circuit CES. In other words, the second data can be represented with the signal input to the wiring XCL and the signal input to the wiring XCLs, and input to the circuit CES. Note that the positive second data, the negative second data, or the "0" second data to be input to the circuit CES is defined as follows.

and the wiring XCL and between the cell IMrefs and the wiring XCLs, as in the circuit CESref[i].

For example, to input each of "+3", "+2", "+1", "0", "−1", "−2", and "−3" as the second data to the circuit CES, the amount of current flowing from the wiring XCL to the cell IMref and the amount of current flowing from the wiring XCLs to the cell IMrefs are set as described above, whereby each of "+3", "+2", "+1", "0", "−1", "−2", and "−3" as the second data can be defined as in the following table.

TABLE 3

| Second data | Current flowing from wiring XCL to cell IMref | Current flowing from wiring XCLs to cell IMrefs |
|---|---|---|
| +3 | $3I_{Xut}$ | 0 |
| +2 | $2I_{Xut}$ | 0 |
| +1 | $I_{Xut}$ | 0 |
| 0 | 0 | 0 |
| −1 | 0 | $I_{Xut}$ |
| −2 | 0 | $2I_{Xut}$ |
| −3 | 0 | $3I_{Xut}$ |

When one of "+3", "+2", "+1", "0", "−1", "−2", and "−3" is retained as the first data in the circuit CES and one of "+1", "0", and "−1" is input to the circuit CES as the second data, the amount of current flowing from the wiring WCL to the cell IM and the cell IMs in the circuit CES, and the amount of current flowing from the wiring WCLr to the cell IMr and the cell IMsr in the circuit CES are considered.

For example, when the second data input to the circuit CES is "+1", the potential corresponding to the absolute value of the "+1" second data is input from the wiring XCL to each of the second terminals of the capacitor C5 and the capacitor C5r in the circuit CES, and the potential corresponding to the ground potential (GND) is input from the wiring XCLs to each of the second terminals of the capacitor C5s and the capacitor C5sr in the circuit CES. When the first data retained in the circuit CES is "+3", the potential corresponding to the absolute value of the "+3" first data is retained in each of the node NN and the node NNsr, and the ground potential (GND) is retained in each of the node NNr and the node NNs. According to Formula (1.12) or Formula (1.16), the current with the amount $3I_{ref0}$ flows between the first terminal and the second terminal of the transistor F2 in the circuit CES at this time. In addition, current does not flow between the first terminals and the second terminals of the transistor F2r, the transistor F2s, and the transistor F2sr. In other words, the current with the amount $3I_{ref0}$ flows from the wiring WCL to the cell IM, current does not flow from the wiring WCL to the cell IMs, current does not flow from the wiring WCLr to the cell IMr, and current does not flow from the wiring WCLr to the cell IMsr.

For example, the second data input to the circuit CES is "+1" and the first data retained in the circuit CES is "−3". Thus, the potential corresponding to the absolute value of the "−3" first data is retained in each of the node NNr and the node NNs, and the ground potential (GND) is retained in each of the node NN and the node NNsr. According to Formula (1.12) or Formula (1.16), the current with the amount $3I_{ref0}$ flows between the first terminal and the second terminal of the transistor F2r in the circuit CES at this time. In addition, current does not flow between the first terminals and the second terminals of the transistor F2, the transistor F2s, and the transistor F2sr. In other words, the current with the amount $3I_{ref0}$ flows from the wiring WCLr to the cell IMr, current does not flow from the wiring WCL to the cell IM, current does not flow from the wiring WCL to the cell IMs, and current does not flow from the wiring WCLr to the cell IMsr.

For example, when the second data input to the circuit CES is "−1", the potential corresponding to the absolute value of the "−1" second data is input from the wiring XCLs to each of the second terminals of the capacitor C5s and the capacitor C5sr in the circuit CES, and the potential corresponding to the ground potential (GND) is input from the wiring XCL to each of the second terminals of the capacitor C5 and the capacitor C5r in the circuit CES. When the first data retained in the circuit CES is "+3", the potential corresponding to the absolute value of the "+3" first data is retained in each of the node NN and the node NNsr, and the ground potential (GND) is retained in each of the node NNr and the node NNs. According to Formula (1.12) or Formula (1.16), the current with the amount $3I_{ref0}$ flows between the first terminal and the second terminal of the transistor F2sr in the circuit CES at this time. In addition, current does not flow between the first terminals and the second terminals of the transistor F2, the transistor F2r, and the transistor F2s. In other words, the current with the amount $3I_{ref0}$ flows from the wiring WCLr to the cell IMsr, current does not flow from the wiring WCL to the cell IM, current does not flow from the wiring WCLr to the cell IMr, and current does not flow from the wiring WCL to the cell IMs.

For example, the second data input to the circuit CES is "−1" and the first data retained in the circuit CES is "−3". Thus, the potential corresponding to the absolute value of the "−3" first data is retained in each of the node NNr and the node NNs, and the ground potential (GND) is retained in each of the node NN and the node NNsr. According to Formula (1.12) or Formula (1.16), the current with the amount $3I_{ref0}$ flows between the first terminal and the second terminal of the transistor F2s in the circuit CES at this time. In addition, current does not flow between the first terminals and the second terminals of the transistor F2, the transistor F2r, and the transistor F2sr. In other words, the current with the amount $3I_{ref0}$ flows from the wiring WCL to the cell IMs, current does not flow from the wiring WCL to the cell IM, current does not flow from the wiring WCLr to the cell IMr, and current does not flow from the wiring WCLr to the cell IMsr.

For example, when the second data input to the circuit CES is "0", the ground potential (GND) is input from the wiring XCL to each of the second terminal of the capacitor C5 and the capacitor C5r in the circuit CES, and the ground potential (GND) is input from the wiring XCLs to each of the second terminals of the capacitor C5s and the capacitor C5sr in the circuit CES. In that case, regardless of the value of the first data retained in the circuit CES, current does not flow between the first terminals and the second terminals of the transistor F2, the transistor F2r, the transistor F2s, and the transistor F2sr.

For example, when the first data retained in the circuit CES is "0", the ground potential (GND) is retained in each of the node NN, the node NNr, the node NNs, and the node NNsr. In that case, regardless of the value of the second data input to the circuit CES, current does not flow between the first terminals and the second terminals of the transistor F2, the transistor F2r, the transistor F2s, and the transistor F2sr.

The cases where the first data are "+3", "−3", and "0" and the second data are "+1", "−1", and "0" are described above; when the same applies to the other cases, the amounts of current flowing through the wiring WCL and the wiring WCLr can be summarized as in the following table.

TABLE 4

| First data | Second data | First data × Second data | Current flowing from wiring WCL to cell IM | Current flowing from wiring WCLr to cell IMr | Current flowing from wiring WCL to cell IMs | Current flowing from wiring WCLr to cell IMsr |
|---|---|---|---|---|---|---|
| +3 | +1 | +3 | $3I_{ref0}$ | 0 | 0 | 0 |
| +2 | +1 | +2 | $2I_{ref0}$ | 0 | 0 | 0 |
| +1 | +1 | +1 | $1I_{ref0}$ | 0 | 0 | 0 |
| 0 | +1 | 0 | 0 | 0 | 0 | 0 |
| −1 | +1 | −1 | 0 | $1I_{ref0}$ | 0 | 0 |
| −2 | +1 | −2 | 0 | $2I_{ref0}$ | 0 | 0 |
| −3 | +1 | −3 | 0 | $3I_{ref0}$ | 0 | 0 |
| +3 | 0 | 0 | 0 | 0 | 0 | 0 |
| +2 | 0 | 0 | 0 | 0 | 0 | 0 |
| +1 | 0 | 0 | 0 | 0 | 0 | 0 |
| 0 | 0 | 0 | 0 | 0 | 0 | 0 |
| −1 | 0 | 0 | 0 | 0 | 0 | 0 |
| −2 | 0 | 0 | 0 | 0 | 0 | 0 |
| −3 | 0 | 0 | 0 | 0 | 0 | 0 |
| +3 | −1 | −3 | 0 | 0 | 0 | $3I_{ref0}$ |
| +2 | −1 | −2 | 0 | 0 | 0 | $2I_{ref0}$ |
| +1 | −1 | −1 | 0 | 0 | 0 | $1I_{ref0}$ |
| 0 | −1 | 0 | 0 | 0 | 0 | 0 |
| −1 | '−1 | +1 | 0 | 0 | $1I_{ref0}$ | 0 |
| −2 | −1 | +2 | 0 | 0 | $2I_{ref0}$ | 0 |
| −3 | −1 | +3 | 0 | 0 | $3I_{ref0}$ | 0 |

As described above, the product-sum operation of the positive, the negative, or "0" first data and the positive or "0" second data can be performed using the arithmetic circuit MAC2. In addition, the product-sum operation of the positive, negative, or "0" first data and the positive, negative, or "0" second data can be performed using the arithmetic circuit MAC3.

One embodiment of the present invention is not limited to the circuit configurations of the arithmetic circuit MAC2 and the arithmetic circuit MAC3 described in this embodiment. The circuit configurations of the arithmetic circuit MAC2 and the arithmetic circuit MAC3 can be changed depending on circumstances. For example, the capacitor C5, the capacitor C5r, the capacitor C5s, the capacitor C5sr, the capacitor C5m, and the capacitor C5ms included in the arithmetic circuit MAC3 can be gate capacitances of transistors (not illustrated). In the arithmetic circuit MAC3, the capacitor C5, the capacitor C5r, the capacitor C5s, the capacitor C5sr, the capacitor C5m, and the capacitor C5ms are not necessarily provided when parasitic capacitances between the node NN, the node NNr, the node NNs, the node NNsr, the node NNref, and the node NNrefs and their nearby wirings are large.

Note that this embodiment can be combined with any of the other embodiments in this specification as appropriate.

Embodiment 3

In this embodiment, a structure in which a sensor is combined with any one of the arithmetic circuit MAC1, the arithmetic circuit MAC1A, the arithmetic circuit MAC2, and the arithmetic circuit MAC3 described in the above embodiment will be described.

Figure 16A:
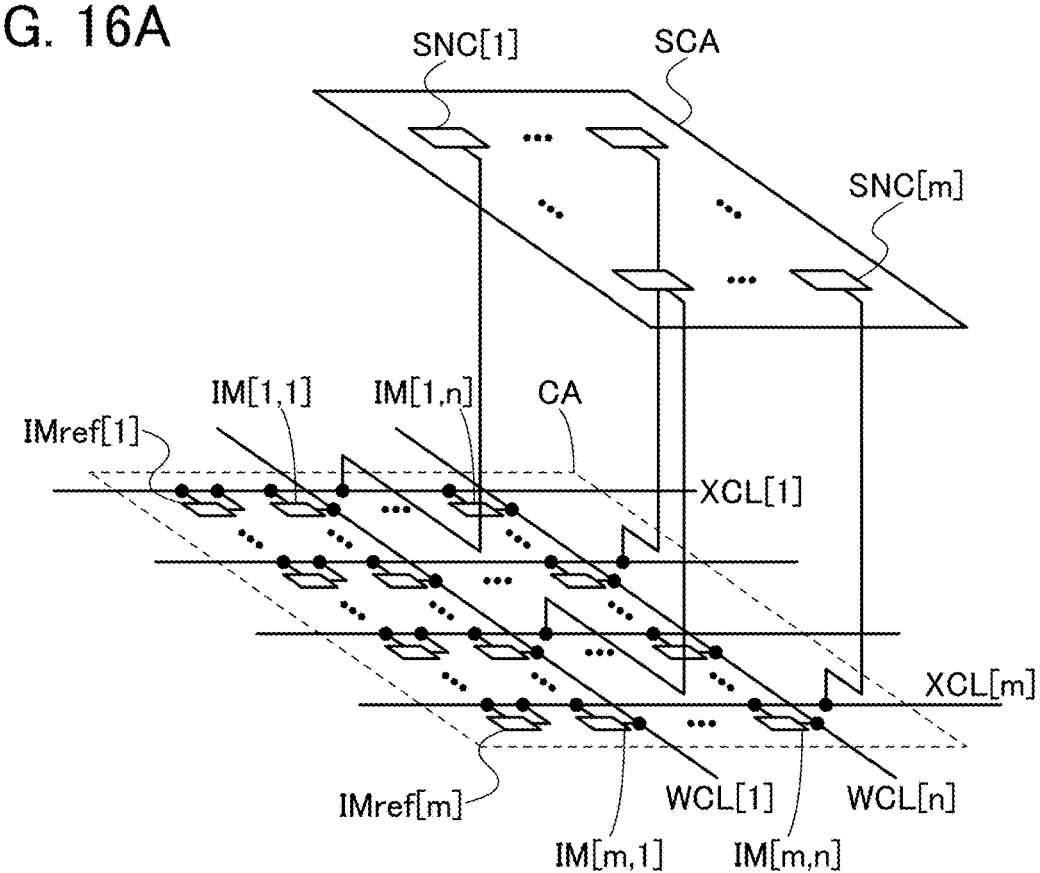
FIGS. 16A and 16B are block diagrams each illustrating a configuration example of a circuit included in a semiconductor device.

FIG. 16A illustrates a structure example in which the arithmetic circuit MAC1 and a circuit SCA including a sensor are combined. FIG. 16A selectively illustrates the cell array CA of the arithmetic circuit MAC1.

The circuit SCA includes a sensor SNC[1] to a sensor SNC[m], for example. In FIG. 16A, the sensor SNC[1] to the sensor SNC[m] are arranged in a matrix, for example.

The sensors SNC[1] to SNC[m] have functions of converting sensed information to a current amount and outputting the current amount. As the sensors SNC[1] to SNC[m], an optical sensor including a photodiode, a pressure sensor, a gyroscope sensor, an acceleration sensor, a sound sensor, a temperature sensor, a humidity sensor, or the like can be used, for example. When particularly optical sensors are used as the sensors SNC[1] to SNC[m], the circuit SCA can be part of an image sensor.

The sensors SNC[1] to SNC[m] are preferably provided in a region close to the external area because they sense information of the external area. For this reason, the circuit SCA is preferably provided over the arithmetic circuit MAC1 as illustrated in FIG. 16A; more specifically, the circuit SCA is preferably provided over the cell array CA.

The sensors SNC[1] to SNC[m] are electrically connected to the wirings XCL[1] to XCL[m], respectively.

Thus, when information is sensed in each of the sensors SNC[1] to SNC[m], current with an amount corresponding to the information flows from the sensors SNC[1] to SNC[m] to the wirings XCL[1] to XCL[m], respectively.

The circuit SCA preferably has a configuration in which the sensors SNC[1] to SNC[m] sequentially perform sensing, and sequentially make currents flow to the wirings XCL[1] to XCL[m]. In this case, for example, signal lines for selecting the sensors SNC[1] to SNC[m] are provided in the circuit SCA so that signals or the like are sequentially sent to the signal lines and the sensors SNC[1] to SNC[m] sequentially operate.

Figure 16B:
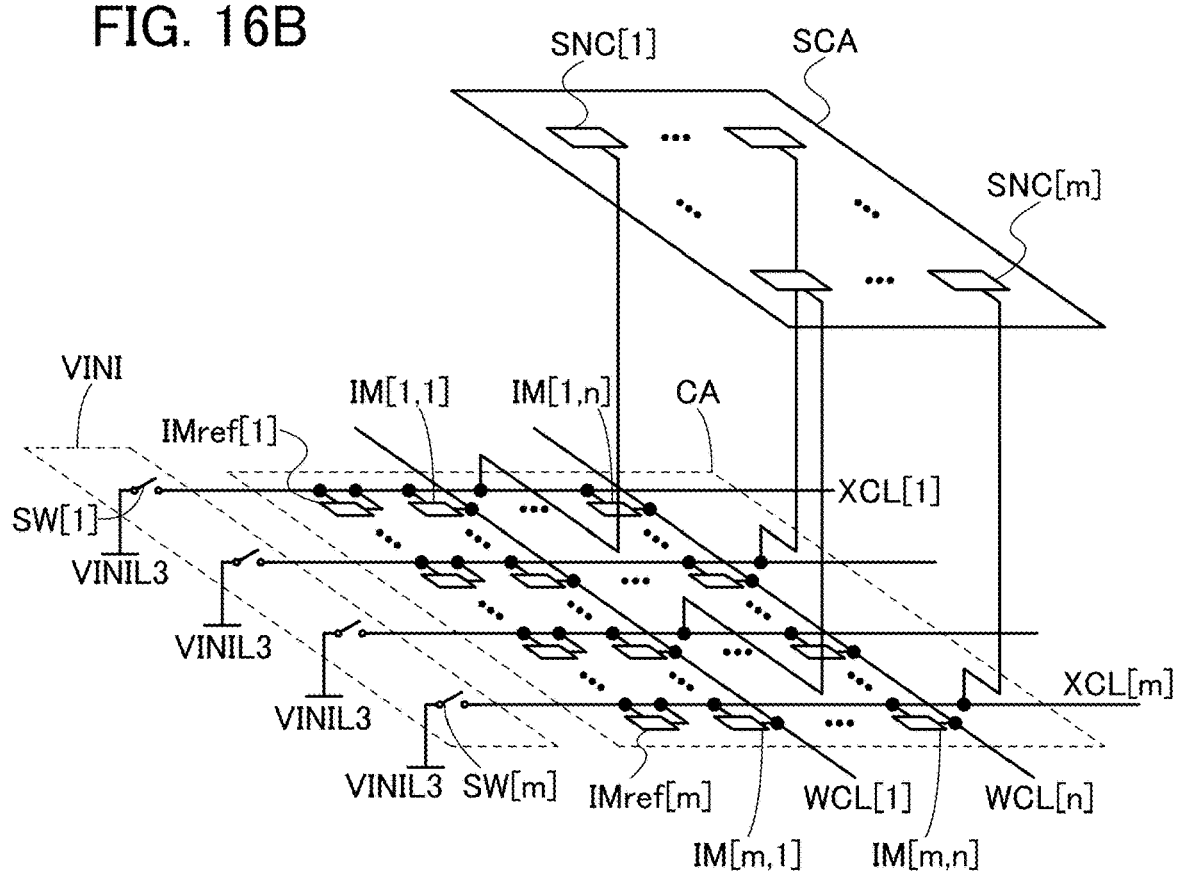

Specifically, for example, as illustrated in FIG. 16B, a circuit VINI may be provided for the wirings XCL[1] to XCL[m] in the circuit configuration of FIG. 16A. The circuit VINI includes switches SW[1] to SW[m]. First terminals of the switches SW[1] to SW[m] are electrically connected to the wirings XCL[1] to XCL[m], and second terminals of the switches SW[1] to SW[m] are electrically connected to a wiring VINIL3. The wiring VINIL3 functions as a wiring that supplies, for example, a constant potential such as a low-level potential or a ground potential. In particular, the constant potential is preferably a potential lower than the potential supplied from the wiring VE. Here, the case is considered in which the switches SW[1] to SW[m] are sequentially turned off such that one of the switches SW[1] to SW[m] is in the off state and the other switches SW are in the on state. When the sensors SNC[1] to SNC[m] perform sensing at the same time, the sensor SNC[1] to the sensor SNC[m] supply current to the wiring XCL[1] to the wiring XCL[m]. In that case, electrical continuity is established between the wiring VINIL3 and the wiring XCL electrically connected to the switch SW in the on state out of the switches SW[1] to SW[m]; thus, the current flows to the wiring VINIL3. Thus, the potential of the wiring XCL electrically connected to the switch SW in the on state becomes substantially equal to the constant potential supplied from the wiring VINIL3. Meanwhile, the potentials of the wirings XCL electrically connected to the switches SW in the off state out of the switches SW[1] to SW[m] are determined in accordance with the amount of the current.

For example, in the case where the sensors SNC[1] to SNC[m] are optical sensors including photodiodes or the like, a filter is prepared such that only one of the sensors SNC[1] to SNC[m] is irradiated with light. Since the number of sensors SNC is m, the number of kinds of filters is also m. In addition, in the case where a filter that does not allow light to enter any of the sensors SNC[1] to SNC[m] is prepared, the number of kinds of filters is m+1. When the circuit SCA is irradiated with light, the filters are sequentially changed, whereby the sensors SNC[1] to SNC[m] can sequentially perform sensing.

For example, in the case where the sensors SNC[1] to SNC[m] are optical sensors including photodiodes or the like, the arithmetic circuit MAC1, the arithmetic circuit MAC1A, the arithmetic circuit MAC2, or the arithmetic circuit MAC3 may have a structure in which the sensors SNC[1] to SNC[m] are irradiated with light independently of each other. With a configuration where the sensors SNC[1] to SNC[m] are irradiated with light independently of each other, the sensors SNC[1] to SNC[m] can be sequentially irradiated with light to perform sequential sensing.

Here, an operation example of the arithmetic circuit MAC1 in which the circuit SCA and the circuit VINI in FIG. 16B are provided is described.

Refer to the timing chart in FIG. 9 for the operation example. Thus, in the description of the operation example of the arithmetic circuit MAC1 in which the circuit SCA and the circuit VINI in FIG. 16B are provided, the same description as that in <Operation example 1 of arithmetic circuit> in Embodiment 1 is omitted.

The constant potential supplied from the wiring VINIL3 is a ground potential.

From Time T13 to Time T15 in the timing chart in FIG. 9, the current with the amount $I_{ref0}$ flows from the sensor SNC[i] of the circuit SCA to the wiring XCL[i]. For example, $I_{ref0}$ is the amount of reference current output from the sensor SNC[i] in FIG. 16B that performs sensing. In the circuit VINI, when the switch SW[i] is turned off, the potential of the wiring XCL[i] is, for example, $V_{gm}$[i].

From Time T13 to Time T15 in the timing chart in FIG. 9, the sensors SNC[1] to SNC[m] other than the sensor SNC[i] do not necessarily perform sensing. At this time, the switches SW[1] to SW[m] except the switch SW[i] are turned on, whereby the potentials of the wirings XCL[1] to XCL[m] except the wiring XCL[i] become ground potentials, for example.

From Time T17 to Time T19 in the timing chart in FIG. 9, the current $I_{ref0}$ flows from the sensor SNC[i+1] of the circuit SCA to the wiring XCL[i+1]. For example, $I_{ref0}$ is the amount of current output from the sensor SNC[i+1] in FIG. 16B that performs sensing. In the circuit VINI, the switch SW[i+1] is turned off, whereby the potential of the wiring XCL[i+1] is, for example, $V_{gm}$[i+1].

From Time T17 to Time T19 in the timing chart in FIG. 9, the sensors SNC[1] to SNC[m] other than the sensor SNC[i+1] do not necessarily perform sensing. At this time, the switches SW[1] to SW[m] except the switch SW[i+1] are turned on, whereby the potentials of the wirings XCL[1] to XCL[m] except the wiring XCL[i+1] become ground potentials, for example.

From Time T22 to Time T23 in the timing chart in FIG. 9, the current with the amount $x[i] \cdot I_{ref0}$, which is $x[i]$ times larger than $I_{ref0}$, flows from the sensor SNC[i] of the circuit SCA to the wiring XCL[i]. For example, the current $x[i]I_{ref0}$ is current output from the sensor SNC[i] in FIG. 16B that performs sensing. In the circuit VINI, the switch SW[i] is turned off, whereby the potential of the wiring XCL[i] changes to, for example, $V_{gm}[i]+\Delta V[i]$.

From Time T22 to Time T23 in the timing chart in FIG. 9, the current with the amount $x[i+1] \cdot I_{ref0}$, which is $x[i+1]$ times larger than $I_{ref0}$, flows from the sensor SNC[i+1] of the circuit SCA to the wiring XCL[i+1]. For example, the current $x[i+1] \cdot I_{ref0}$ is current output from the sensor SNC[i+1] in FIG. 16B that performs sensing. In the circuit VINI, the switch SW[i+1] is turned off, whereby the potential of the wiring XCL[i+1] changes to, for example, $V_{gm}[i+1]+\Delta V[i-1]$.

Then, as in the timing chart in FIG. 9, the amount of current flowing between the converter circuit ITRZ[j] and the wiring WCL[j] is the sum of the amount of current $I_1[i, j]$ flowing between the first terminal and the second terminal of the transistor F2 in the cell IM[i, j] and the amount of current $I_1[i+1, j]$ flowing between the first terminal and the second terminal of the transistor F2 in the cell (corresponding to Formula (1.17)). Thus, the amount of current output from the converter circuit ITRZ[j] to the wiring WCL[j] is the amount of current proportional to the sum of products of the weight coefficients w[i, j] and w[i+1, j] that are the first data and the values x[i] and x[i+1] of the signals of the neurons that are the second data, i.e., x[i]w[i, j]+x[i+1]w[i+1, j].

The arithmetic circuit MAC1 including the circuit SCA can perform arithmetic operation of a hierarchical neural network from its first layer (input layer) to its second layer (intermediate layer), for example. That is, the information (value) obtained through sensing by the sensors SNC[1] to SNC[m] corresponds to the signal transmitted from the first-layer neuron to the second-layer neuron. When the weight coefficient between the first-layer neuron and the second-layer neuron is retained in the cells IM[1, j] to IM[m, j], the arithmetic circuit MAC1 can perform a product-sum operation of the information (value) and the weight coefficient.

The hierarchical neural network will be described in Embodiment 5.

In particular, when arithmetic operation is performed on the second and subsequent layers in the hierarchical neural network, the arithmetic circuits illustrated in FIGS. 16A and 16B preferably have a configuration where the arithmetic circuits MACL each including the cell array CA and the circuit ITS are stacked as in the circuit CDV in FIG. 1 described in the above embodiment.

Figure 17:
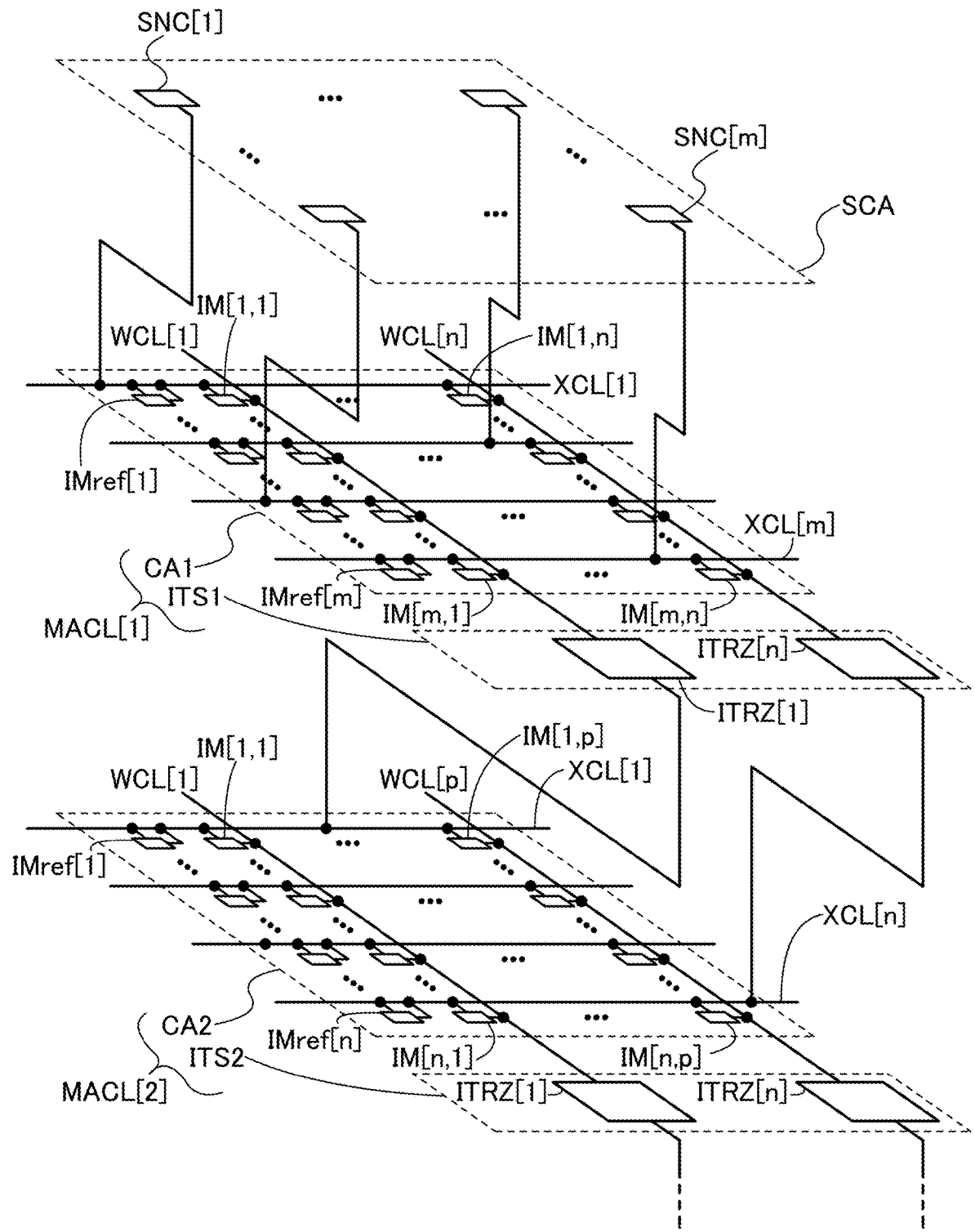
FIG. 17 is a block diagram illustrating a configuration example of a semiconductor device.

Specifically, for example, a configuration where the arithmetic circuit MACL[1] is provided below the circuit SCA and the arithmetic circuit MACL[2] is provided below the arithmetic circuit MACL[1], as illustrated in FIG. 17, may be employed. The arithmetic circuit MACL[1] includes a cell array CA1 corresponding to the cell array CA illustrated in FIG. 16A or FIG. 16B and a circuit ITS1 corresponding to the circuit ITS illustrated in FIG. 1. The arithmetic circuit MACL[2] includes a cell array CA2 corresponding to the cell array CA1 of the arithmetic circuit MACL[1] and a circuit ITS2 corresponding to the circuit ITS1 of the arithmetic circuit MACL[1].

In the arithmetic circuit in FIG. 17, information sensed by the sensors SNC[1] to SNC[m] included in the circuit SCA is transmitted to the wirings XCL[1] to XCL[m] extending in the cell array CA1 of the arithmetic circuit MACL[1], so that a product-sum operation of the information and a weight coefficient retained in the cell IM is performed, as in the arithmetic circuits in FIGS. 16A and 16B. Results of the product-sum operation are transmitted to the circuit ITS1, and then an arithmetic operation of a function system is performed in the circuit ITS1 using the results of the product-sum operation as input values.

Furthermore, results of the arithmetic operation by the circuit ITS1 are transmitted to the wirings XCL[1] to XCL[n] extending in the cell array CA2 of the arithmetic circuit MACL[2], so that a product-sum operation of the information and a weight coefficient retained in the cell IM is performed. Results of the product-sum operation are transmitted to the circuit ITS2, and then an arithmetic operation of a function system is performed in the circuit ITS2 using the results of the product-sum operation as input values. In other words, the arithmetic circuit MACL[2] performs arithmetic operations corresponding to those in the second and third layers of the hierarchical neural network.

As described above, in accordance with the number of layers in a hierarchical neural network, a plurality of arithmetic circuits MACL are stacked, whereby the hierarchical neural network can execute an arithmetic operation using information sensed by the sensors SNC[1] to SNC[m] included in the circuit SCA as input data.

<Optical Sensor>

Figure 18:
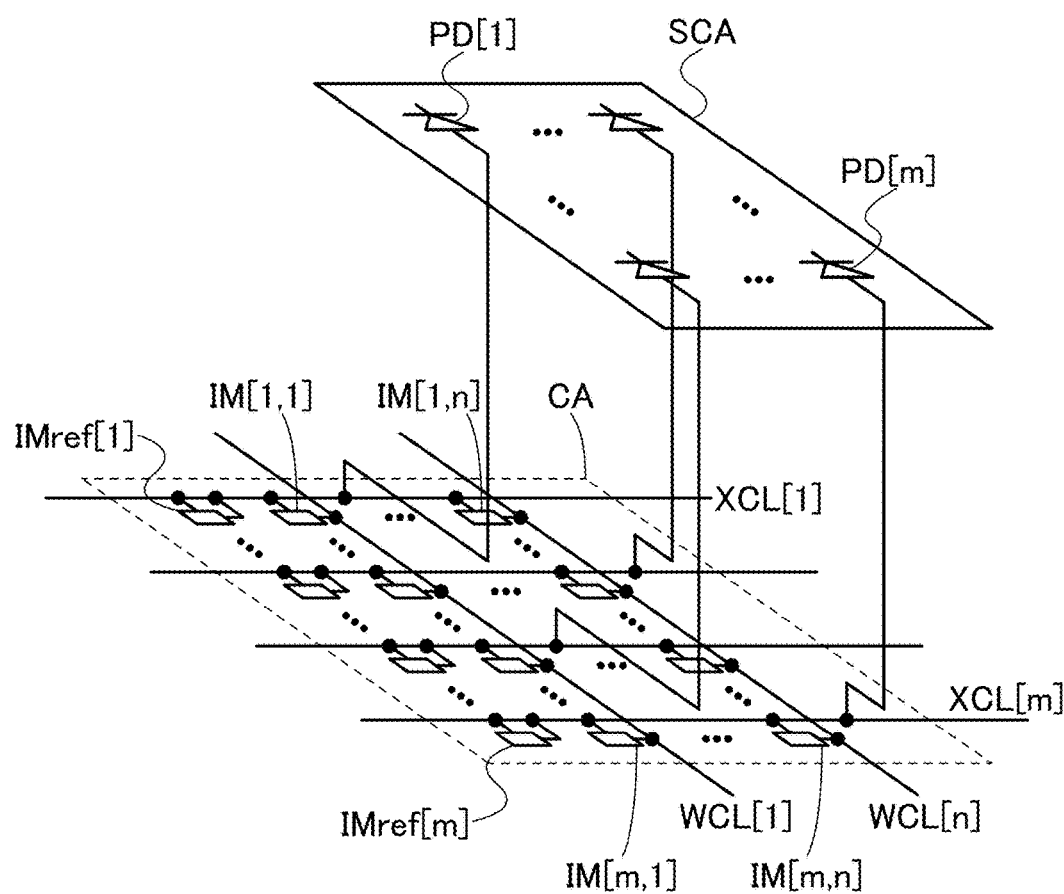
FIG. 18 is a block diagram illustrating a configuration example of a circuit included in a semiconductor device.

FIG. 18 illustrates the circuit SCA including photodiodes PD[1] to PD[m] as the sensors SNC[1] to SNC[m] in FIG. 16A, for example. That is, the circuit SCA in FIG. 18 is assumed to be an optical sensor. The optical sensor has a function of receiving light and generating current in accordance with the intensity of the light. In other words, when the optical sensor in FIG. 16A is irradiated with light, for example, the photodiode PD[i] generates current, and the current flows through the cells IM[i, 1] to IM[i, n] and the cell IMref[i] in the i-th row of the cell array CA.

In the case where an optical sensor is used in this manner, the intensity of light delivered to the optical sensor is desirably within the range of the intensity of light delivered under the usage conditions of the optical sensor.

Note that this embodiment can be combined with any of the other embodiments in this specification as appropriate.

Embodiment 4

In this embodiment, an odor sensor which is a configuration example described in Embodiment 3 in which one of the arithmetic circuit MAC1, the arithmetic circuit MAC1A, the arithmetic circuit MAC2, and the arithmetic circuit MAC3 is combined with a sensor is described. An example of an electronic device in which one of the arithmetic circuit MAC1, the arithmetic circuit MAC1A, the arithmetic circuit MAC2, and the arithmetic circuit MAC3 is combined with a tactile sensor is described. An example of an electronic device in which one of the arithmetic circuit MAC1, the arithmetic circuit MAC1A, the arithmetic circuit MAC2, and the arithmetic circuit MAC3 is combined with a taste sensor is described.

<Odor Sensor>

Figure 19:
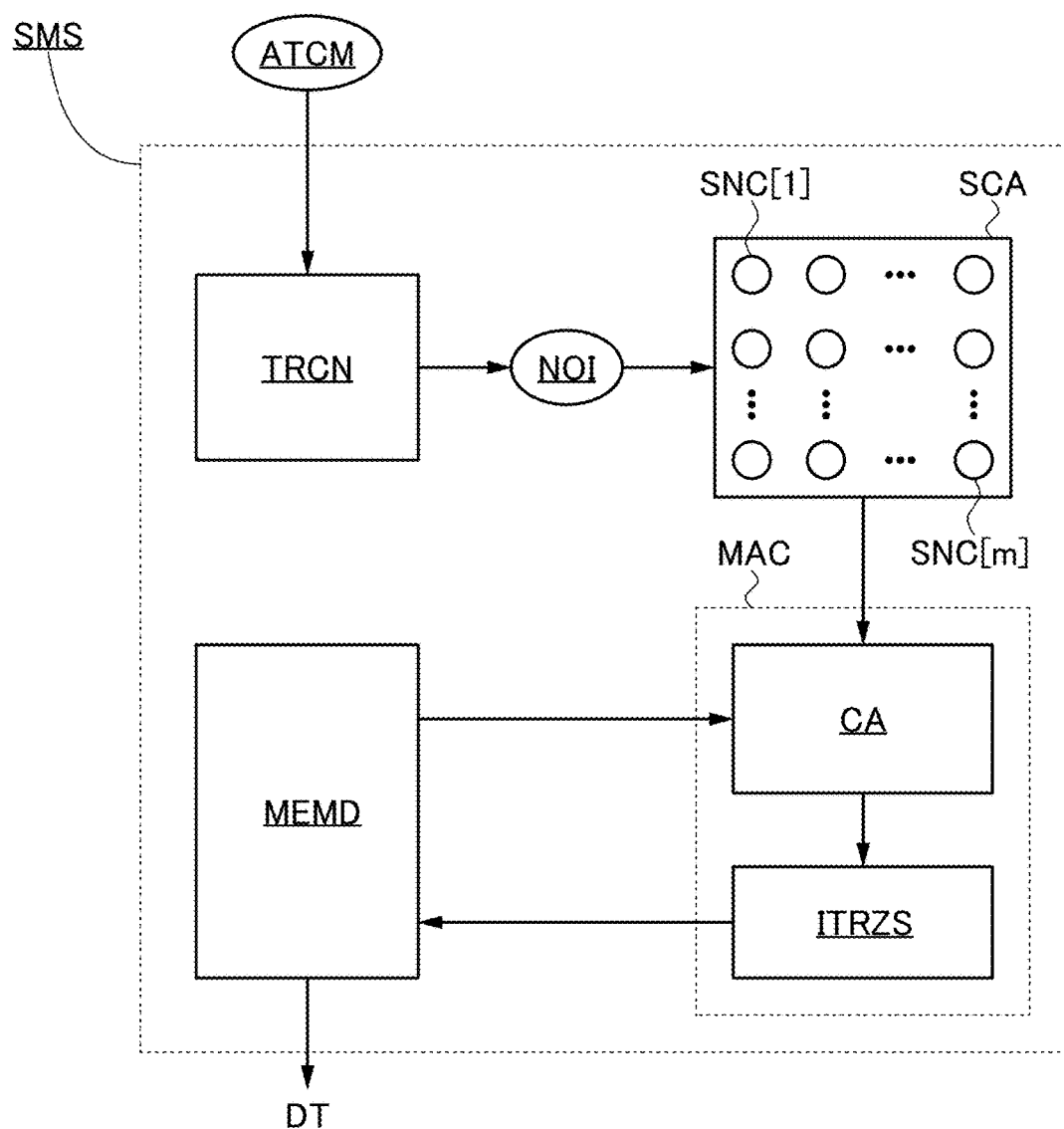
FIG. 19 is a block diagram illustrating a configuration example of an odor sensor.

FIG. 19 is a block diagram illustrating a configuration example of an odor sensor. An odor sensor SMS includes a path TRCN, the circuit SCA including a sensor, the arithmetic circuit MAC, and a memory portion MEMD.

The path TRCN is a path to send an atmospheric component ATCM to the circuit SCA. The path TRCN may have a function of selectively capturing only a targeted odor molecule and condensing it.

In the case where the path TRCN has the function, the path TRCN preferably includes a nano-level path, a nano-piller, a nanowire, or the like. When the path TRCN includes a nano-level path, a nanopiller, a nanowire, or the like, odor molecules unnecessary to be detected by the odor sensor SMS included in the atmospheric component ATCM can be removed. Thus, through the path TRCN, an odor component NOI which is a rest of the atmospheric component ATCM from which unnecessary odor molecules are removed can be sent to the circuit SCA.

Like the circuit SCA described in Embodiment 3, the circuit SCA includes the sensors SNC[1] to SNC[m], for example. The sensors SNC[1] to SNC[m] are arranged in a matrix in FIG. 19, for example. In FIG. 19, the sensors SNC[1] to SNC[m] are arranged in a matrix as an example; however, these are not necessarily arranged in a matrix. The sensors SNC[1] to SNC[m] can be arranged depending on circumstances.

In this embodiment, the sensors SNC[1] to SNC[m] illustrated in FIG. 19 are detector elements for detecting odor molecules. The sensors SNC[1] to SNC[m] can be sensors detecting the same odor components or sensors detecting different odor components. A plurality of sensors may sense the same odor components. An example of the sensors SNC[1] to SNC[m] is described later.

Any one of the arithmetic circuit MAC1 and the arithmetic circuit MAC1A described in Embodiment 1 and the arithmetic circuit MAC2 and the arithmetic circuit MAC3 described in Embodiment 2 can be used as the arithmetic circuit MAC.

As illustrated in FIG. 19, the arithmetic circuit MAC includes the cell array CA and a converter circuit ITRZS, for example. The cell array CA illustrated in FIG. 2, FIG. 7, FIG. 10, or FIG. 15 can be used as the cell array CA. In the case where the cell array CA illustrated in FIG. 2 is used as the cell array CA in FIG. 19, the configurations illustrated in FIG. 16A and FIG. 16B are referred to for the relation of the circuit SCA and the cell array CA. The converter circuit ITRZS in FIG. 19 collectively shows the converter circuits ITRZ[1] to ITRZ[n] in FIG. 2, the converter circuits ITRZ[1] to ITRZ[n] in FIG. 7, the converter circuit ITRZD[j] in FIG. 10, or the converter circuit ITRZD[j] in FIG. 15. In FIG. 19, the circuit WCS, the circuit WSD, the circuit SWS1, the circuit SWS2, and the like are omitted.

The memory portion MEMD has a function of storing the result of the calculation in the arithmetic circuit MAC, for example. The memory portion MEMD has a function of outputting the result as data DT to the outside of the odor sensor SMS. When the arithmetic circuit MAC performs operations repeatedly, the memory portion MEMD may have a function of temporarily storing data in the middle of the arithmetic operation.

Figure 20A:
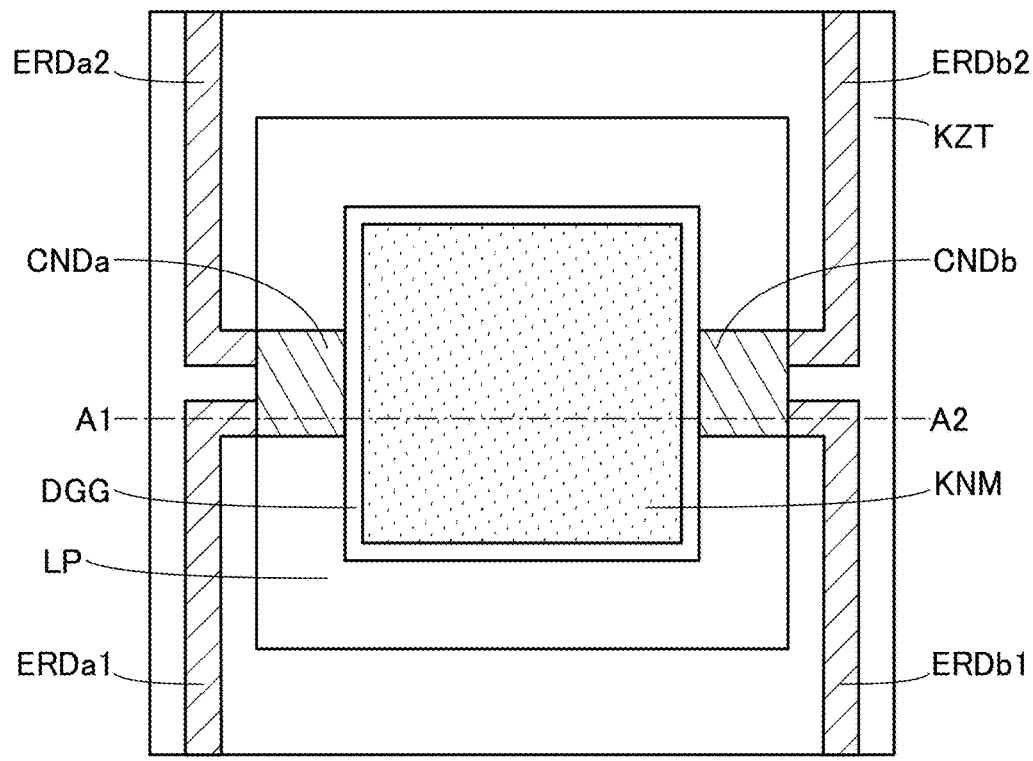
FIG. 20A is a plan view illustrating an example of a detector element included in an odor sensor.
Figure 20B:
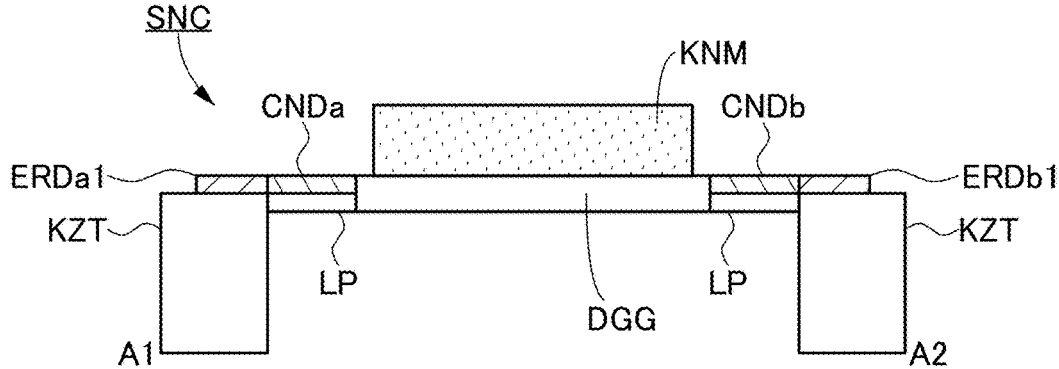
FIGS. 20B and 20C are cross-sectional views illustrating an example of the detector element included in the odor sensor.

The sensors SNC[1] to SNC[m] for detecting odor molecules can be, for example, the sensor SNC illustrated in FIGS. 20A and 20B. FIG. 20A shows a plan view of the sensor SNC, and FIG. 20B shows a cross-sectional view taken along the dashed-dotted line A1-A2 in FIG. 20A.

For example, the sensor SNC includes a structure body KZT, a wiring ERDa1, a wiring ERDa2, a wiring ERDb1, a wiring ERDb2, a strain gauge DGG, a connection portion LP, a conductor CNDa, a conductor CNDb, and a sensing film KNM.

The strain gauge DGG is connected to the structure body KZT through the connection portion LP. The sensing film KNM is provided on the strain gauge DGG.

The strain gauge DGG and the connection portion LP are preferably flexible insulators. As the structure body KZT, an insulator highly resistant to strain is preferable.

The sensing film KNM has a property of expanding and contracting when a specific odor molecule is attached.

The wiring ERDa1 and the wiring ERDa2 are positioned over the structure body KZT. The wiring ERDb1 and the wiring ERDb2 are also positioned over the structure body KZT.

The conductor CNDa and the conductor CNDb are positioned over the connection portion LP. The conductor CNDa is provided such that the wiring ERDa1 and the wiring ERDa2 are in the conduction state. Similarly, the conductor CNDb is provided such that the wiring ERDb1 and the wiring ERDb2 are in the electrical conduction state.

A constant voltage is applied between the wiring ERDa1 and the wiring ERDa2, for example. A current flows in the wiring ERDa1 and the wiring ERDa2 through the conductor CNDa, and the amount of the current is $I_a$. A constant voltage is also applied between the wiring ERDb1 and the wiring ERDb2, for example. A current flows in the wiring ERDb1 and the wiring ERDb2 through the conductor CNDb, and the amount of the current is $I_b$.

Figure 20C:
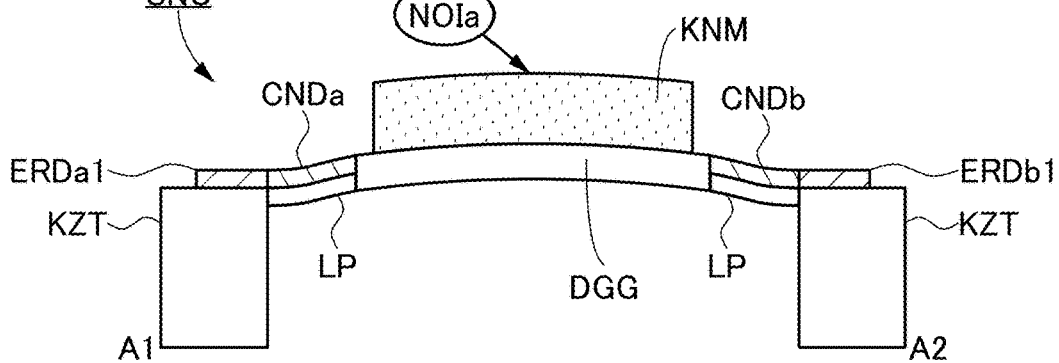

Here, a case where an odor molecule NOIa included in the odor component NOI sent from the path TRCN is attached to the sensing film KNM is considered. For example, when the odor molecule NOIa is attached to the sensing film KNM, the surface of the sensing film KNM which is not in contact with the strain gauge expands. Thus, as illustrated in FIG. 20C, strain is generated in the sensing film KNM and the strain gauge DGG, force is applied to the connection portion LP, the conductor CNDa, and the conductor CNDb, and the shapes of the connection portion LP, the conductor CNDa, and the conductor CNDb also change.

The shapes of the conductor CNDa and the conductor CNDb change, whereby the resistance values of the conductor CNDa and the conductor CNDb change. When the amount of change in the current flowing through the conductor CNDa is $\Delta I_a$ due to the change, the amount of current flowing through the wiring ERDa1 and the wiring ERDa2 is represented as $I_a - \Delta I_a$. Similarly, when the amount of change in the current flowing through the conductor CNDb is $\Delta I_b$ due to the change, the amount of current flowing through the wiring ERDb1 and the wiring ERDb2 is represented as $I_b + \Delta I_b$.

A current flowing from the sensor SNC may be one of the current flowing through the wiring ERDa1 and the wiring ERDa2 and the current flowing through the wiring ERDa1 and the wiring ERDa2. A current flowing from the sensor SNC may be the sum of the current flowing through the wiring ERDa1 and the wiring ERDa2 and the current flowing through the wiring ERDa1 and the wiring ERDa2. A current flowing from the sensor SNC may be the average of the current flowing through the wiring ERDa1 and the wiring ERDa2 and the current flowing through the wiring ERDa1 and the wiring ERDa2.

In FIG. 19, the current flowing from the sensor SNC flows into the cell array CA of the arithmetic circuit MAC. Specifically, as illustrated in FIG. 16A and FIG. 16B, currents from the sensors SNC[1] to SNC[m] flow to the wirings XCL[1] to XCL[m].

For example, the amount of current flowing from the sensor SNC[i] is $I_a[i]$ before the odor component NOI is attached to the sensing film KNM of the sensor SNC[i] (i is an integer more than or equal to 1 and less than or equal to m). Further, the current flows through the wiring XCL[i] between Time T13 and Time T14 in the timing chart in FIG. 9.

For example, the amount of current flowing from the sensor SNC[i] is $x[i]I_a[i]=I_a[i]+\Delta I_a[i]$ after the odor component NOI is attached to the sensing film KNM of the sensor SNC[i]. The current flows through the wiring XCL[i] between Time T22 and Time T23 in the timing chart in FIG. 9.

As described above, a current from the sensors SNC[1] to SNC[m] flows from the circuit SCA to the cell array CA in the arithmetic circuit MAC, a second data x[1] to x[m] corresponding to the odor component NOI can be input to the arithmetic circuit MAC. Thus, the product-sum operation of the first data stored in the cell IM in the cell array CA and the second data can be performed. In other words, the neural network arithmetic operation can be performed using the odor component NOI as an input data.

The arithmetic operation of the neural network is a pattern recognition algorithm to the odor component NOI. The first data (coefficient of weight) used in the neural network is stored in the node NN in the cell IM through the machine learning or the like. Thus, from the pattern of a current flowing from the circuit SCA to the cell array CA corresponding to the odor component NOI, the odor, the molecular size, the shape, and the like of the odor component NOI can be recognized and the result can be output as the data DT from the odor sensor SMS.

<Tactile Sensor>

Figure 21:
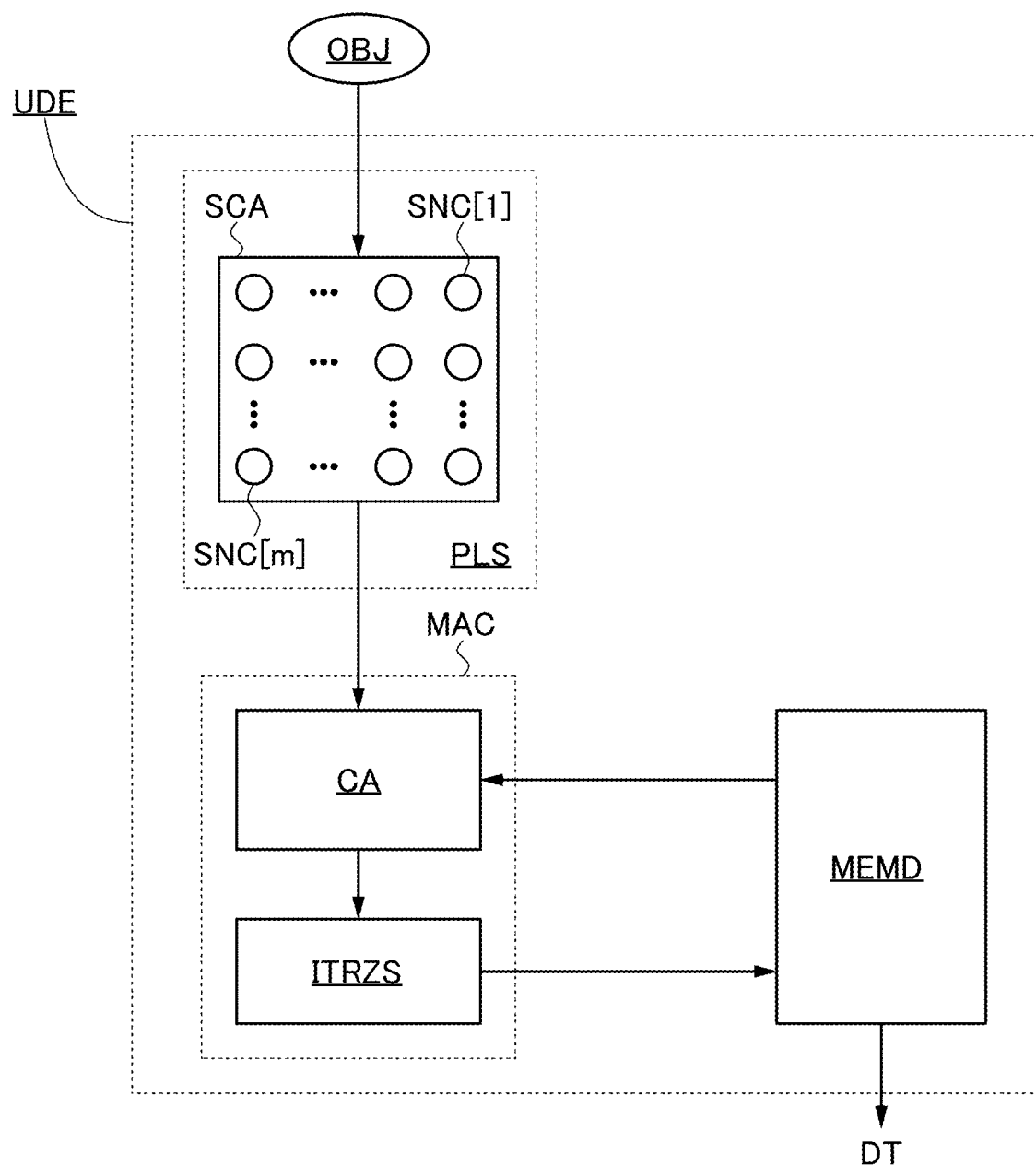
FIG. 21 is a block diagram illustrating a structure example of an electronic device including a pressure sensor or a tactile sensor.

FIG. 21 is a block diagram illustrating a configuration example of an electronic device including a tactile sensor. An electronic device UDE includes, for example, a sensor portion PLS functioning as a tactile sensor, the arithmetic circuit MAC, and the memory portion MEMD. The sensor portion PLS includes the circuit SCA, and as the circuit SCA, the circuit SCA described in Embodiment 3 can be used, for example.

As an example of the circuit SCA in FIG. 21, the sensors SNC[1] to SNC[m] are included in the circuit SCA as in the circuit SCA described in Embodiment 3. In FIG. 21, the sensors SNC[1] to SNC[m] are arranged in a matrix as an example; however, these are not necessarily arranged in a matrix. The sensors SNC[1] to SNC[m] can be arranged depending on circumstances.

The sensors SNC[1] to SNC[m] in FIG. 21 are pressure sensors, and detector elements detecting pressure from the outside. An object OBJ is illustrated in FIG. 21; the sensors SNC[1] to SNC[m] are in contact with the object OBJ, and a detection signal is sent to the arithmetic circuit MAC. The signal can be, for example, a voltage, a current, or a change thereof.

The arithmetic circuit MAC is a circuit as which one of the arithmetic circuit MAC1 and the arithmetic circuit MAC1A described in Embodiment 1 and the arithmetic circuit MAC2 and the arithmetic circuit MAC3 described in Embodiment 2 can be used.

As illustrated in FIG. 21, the arithmetic circuit MAC includes the cell array CA and the converter circuit ITRZS, for example. As the cell array CA and the converter circuit ITRZS in FIG. 21, the descriptions of the arithmetic circuit MAC in FIG. 19 are referred to.

The memory portion MEMD has a function of storing the result of a calculation in the arithmetic circuit MAC, for example. The memory portion MEMD has a function of outputting the result as the data DT to the outside of the electronic device UDE. When the arithmetic circuit MAC performs operations repeatedly, the memory portion MEMD may have a function of temporarily storing data in the middle of the arithmetic operation.

Figure 22A:
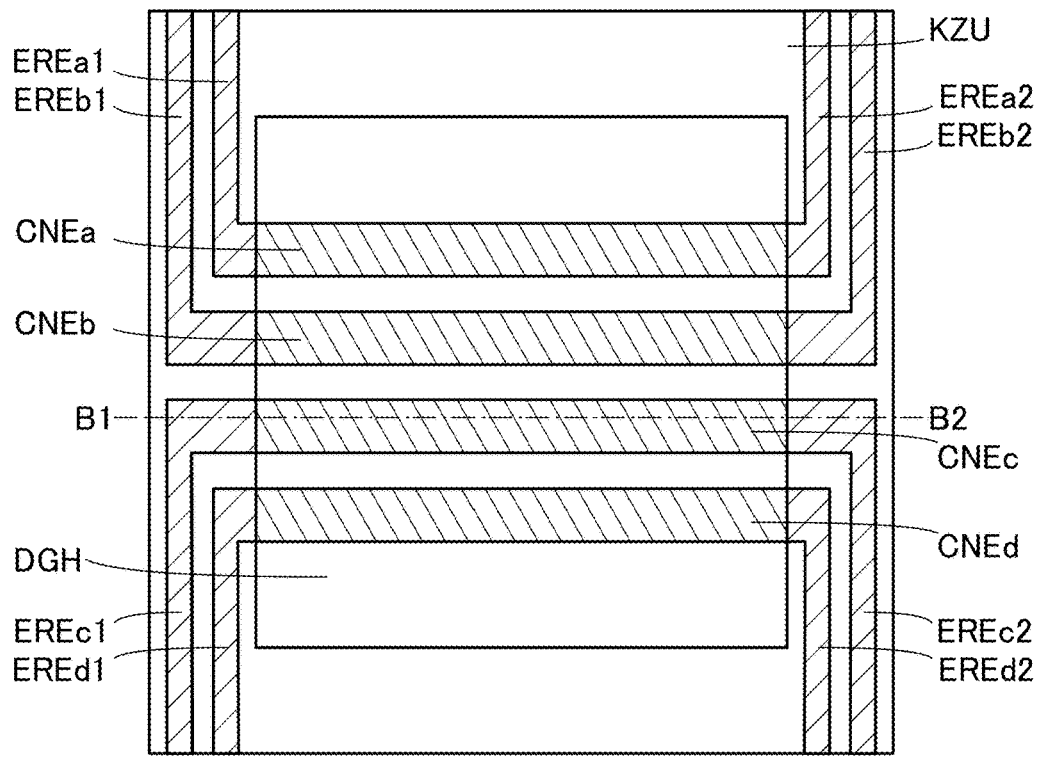
FIG. 22A is a plan view illustrating an example of a detector element included in a pressure sensor.
Figure 22B:
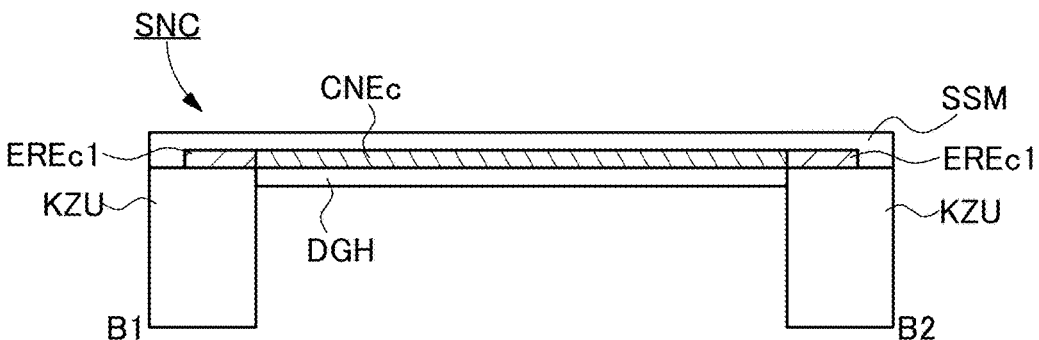
FIGS. 22B and 22C are cross-sectional views illustrating an example of the detector element included in the pressure sensor.

For example, the sensor SNC illustrated in FIG. 22A and FIG. 22B can be used as the sensors SNC[1] to SNC[m] included in the sensor portion PLS. FIG. 22A shows a plan view of the sensor SNC, and FIG. 22B is a cross-sectional view taken along the dashed-dotted line B1-B2 in FIG. 22A.

As an example, the sensor SNC includes a structure KZU, a wiring EREa1, a wiring EREa2, a wiring EREb1, a wiring EREb2, a wiring EREa1, a wiring EREc2, a wiring EREd1, a wiring EREd2, a conductor CNEa, a conductor CNEb, a conductor CNEc, a conductor CNEd, an insulator SSM, and a strain gauge DGH.

The strain gauge DGH is connected to the structure body KZU. The conductor CNEa, the conductor CNEb, the conductor CNEc, and the conductor CNEd are provided over the strain gauge DGH.

The wiring EREa1 and the wiring EREa2 are provided over the structure body KZU and in the conduction state with the conductor CNEa therebetween. The wiring EREb1 and the wiring EREb2 are provided over the structure body KZU to be in the conduction state with the conductor CNEb therebetween. The wiring EREc1 and the wiring EREc2 are provided over the structure body KZU to be in the conduction state with the conductor CNEc therebetween. The wiring EREd1 and the wiring EREd2 are provided over the structure body KZU to be in the conduction state with the conductor CNEd therebetween.

The insulator SSM is provided over the structure body KZU and the strain gauge DGH to cover the wiring EREa1, the wiring EREa2, the wiring EREb1, the wiring EREb2, the wiring EREc1, the wiring EREc2, the wiring EREd1, the wiring EREd2, the conductor CNEa, the conductor CNEb, the conductor CNEc, and the conductor CNEd. The insulator SSM is not illustrated in FIG. 22A.

The strain gauge DGH and the insulator SSM are preferably flexible insulators. As the structure body KZU, an insulator highly resistant to strain is preferable.

Figure 22C:
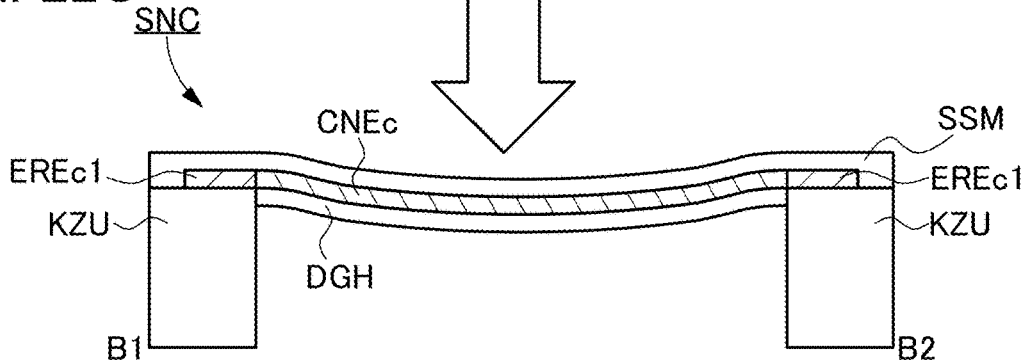

When force is applied from the outside in the sensor SNC illustrated in FIG. 22A and FIG. 22B, the sensor SNC distorts by applying force to the strain gauge DGH as illustrated in FIG. 22C. Thus, the conductor CNEa, the conductor CNEb, the conductor CNEc, the conductor CNEd, and the insulator SSM distorts with the strain gauge DGH, and the shapes of the conductor CNEa, the conductor CNEb, the conductor CNEc, the conductor CNEd, and the insulator SSM also change.

The shapes of the conductor CNEa, the conductor CNEb, the conductor CNEc, and the conductor CNEd change, and the resistance values of the conductor CNEa, the conductor CNEb, the conductor CNEc, and the conductor CNEd change. The resistance values of the conductor CNEa, the conductor CNEb, the conductor CNEc, and the conductor CNEd change after a pressure detection; the sensor SNC makes constant currents flow through the wiring EREa1, the wiring EREa2, the wiring EREb1, the wiring EREb2, the wiring EREa1, the wiring EREc2, the wiring EREd1, and the wiring EREd2 to the conductor CNEa, the conductor CNEb, the conductor CNEc, and the conductor CNEd, whereby the pressure can be detected by the changes of the voltages of the conductor CNEa, the conductor CNEb, the conductor CNEc, and the conductor CNEd.

Figure 23A:
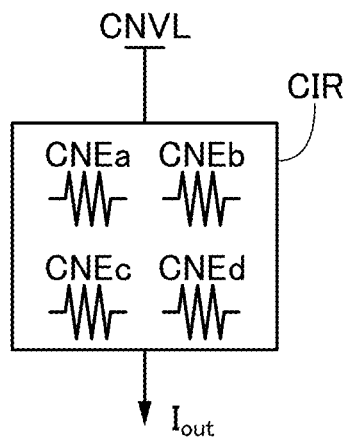
FIGS. 23A to 23C are circuit diagrams each illustrating an example of a circuit configuration included in a pressure sensor.

In the case where the sensor SNC is a tactile sensor, for example, the circuit illustrated in FIG. 23A can be used as the circuit including the conductor CNEa, the conductor CNEb, the conductor CNEc, and the conductor CNEd. A circuit CIR includes at least one of the conductor CNEa, the conductor CNEb, the conductor CNEc, and the conductor CNEd. The wiring CNVL functions as a wiring for supplying a constant voltage.

FIG. 23A illustrates a circuit configuration in which, when a constant voltage is supplied from the wiring CNVL to the circuit CIR, the output current $I_{out}$ can be obtained. When pressure is detected with the sensor SNC, the resistance values of the conductor CNEa, the conductor CNEb, the conductor CNEc, and the conductor CNEd change, and thus the current $I_{out}$ changes before/after the detection of the pressure.

Figure 23B:
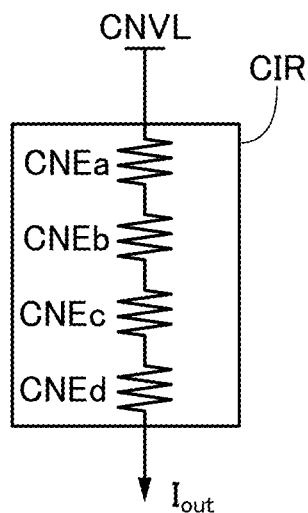
Figure 23C:
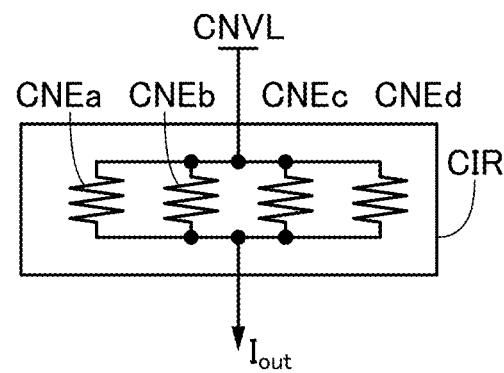

As a configuration example of the circuit CIR illustrated in FIG. 23A, the conductor CNEa, the conductor CNEb, the conductor CNEc, and the conductor CNEd may be electrically connected in series as illustrated in FIG. 23B. The conductor CNEa, the conductor CNEb, the conductor CNEc, and the conductor CNEd may be electrically connected in parallel as illustrated in FIG. 23C.

The current $I_{out}$ output from the circuit CIR in FIG. 23A is input to the arithmetic circuit MAC in FIG. 21. Specifically, for example, the amount of current flowing from the sensor SNC[i] is $I_{out}[i]$ before pressure is detected by the sensor SNC[i] (i is an integer more than or equal to 1 and less than or equal to m). Furthermore, the current flows through the wiring XCL[i] between Time T13 and Time T14 in the timing chart in FIG. 9.

For example, the amount of current flowing from the sensor SNC[i] is $x[i]I_{out}[i]=I_{out}[i]+\Delta I_{out}[i]$ after pressure is detected by the sensor SNC[i]. The current flows through the wiring XCL[i] between Time T22 and Time T23 in the timing chart in FIG. 9.

As described above, a current from the sensors SNC[1] to SNC[m] flows from the circuit SCA to the cell array CA in the arithmetic circuit MAC, whereby the second data x[1] to x[m] corresponding to the pressure detected with the sensors SNC[1] to SNC[m] can be input to the arithmetic circuit MAC. Thus, the product-sum operation of the first data stored in the cell IM in the cell array CA and the second data can be performed. In other words, the neural network arithmetic operation can be performed using a pressure as an input data.

The structure of the electronic device of one embodiment of the present invention is not limited to the structure of the electronic device UDE in FIG. 21, which includes the sensor SNC illustrated in FIG. 22A and FIG. 22B as the sensor SNC provided to the sensor portion PLS. For example, a circuit that can be used in the sensor portion PLS of the electronic device UDE in FIG. 21 may have a configuration of a sensor portion PLSA illustrated in FIG. 24A.

Figure 24A:
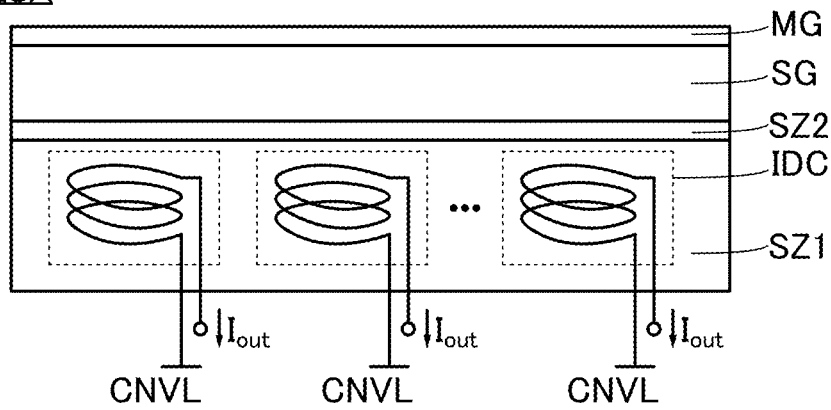
FIGS. 24A and 24B are schematic cross-sectional views illustrating a structure example of a tactile sensor.

The sensor portion PLSA illustrated in FIG. 24A includes an insulator SZ1, a coil IDC, an insulator SZ2, a material SG, and a material MG.

The coil IDC functioning as the sensor SNC is embedded in the insulator SZ1. The insulator SZ2 is provided over the insulator SZ1, the material SG is provided over the insulator SZ2, and the material MG is provided over the material SG.

One terminal of the coil IDC is, for example, electrically connected to the wiring CNVL. The wiring CNVL functions as a wiring for supplying a constant voltage, like the wiring CNVL in FIG. 23A to FIG. 23C. Thus, when the wiring CNVL supplies a constant voltage and a voltage is generated between one terminal and the other terminal of the coil IDC, a steady current $I_{out}$ is generated between one terminal and the other terminal of the coil IDC after a sufficient period.

The material SG is preferably an elastic material, specifically, elastomer. Specifically, for example, a synthetic resin such as silicone rubber can be used as the material SG.

As a material for the material MG, for example, elastomer including a metal material emitting magnetism is preferably used. Specifically, thermosetting elastomer including a metal material emitting a magnetic field (e.g., metal powder) can be used as the material MG.

As the insulator SZ2, an insulator that does not block the magnetic field generated by the metal material included in the material MG is preferably used, for example.

In the sensor portion PLSA illustrated in FIG. 24A, when the shape of the material MG is changed by pushing or the like, the position of the metal material included in the material MG changes. The position of the metal material changes, whereby the magnetic field generated by the metal material changes; thus, in the coil IDC near the metal material whose position changes, electromotive force through electromagnetic induction is generated.

Figure 24B:
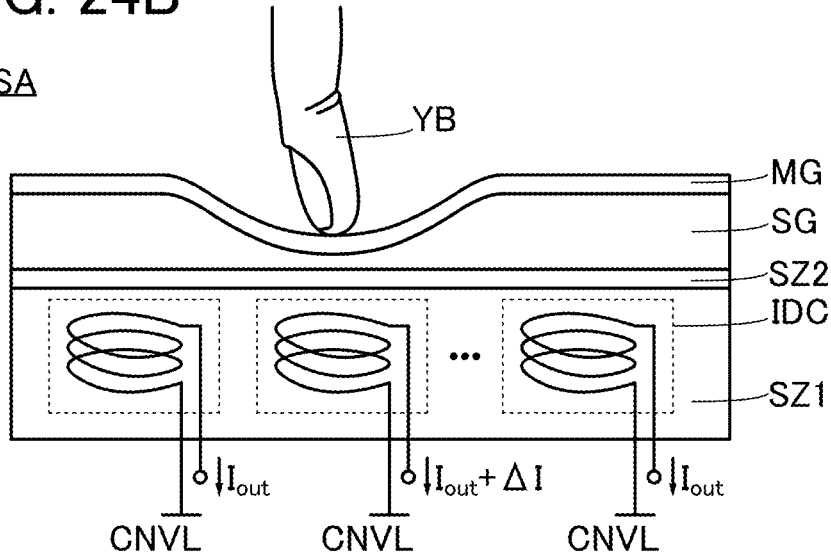

For example, when the material MG is dented by pushing of a finger YB, the position of the metal material included in the material MG changes and the magnetic field generated by the metal material changes; thus, in the coil IDC near the finger YB, electromotive induction occurs, as illustrated in FIG. 24B. Accordingly, electromotive force is generated in the coil IDC near the finger YB.

At this time, the amount of steady current flowing in the coil IDC temporarily changes. For example, when the amount of change in a current flowing through the coil IDC near the finger YB is ΔI, the amount of current flowing between one terminal and the other terminal of the coil IDC is $I_{out}+\Delta I$. At this time, x satisfying $xI_{out}=I_{out}+\Delta I$ is defined.

The currents $I_{out}$ and $I_{out}+\Delta I$ output from the tactile sensor illustrated in FIG. 24A and FIG. 24B are input to the arithmetic circuit MAC in FIG. 21. Specifically, before an object touches the tactile sensor, the current amount $I_{out}$ flows from the tactile sensor to the wiring XCL. The current flows through the wiring XCL between Time T13 and Time T14 in the timing chart in FIG. 9.

Then an object touches the tactile sensor, for example, the current amount $I_{out}+\Delta I$ flows from the tactile sensor to the wiring XCL. The current flows through the wiring XCL[i] between Time T22 and Time T23 in the timing chart in FIG. 9.

As described above, a current from the tactile sensor in FIG. 24A as the sensors SNC[1] to SNC[m] flows from the circuit SCA to the cell array CA in the arithmetic circuit MAC, whereby the second data x[1] to x[m] corresponding to the shape of the object touching the sensors SNC[1] to SNC[m] can be input to the arithmetic circuit MAC. Thus, the product-sum operation of the first data stored in the cell IM in the cell array CA and the second data can be performed. In other words, the neural network arithmetic operation can be performed using the shape of an object as an input data.

<<Application Example of Tactile Sensor>>

Next, an application example of the electronic device UDE in FIG. 21 for which a tactile sensor is used as the sensor portion PLS is described.

Figure 25A:
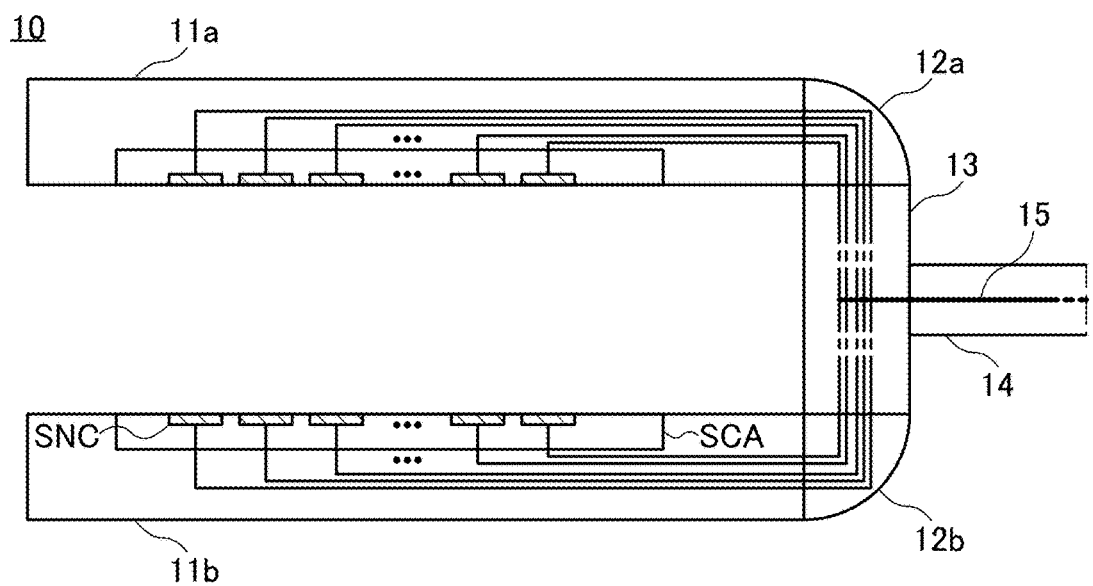

FIG. 25A shows a configuration example where the electronic device UDE is used in a hand portion of an industrial manipulator. Specifically, the circuit SCA included in the electronic device UDE in FIG. 21 is embedded in a finger portion 11a and a finger portion 11b of a hand portion 10 in FIG. 25A to expose the sensors SNC to the outside.

The hand portion 10 includes the finger portion 11a, the finger portion 11b, a joint portion 12a, a joint portion 12b, an extending portion 13, a support portion 14, and a bus wiring 15, for example.

For example, the finger portion 11a and the finger portion 11b function as part to hold an object. The hand portion 10 is configured to have a structure for holding an object in FIG. 25A; however, one embodiment of the present invention is not limited to the structure of the hand portion 10. For example, the hand portion 10 may be configured to push an object in one direction with the finger portion 11a or the finger portion 11b (not illustrated).

The joint portion 12a has a function of changing an angle formed between the finger portion 11a and the extending portion 13, for example. Similarly, the joint portion 12b has a function of changing an angle formed between the finger portion 11b and the extending portion 13, for example. The joint portion 12a and the joint portion 12b change the angles formed between the finger portion 11a and the finger portion 11b and the extending portion 13, whereby an object can be held with the finger portion 11a and the finger portion 11b.

The extending portion 13 has a function of adjusting the length between the joint portion 12a and the joint portion 12b, for example. The length of the extending portion 13 can be adjusted to the size of an object held with the hand portion 10.

The support portion 14 has a function of supporting the entire hand portion 10, for example. The support portion 14 can include, for example, a mechanism to make the hand portion 10 closer to an object, a driving shaft to direct the hand portion 10 to an object, and the like, which are not illustrated in FIGS. 25A to 25C.

A plurality of sensors SNC of the circuit SCA provided in the finger portion 11a and the finger portion 11b are electrically connected to the bus wiring 15 for supplying a current and/or a voltage. The wiring is provided inside the finger portion 11a, the finger portion 11b, the joint portion 12a, the joint portion 12b, the extending portion 13, and the support portion 14 as an example. It is particularly preferable that a current flowing at the time when the sensors SNC detect a change in pressure or a touch of an object is input to the main device of the hand portion (not illustrated) or the wirings XCL[1] to XCL[m] (see FIG. 16A and FIG. 16B) of the arithmetic circuit MAC included in the main device through the bus wiring 15. Thus, the bus wiring 15 is preferably electrically connected to the wirings XCL[1] to XCL[m] of the arithmetic circuit MAC.

An operation example of the hand portion 10 holding an object is described.

Figure 25B:
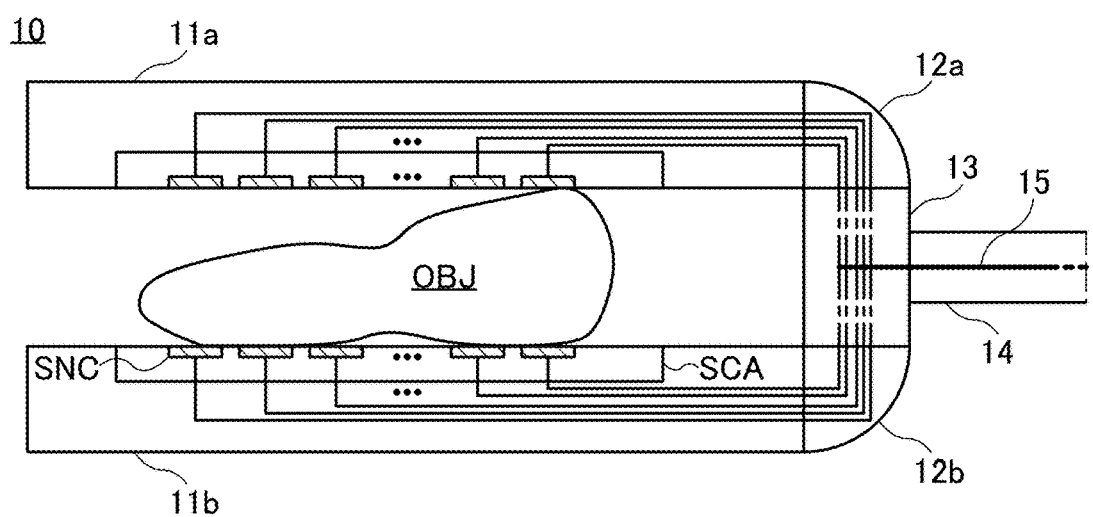

FIG. 25B shows the hand portion 10 holding the object OBJ. At this time, a detectable region of the sensor SNC of the circuit SCA provided for the finger portion 11a and the finger portion 11b touches the object OBJ, whereby the amount of current flowing from the sensor SNC touching the object OBJ to the main device through the bus wiring 15 changes. Through the change of the current amount, the main device can recognize that the object OBJ touches the finger portion 11a and/or the finger portion 11b of the hand portion 10.

Not to drop the object OBJ held with the finger portion 11a and the finger portion 11b, it is necessary that the shape of the object OBJ is recognized with the main device and the joint portion 12a, the joint portion 12b, the joint portion 13, and the like are adjusted in accordance with the shape of the object OBJ. For example, as illustrated in FIG. 25B, the hand portion 10 holds the object OBJ with the finger portion 11a and the finger portion 11b parallel to each other; depending on the shape of the object OBJ, the circuit SCA includes the sensor SNC not touching the object OBJ. The amount of current flowing from the sensor SNC not touching the object OBJ to the main device through the bus wiring 15 does not change; thus, the main device can recognize that the finger portion 11a and/or the finger portion 11b of the hand portion 10 does not touch the object OBJ.

Thus, with the amount of change in a current flowing from each of the plurality of sensors SNC of the circuit SCA included in the finger portion 11a and the finger portion 11b to the bus wiring 15, the region where the object OBJ touches the circuit SCA of the finger portion 11a and the finger portion 11b can be represented. Thus, a current flows from the plurality of sensors SNC through the bus wiring 15 to the arithmetic circuit MAC, whereby the region can be regarded as an input data to the arithmetic circuit MAC.

The sensors SNC included in the circuit SCA of the finger portion 11a and the finger portion 11b are the sensors SNC[1] to SNC[m] (m is an integer more than or equal to 1). In FIG. 25A, a current output from the sensor SNC[i] (i is an integer more than or equal to 1 and less than or equal to m) is $I_{out}[i]$ and in FIG. 25B, a current output from the sensor SNC[i] is $x[i]I_{out}[i]$. At this time, the region of the circuit SCA of the finger portion 11a and the finger portion 11b touching the object OBJ can be represented with x[1] to x[m]. By inputting x[1] to x[m] to the arithmetic circuit MAC as the second data, a product-sum operation of the first data stored in the cell IM in the cell array CA and the second data can be performed. That is, an arithmetic operation of the neural network can be performed using the input data of the region where the circuit SCA of the finger portion 11a and the finger portion 11b touches the object OBJ and where the circuit SCA does not touch the object OBJ.

The arithmetic operation of the neural network uses a pattern recognition algorithm for the region where the circuit SCA of the finger portion 11a and the finger portion 11b touches the object held by the hand portion 10 and where the circuit SCA does not touch the object held by the hand portion 10. The first data (coefficient of weight) used in the neural network is stored in the node NN in the cell IM through the machine learning or the like. Thus, from the patterns of currents flowing from the circuit SCA to the cell array CA corresponding to the region where the circuit SCA of the finger portion 11a and the finger portion 11b touches the object held by the hand portion 10 and where the circuit SCA does not touch the object held by the hand portion 10, the shape, size, and the like of the object OBJ can be recognized.

Data of the object OBJ recognized with a pattern recognition may be fed back, and the hand portion 10 can change the way of holding the object OBJ. Specifically, from the recognized object OBJ data, the joint portion 12a, the joint portion 12b, the extending portion 13, and the like can be adjusted in accordance with the shape of the object OBJ. Thus, as illustrated in FIG. 25C, the hand portion 10 can more stably hold the object OBJ than that in FIG. 25B.

Figure 25C:
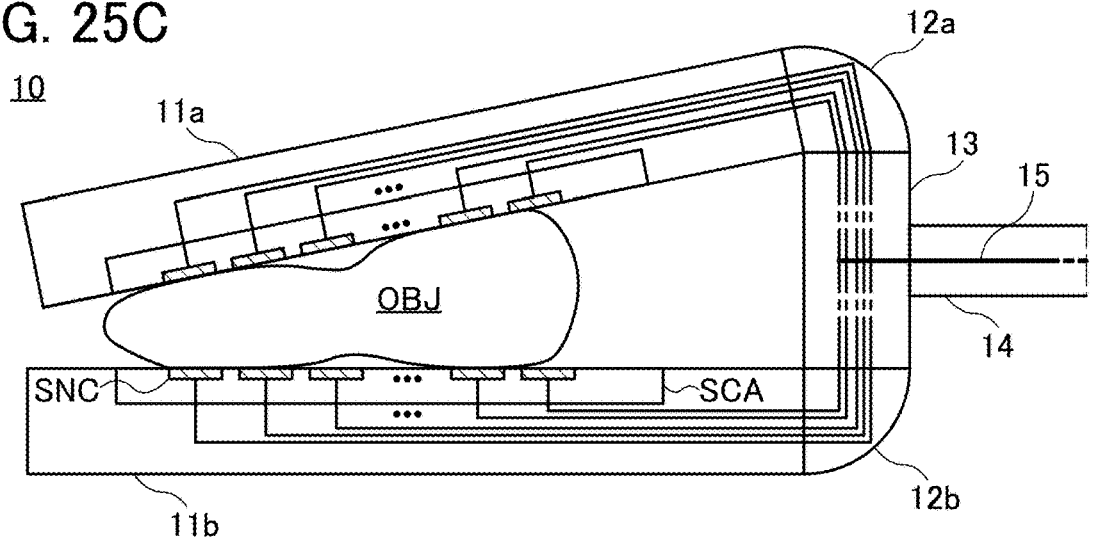

A hand portion of an industrial manipulator is not limited to the hand portion 10 in FIG. 25A to FIG. 25C. For example, the hand portion of an industrial manipulator may have a structure illustrated in FIG. 26A.

Figure 26A:
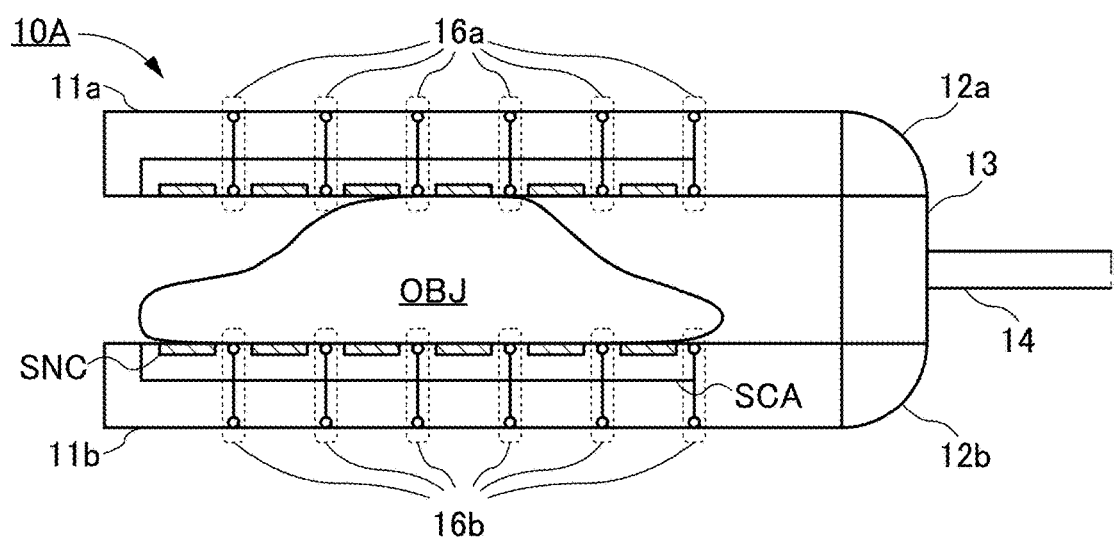

A hand portion 10A illustrated in FIG. 26A differs from the hand portion 10 in FIG. 25A in that a plurality of joint portions 16a is included in the finger portion 11a and a plurality of joint portions 16b is included in the finger portion 11b. FIG. 26A illustrates that the object OBJ is held with the finger portion 11a and the finger portion 11b.

The joint portion 16a and the joint portion 16b included in the finger portion 11a and the finger portion 11b may be one, not plural. In FIG. 26A, the joint portion 16a or the joint portion 16b is provided between different sensors SNC; the position of the joint portion 16a or the joint portion 16b can be decided freely in accordance with an object held with the hand portion 10A.

In FIG. 26A, the bus wiring 15 electrically connected to the plurality of sensors SNC is omitted.

The joint portion 16a and the joint portion 16b in FIG. 26A have mechanisms to bend the finger portion 11a and the finger portion 11b to the inside or the outside. Thus, the hand portion 10A can change the shapes of the finger portion 11a and the finger portion 11b depending on the shape of the object held.

Figure 26B:
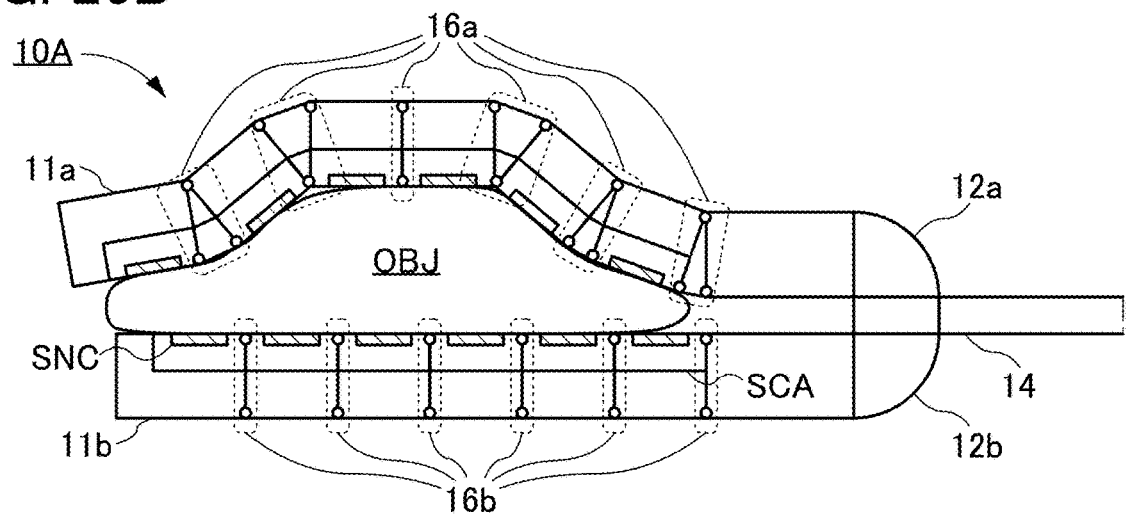

For example, as in the case of FIG. 25B and FIG. 25C described above, the shape of the object OBJ is calculated with the plurality of sensors SNC included in the circuit SCA and the arithmetic circuit MAC, and the joint portion 16a of the finger portion 11a and the joint portion 16b of the finger portion 11b can be adjusted to the calculated data at the step of FIG. 26A. Thus, as illustrated in FIG. 26B, the hand portion 10A can more stably hold the object OBJ than that in FIG. 26A.

The electronic device of one embodiment of the present invention can be used for a device or the like in addition to the above-described manipulator. For example, the electronic device of one embodiment of the present invention can be used for a medical device for a palpation or the like.

<Test Sensor>

Figure 27:
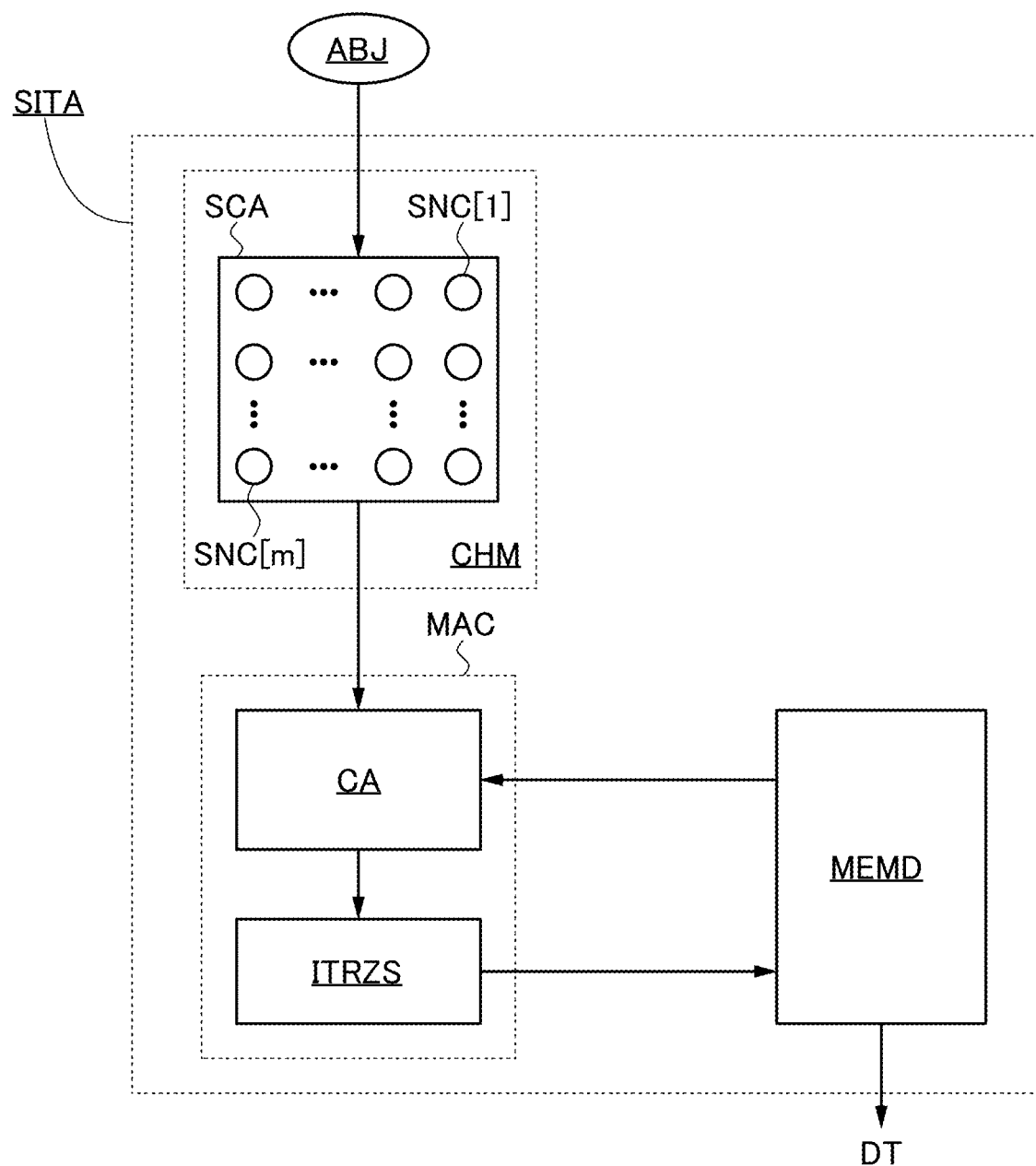
FIG. 27 is a block diagram illustrating a structure example of an electronic device including a taste sensor.

FIG. 27 is a block diagram illustrating a structure example of an electronic device including a taste sensor. As an example, an electronic device SITA includes a sensor portion CHM functioning as a taste sensor, the arithmetic circuit MAC, and the memory portion MEMD. The sensor portion CHM includes the circuit SCA, and the circuit SCA in Embodiment 3 can be used as the circuit SCA, for example.

As an example of the circuit SCA in FIG. 27, the sensors SNC[1] to SNC[m] are included in the circuit SCA as in the circuit SCA described in Embodiment 3. The sensors SNC [1] to SNC[m] are arranged in a matrix as in FIG. 27 as an example; however, the sensors SNC[1] to SNC[m] are not necessarily arranged in a matrix. The sensors SNC[1] to SNC[m] can be arranged depending on circumstances.

The sensors SNC[1] to SNC[m] in FIG. 27 are taste sensors and detection elements detecting a specific taste component included in an evaluated material. A specific taste component is a material giving a human tongue a reaction of five basic tastes, spiciness, astringency, and the like. An evaluated object ABJ is illustrated in FIG. 27; the sensors SNC[1] to SNC[m] touch the evaluated object ABJ, and a detection signal is sent to the arithmetic circuit MAC. The signal can be, for example, a voltage, a current, or a change thereof.

The arithmetic circuit MAC can have a configuration similar to that of the arithmetic circuit MAC described in the odor sensor or the tactile sensor. For the arithmetic circuit MAC in FIG. 27, the arithmetic circuit MAC described in the odor sensor or the tactile sensor is referred to.

The memory portion MEMD can have a configuration similar to that of the memory portion MEMD described in the odor sensor or the tactile sensor. For the memory portion MEMD in FIG. 27, the memory portion MEMD described in the odor sensor or the tactile sensor is referred to.

Figure 28A:
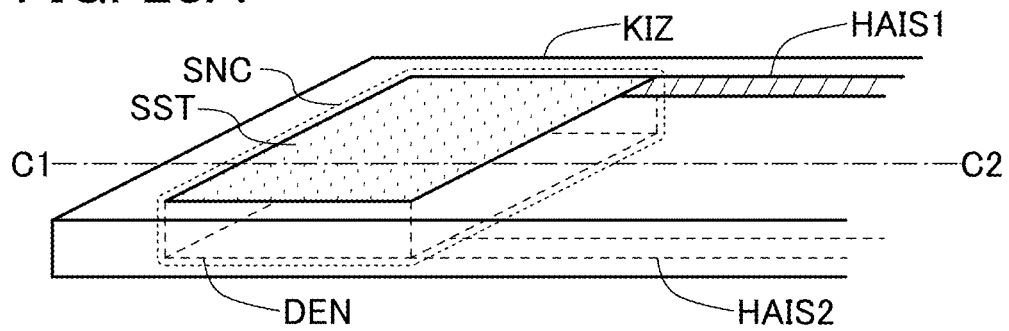
FIG. 28A is a perspective view illustrating a structure example of an electronic device including a taste sensor.
Figure 28B:
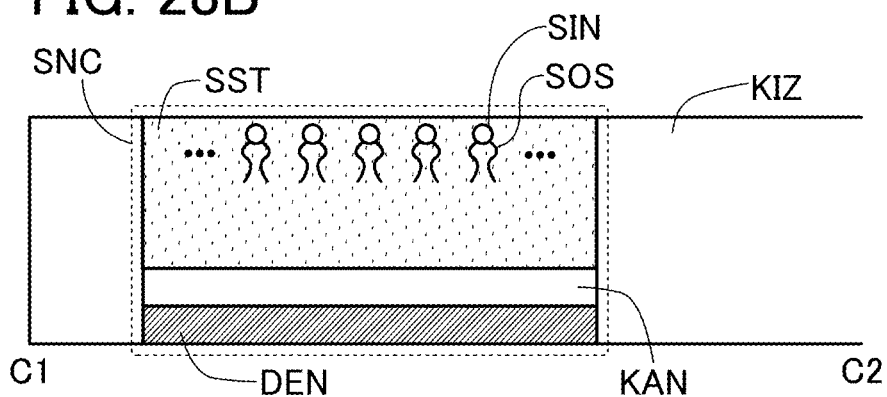
FIG. 28B is a cross-sectional view illustrating a structure example of the taste sensor.

Next, the sensors SNC[1] to SNC[m] included in the sensor portion CHM are described. The sensor SNC illustrated in FIG. 28A and FIG. 28B can be used as the sensors SNC[1] to SNC[m], for example. FIG. 28A is a perspective view of a structure example of a sensing element including the sensor SNC. FIG. 28B is a cross-sectional view taken along the dashed-dotted line C1-C2 in FIG. 28A.

The sensor SNC in FIG. 28A is, for example, mounted on a base material KIZ. The sensor SNC is electrically connected to a wiring HAIS1 and a wiring HAIS2.

As an example, the sensor SNC includes a lipid film SST, a buffer film KAN, and a reference electrode DEN as illustrated in FIG. 28B. The reference electrode DEN is provided to overlap with the lipid film SST with the buffer film KAN therebetween in FIG. 28B; the reference electrode DEN and the lipid film SST do not necessarily overlap.

When the lipid film SST touches a taste component, the lipid film SST functions as a sensor electrode to obtain a potential corresponding to the taste component, and includes lipid, plasticizer, polyvinyl chloride, and the like. The lipid includes a lipid molecule including a hydrophilic portion SIN and a hydrophobic portion SOS as an example. As illustrated in FIG. 28B, water or reference solution soaks the lipid film SST and lipid molecules are automatically aligned such that the hydrophilic portion SIN points to the outside of the film and the hydrophobic portion SOS points to the inside of the film in the vicinity of the surface of the lipid film SST. As the reaction of the lipid film SST to a taste material, a surface charge density, a surface potential, a connection proportion of hydrogen ions, and the like change and thus the potential of the lipid film SST changes.

In the lipid film SST, kinds of lipid and a plasticizer are changed or a ratio of lipid and a plasticizer is adjusted depending on taste components, e.g., sweetness, bitterness, sourness, savoriness, saltiness, spiciness, and, astringency, that are sensed. For example, in the case of a sensor sensing a taste component giving a human tongue astringency, the hydrophobic property of the lipid film SST is improved by decreasing the amount of lipid including charges. For example, in the case of a sensor sensing a taste component giving a human tongue saltiness, the hydrophilic property of the lipid film SST is improved by increasing the amount of lipid including charges to easily cause electrostatic reaction with ions.

The buffer film KAN has a function of preventing a transfer of charges between the lipid film SST and the reference electrode DEN. Thus, the buffer film KAN is preferably an insulator.

The reference electrode DEN functions as an electrode to obtain a reference potential of a corresponding taste component.

The lipid film SST is electrically connected to the wiring HAIS1, for example. The reference electrode DEN is electrically connected to the wiring HAIS2, for example.

The sensor SNC in FIG. 28A and FIG. 28B are soaked with a solution and the like including the evaluated material ABJ, whereby a potential difference is caused between the lipid film SST and the reference electrode DEN. The potential difference is determined with the evaluated material ABJ and the concentration of the solution; thus, the potential difference may be analyzed when the taste of the evaluated material ABJ is determined.

Figure 28C:
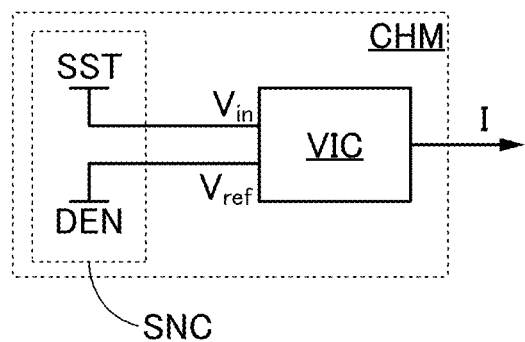
FIG. 28C is a block diagram illustrating a configuration example of a circuit included in the electronic device.

In particular, when the difference between the potentials obtained with the electronic device SITA in FIG. 27 is analyzed, it is preferable that the potential difference be converted into a current value to be input to the arithmetic circuit MAC. For example, the sensor portion CHM preferably has a structure illustrated in a block diagram illustrated in FIG. 28C, in which a potential $V_{in}$ obtained with the lipid film SST and a potential $V_{ref}$ obtained with the reference electrode DEN are input to a voltage-current converter circuit VIC, and the voltage-current converter circuit VIC outputs a current I in accordance with the potential difference between $V_{in}$ and $V_{ref}$. The current I is input to the arithmetic circuit MAC from the sensor portion CHM in the electronic device SITA in FIG. 27.

The voltage-current converter circuit VIC includes two input terminals and one output terminal, and has a function of converting the potential difference between the potentials input to the two input terminals into a current and outputting the current to the output terminal.

For example, $I_{out}[i]$ represents a current output from the output terminal of the voltage-current converter circuit VIC before a solution and the like including the evaluated material ABJ soaks the sensor SNC[i] in FIG. 27. The current $I_{out}[i]$ flows through the wiring XCL[i] between Time T13 and Time T14 in the timing chart in FIG. 9. "Before a solution and the like including the evaluated material ABJ soaks the sensor SNC[i]" includes the case where the sensor SNC[i] is in contact with the outside air, the case where the sensor SNC[i] is in contact with a reference liquid (e.g., a solution not including the evaluated material ABJ, e.g., pure water), and the like.

For example, a current output from the output terminal of the voltage-current converter circuit VIC is $x[i]I_{out}[i]=I_{out}[i]+\Delta I_{out}[i]$ before the sensor SNC[i] in FIG. 27 is soaked with a solution including the evaluated material ABJ. The current flows through the wiring XCL[i] between Time T22 and Time T23 in the timing chart in FIG. 9.

As described above, a current from the sensors SNC[1] to SNC[m] flows from the circuit SCA to the cell array CA in the arithmetic circuit MAC, whereby the second data x[1] to x[m] corresponding to a plurality of pieces of taste data detected by the sensors SNC[1] to SNC[m] can be input to the arithmetic circuit MAC. Thus, the product-sum operation of the first data stored in advance in the cell IM in the cell array CA and the second data can be performed. In other words, the neural network arithmetic operation can be performed using a plurality of pieces of taste data as input data.

The arithmetic operation of the neural network uses a pattern recognition algorithm for a plurality of pieces of taste data detected with the sensors SNC[1] to SNC[m]. The first data (coefficient of weight) used in the neural network is stored in the node NN in the cell IM through the machine learning or the like. Thus, from the pattern of a current flowing from the circuit SCA to the cell array CA, corresponding to the evaluated material ABJ, what type of taste is given to a human tongue by the evaluated material ABJ can be recognized and the result can be output from the electronic device SITA as the data DT.

Figure 29A:
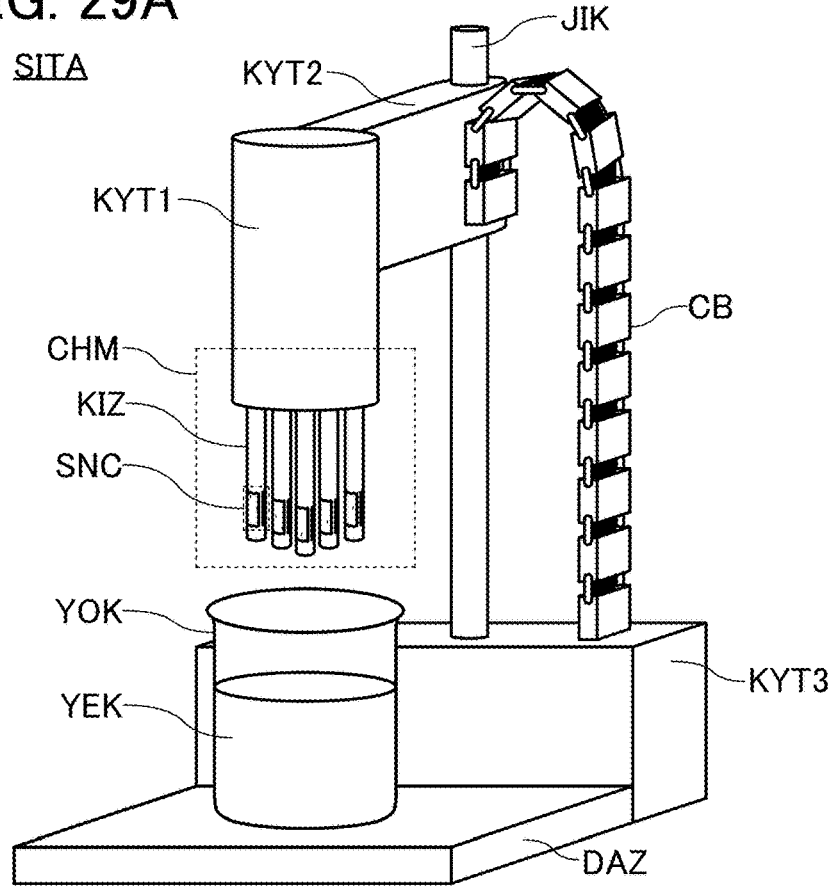
FIG. 29A is a perspective view illustrating a structure example of an electronic device including a taste sensor.

FIG. 29A is a perspective view of an example of the electronic device SITA in FIG. 27. In the electronic device SITA in FIG. 29A, a plurality of sensors SNC and a plurality of base materials KIZ in FIG. 28A and FIG. 28B are provided as the sensor portion CHM; when the electronic device SITA operates, the plurality of sensors SNC are soaked with a solution YEK including the evaluated material ABJ. The electronic device SITA has a function of sensing plural kinds of taste components included in the evaluated material ABJ with the plurality of sensors SNC in a single driving of the electronic device SITA.

The electronic device SITA in FIG. 29A includes a first housing KYT1, a second housing KYT2, a third housing KYT3, an axis JIK, a base DAZ, and a cable bare (registered trademark) CB in addition to the sensor SNC and the base material KIZ. FIG. 29A also illustrates a container YOK and the solution YEK including the evaluated material ABJ.

Figure 29B:
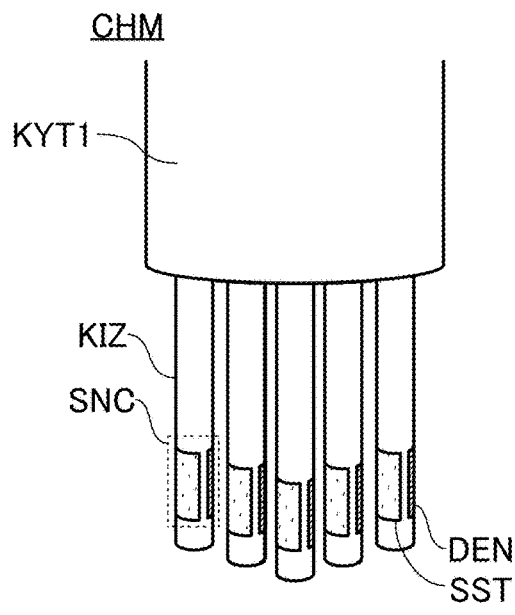
FIGS. 29B and 29C are perspective views each illustrating a structure example of a plurality of taste sensors included in the electronic device.

FIG. 29B is an enlarged view of the sensor portion CHM of the electronic device SITA in FIG. 29A. The first housing KYT1 is a structure body to which a plurality of base materials KIZ with the sensor SNC can be attached as illustrated in FIG. 29B. One of the plurality of sensors SNC can be a sensor that detects a taste selected from one of the five basic tastes, spiciness, astringency, and the like. For example, sweetness and the like includes a plurality of taste components such as sucrose, xylitol, synthetic sweetener; the base material KIZ with the sensor SNC for each taste component to be detected is prepared. In this manner, each of a plurality of sensors SNC is a taste sensor detecting a different taste, whereby the plurality of sensors SNC can detect the taste components included in the evaluated material ABJ in a single driving of the electronic device SITA.

The first housing KYT1 can have a structure in which the wiring HAIS1 and the wiring HAIS2 illustrated in FIG. 28A are electrically connected to the internal circuit of the first housing KYT1. The first housing KYT1 and the wiring HAIS2 are not illustrated in FIG. 29B. The first housing KYT1 is structurally connected to the second housing KYT2. The electronic device SITA illustrated in FIG. 29A may have a structure in which the first housing KYT1 and the second housing KYT2 are collectively provided. The wiring HAIS1 and the wiring HAIS2 provided in the base material KIZ are electrically connected to the second housing KYT2 through the first housing KYT1.

The second housing KYT2 is a structure body which can perform an elevation and a descent along the axis JIK. For example, the second housing KYT2 includes a component for operation such as a motor, and with the component, the second housing KYT2 itself can be elevated or descended. The second housing KYT2 is elevated or descended along the axis JIK, whereby the first housing KYT1 can be elevated or descended at the same time. Thus, the sensors SNC attached to the plurality of base materials KIZ can be moved up and down.

The base DAZ and the axis JIK are structurally connected to the third housing KYT3. The third housing KYT3 may have a function of controlling the elevation and descent of the second housing KYT2. In this case, a wiring electrically connecting the third housing KYT3 and the second housing KYT2 is preferably provided.

The third housing KYT3 includes the arithmetic circuit MAC and the memory portion MEMD illustrated in FIG. 27. In this case, a wiring electrically connecting the third housing KYT3 and the sensor SNC is preferably provided. That is, the electronic device SITA may be configured to send data about an taste component included in the evaluated material detected with the sensor SNC to the third housing KYT3 and analyze the data with the arithmetic circuit MAC included in third housing KYT3.

In the case where electrical signals are transmitted through a plurality of wirings between the third housing KYT3 and the first housing KYT1 and/or the second housing KYT2, as illustrated in FIG. 29A, the electronic device SITA preferably includes a cable bare (registered trademark) CB. The cable bare CB includes a plurality of wirings, and the plurality of wirings electrically connects the third housing KYT3 and the second housing KYT2. The plurality of wirings are bundled with the cable bare CB, so that the plurality of wirings can be prevented from coming apart even when the first housing KYT1 and the second housing KYT2 elevate and descend. In the electronic device SITA, the cable bare CB is not necessarily used. Without the cable bare CB, a flexible printed circuit (FPC) can be used instead of the plurality of wirings.

In the above descriptions, the third housing KYT3 includes the arithmetic circuit MAC and the memory portion MEMD in FIG. 27; however, the structure of the electronic device including the semiconductor device of one embodiment of the present invention is not limited thereto. For example, the arithmetic circuit MAC and the memory unit MEMD in FIG. 27 may be included in the first housing KYT1 or the second housing KYT2, or the arithmetic circuit MAC and the memory portion MEMD may be included in different housings.

The base DAZ functions as a space to which the container YOK is provided. The base DAZ may function as a support to make the electronic device SITA stand alone. In the case where the second housing KYT2 does not have a function of elevating and descending along the axis JIK, the base DAZ may have a function of elevating and descending. Thus, the electronic device SITA can soak the sensor SNC with the solution YEK with the base DAZ elevating.

The structure of the electronic device including the semiconductor device of one embodiment of the present invention is not limited to FIG. 29A and FIG. 29B. The electronic device including the semiconductor device of one embodiment of the present invention may have a structure in which the structures illustrated in FIG. 29A and FIG. 29B are changed.

Figure 29C:
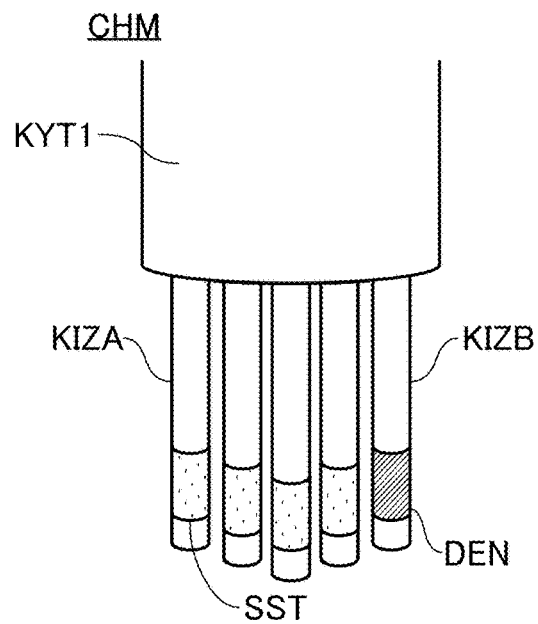

For example, the structure of the base KIZ attached to the first housing KYT1 in FIG. 29B may be changed as illustrated in FIG. 29C. FIG. 29C shows a plurality of base materials KIZA with the lipid films SST and one base material KIZB with the reference electrode DEN are attached to the first housing KYT1, for example. In other words, the structure in FIG. 29C has one reference electrode DEN to obtain a reference potential. Thus, the reference potential can be obtained with one reference electrode DEN (base material KIZB), whereby the number of wirings can be less than that in FIG. 29B. When the structure in FIG. 29C is used for the electronic device SITA, as in the electronic device SITA having the structure in FIG. 29B, the potential differences between the reference potential and a plurality of potentials corresponding to the evaluated material ABJ included in the solution YEK obtained with lipid films SST attached to the plurality of base materials KIZA can be obtained.

As described in this embodiment, by combining the arithmetic circuit MAC described in the above embodiment and the sensor, an electronic device including an odor sensor or a tactile sensor, an electronic device including an odor sensor and a taste sensor, or the like can be manufactured.

Note that this embodiment can be combined with any of the other embodiments in this specification as appropriate.

Embodiment 5

In this embodiment, a hierarchical neural network will be described. An arithmetic operation of a hierarchical neural network can be performed using the semiconductor device described in the above embodiments.

<Hierarchical Neural Network>

A hierarchical neural network is composed of three or more layers of one input layer, one or more intermediate layers (hidden layers), and one output layer, for example.

Figure 30A:
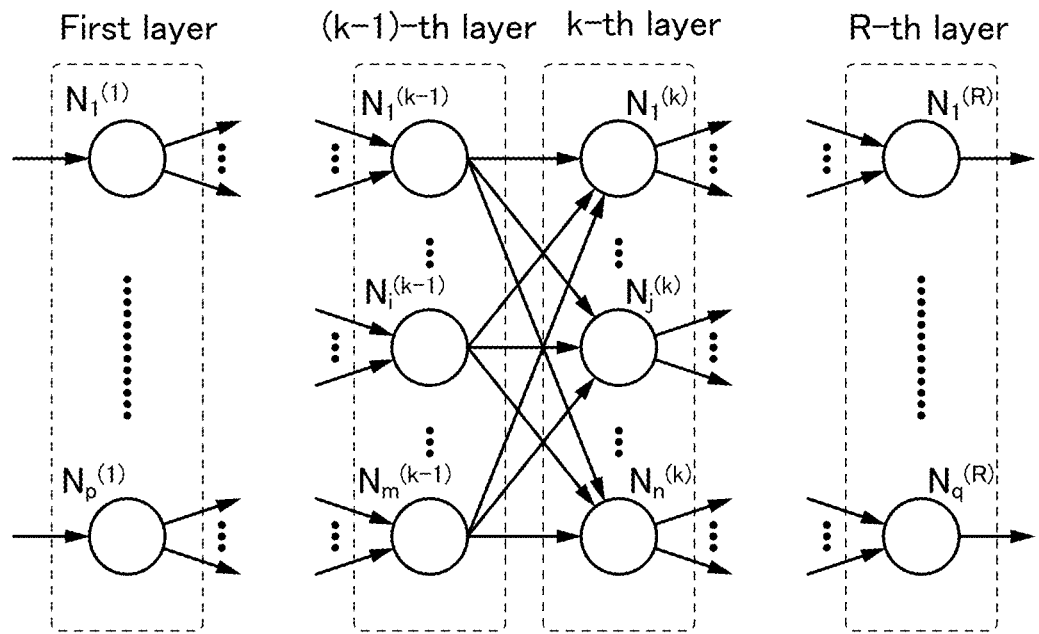
FIGS. 30A and 30B are diagrams illustrating a hierarchical neural network.

FIG. 30A illustrates an example of the hierarchical neural network, and a neural network 100 includes first to R-th layers (here, R is an integer greater than or equal to 4). Specifically, the first layer is the input layer, the R-th layer is the output layer, and the other layers are the intermediate layers. FIG. 30A illustrates a (k−1)-th layer and a k-th layer (here, k is an integer greater than or equal to 3 and less than or equal to R−1) as the intermediate layers, and does not show the other intermediate layers.

Each of the layers of the neural network 100 includes one or more neurons. In FIG. 30A, the first layer includes neurons $N_1^{(1)}$ to $N_p^{(1)}$ (here, p is an integer greater than or equal to 1). The (k−1)-th layer includes neurons $N_1^{(k-1)}$ to $N_m^{(k-1)}$ (here, m is an integer greater than or equal to 1). The k-th layer includes neurons $N_1^{(k)}$ to $N_n^{(k)}$ (here, n is an integer greater than or equal to 1). The R-th layer includes neurons $N_1^{(R)}$ to $N_q^{(R)}$ (here, q is an integer greater than or equal to 1).

FIG. 30A illustrates, in addition to the neurons $N_1^{(1)}$, $N_p^{(1)}$, $N_1^{(k-1)}$, $N_m^{(k-1)}$, $N_1^{(k)}$, $N_n^{(k)}$, $N_1^{(R)}$, and $N_q^{(R)}$, a neuron $N_i^{(k-1)}$ (here, i is an integer greater than or equal to 1 and less than or equal to m) in the (k−1)-th layer and a neuron $N_j^{(k)}$ (here, j is an integer greater than or equal to 1 and less than or equal to n) in the k-th layer; the other neurons are not illustrated.

Next, signal transmission from a neuron in one layer to a neuron in the next layer and signals input to and output from neurons will be described. The description here is made with a focus on the neuron $N_j^{(k)}$ in the k-th layer.

Figure 30B:
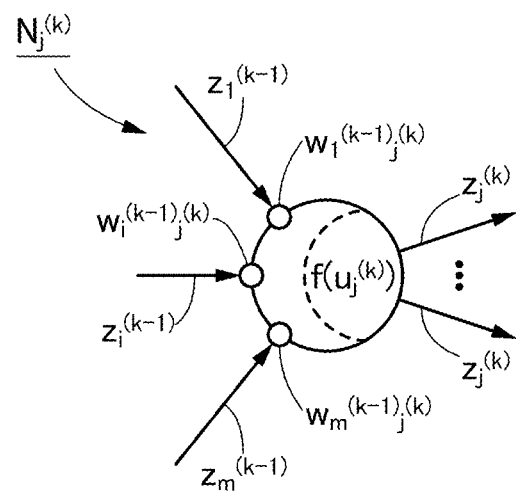

FIG. 30B illustrates the neuron $N_j^{(k)}$ in the k-th layer, signals input to the neuron $N_j^{(k)}$, and signals output from the neuron $N_j^{(k)}$.

Specifically, output signals $z_1^{(k-1)}$ to $z_m^{(k-1)}$ from the neurons $N_1^{(k-1)}$ to $N_m^{(k-1)}$ in the (k−1)-th layer are output to the neuron $N_j^{(k)}$. Then, the neuron $N_j^{(k)}$ generates output signals $z_j^{(k)}$ in response to the signals $z_1^{(k-1)}$ to $z_m^{(k-1)}$, and outputs the output signals $z_j^{(k)}$ to the neurons in the (k+1)-th layer (not illustrated).

The degree of transmitting a signal input from a neuron in one layer to a neuron in the next layer depends on the connection strength (hereinafter referred to as weight coefficient) of the synapse that connects the neurons to each other. In the neural network 100, a signal output from a neuron in one layer is multiplied by a corresponding weight coefficient and then is input to a neuron in the next layer. When i is an integer greater than or equal to 1 and less than or equal to m and the weight coefficient of the synapse between the neuron $N_i^{(k-1)}$ in the (k−1)-th layer and the neuron $N_j^{(k)}$ in the k-th layer is $w_i^{(k-1)(k)}_j$, a signal input to the neuron $N_j^{(k)}$ in the k-th layer can be expressed by Formula (5.1).

$$w_i^{(k-1)(k)}_j \cdot z_i^{(k-1)} \tag{5.1}$$

That is, when the signals $z_1^{(k-1)}$ to $z_m^{(k-1)}$ are transmitted from the neurons $N_1^{(k-1)}$ to $N_m^{(k-1)}$ in the (k−1)-th layer to the neuron $N_j^{(k)}$ in the k-th layer, the signals $z_1^{(k-1)}$ to $z_m^{(k-1)}$ are multiplied by respective weight coefficients $w_1^{(k-1)(k)}_j$ to $w_m^{(k-1)(k)}_j$. Then, $w_1^{(k-1)(k)}_j \cdot z_1^{(k-1)}$ to $w_m^{(k-1)(k)}_j \cdot z_m^{(k-1)}$ are input to the neuron $N_j^{(k)}$ in the k-th layer. At that time, the total sum $u_j^{(k)}$ of the signals input to the neuron $N_j^{(k)}$ in the k-th layer is expressed by Formula (5.2).

$$u_j^{(k)} = \sum_{i=1}^{m} w_i^{(k-1)(k)}_j \cdot z_i^{(k-1)} \tag{5.2}$$

In addition, a bias may be added to the product-sum result of the weight coefficients $w_1^{(k-1)(k)}_j$ to $w_m^{(k-1)(k)}_j$ and the signals $z_1^{(k-1)}$ to $z_m^{(k-1)}$ of the neurons. When the bias is denoted by b, Formula (5.2) can be rewritten as the following formula.

$$u_j^{(k)} = \sum_{i=1}^{m} w_i^{(k-1)(k)}_j \cdot z_i^{(k-1)} + b \tag{5.3}$$

The neuron $N_j^{(k)}$ generates the output signal $z_j^{(k)}$ in accordance with $u_j^{(k)}$. Note that the output signal $z_j^{(k)}$ from the neuron $N_j^{(k)}$ is defined by the following formula.

$$z_j^{(k)} = f(u_j^{(k)}) \tag{5.4}$$

A function $f(u_j^{(k)})$ is an activation function in a hierarchical neural network. A step function, a linear ramp function, a sigmoid function, or the like can be used as the function $f(u_u^{(k)})$. Note that the activation function may be the same among all neurons or may be different among neurons. Furthermore, the neuron activation function in one layer may be the same as or different from that in another layer.

Signals output from the neurons in the layers, weight coefficients w, or bias b may have an analog value or a binary value. The digital value may be, for example, a binary value or a ternary value. A value having a larger number of bits may be used. In the case of an analog value, for example, a linear ramp function or a sigmoid function is used as the activation function. In the case of a binary digital value, for example, a step function with an output of "−1" or "1" or an output of "0" or "1" is used. Alternatively, the neurons in the layers may each output a ternary or higher-level signal; in this case, a step function with an output of three or more values, for example, an output of "−1", "0", or "1" or an output of "0", "1", or "2" is used as an activation function. Furthermore, as an activation function for outputting five values, a step function with an output of "−2", "−1", "0", "1", or "2" may be used, for example. Using a digital value as at least one of the signals output from the neurons in the layers, the weight coefficients w, and the bias b enables a reduction in the circuit scale, a reduction in power consumption, or an increase in operation speed, for example. Furthermore, the use of an analog value as at least one of the signals output from the neurons in the layers, the weight coefficients w, and the bias b can improve the arithmetic accuracy.

The neural network 100 performs operation in which an input signal is input to the first layer (the input layer), output signals are sequentially generated in layers from the first layer (the input layer) to the last layer (the output layer) according to Formula (5.1), Formula (5.2) or (5.3), and Formula (5.4) on the basis of the signals input from the previous layers, and the output signals are output to the subsequent layers. The signal output from the last layer (the output layer) corresponds to the calculation results of the neural network 100.

In the case where the arithmetic circuit MAC1 described in Embodiment 1 is used as the above-described hidden layer, the weight coefficient $w_{s[k-1]}^{(k-1)}{}_{s[k]}^{(k)}$ (s[k−1] is an integer greater than or equal to 1 and less than or equal to m, and s[k] is an integer greater than or equal to 1 and less than or equal to n) is used as the first data, the current amount corresponding to the first data is stored in the cells IM in the same column sequentially, the output signal $z_{s[k-1]}^{(k-1)}$ from the neuron $N_{s[k-1]}^{(k-1)}$ in the (k−1)-th layer is used as the second data, and the current with the amount corresponding to the second data is made to flow from the circuit XCS to the wiring XCL in each row, so that the product-sum of the first data and the second data can be obtained from the current amount $I_S$ input to the converter circuit ITRZ. In addition, the value of the activation function can be obtained from the value of the sum of products, so that the value of the activation function can be the output signal $z_{s[k]}^{(k)}$ of the neuron $N_{s[k-1]}^{(k)}$ in the k-th layer.

In the case where the arithmetic circuit MAC1 described in Embodiment 1 is used as the above-described output layer, the weight coefficient $w_{s[R-1]\ s[R]}^{(R-1)\ (R)}$ (s[R−1] is an integer greater than or equal to 1, and s[R] is an integer greater than or equal to 1 and less than or equal to q) is used as the first data, the current amount corresponding to the first data is stored in the cells IM in the same column sequentially, the output signal $z_{s[R-1]}^{(R-1)}$ from the neuron $N_{s[R-1]}^{(R-1)}$ in the (R−1)-th layer is used as the second data, and the current with the amount corresponding to the second data is made to flow from the circuit XCS to the wiring XCL in each row, so that the sum of products of the first data and the second data can be obtained from the current amount $I_S$ input to the converter circuit ITRZ. In addition, the value of the activation function can be obtained from the value of the sum of products, so that the value of the activation function can be the output signal $z_{s[R]}^{(R)}$ of the neuron $N_{s[R]}^{(R)}$ in the k-th layer.

Note that the input layer described in this embodiment may function as a buffer circuit that outputs an input signal to the second layer.

When the arithmetic circuit MAC2 described in Embodiment 2 in which the converter circuit ITRZD4 in FIG. 12 is used as the converter circuit ITRZD[j] is used as the above-described hidden layer, the weight coefficient $w_{s[k-1]\ s[k]}^{(k-1)\ (k)}$ is used as the first data, the current amount corresponding to the first data is stored in the cells IM and the cells IMr of the circuit CES in the same row sequentially, the output signal $z_{s[k-1]}^{(k-1)}$ from the neuron $N_{s[k-1]}^{(k-1)}$ in the (k−1)-th layer is used as the second data, and the current with the amount corresponding to the second data is made to flow from the circuit XCS to the wiring XCL in each row, whereby the value of the activation function corresponding to the sum of products of the first data and the second data can be obtained from the current amounts $I_S$ and $I_{Sr}$ input to the converter circuit ITRZD4. That is, the value can be the output signal $z_{s[k]}^{(k)}$ from the neuron $N_{s[k]}^{(k)}$ in the k-th layer. Since the converter circuit ITRZD4 outputs the current amount corresponding to the value, the output signal $Z_{s[k]}^{(k)}$ from the neuron $N_{s[k]}^{(k)}$ in the k-th layer input to the (k+1)-th layer can be current, for example. That is, in the case where the arithmetic circuit MAC2 is used as the (k+1)-th hidden layer, the output signal $z_{s[k]}^{(k)}$ from the neuron $N_{s[k]}^{(k)}$ in the k-th layer input to the wiring XCL of the arithmetic circuit MAC2 is not generated in the circuit XCS but can be current output from the converter circuit ITRZD4 of the arithmetic circuit MAC2 of the k-th hidden layer.

Figure 31:
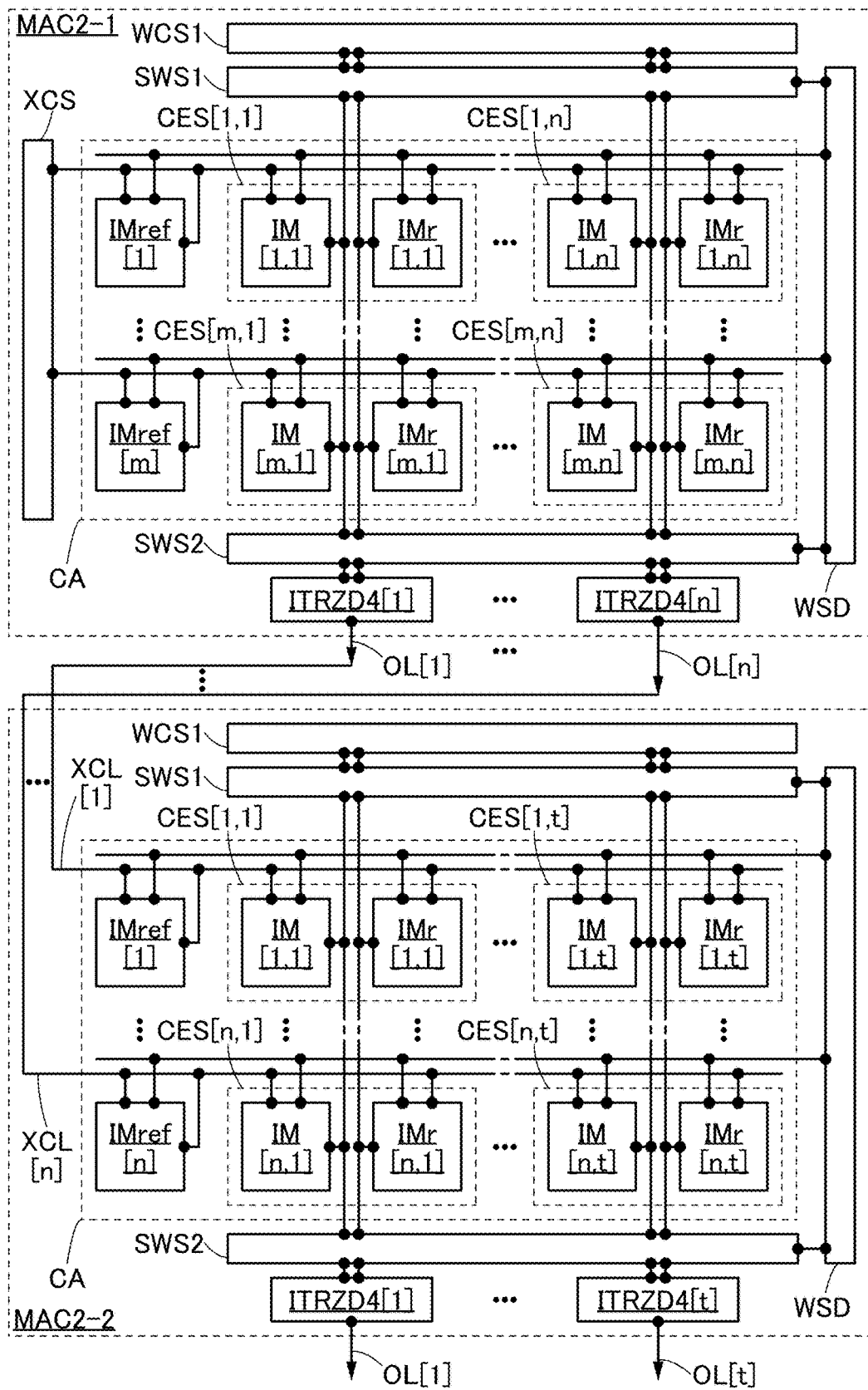
FIG. 31 is a block diagram illustrating a configuration example of a semiconductor device.

Specifically, with use of an arithmetic circuit illustrated in FIG. 31, the arithmetic operation of the hierarchical neural network can be performed. The arithmetic circuit in FIG. 31 includes, for example, an arithmetic circuit MAC2-1 having a structure similar to that of the arithmetic circuit MAC2 in FIG. 10 and an arithmetic circuit MAC2-2 having a structure in which the circuit XCS in the arithmetic circuit MAC2 in FIG. 10 is not provided. In the cell array CA of the arithmetic circuit MAC2-1, m×n circuits CES are arranged in a matrix, and in the cell array CA of the arithmetic circuit MAC2-2, n×t circuits CES (t is an integer greater than or equal to 1) are arranged in a matrix. The wirings OL[1] to OL[n] of the arithmetic circuit MAC2-1 are electrically connected to the wirings XCL[1] to XCL[n] of the arithmetic circuit MAC2-2, respectively.

For example, in the arithmetic circuit MAC2-1 in FIG. 31, the weight coefficient between the neurons in the (k−1)-th layer and the neurons in the k-th layer is used as the first data and retained in the circuits CES[1, 1] to CES[m, n] of the cell array CA, the output signal $z_{s[k-1]}^{(k-1)}$ from the neuron $N_{s[k-1]}^{(k-1)}$ in the (k−1)-th layer is used as the second data, and the current with the amount corresponding to the second data is made to flow from the circuit XCS to the wiring XCL in each row, whereby the output signals $z_1^{(k)}$ to $Z_n^{(k)}$ of the neuron $N_1^{(k)}$ to the neuron $N_n^{(k)}$ in the k-th layer can be output from the wirings OL[1] to OL[n]. The values of the output signals $z_1^{(k)}$ to $z_n^{(k)}$ can be represented as the amounts of current output from the converter circuit ITRZD4[1] to the converter circuit ITRZD4[$n$].

In the arithmetic circuit MAC2-2 in FIG. 31, the weight coefficient between the neurons in the k-th layer and the neurons in the (k+1)-th layer is used as the first data and retained in the circuits CES[1, 1] to CES[n,t] of the cell array CA, and the amount of current flowing through the wiring XCL in each row, i.e., the output signals $z_1^{(k)}$ to $z_n^{(k)}$ from the neuron $N_1^{(k)}$ to the neuron $N_n^{(k)}$ in the k-th layer, is used as the second data, whereby the wirings OL[s[k+1]] (here, s[k+1] is an integer greater than or equal to 1 and less than or equal to t) can output the output signal $z_{s[k+1]}^{(k+1)}$ of the neuron $N_{s[k+1]}^{(k+1)}$ in the (k+1)-th layer.

As described in Embodiment 2, any one of the converter circuits ITRZD4 in FIG. 12, FIG. 13A, and FIGS. 14A to 14C is used as the converter circuit ITRZD4[1] to the converter circuit ITRZD4[$n$] of the arithmetic circuit MAC2-1 in FIG. 31, whereby the converter circuit ITRZD4 [1] to the converter circuit ITRZD4[$n$] function as ReLU functions. Thus, when the result of the product-sum operation in the circuits CES[1, j] to CES[m, j] is "negative", the amount of current flowing from the converter circuit ITRZD4 to the wiring OL[j] is preferably ideally 0. However, in some actual cases, a minute amount of current flows from the converter circuit ITRZD4 to the wiring OL[j], or a minute amount of current flows from the wiring OL[j] to the converter circuit ITRZD4.

Figure 32:
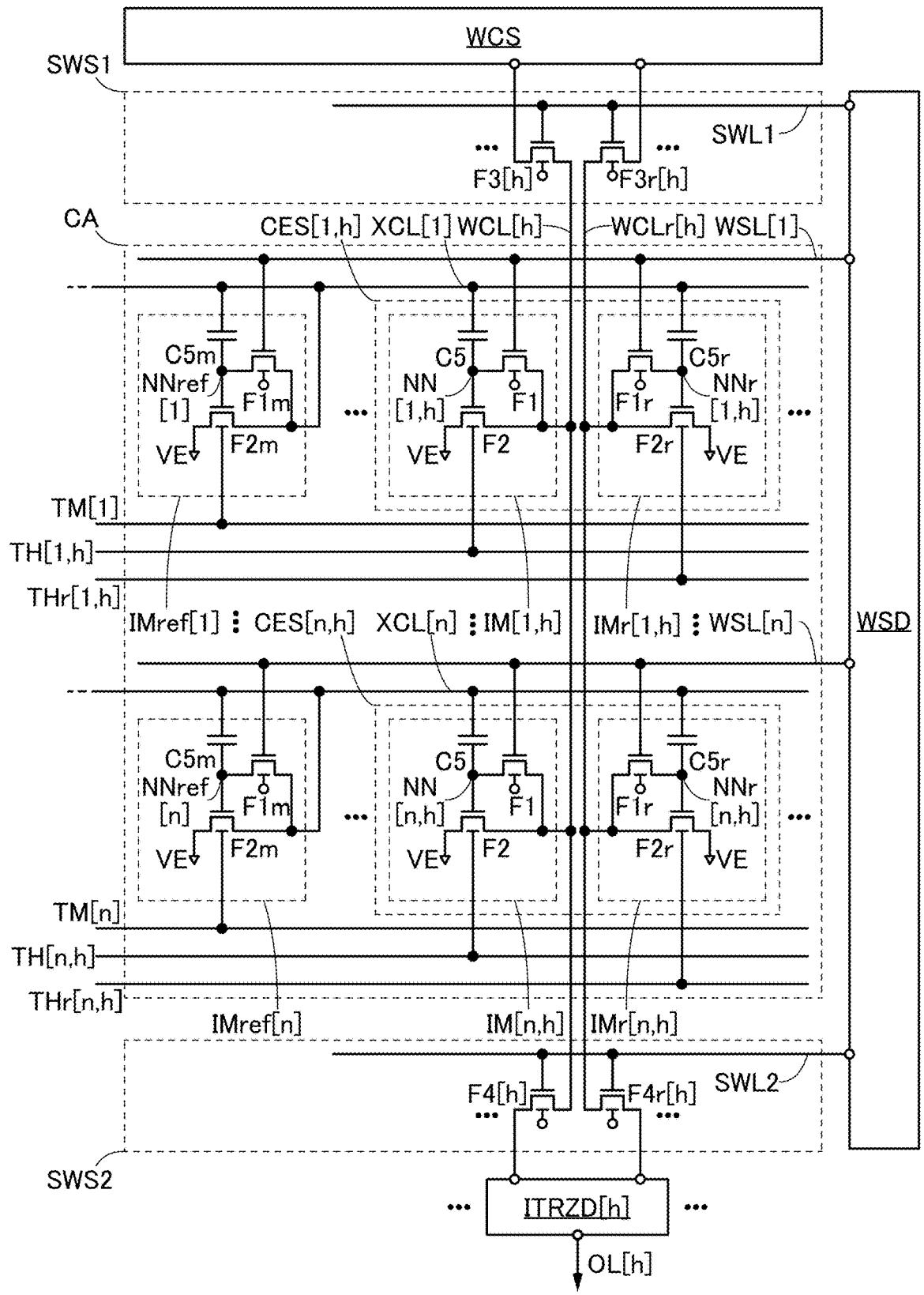
FIG. 32 is a circuit diagram illustrating a configuration example of a semiconductor device.

Accordingly, FIG. 32 illustrates a configuration example of the arithmetic circuit MAC2-2 for properly performing arithmetic operation in the subsequent layers of the hierarchical neural network. The arithmetic circuit MAC2-2 illustrated in FIG. 32 has a configuration in which the circuits CES arranged in a matrix of m×n in the cell array CA in the arithmetic circuit MAC2 in FIG. 10 are changed to those arranged in a matrix of n×t and the circuit XCS is not provided. Since the circuits CES in the cell array CA of the arithmetic circuit MAC2-2 are arranged in a matrix of n×t, the values in the parenthesis such as [ ] with the reference numerals of the wirings, the circuits, and the like illustrated in FIG. 32 are also changed.

FIG. 32 illustrates an example of a circuit configuration of the arithmetic circuit MAC2-2 in which a wiring TM[1], a wiring TM[n], a wiring TH[1, h] (h is an integer greater than or equal to 1 and less than or equal to t), a wiring TH[n,h], a wiring THr[1, h], and a wiring THr[n,h] are provided in the arithmetic circuit MAC2-2. In the arithmetic circuit MAC2-2 in FIG. 32, the wiring TM[1] is electrically connected to the back gate of the transistor F2$m$ in the cell IMref[1], the wiring TM[n] is electrically connected to the back gate of the transistor F2$m$ in the cell IMref[n], the wiring TH[1, h] is electrically connected to the back gate of the transistor F2 in the cell IM[1, h], the wiring THr[1, h] is electrically connected to the back gate of the transistor F2r in the cell IMr[1, h], the wiring TH[n,h] is electrically connected to the back gate of the transistor F2 in the cell IM[n,h], and the wiring THr[n,h] is electrically connected to the back gate of the transistor F2r in the cell IMr[n,h].

A low-level potential is supplied to the wiring TM[1], the wiring TM[n], the wiring TH[1, h], the wiring TH[n,h], the wiring THr[1, h], and the wiring THr[n,h], whereby the threshold voltages of the transistors whose back gates are electrically connected to these wirings can be increased. This can prevent a minute amount of current flowing through the wiring OL of the arithmetic circuit MAC2-1 from flowing to the wiring VE through the cell IMref of the arithmetic circuit MAC2-2. That is, the output characteristics of the converter circuits ITRZD4[1] to circuit ITRZD4[n] can be close to ReLU functions. Thus, the arithmetic operation in the subsequent layer of the hierarchical neural network can be performed properly.

For example, the structure of the arithmetic circuit MAC2-2 in FIG. 32 can be used for the arithmetic circuit MAC2-1 in FIG. 31. With such a configuration, the threshold voltages of the transistor F2, the transistor F2r, and the transistor F2m included in the arithmetic circuit MAC2-1 can be changed, as in the arithmetic circuit MAC2-2.

FIG. 32 illustrates the wiring TM[1], the wiring TM[n], the wiring TH[1, h], the wiring TH[n,h], the wiring THr[1, h], and the wiring THr[n,h]; however, the arithmetic circuit MAC2-2 in FIG. 32 can have a configuration in which the wiring TM[1], the wiring TH[1, h], and the wiring THr[1, h] are combined into one wiring, and the wiring TM[n], the wiring TH[n,h], and the wiring THr[n,h] are combined into one wiring, for example.

With the arithmetic circuit in FIG. 31, as described above, the value of the output signal of the neuron (current amount) output from the arithmetic circuit MAC2-1 can be directly input to the arithmetic circuit MAC2-2, whereby arithmetic operation of a hierarchical neural network can be performed successively from the first layer, for example. The output signals output from the wirings OL[1] to OL[n] of the arithmetic circuit MAC2-1 need not be temporarily stored with an external circuit or the like; thus, a memory device for temporarily storing the signal need not be provided. That is, with the arithmetic circuit in FIG. 31, the circuit area can be reduced and power necessary for transmitting data to be temporarily stored can be reduced.

Note that this embodiment can be combined with any of the other embodiments in this specification as appropriate.

Embodiment 6

This embodiment will describe structure examples of the semiconductor device described in any of the above embodiments and structure examples of a transistor that can be used for the semiconductor device described in any of the above embodiments.

<Structure Example>

Figure 33:
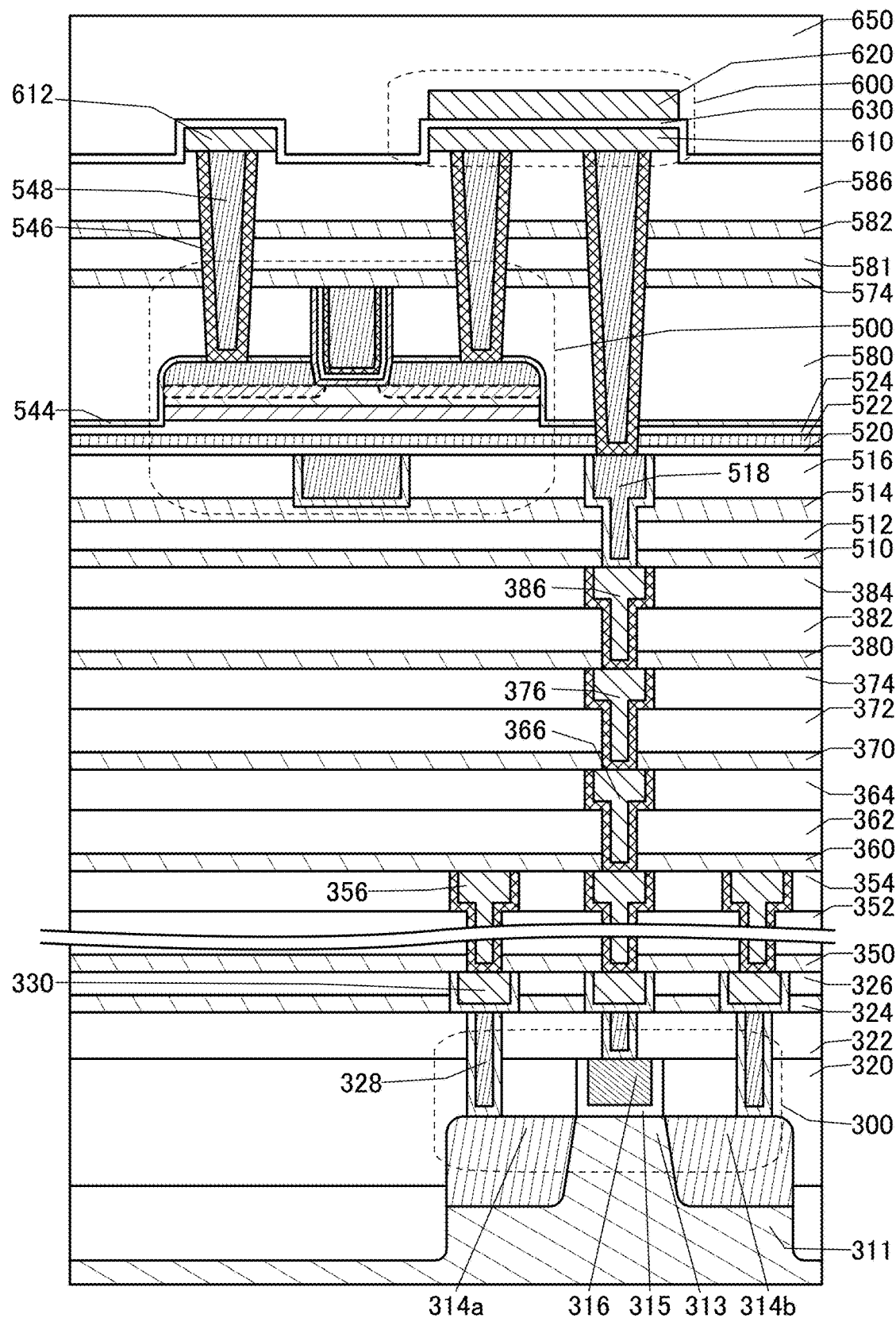
FIG. 33 is a schematic cross-sectional view illustrating a structure example of a semiconductor device.
Figure 35A:
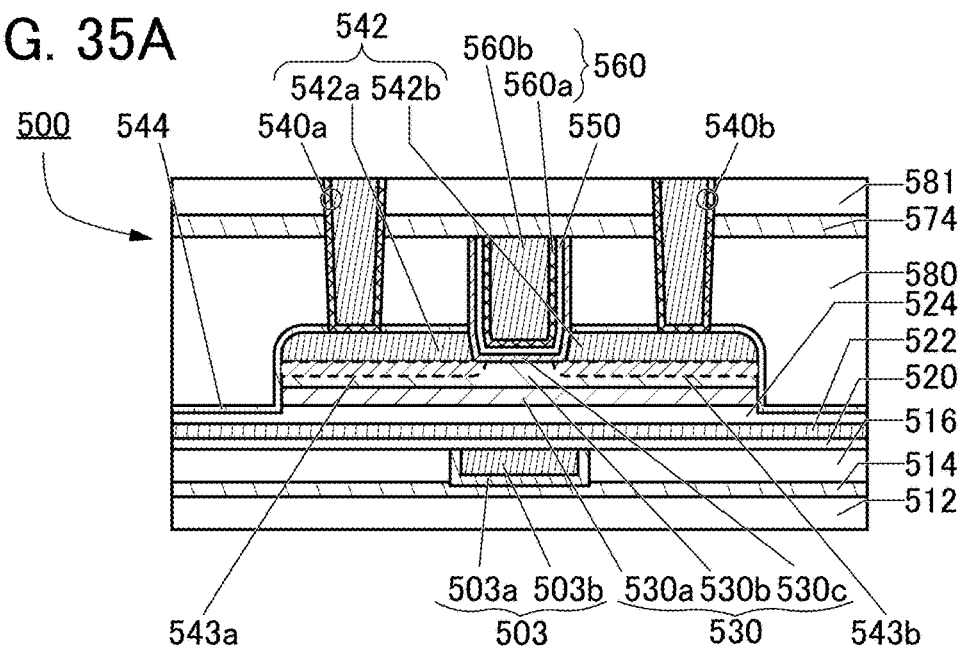
FIGS. 35A to 35C are schematic cross-sectional views illustrating a structure example of a transistor.
Figure 35B:
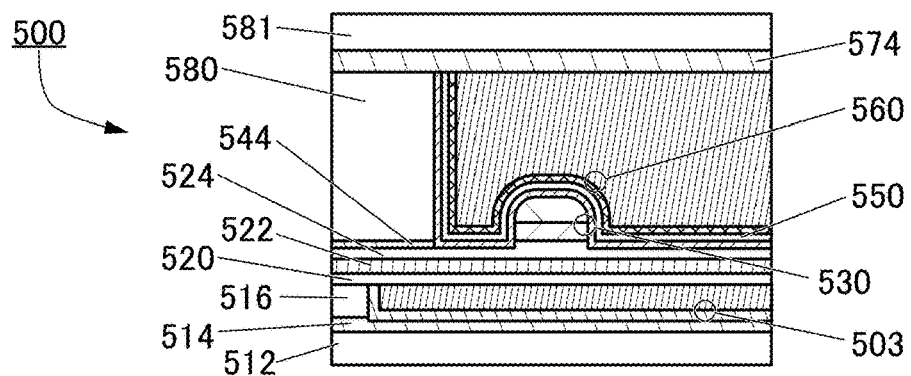
Figure 35C:
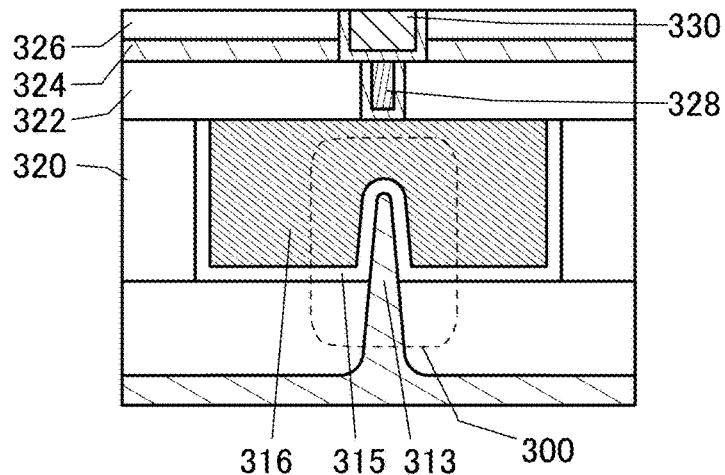

A semiconductor device illustrated in FIG. 33 includes a transistor 300, a transistor 500, and a capacitor 600. FIG. 35A is a cross-sectional view of the transistor 500 in the channel length direction. FIG. 35B is a cross-sectional view of the transistor 500 in the channel width direction. FIG. 35C is a cross-sectional view of the transistor 300 in the channel width direction.

The transistor 500 is a transistor including a metal oxide in its channel formation region (an OS transistor). The transistor 500 has features that the off-state current is low and that the field-effect mobility has no changes even at high temperatures. The transistor 500 is used as a transistor included in a semiconductor device, for example, the arithmetic circuit MAC1, the arithmetic circuit MAC1A, the arithmetic circuit MAC2, the arithmetic circuit MAC3, or the like described in the above embodiment, whereby a semiconductor device whose operating capability does not deteriorate even at a high temperature can be obtained. In particular, by utilizing the feature of a low off-state current, the transistor 500 can be used as the transistor F1 and the transistor F1m, in which case potentials written to the cell IM, the cell IMref, and the like can be retained for a long time.

The semiconductor device described in this embodiment includes the transistor 300, the transistor 500, and the capacitor 600 as illustrated in FIG. 33, for example. For example, the transistor 500 is provided above the transistor 300, and the capacitor 600 is provided above the transistor 300 and the transistor 500. The capacitor 600 can be used as the capacitor or the like included in the arithmetic circuit MAC1, the arithmetic circuit MAC1A, the arithmetic circuit MAC2, the arithmetic circuit MAC3, or the like described in the above embodiment. Note that depending on a circuit configuration, the capacitor 600 illustrated in FIG. 33 is not necessarily provided.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region. Note that the transistor 300 can be used as, for example, the transistors or the like included in the arithmetic circuit MAC1, the arithmetic circuit MAC1A, the arithmetic circuit MAC2, the arithmetic circuit MAC3, or the like described in the above embodiment. Specifically, the transistor 300 can be used as a transistor included in the operational amplifier OP1 or the like included in the converter circuit ITRZ1 to the converter circuit ITRZ3 in FIG. 5A to FIG. 5C, for example. Note that FIG. 33 illustrates a structure in which a gate of the transistor 300 is electrically connected to one of a source and a drain of the transistor 500 through a pair of electrodes of the capacitor 600; however, depending on the configuration of the arithmetic circuits MAC1, MAC1A, MAC2, and MAC3, and the like, one of a source and a drain of the transistor 300 can be configured to be electrically connected to one of the source and the drain of the transistor 500 through the pair of electrodes of the capacitor 600, one of the source and the drain of the transistor 300 can be configured to be electrically connected to a gate of the transistor 500 through the pair of electrodes of the capacitor 600, the transistor 300 can be configured to have no electrical connection to each terminal of the transistor 500 and each terminal of the capacitor 600.

A semiconductor substrate (e.g., a single crystal substrate or a silicon substrate) is preferably used as the substrate 311.

In the transistor 300, the top surface and the side surface in the channel width direction of the semiconductor region 313 are covered with the conductor 316 with the insulator 315 therebetween, as illustrated in FIG. 35C. Such a Fin-type transistor 300 can have an increased effective channel width, and thus have improved on-state characteristics. In addition, contribution of the electric field of the gate electrode can be increased, so that the off-state characteristics of the transistor 300 can be improved.

Note that the transistor 300 can be a p-channel transistor or an n-channel transistor.

A region of the semiconductor region 313 where a channel is formed, a region in the vicinity thereof, the low-resistance regions 314a and 314b functioning as the source and drain regions, and the like preferably contain a semiconductor such as a silicon-based semiconductor, further preferably contain single crystal silicon. Alternatively, a material including germanium (Ge), silicon germanium (SiGe), gallium arsenide (GaAs), aluminum gallium arsenide (GaAlAs), gallium nitride (GaN), or the like may be used. Moreover, the above regions may each be formed using silicon whose effective mass is adjusted by applying stress to the crystal lattice and changing the lattice spacing. Alternatively, the transistor 300 may be a high-electron-mobility transistor (HEMT) including gallium arsenide and aluminum gallium arsenide in the above regions.

The low-resistance regions 314a and 314b contain an element that imparts n-type conductivity, such as arsenic or phosphorus, or an element that imparts p-type conductivity, such as boron, in addition to a semiconductor material used for the semiconductor region 313.

The conductor 316 functioning as the gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that a material used for a conductor determines the work function; thus, selecting the material used for the conductor can adjust the threshold voltage of a transistor. Specifically, titanium nitride, tantalum nitride, or the like is preferably used for the conductor. Furthermore, in order to ensure the conductivity and embeddability of the conductor, a metal material such as tungsten or aluminum is preferably stacked over the conductor. In particular, tungsten is preferable in terms of heat resistance.

Figure 34:
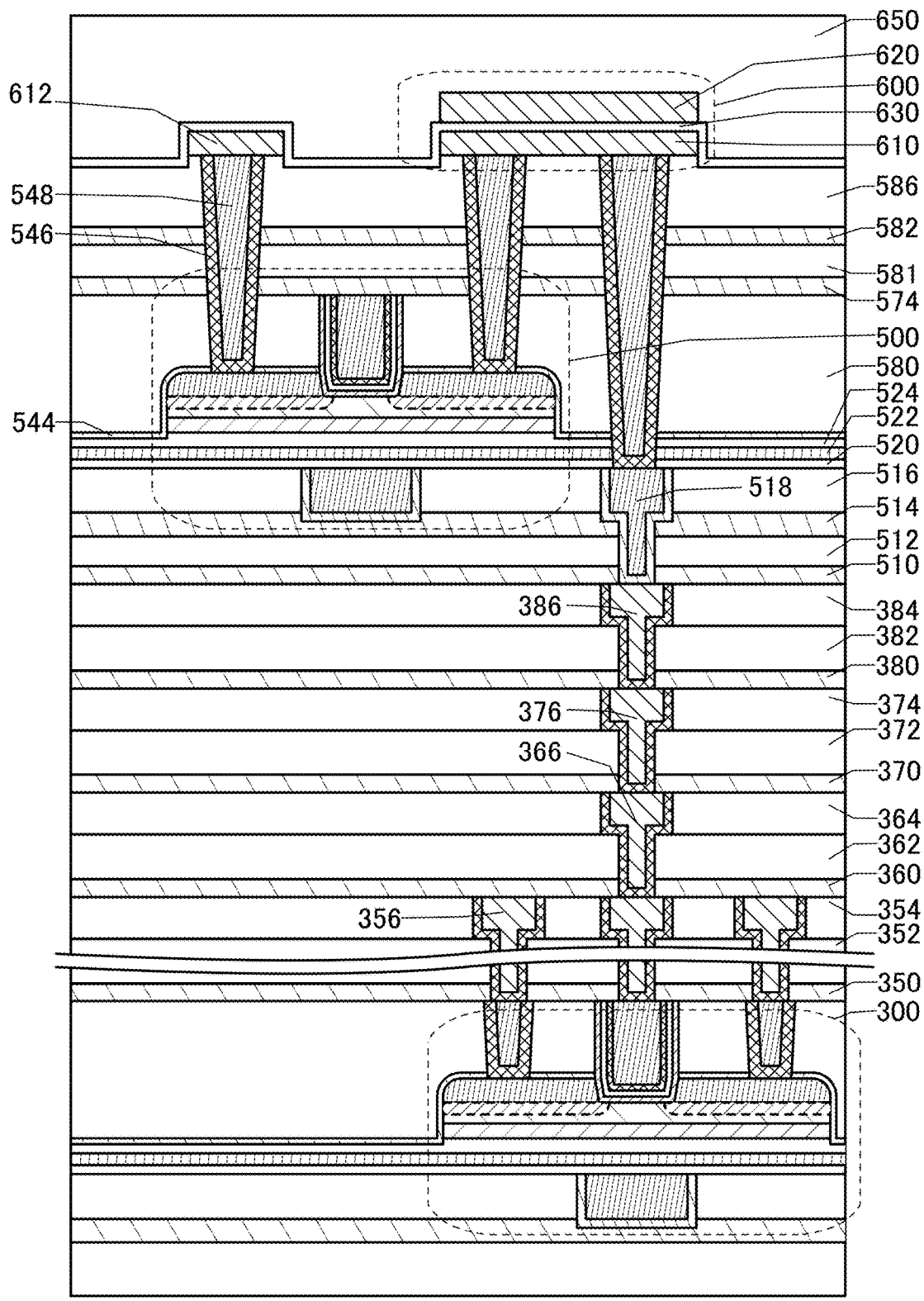
FIG. 34 is a schematic cross-sectional view illustrating a structure example of a semiconductor device.

Note that the transistor 300 illustrated in FIG. 33 is just an example and the structure of the transistor 300 is not limited to that illustrated therein; an appropriate transistor may be used in accordance with a circuit configuration or a driving method. For example, when a semiconductor device is composed only of OS transistors, the transistor 300 has a structure similar to that of the transistor 500 containing an oxide semiconductor, as illustrated in FIG. 34. Note that the details of the transistor 500 will be described later.

An insulator 320, an insulator 322, an insulator 324, and an insulator 326 are stacked in this order to cover the transistor 300.

For the insulators 320, 322, 324, and 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may function as a planarization film for eliminating a level difference caused by the transistor 300 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents impurities such as hydrogen from the substrate 311, the transistor 300, or the like from diffusing to a region where the transistor 500 is provided.

For the film having a barrier property against hydrogen, for example, silicon nitride deposited by a CVD method can be used. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. Specifically, the film that inhibits hydrogen diffusion is a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. For example, the dielectric constant of the insulator 326 is preferably 0.7 times or less that of the insulator 324, further preferably 0.6 times or less that of the insulator 324. In the case where a material with a low dielectric constant is used for an interlayer film, the parasitic capacitance between wirings can be reduced.

Conductors 328 and 330 that are connected to the capacitor 600 or the transistor 500 are provided in the insulators 320, 322, 324, and 326. Note that each of the conductors 328 and 330 functions as a plug or a wiring. A plurality of conductors functioning as plugs or wirings are collectively denoted by the same reference numeral in some cases. In this specification and the like, a wiring and a plug connected to the wiring may be a single component. That is, in some cases, part of a conductor functions as a wiring or part of a conductor functions as a plug.

As a material for each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 33, an insulator 350, an insulator 352, and an insulator 354 are stacked in this order. Furthermore, the conductor 356 is formed in the insulators 350, 352, and 354. The conductor 356 serves as a plug or a wiring that is connected to the transistor 300. Note that the conductor 356 can be formed using a material similar to that for the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening portion of the insulator 350 having a barrier property against hydrogen. With this structure, the transistor 300 and the transistor 500 can be separated by a barrier layer, so that the diffusion of hydrogen from the transistor 300 to the transistor 500 can be inhibited.

Note that as the conductor having a barrier property against hydrogen, tantalum nitride is preferably used, for example. A stacked structure of tantalum nitride and tungsten having high conductivity can inhibit hydrogen diffusion from the transistor 300 while the conductivity of a wiring is ensured. In this case, a tantalum nitride layer having a barrier property against hydrogen is preferably in contact with the insulator 350 having a barrier property against hydrogen.

A wiring layer may be provided over the insulator 354 and the conductor 356. For example, in FIG. 33, an insulator 360, an insulator 362, and an insulator 364 are stacked in this order. Moreover, a conductor 366 is formed in the insulator 360, the insulator 362, and the insulator 364. The conductor 366 functions as a plug or a wiring. Note that the conductor 366 can be formed using a material similar to those used for forming the conductor 328 and the conductor 330.

Note that for example, the insulator 360 is preferably formed using an insulator having a barrier property against hydrogen, like the insulator 324. Furthermore, the conductor 366 preferably includes a conductor having a barrier property against hydrogen. The conductor having a barrier property against hydrogen is formed particularly in an opening portion of the insulator 360 having a barrier property against hydrogen. With this structure, the transistor 300 and the transistor 500 can be separated with a barrier layer, so that the diffusion of hydrogen from the transistor 300 to the transistor 500 can be inhibited.

A wiring layer may be provided over the insulator 364 and the conductor 366. For example, in FIG. 33, an insulator 370, an insulator 372, and an insulator 374 are stacked in this order. Furthermore, a conductor 376 is formed in the insulator 370, the insulator 372, and the insulator 374. The conductor 376 functions as a plug or a wiring. Note that the conductor 376 can be formed using a material similar to those for the conductor 328 and the conductor 330.

Note that for example, the insulator 370 is preferably formed using an insulator having a barrier property against hydrogen, like the insulator 324. Furthermore, the conductor 376 preferably includes a conductor having a barrier property against hydrogen. The conductor having a barrier property against hydrogen is formed particularly in an opening portion of the insulator 370 having a barrier property against hydrogen. With this structure, the transistor 300 and the transistor 500 can be separated by a barrier layer, so that the diffusion of hydrogen from the transistor 300 to the transistor 500 can be inhibited.

A wiring layer may be provided over the insulator 374 and the conductor 376. For example, in FIG. 33, an insulator 380, an insulator 382, and an insulator 384 are stacked in this order. Moreover, a conductor 386 is formed in the insulator 380, the insulator 382, and the insulator 384. The conductor 386 functions as a plug or a wiring. Note that the conductor 386 can be formed using a material similar to those used for forming the conductor 328 and the conductor 330.

Note that for example, the insulator 380 is preferably formed using an insulator having a barrier property against hydrogen, like the insulator 324. Furthermore, the conductor 386 preferably includes a conductor having a barrier property against hydrogen. The conductor having a barrier property against hydrogen is formed particularly in an opening portion of the insulator 380 having a barrier property against hydrogen. With this structure, the transistor 300 and the transistor 500 can be separated by a barrier layer, so that the diffusion of hydrogen from the transistor 300 to the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited to this structure. The number of wiring layers similar to the wiring layer including the conductor 356 may be three or less, or five or more.

An insulator 510, an insulator 512, an insulator 514, and an insulator 516 are stacked in this order over the insulator 384. A material with a barrier property against oxygen or hydrogen is preferably used for any of the insulators 510, 512, 514, and 516.

For example, each of the insulator 510 and the insulator 514 is preferably formed using a film having a barrier property that prevents hydrogen or impurities from the substrate 311, a region where the transistor 300 is provided, or the like from diffusing to a region where the transistor 500 is provided. Therefore, each of the insulator 510 and the insulator 514 can be formed using a material similar to that for the insulator 324.

For the film having a barrier property against hydrogen, for example, silicon nitride deposited by a CVD method can be used. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. Specifically, the film that inhibits hydrogen diffusion is a film from which a small amount of hydrogen is released.

For the film having a barrier property against hydrogen used for the insulator 510 and the insulator 514, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide contained in the transistor 500 can be prevented. Therefore, aluminum oxide is suitably used for a protective film of the transistor 500.

The insulators 512 and 516 can each be formed using a material similar to that for the insulator 320, for example. In the case where a material with a relatively low dielectric constant is used for these insulators, the parasitic capacitance between wirings can be reduced. A silicon oxide film or a silicon oxynitride film can be used for the insulators 512 and 516, for example.

A conductor 518, a conductor included in the transistor 500 (e.g., a conductor 503), and the like are provided in the insulators 510, 512, 514, and 516. Note that the conductor 518 serves as a plug or a wiring that is connected to the capacitor 600 or the transistor 300. The conductor 518 can be formed using a material similar to that used for forming the conductors 328 and 330.

In particular, part of the conductor 518 that is in contact with the insulators 510 and 514 is preferably a conductor having a barrier property against oxygen, hydrogen, and water. With this structure, the transistor 300 and the transistor 500 can be separated by a layer having a barrier property against oxygen, hydrogen, and water. As a result, the diffusion of hydrogen from the transistor 300 to the transistor 500 can be prevented.

The transistor 500 is provided over the insulator 516.

As illustrated in FIGS. 35A and 35B, the transistor 500 includes the conductor 503 arranged to be embedded in the insulators 514 and 516, an insulator 520 over the insulator 516 and the conductor 503, an insulator 522 over the insulator 520, an insulator 524 over the insulator 522, an oxide 530a over the insulator 524, an oxide 530b over the oxide 530a, a conductor 542a and a conductor 542b arranged apart from each other over the oxide 530b, an insulator 580 that is placed over the conductors 542a and 542b and has an opening between the conductors 542a and 542b, an oxide 530c on a bottom surface and a side surface of the opening, an insulator 550 over and in contact with the oxide 530c, and a conductor 560 over and in contact with the insulator 550. Note that the conductor 542a and the conductor 542b are collectively referred to as a conductor 542 in this specification and the like.

As illustrated in FIGS. 35A and 35B, an insulator 544 is preferably provided between the insulator 580 and any of the oxides 530a and 530b and the conductors 542a and 542b. As illustrated in FIGS. 35A and 35B, the conductor 560 preferably includes a conductor 560a over and in contact with the insulator 550 and a conductor 560b provided in contact with the conductor 560a to fill the opening. As illustrated in FIGS. 35A and 35B, an insulator 574 is preferably provided over the insulator 580, the conductor 560, and the insulator 550.

Hereinafter, the oxide 530a, the oxide 530b, and the oxide 530c may be collectively referred to as an oxide 530.

The transistor 500 has, in the region where the channel is formed and its vicinity, a structure in which the oxide 530a, the oxide 530b, and the oxide 530c are stacked; however, one embodiment of the present invention is not limited thereto. For example, the transistor 500 may have a single-layer structure of the oxide 530b, a two-layer structure of the oxide 530b and the oxide 530a or 530c, or a stacked-layer structure of four or more layers. Although the conductor 560 has a two-layer structure in the transistor 500, one embodiment of the present invention is not limited thereto. For example, the conductor 560 may have a single-layer structure or a stacked-layer structure of three or more layers. The transistor 500 illustrated in FIG. 33, FIG. 35A and FIG. 35B is just an example and is not limited to the structure shown therein; an appropriate transistor can be used in accordance with a circuit configuration or a driving method.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The conductor 560, the conductor 542a, and the conductor 542b are formed in a self-aligned manner with respect to the position of the opening of the insulator 580. That is, in the transistor 500, the gate electrode can be positioned between the source electrode and the drain electrode in a self-aligned manner. Therefore, the conductor 560 can be formed without an alignment margin, resulting in a reduction in the footprint of the transistor 500. Accordingly, miniaturization and high integration of the semiconductor device can be achieved.

In addition, since the conductor 560 is formed in the region between the conductor 542a and the conductor 542b in a self-aligned manner, the conductor 560 has neither a region overlapping with the conductor 542a nor a region overlapping with the conductor 542b. Thus, parasitic capacitance formed between the conductor 560 and the conductors 542a and 542b can be reduced. As a result, the transistor 500 can have increased switching speed and excellent frequency characteristics.

The conductor 560 functions as a first gate (also referred to as a top gate) electrode in some cases. The conductor 503 functions as a second gate (also referred to as a bottom gate) electrode in some cases. In that case, by changing a potential applied to the conductor 503 independently of a potential applied to the conductor 560, the threshold voltage of the transistor 500 can be controlled. In particular, when a negative potential is applied to the conductor 503, the threshold voltage of the transistor 500 can be increased to higher than 0 V, and the off-state current can be reduced. Thus, a drain current when a potential applied to the conductor 560 is 0 V can be smaller in the case where a negative potential is applied to the conductor 503 than in the case where the negative potential is not applied to the conductor 503.

The conductor 503 is positioned to overlap with the oxide 530 and the conductor 560. Accordingly, in the case where potentials are supplied to the conductor 560 and the conductor 503, an electric field generated from the conductor 560 and an electric field generated from the conductor 503 are connected, so that the channel formation region in the oxide 530 can be covered. In this specification and the like, a transistor structure in which the channel formation region is electrically surrounded by electric fields of the first gate electrode and the second gate electrode is referred to as surrounded channel (s-channel) structure.

The conductor 503 has a structure similar to that of the conductor 518; the conductor 503a is formed in contact with an inner wall of the opening in the insulators 514 and 516, and the conductor 503b is formed over and in contact with the conductor 503a. Although the conductor 503a and the conductor 503b are stacked in the transistor 500, one embodiment of the present invention is not limited thereto. For example, the conductor 503 may have a single-layer structure or a stacked-layer structure of three or more layers.

The conductor 503a is preferably formed using a conductive material having a function of inhibiting diffusion of impurities such as a hydrogen atom, a hydrogen molecule, a water molecule, and a copper atom, that is, a conductive material through which the above impurities are less likely to pass. Alternatively, the conductor 503a is preferably formed using a conductive material having a function of inhibiting diffusion of oxygen (e.g., at least one of oxygen atoms, oxygen molecules, and the like), that is, a conductive material through which oxygen is less likely to pass. Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, the conductivity of the conductor 503b can be prevented from being lowered because of oxidation.

In the case where the conductor 503 functions as a wiring, the conductor 503b is preferably formed using a conductive material with high conductivity that contains tungsten, copper, or aluminum as its main component. In the case where the conductivity of the wiring can be kept high, the conductor 503a is not necessarily provided. Note that the conductor 503b is a single layer in the drawing but may have a stacked-layer structure, for example, a stacked-layer structure of titanium or titanium nitride and any of the above conductive materials.

The insulator 520, the insulator 522, and the insulator 524 function as a second gate insulating film.

Here, an insulator containing oxygen more than that in the stoichiometric composition is preferably used as the insulator 524 in contact with the oxide 530. That is, an excess-oxygen region is preferably formed in the insulator 524. When such an insulator containing excess oxygen is provided in contact with the oxide 530, the amount of oxygen vacancies in the oxide 530 can be reduced, leading to an improvement in reliability of the transistor 500. Note that in this specification and the like, an oxygen vacancy in a metal oxide is sometimes referred to as $V_O$.

As for a transistor using a metal oxide, when impurities or oxygen vacancies ($V_O$) are in a channel formation region of the metal oxide, electrical characteristics of the transistor easily vary and the reliability thereof may worsen. In some cases, hydrogen in the vicinity of an oxygen vacancy ($V_O$) forms a defect that is an oxygen vacancy ($V_O$) into which hydrogen enters (hereinafter sometimes referred to as $V_OH$), which generates an electron serving as a carrier. Therefore, when the channel formation region in the oxide semiconductor includes oxygen vacancies, the transistor tends to have normally-on characteristics (a channel is generated even when no voltage is applied to a gate electrode and a current flows through the transistor). Therefore, the impurities, oxygen vacancies, and $V_OH$ are preferably reduced as much as possible in the channel formation region of the oxide semiconductor. In other words, the oxide semiconductor preferably includes an i-type (intrinsic) or substantially i-type channel formation region with a low carrier concentration.

As the insulator including the excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_OH$ is cut occurs, i.e., a reaction of $V_OH \rightarrow V_O+H$ occurs. Some hydrogen generated at this time is bonded to oxygen to be H$_2$O, and removed from the oxide 530 and an insulator near the oxide 530 in some cases. Some hydrogen is diffused in or trapped (also referred to as gettering) by the conductors 542a and 542b in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The microwave treatment is performed under a pressure of 133 Pa or higher, preferably 200 Pa or higher, further preferably 400 Pa or higher. As a gas introduced into an apparatus for performing the microwave treatment, for example, oxygen and argon are used and the oxygen flow rate ratio (O$_2$/(O$_2$+Ar)) is lower than or equal to 50%, preferably higher than or equal to 10% and lower than or equal to %.

In a manufacturing process of the transistor 500, the heat treatment is preferably performed with the surface of the oxide 530 exposed. For example, the heat treatment is performed at a temperature higher than or equal to 100° C. and lower than or equal to 450° C., preferably higher than or equal to 350° C. and lower than or equal to 400° C. The heat treatment is performed in a nitrogen gas atmosphere, an inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under a reduced pressure. Alternatively, the heat treatment may be performed in such a manner that heat treatment is performed in a nitrogen gas atmosphere or an inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas atmosphere or an inert gas atmosphere.

Note that the oxygen adding treatment performed on the oxide 530 can promote a reaction in which oxygen vacancies in the oxide 530 are filled with supplied oxygen, i.e., a reaction of $V_O+O\rightarrow$null. Furthermore, hydrogen remaining in the oxide 530 reacts with supplied oxygen, so that the hydrogen can be removed as H$_2$O (dehydration). This can inhibit recombination of hydrogen remaining in the oxide 530 with oxygen vacancies and formation of $V_OH$.

In the case where the insulator 524 includes an excess-oxygen region, the insulator 522 preferably has a function of inhibiting diffusion of oxygen (e.g., oxygen atoms and oxygen molecules). That is, it is preferable that oxygen be less likely to pass through the insulator 522.

The insulator 522 preferably has a function of inhibiting diffusion of oxygen, impurities such as water or hydrogen, or the like, in which case diffusion of oxygen contained in the oxide 530 to the insulator 520 side is prevented. In addition, the conductor 503 can be inhibited from reacting with oxygen in the insulator 524 and the oxide 530.

The insulator 522 preferably has a single-layer structure or a stacked-layer structure using an insulator containing a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba, Sr)TiO$_3$ (BST). As miniaturization and high integration of transistors progress, a problem such as generation of leakage current may arise because of a thinner gate insulating film. When a high-k material is used for an insulator functioning as the gate insulating film, a gate potential at the time of operating the transistor can be reduced while the physical thickness of the gate insulating film is kept.

It is particularly preferable to use an insulator containing an oxide of one or both of aluminum and hafnium, which is an insulating material having a function of inhibiting diffusion of impurities, oxygen, and the like, that is, an insulating material through which oxygen is less likely to pass. As the insulator containing an oxide of one or both of aluminum and hafnium, aluminum oxide, hafnium oxide, an oxide containing aluminum and hafnium (hafnium aluminate), or the like is preferably used. The insulator 522 formed of such a material functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, the insulator may be subjected to nitriding treatment. Silicon oxide, silicon oxynitride, or silicon nitride may be stacked over the above insulator.

It is preferable that the insulator 520 be thermally stable. For example, silicon oxide and silicon oxynitride are suitable because of their thermal stability. Furthermore, a combination of a high-k insulator and silicon oxide or silicon oxynitride enables the insulator 520 to have a stacked-layer structure that is thermally stable and has a high dielectric constant.

Note that FIGS. 35A and 35B show that the transistor 500 includes the insulators 520, 522, and 524 as the second gate insulating film having a three-layer structure; alternatively, the second gate insulating film may have a single-layer structure, a two-layer structure, or a stacked-layer structure of four or more layers. In that cases, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, cobalt, magnesium, antimony, and the like) is used. In particular, the In-M-Zn oxide that can be used as the oxide 530 is preferably a c-axis aligned crystal oxide semiconductor (CAAC-OS) or a cloud-aligned composite oxide semiconductor (CAC-OS). Alternatively, In—Ga oxide, In—Zn oxide, or indium oxide may be used as the oxide 530.

Moreover, a metal oxide with low carrier density is preferably used for the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities contained in the metal oxide include hydrogen, nitrogen, alkali metal, alkaline earth metal, iron, nickel, and silicon.

Specifically, hydrogen contained in a metal oxide reacts with oxygen bonded to a metal atom to be water, and thus sometimes causes an oxygen vacancy in the metal oxide. In the case where hydrogen enters an oxygen vacancy in the oxide 530, the oxygen vacancy and the hydrogen are bonded to each other to form $V_OH$ in some cases. The $V_OH$ serves as a donor and an electron that is a carrier is generated in some cases. In other cases, bonding of part of hydrogen to oxygen bonded to a metal atom generates electrons serving as carriers. Thus, a transistor including a metal oxide that contains a large amount of hydrogen is likely to have normally-on characteristics. Moreover, hydrogen in a metal oxide easily moves by stress such as heat and an electric field; thus, the reliability of a transistor may be low when the metal oxide contains a plenty of hydrogen. In one embodiment of the present invention, $V_OH$ in the oxide 530 is preferably reduced as much as possible so that the oxide 530 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen supplying treatment) to obtain a metal oxide whose $V_OH$ is reduced enough. When a metal oxide in which impurities such as $V_OH$ are sufficiently reduced is used for a channel formation region in a transistor, the transistor can have stable electrical characteristics.

A defect in which hydrogen enters an oxygen vacancy can serve as a donor of the metal oxide. However, it is difficult to evaluate the defects quantitatively. Thus, in the metal oxide, the defects are evaluated by carrier concentration, not by donor concentration. Accordingly, in this specification and the like, carrier concentration is sometimes used for a parameter of a metal oxide when an electric field is not applied, instead of donor concentration. That is, "carrier concentration" in this specification and the like can be replaced with "donor concentration" in some cases.

Therefore, when a metal oxide is used as the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

When a metal oxide is used for the oxide 530, the metal oxide is an intrinsic (also referred to as i-type) or substantially intrinsic semiconductor with a large band gap, the carrier concentration of the metal oxide in the channel formation region is preferably lower than or equal to $1\times10^{18}$ cm$^{-3}$, further preferably lower than $1\times10^{17}$ cm$^{-3}$, further preferably lower than $1\times10^{16}$ cm$^{-3}$, further preferably lower than $1\times10^{13}$ cm$^{-3}$, further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

When a metal oxide is used for the oxide 530, contact between the conductor 542 (the conductor 542a and the conductor 542b) and the oxide 530 may make oxygen in the oxide 530 diffuse into the conductors 542a and 542b, resulting in oxidation of the conductors 542a and 542b. It is highly possible that oxidation of the conductor 542a and the conductor 542b lowers the conductivity of the conductor 542a and the conductor 542b. Note that diffusion of oxygen from the oxide 530 into the conductors 542a and 542b can be interpreted as absorption of oxygen in the oxide 530 by the conductors 542a and 542b.

When oxygen in the oxide 530 is diffused into the conductor 542 (the conductors 542a and 542b), a layer is sometimes formed between the conductor 542a and the oxide 530b, and between the conductor 542b and the oxide 530b. The layer contains more oxygen than the conductors 542a and 542b do, so that the layer presumably has an insulating property. The three-layer structure of the conductor 542, the layer, and the oxide 530b can be the structure with a metal, an insulator, and a semiconductor, which is sometimes called a metal-insulator-semiconductor (MIS) structure or a diode junction structure having an MIS structure as its main part.

The above layer is not necessarily formed between the conductor 542 and the oxide 530b, but the layer may be formed between the conductor 542 and the oxide 530c, or layers are formed both between the conductor 542 and the oxide 530b, and the conductor 542 and the oxide 530c.

The metal oxide functioning as the channel formation region in the oxide 530 has a band gap of preferably 2 eV or higher, further preferably 2.5 eV or higher. The use of a metal oxide having such a wide band gap can reduce the off-state current of a transistor.

By including the oxide 530a under the oxide 530b, the oxide 530 can prevent impurities from diffusing into the oxide 530b from the components formed below the oxide 530a. By including the oxide 530c over the oxide 530b, the oxide 530 can prevent impurities from diffusing into the oxide 530b from the components formed above the oxide 530c.

The oxide 530 preferably has a stacked structure of a plurality of oxide layers that differ in the atomic ratio of metal atoms. Specifically, the atomic ratio of the element M to constituent elements in the metal oxide used as the oxide 530a is preferably greater than that in the metal oxide used as the oxide 530b. Moreover, the atomic ratio of the element M to In in the metal oxide used as the oxide 530a is preferably greater than that in the metal oxide used as the oxide 530b. Moreover, the atomic ratio of In to the element M in the metal oxide used as the oxide 530b is preferably greater than that in the metal oxide used as the oxide 530a. The oxide 530c can be formed using a metal oxide that can be used as the oxide 530a or the oxide 530b.

Specifically, as the oxide 530a, a metal oxide having an atomic ratio of In to Ga and Zn (In:Ga:Zn) that is 1:3:4 or 1:1:0.5 is used. In addition, as the oxide 530b, a metal oxide having an atomic ratio of In to Ga and Zn (In:Ga:Zn) that is 4:2:3 or 1:1:1 is used. In addition, as the oxide 530c, a metal oxide having an atomic ratio of In to Ga and Zn (In:Ga:Zn) that is 1:3:4 or an atomic ratio of Ga to Zn (Ga:Zn) that is 2:1 or 2:5 is used. Specific examples of the case where the oxide 530c has a stacked-layer structure include a stacked-layer structure of a layer with an atomic ratio of In to Ga and Zn (In:Ga:Zn) that is 4:2:3 and a layer with In:Ga:Zn=1:3:4; a stacked-layer structure of a layer with an atomic ratio of Ga to Zn (Ga:Zn) that is 2:1 and a layer in which an atomic ratio of In to Ga and Zn (In:Ga:Zn) that is 4:2:3; a stacked-layer structure of a layer in with an atomic ratio of Ga to Zn (Ga:Zn) that is 2:5 and a layer with an atomic ratio of In to Ga and Zn (In:Ga:Zn) that is 4:2:3; and a stacked-layer structure of gallium oxide and a layer with an atomic ratio of In to Ga and Zn (In:Ga:Zn) that is 4:2:3.

For example, in the case where the atomic ratio of In to the element M in the metal oxide used as the oxide 530a is lower than the atomic ratio of In to the element M in the metal oxide used as the oxide 530b, an In—Ga—Zn oxide having a composition with an atomic ratio of In:Ga:Zn=5:1:6 or a neighborhood thereof, In:Ga:Zn=5:1:3 or a neighborhood thereof, In:Ga:Zn=10:1:3 or a neighborhood thereof, or the like can be used as the oxide 530b.

As the oxide 530b, it is also possible to use a metal oxide having a composition of In:Zn=2:1, a composition of In:Zn=5:1, a composition of In:Zn=10:1, or a composition in the neighborhood of any one of these compositions, other than the above-described compositions.

The oxides 530a, 530b, and 530c are preferably formed to satisfy the above atomic ratio. For example, it is preferable that the oxides 530a and 530c be each a metal oxide having a composition of In:Ga:Zn=1:3:4 or a composition which is in the neighborhood of the above atomic ratio and the oxide 530b be a metal oxide having a composition of In:Ga:Zn=4:2:3 to 4:2:4.1 or a composition which is in the neighborhood of the above atomic ratios. Here, the term "composition" refers to the atomic ratio of an oxide formed over a substrate or the atomic ratio of a sputtering target. Moreover, the proportion of In is preferably increased in the composition of the oxide 530b because the transistor can have a higher on-state current, higher field-effect mobility, or the like.

The energy of the conduction band minimum of each of the oxide 530a and the oxide 530c is preferably higher than that of the oxide 530b. In other words, the electron affinity of each of the oxide 530a and the oxide 530c is preferably smaller than that of the oxide 530b.

Here, the energy level of the conduction band minimum is gradually varied at a junction portion of each of the oxides 530a, 530b, and 530c. In other words, the energy level of the conduction band minimum at a junction portion of each of the oxides 530a, 530b, and 530c is continuously varied or continuously connected. To vary the energy level gradually, the density of defect states in a mixed layer formed at the interface between the oxides 530a and 530b and the interface between the oxides 530b and 530c is preferably made low.

Specifically, when the oxides 530a and 530b or the oxides 530b and 530c contain the same element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxides 530a and 530c.

At this time, the oxide 530b serves as a main carrier path. When the oxides 530a and 530c have the above structure, the density of defect states at the interface between the oxides 530a and 530b and the interface between the oxides 530b and 530c can be made low. Thus, the influence of interface scattering on carrier conduction is small, and the transistor 500 can have high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film such as a tantalum nitride film is preferable because it has a barrier property against hydrogen or oxygen.

Although the conductor 542a and the conductor 542b each have a single-layer structure in FIGS. 35A and 35B, they may each have a stacked-layer structure of two or more layers. For example, a tantalum nitride film and a tungsten film may be stacked. Alternatively, a titanium film and an aluminum film may be stacked. Other examples include a two-layer structure in which an aluminum film is stacked over a tungsten film, a two-layer structure in which a copper film is stacked over a copper-magnesium-aluminum alloy film, a two-layer structure in which a copper film is stacked over a titanium film, and a two-layer structure in which a copper film is stacked over a tungsten film.

Other examples include a three-layer structure in which a titanium film or a titanium nitride film, an aluminum film or a copper film, and a titanium film or a titanium nitride film are stacked in this order and a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used.

As illustrated in FIG. 35A, a region 543a and a region 543b are sometimes formed as low-resistance regions at and near the interface between the oxide 530 and the conductor 542a and the interface between the oxide 530 and the conductor 542b. In that case, the region 543a functions as one of a source region and a drain region, and the region 543b functions as the other of the source region and the drain region. A channel formation region is formed in a region between the region 543a and the region 543b.

When the conductor 542a and the conductor 542b are provided in contact with the oxide 530, the oxygen concentrations of the region 543a and the region 543b sometimes decrease. In addition, a metal compound layer that contains the metal contained in the conductor 542a and the conductor 542b and the component of the oxide 530 is sometimes formed in the region 543a and the region 543b. In such a case, the region 543a and the region 543b each have increased carrier density to be a low-resistance region.

The insulator 544 is provided to cover the conductor 542a and the conductor 542b and inhibits oxidation of the conductor 542a and the conductor 542b. Here, the insulator 544 may be provided to cover the side surface of the oxide 530 and to be in contact with the insulator 524.

A metal oxide containing one or more of hafnium, aluminum, gallium, yttrium, zirconium, tungsten, titanium, tantalum, nickel, germanium, neodymium, lanthanum, magnesium, and the like can be used as the insulator 544. Moreover, silicon nitride oxide or silicon nitride can be used as the insulator 544, for example.

It is particularly preferable to use an insulator containing an oxide of one or both of aluminum and hafnium, such as aluminum oxide, hafnium oxide, or an oxide containing aluminum and hafnium (hafnium aluminate) as the insulator 544. In particular, hafnium aluminate has higher heat resistance than a hafnium oxide film and thus is less likely to be crystallized by heat treatment in a later step. Therefore, it is preferable to use hafnium aluminate. Note that the insulator 544 is not necessarily provided when the conductors 542a and 542b are formed using a material that is oxidation-resistant or does not significantly lose the conductivity even after absorbing oxygen. Design is determined as appropriate in consideration of required transistor characteristics.

The insulator 544 can prevent impurities such as water and hydrogen contained in the insulator 580 from diffusing into the oxide 530b through the oxide 530c and the insulator 550. Moreover, the oxidation of the conductor 542 due to excess oxygen in the insulator 580 can be inhibited.

The insulator 550 functions as a first gate insulating film. The insulator 550 is preferably in contact with the inner side (the top surface and the side surface) of the oxide 530c. The insulator 550 is preferably formed using an insulator which contains excess oxygen and from which oxygen is released by heating, like the insulator 524.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide or silicon oxynitride is preferable because of being thermally stable.

When as the insulator 550, an insulator from which oxygen is released by heating is provided in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

In order to efficiently supply excess oxygen of the insulator 550 to the oxide 530, a metal oxide may be provided between the insulator 550 and the conductor 560. The metal oxide preferably inhibits oxygen diffusion from the insulator 550 into the conductor 560. Providing the metal oxide that inhibits oxygen diffusion prevents diffusion of excess oxygen from the insulator 550 to the conductor 560. That is, a reduction in the amount of excess oxygen supplied to the oxide 530 can be suppressed. Moreover, oxidization of the conductor 560 due to excess oxygen can be suppressed. The metal oxide is formed using a material that can be used for the insulator 544.

Note that the insulator 550 may have a stacked-layer structure like the second gate insulating film. As miniaturization and high integration of transistors progress, a problem such as leakage current may arise because of a thinner gate insulating film. For that reason, when the insulator functioning as a gate insulating film has a stacked-layer structure of a high-k material and a thermally stable material, a gate potential at the time when the transistor operates can be reduced while the physical thickness of the gate insulating film is maintained. Furthermore, the stacked-layer structure can be thermally stable and have a high dielectric constant.

Although the conductor 560 serving as the first gate electrode has a two-layer structure in FIGS. 35A and 35B, the conductor 560 may have a single-layer structure or a stacked-layer structure of three or more layers.

The conductor 560a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 560a is preferably formed using a conductive material having a function of inhibiting diffusion of oxygen (e.g., oxygen atoms, oxygen molecules, or both). When the conductor 560a has a function of inhibiting diffusion of oxygen, the conductivity of the conductor 560b can be inhibited from being lowered because of oxidation due to oxygen contained in the insulator 550. As a conductive material having a function of inhibiting oxygen diffusion, tantalum, tantalum nitride, ruthenium, or ruthenium oxide is preferably used, for example. The conductor 560a can be formed using an oxide semiconductor that can be used for the oxide 530. In that case, when the conductor 560b is formed by a sputtering method, the conductor 560a can have a reduced electric resistance and become a conductor. Such a conductor can be referred to as an oxide conductor (OC) electrode.

Furthermore, the conductor 560b is preferably formed using a conductive material containing tungsten, copper, or aluminum as its main component. The conductor 560b also functions as a wiring and thus is preferably a conductor having high conductivity. For example, a conductive material containing tungsten, copper, or aluminum as its main component can be used. The conductor 560b may have a stacked-layer structure, for example, a stacked-layer structure of titanium or titanium nitride and the above conductive material.

The insulator 580 is provided over the conductor 542a and the conductor 542b with the insulator 544 positioned therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride are preferable because they are thermally stable. Silicon oxide and porous silicon oxide are particularly preferable because an excess-oxygen region can be formed easily in a later step.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. The concentration of impurities such as water or hydrogen in the insulator 580 is preferably lowered.

The opening of the insulator 580 is formed to overlap with a region between the conductor 542a and the conductor 542b. Accordingly, the conductor 560 is embedded in the opening of the insulator 580 and the region between the conductor 542a and the conductor 542b.

The gate length needs to be short for miniaturization of the semiconductor device without a reduction in the conductivity of the conductor 560. When the conductor 560 is made thick to achieve this, the conductor 560 might have a shape with a high aspect ratio. Even when having a shape with a high aspect ratio, the conductor 560 can be formed without collapsing during the process because the conductor 560 is embedded in the opening of the insulator 580 in this embodiment.

The insulator 574 is preferably provided in contact with the top surfaces of the insulator 580, the conductor 560, and the insulator 550. When the insulator 574 is formed by a sputtering method, the insulator 550 and the insulator 580 can include an excess-oxygen region. Therefore, oxygen can be supplied from the excess-oxygen region to the oxide 530.

For example, a metal oxide containing one or more of hafnium, aluminum, gallium, yttrium, zirconium, tungsten, titanium, tantalum, nickel, germanium, magnesium, and the like can be used as the insulator 574.

In particular, aluminum oxide has a high barrier property, so that even a thin aluminum oxide film having a thickness greater than or equal to 0.5 nm and less than or equal to 3.0 nm can inhibit diffusion of hydrogen and nitrogen. Thus, aluminum oxide deposited by a sputtering method can serve as not only an oxygen supply source but also a barrier film against impurities such as hydrogen.

The insulator 581 functioning as an interlayer film is preferably provided over the insulator 574. As in the insulator 524 or the like, the concentration of impurities such as water or hydrogen in the insulator 581 is preferably lowered.

A conductor 540a and a conductor 540b are provided in the openings formed in the insulator 581, the insulator 574, the insulator 580, and the insulator 544. The conductors 540a and 540b are provided to face each other with the conductor 560 positioned therebetween. The conductors 540a and 540b have the same structure as that of a combination of a conductor 546 and a conductor 548 that will be described later.

An insulator 582 is provided over the insulator 581. A substance having a barrier property against oxygen and hydrogen is preferably used for the insulator 582. Thus, the insulator 582 can be formed using a material similar to that for the insulator 514. For the insulator 582, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide contained in the transistor 500 can be prevented. Therefore, aluminum oxide is suitably used for a protective film of the transistor 500.

An insulator 586 is provided over the insulator 582. The insulator 586 can be formed using a material similar to that for the insulator 320. In the case where a material with a relatively low dielectric constant is used for these insulators, the parasitic capacitance between wirings can be reduced. A silicon oxide film or a silicon oxynitride film can be used as the insulator 586, for example.

The conductor 546 and the conductor 548 are embedded in the insulator 520, the insulator 522, the insulator 524, the insulator 544, the insulator 580, the insulator 574, the insulator 581, the insulator 582, and the insulator 586.

The conductors 546 and 548 function as plugs or wirings that are connected to the capacitor 600, the transistor 500, or the transistor 300. The conductors 546 and 548 can be formed using a material similar to those used for forming the conductors 328 and 330.

After the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as some of the manufacturing steps of the transistor 500. The insulator having a high barrier property against hydrogen or water is formed using a material similar to that for the insulator 522, for example.

The capacitor 600 is provided above the transistor 500. The capacitor 600 includes a conductor 610, a conductor 620, and an insulator 630.

A conductor 612 may be provided over the conductors 546 and 548. The conductor 612 functions as a plug or a wiring that is connected to the transistor 500. The conductor 610 functions as an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 33; however, one embodiment of the present invention is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 positioned therebetween. The conductor 620 can be formed using a conductive material such as a metal material, an alloy material, or a metal oxide material. It is preferable to use a high-melting-point material that has both heat resistance and conductivity, such as tungsten or molybdenum, and especially tungsten is preferred. In the case in which the conductor 620 is formed concurrently with another component such as a conductor, copper (Cu), aluminum (Al), or the like, which is a low-resistance metal material, can be used.

An insulator 650 is provided over the conductor 620 and the insulator 630. The insulator 650 can be formed using a material similar to that used for the insulator 320. The insulator 650 may function as a planarization film that covers roughness due to underlying layers.

With use of this structure, a change in electrical characteristics can be prevented and reliability can be improved in a semiconductor device including a transistor including an oxide semiconductor. Alternatively, a semiconductor device using a transistor including an oxide semiconductor can be miniaturized or highly integrated.

Next, other structure examples of the OS transistors illustrated in FIG. 33 and FIG. 34 are described.

Figure 36A:
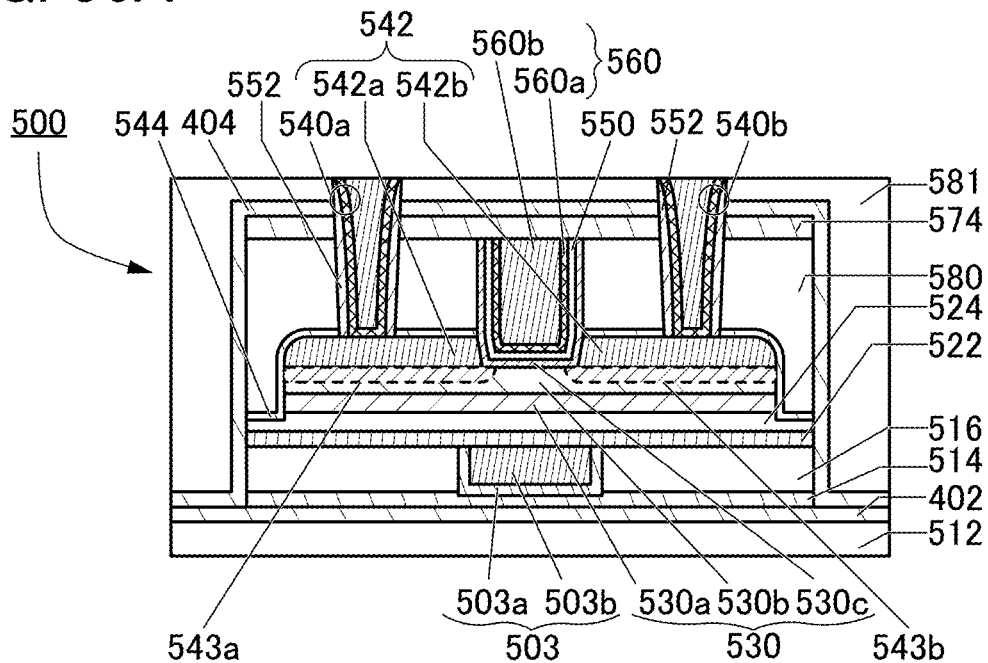
FIGS. 36A and 36B are schematic cross-sectional views illustrating a structure example of a transistor.
Figure 36B:
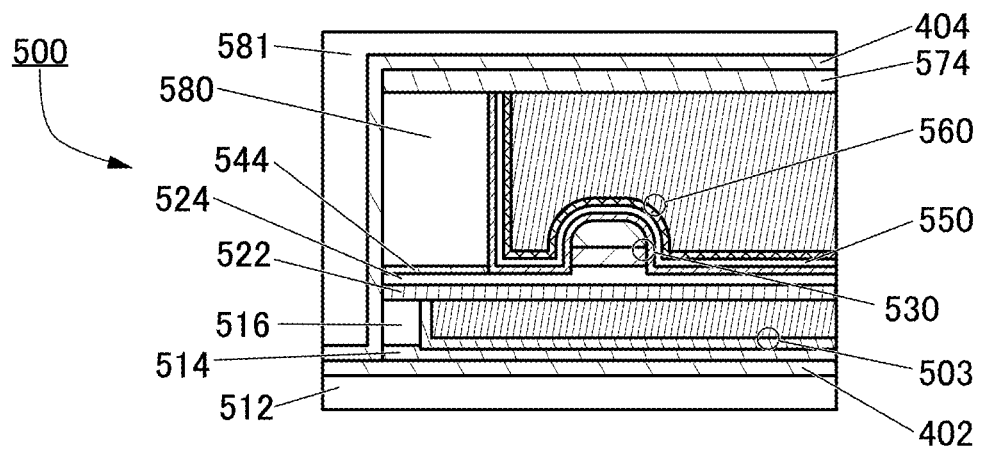

FIG. 36A and FIG. 36B illustrate a modification example of the transistor 500 illustrated in FIG. 35A and FIG. 35B; FIG. 36A is a cross-sectional view of the transistor 500 in the channel length direction and FIG. 36B is a cross-sectional view of the transistor 500 in the channel width direction. Note that the structure illustrated in FIGS. 36A and 36B can be employed for other transistors included in the semiconductor device, such as the transistor 300, according to one embodiment of the present invention.

The transistor 500 illustrated in FIGS. 36A and 36B is different from the transistor 500 in FIGS. 35A and 35B in that an insulator 402 and an insulator 404 are included. In addition, a point of difference from the transistor 500 having the structure illustrated in FIGS. 35A and 35B is that the insulators 552 are provided in contact with the side surfaces of the conductor 540a and the conductor 540b. Furthermore, another point of difference from the transistor 500 having the structure illustrated in FIGS. 35A and 35B is not including the insulator 520.

In the transistor 500 illustrated in FIGS. 36A and 36B, the insulator 402 is provided over the insulator 512. The insulator 404 is provided over the insulator 574 and the insulator 402.

In the structure of the transistor 500 illustrated in FIGS. 36A and 36B, the insulator 514, the insulator 516, the insulator 522, the insulator 524, the insulator 544, the insulator 580, and the insulator 574 are provided and covered with the insulator 404. That is, the insulator 404 is in contact with the top surfaces of the insulator 574 and the insulator 402 and the side surfaces of the insulator 574, the insulator 580, the insulator 544, the insulator 524, the insulator 522, the insulator 516, and the insulator 514. With such a structure, the oxide 530 and the like are isolated from the outside by the insulator 404 and the insulator 402.

The insulator 402 and the insulator 404 preferably have high capability of inhibiting diffusion of hydrogen (e.g., one or both of hydrogen atoms, hydrogen molecules) or water molecules. For example, the insulator 402 and the insulator 404 are preferably formed using silicon nitride or silicon nitride oxide with a high hydrogen barrier property. This can inhibit diffusion of hydrogen or the like into the oxide 530, thereby suppressing the degradation of the characteristics of the transistor 500. Thus, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, as the insulator 552, an insulator such as silicon nitride, aluminum oxide, or silicon nitride oxide that has a high hydrogen barrier property is preferably used. In particular, silicon nitride is suitably used for the insulator 552 because of its high hydrogen barrier property. The use of a material having a high hydrogen barrier property for the insulator 552 can inhibit diffusion of impurities such as water or hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. In this manner, the reliability of the semiconductor device of one embodiment of the present invention can be increased.

Figure 37:
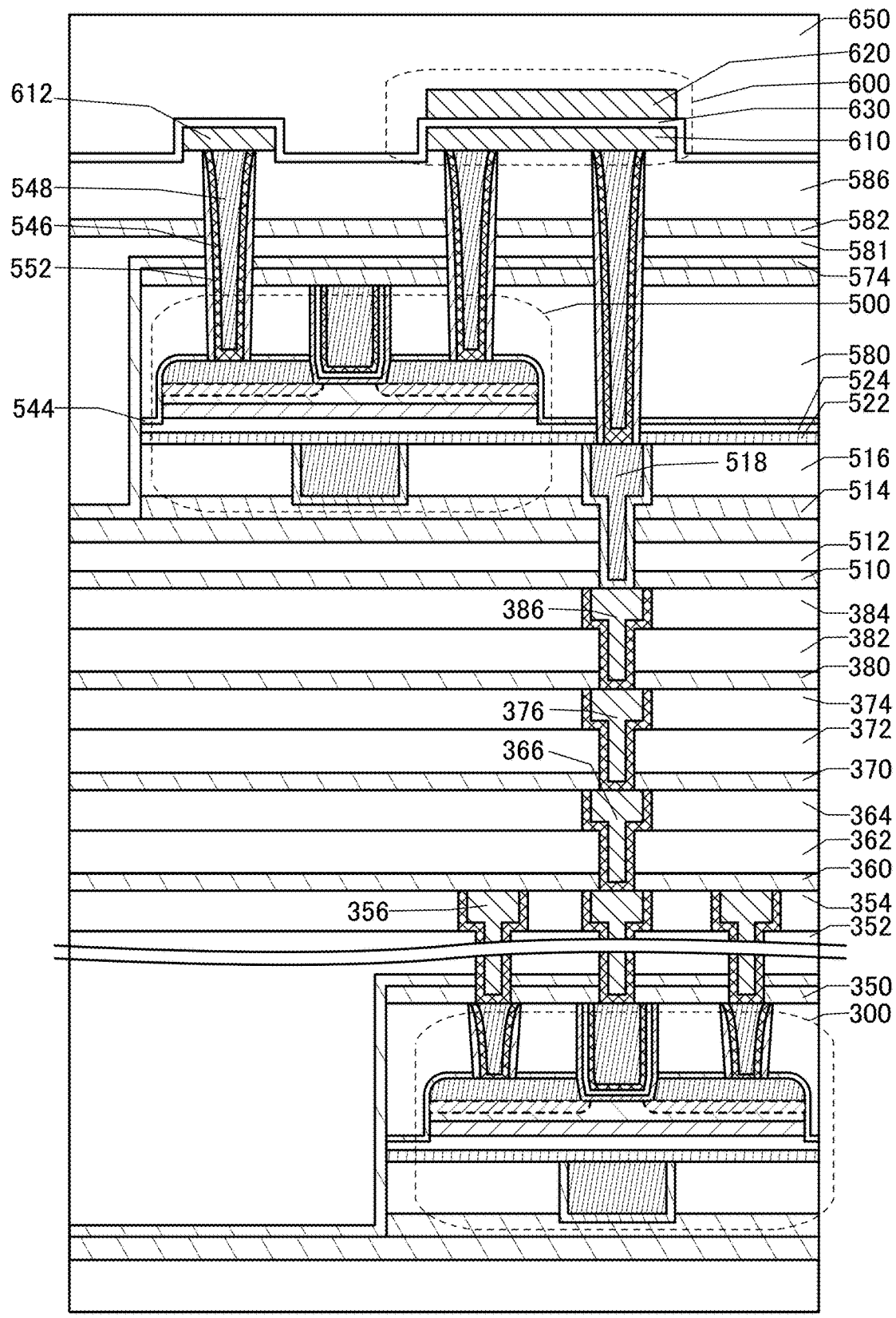
FIG. 37 is a schematic cross-sectional view illustrating a structure example of a semiconductor device.

FIG. 37 is a cross-sectional view illustrating a structure example of the semiconductor device in the case where the transistors 500 and 300 have the structure illustrated in FIGS. 36A and 36B. The insulator 552 is provided on the side surface of the conductor 546.

Figure 38A:
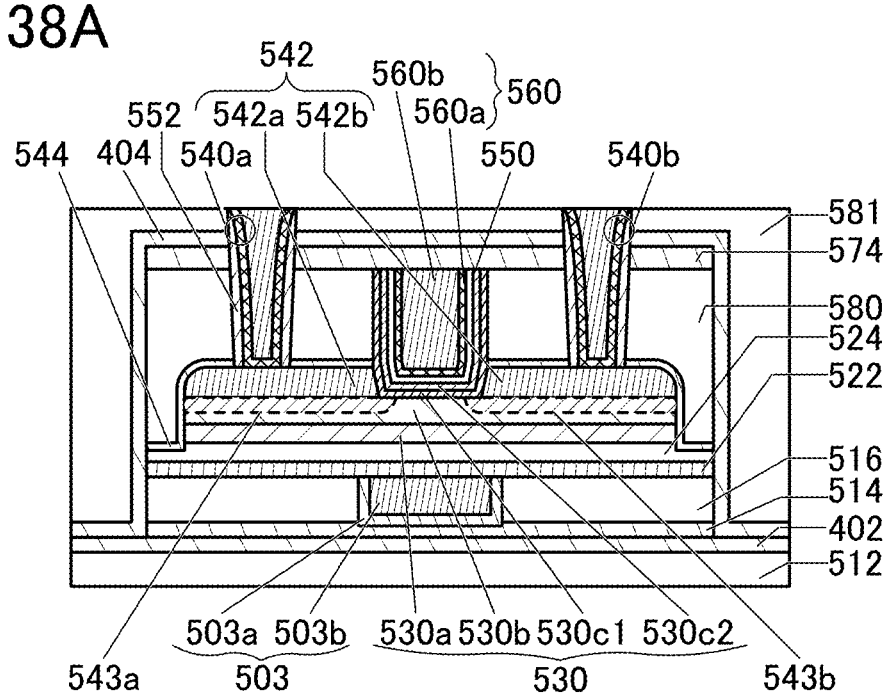
FIGS. 38A and 38B are schematic cross-sectional views illustrating a structure example of a transistor.
Figure 38B:
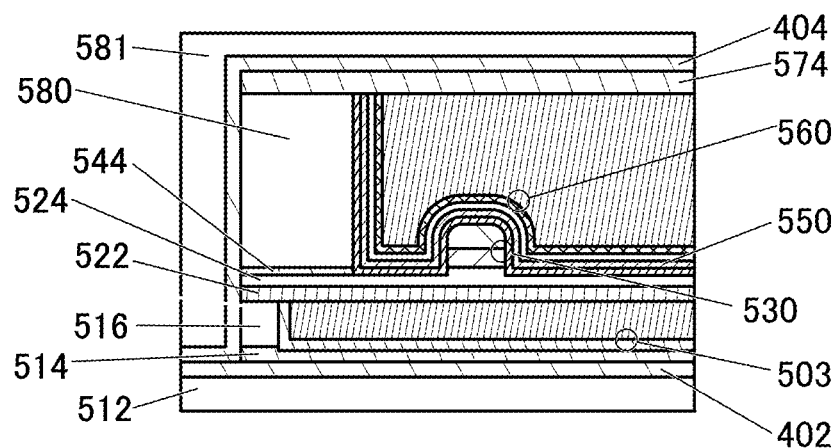

The transistor structure of the transistor 500 illustrated in FIGS. 36A and 36B may be changed depending on the situation. As the modification example of the transistor 500 in FIGS. 36A and 36B, a transistor illustrated in FIGS. 38A and 38B can be employed, for example. FIG. 38A is a cross-sectional view of the transistor in the channel length direction and FIG. 38B illustrates a cross-sectional view of the transistor in the channel width direction. The transistor illustrated in FIGS. 38A and 38B is different from the transistor illustrated in FIGS. 36A and 36B in that the oxide 530c has a two-layer structure of an oxide 530c1 and an oxide 530c2.

The oxide 530c1 is in contact with the top surface of the insulator 524, the side surface of the oxide 530a, the top surface and the side surface of the oxide 530b, the side surfaces of the conductor 542a and the conductor 542b, the side surface of the insulator 544, and the side surface of the insulator 580. The oxide 530c2 is in contact with the insulator 550.

An In—Zn oxide can be used, for example, as the oxide 530c1. For the oxide 530c2, it is possible to use the same material as that can be used for the oxide 530c when the oxide 530c has a single layer. For example, as the oxide 530c2, a metal oxide having an atomic ratio of In:Ga:Zn=1:3:4, Ga:Zn=2:1, or Ga:Zn=2:5 can be used.

When the oxide 530c has a two-layer structure of the oxide 530c1 and the oxide 530c2, the on-state current of the transistor can be increased as compared with the case where the oxide 530c has a single-layer structure. Thus, a transistor can be a power MOS transistor, for example. Note that the oxide 530c included in the transistor illustrated in FIGS. 35A and 35B can also be a two-layer structure of the oxide 530c1 and the oxide 530c2.

The transistor having the structure illustrated in FIGS. 38A and 38B can be used as, for example, the transistor 300 illustrated in FIG. 33 and FIG. 34. In addition, for example, the transistor 300 can be used as a transistor or the like included in the semiconductor device described in the above embodiments, for example, the arithmetic circuit MAC1, the arithmetic circuit MAC1A, the arithmetic circuit MAC2, and the arithmetic circuit MAC3 described in the above embodiments, as described above. Note that the transistor illustrated in FIGS. 38A and 38B can be used as a transistor, other than the transistor 300 and the transistor 500, included in the semiconductor device of one embodiment of the present invention.

Figure 39:
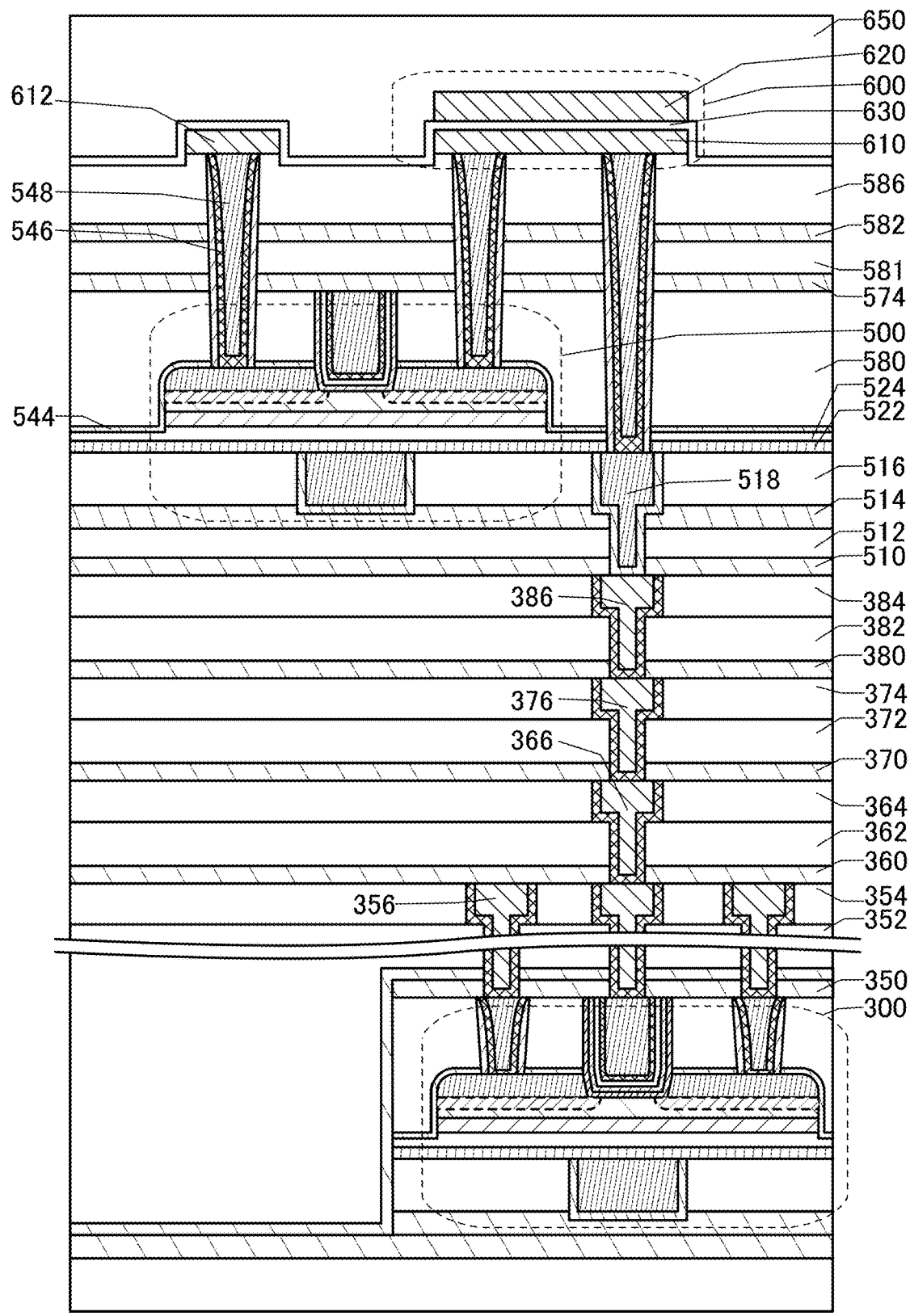
FIG. 39 is a schematic cross-sectional view illustrating a structure example of a semiconductor device.

FIG. 39 is a cross-sectional view illustrating a structure example of a semiconductor device in the case where the transistor 500 has the transistor structure illustrated in FIG. 35A and the transistor 300 has the transistor structure illustrated in FIG. 38A. Note that as in FIG. 37, the structure is employed in which the insulator 552 is provided on the side surface of the conductor 546. As illustrated in FIG. 39, in the semiconductor device of one embodiment of the present invention, the transistor 300 and the transistor 500 can have different structures while the transistor 300 and the transistor 500 are both OS transistors.

Next, a capacitor that can be used in the semiconductor devices in FIG. 33, FIG. 34, FIG. 37, and FIG. 39 is described.

Figure 40A:
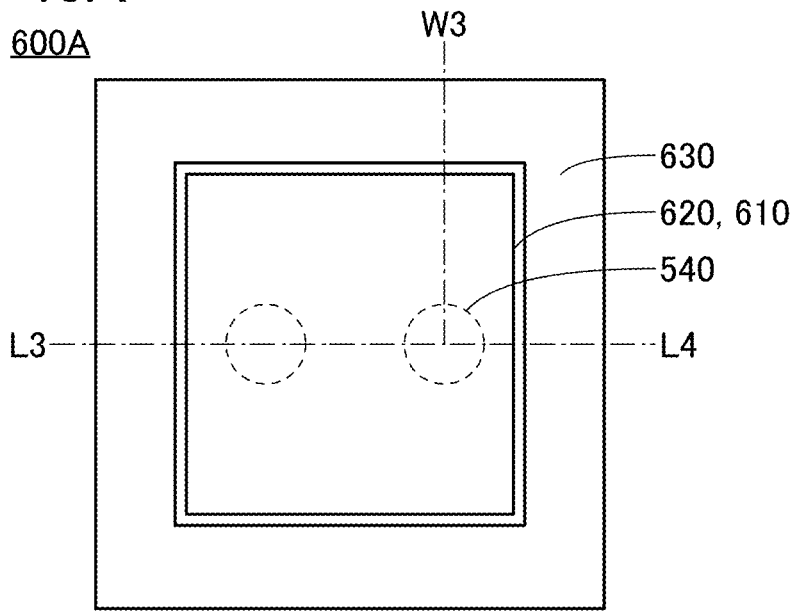
FIG. 40A is a plan view illustrating a structure example of a capacitor.
Figure 40B:
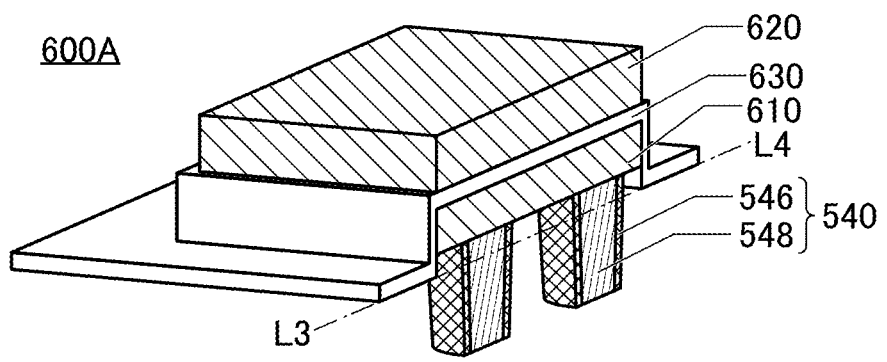
FIGS. 40B and 40C are cross-sectional perspective views illustrating a structure example of the capacitor.
Figure 40C:
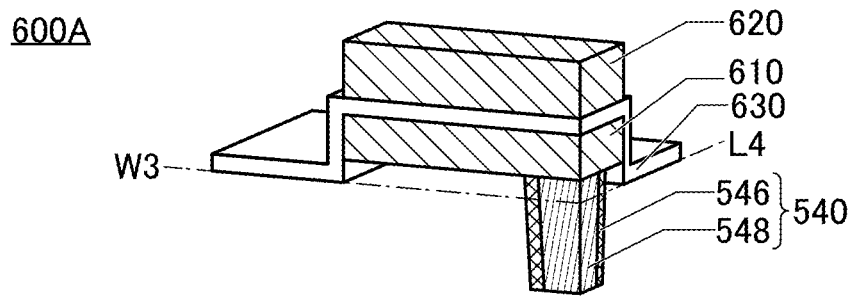

FIGS. 40A to 40C illustrate a capacitor 600A as an example of the capacitor 600 that can be used in the semiconductor device shown in FIG. 33, FIG. 34, FIG. 37, and FIG. 39. FIG. 40A is a plan view of the capacitor 600A. FIG. 40B is a perspective view illustrating a cross section of the capacitor 600A along the dashed-dotted line L3-L4. FIG. 40C is a perspective view illustrating a cross section of the capacitor 600A along the dashed-dotted line W3-L4.

The conductor 610 functions as one of a pair of electrodes of the capacitor 600A, and the conductor 620 functions as the other of the pair of electrodes of the capacitor 600A. The insulator 630 functions as a dielectric that is sandwiched between the pair of electrodes.

The insulator 630 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, zirconium oxide, or the like. Note that in this specification, "hafnium oxynitride" refers to a material that contains oxygen at a higher proportion than nitrogen, and "hafnium nitride oxide" refers to a material that contains nitrogen at a higher proportion than oxygen.

For example, the insulator 630 preferably has a stacked-layer structure using a material with high dielectric strength such as silicon oxynitride and a high dielectric constant (high-k) material. In the capacitor 600A having such a structure, a sufficient capacitance can be provided owing to the high dielectric constant (high-k) insulator, and the dielectric strength can be increased owing to the insulator with high dielectric strength, so that the electrostatic breakdown of the capacitor 600A can be prevented.

As the insulator using a high dielectric constant (high-k) material (a material having a high dielectric constant), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

Alternatively, the insulator 630 may have a single-layer structure or a stacked-layer structure using an insulator containing a high-k material such as aluminum oxide, hafnium oxide, tantalum oxide, zirconium oxide, lead zirconate titanate (PZT), strontium titanate ($SrTiO_3$), or (Ba, Sr)$TiO_3$ (BST). For a stacked-layer structure of the insulator 630, a three-layer structure with zirconium oxide, aluminum oxide, and zirconium oxide in this order, or a four-layer structure with zirconium oxide, aluminum oxide, zirconium oxide, and aluminum oxide in this order can be employed, for example. For the insulator 630, a compound containing hafnium and zirconium may be used. When the semiconductor device is minimized and highly integrated, a gate insulator and a dielectric used for a capacitor become thin, which might cause a problem of leakage current generated in a transistor or a capacitor. When a high-k material is used for an insulator functioning as a gate insulator and a dielectric used for a capacitor, a gate potential at the time when the transistor operates can be reduced and capacitance of the capacitor can be secured while the physical thickness of a gate insulator and a capacitor is maintained.

The bottom portion of the conductor 610 in the capacitor 600 is electrically connected to the conductor 546 and the conductor 548. The conductors 546 and 548 function as plugs or wirings for connecting to another circuit component. In FIGS. 40A to 40C, the conductors 546 and 548 are collectively indicated by a conductor 540.

For simplification, FIGS. 40A to 40C do not show the insulator 586 in which the conductors 546 and 548 are embedded, and the insulator 650 that covers the conductor 620 and the insulator 630.

Although the capacitor 600 illustrated in each of FIG. 33, FIG. 34, FIG. 37, FIG. 39, FIGS. 40A to 40C is a planar capacitor, the shape of the capacitor is not limited thereto. For example, the capacitor 600 may be a cylindrical capacitor 600B illustrated in FIGS. 41A to 41C.

Figure 41A:
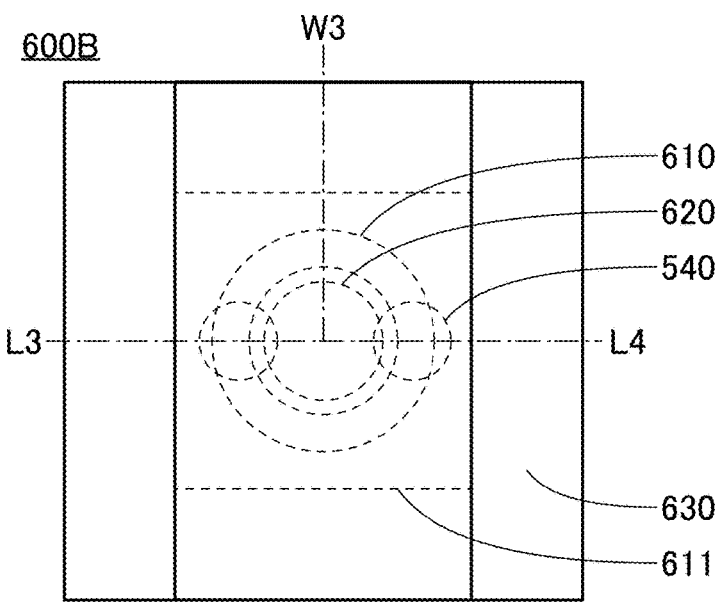
FIG. 41A is a plan view illustrating a structure example of a capacitor.
Figure 41B:
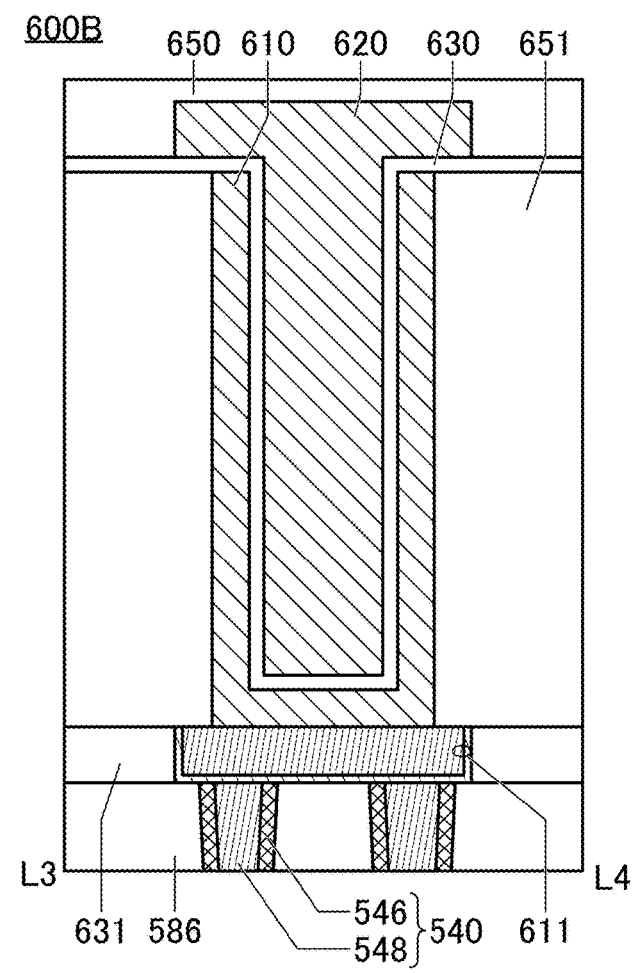
FIG. 41B is a cross-sectional view illustrating a structure example of the capacitor.
Figure 41C:
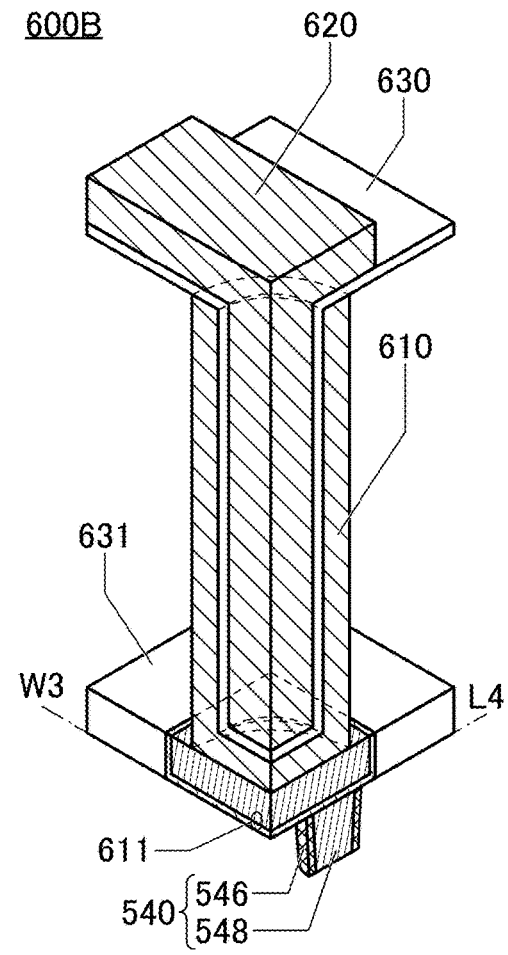
FIG. 41C is a cross-sectional perspective view illustrating a structure example of the capacitor.

FIG. 41A is a plan view of the capacitor 600B. FIG. 41B is a perspective view illustrating a cross section of the capacitor 600B along the dashed-dotted line L3-L4. FIG. 41C is a perspective view illustrating a cross section of the capacitor 600B along the dashed-dotted line W3-L4.

In FIG. 41B, the capacitor 600B includes an insulator 631 over the insulator 586 in which the conductor 540 is embedded, an insulator 651 having an opening, the conductor 610 functioning as one of a pair of electrodes, and the conductor 620 functioning as the other of the pair of electrodes.

For simplification, the insulator 586, the insulator 650, and the insulator 651 are omitted in FIG. 41C.

The insulator 631 can be formed using a material similar to that for the insulator 586, for example.

A conductor 611 is embedded in the insulator 631 to be electrically connected to the conductor 540. The conductor 611 can be formed using a material similar to that for the conductor 330 and the conductor 518, for example.

The insulator 651 can be formed using a material similar to that for the insulator 586, for example.

The insulator 651 has an opening as described above, and the opening overlaps the conductor 611.

The conductor 610 is formed on the bottom portion and the side surface of the opening. In other words, the conductor 610 overlaps the conductor 611 and is electrically connected to the conductor 611.

Note that the opening is formed in the insulator 651 by etching or the like, and then, the conductor 610 is formed by a sputtering method, an ALD method, or the like. After that, the conductor 610 formed over the insulator 651 is removed by a CMP method or the like while the conductor 610 in the opening is left.

The insulator 630 is positioned over the insulator 651 and the conductor 610. In the capacitor, the insulator 630 functions as a dielectric between the pair of electrodes.

The conductor 620 is formed over the insulator 630 so as to fill the opening of the insulator 651.

The insulator 650 is formed to cover the insulator 630 and the conductor 620.

The capacitance of the cylindrical capacitor 600B in FIGS. 41A to 41C can be higher than that of the planar capacitor 600A.

Note that this embodiment can be combined with any of the other embodiments in this specification as appropriate.

Embodiment 7

Described in this embodiment is a metal oxide (hereinafter also referred to as an oxide semiconductor) applicable to an OS transistor described in the above embodiments.

A metal oxide preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and cobalt may be contained.

<Classification of Crystal Structure>

First, the classification of the crystal structures of an oxide semiconductor will be described with reference to FIG. 42A. FIG. 42A shows the classification of crystal structures of an oxide semiconductor, typically IGZO (a metal oxide containing In, Ga, and Zn).

As shown in FIG. 42A, oxide semiconductors are roughly classified into "Amorphous", "Crystalline", and "Crystal". The term "Amorphous" includes a completely amorphous structure. The term "Crystalline" includes c-axis-aligned crystalline (CAAC), nanocrystalline (nc), and cloud-aligned composite (CAC) structures, excluding single crystal and poly crystal. Note that the term "Crystalline" excludes single crystal, poly crystal, and completely amorphous. The term "Crystal" includes single crystal and poly crystal structures.

Note that the structures in the thick frame in FIG. 42A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 42B shows an XRD spectrum, which is obtained by grazing-incidence XRD (GIXD) measurement, of a CAAC-IGZO film classified into "Crystalline" (the vertical axis represents intensity in arbitrary unit (a. u.)). Note that a GIXD method is also referred to as a thin film method or a Seemann-Bohlin method. The XRD spectrum that is shown in FIG. 42B and obtained by GIXD measurement is hereinafter simply referred to as an XRD spectrum. The CAAC-IGZO film in FIG. 42B has an atomic ratio of In:Ga:Zn=4:2:3 or a neighborhood thereof. The CAAC-IGZO film in FIG. 42B has a thickness of 500 nm.

As shown in FIG. 42B, a clear peak indicating crystallinity is observed in the XRD spectrum of the CAAC-IGZO film. Specifically, a peak indicating c-axis alignment is observed at 2θ of around 31° in the XRD spectrum of the CAAC-IGZO film. As shown in FIG. 42B, the peak at 2θ of around 31° is asymmetric with the angle at which the peak intensity is observed as the axis.

A crystal structure of a film or a substrate can also be evaluated with a diffraction pattern obtained by a nanobeam electron diffraction (NBED) method (such a pattern is also referred to as a nanobeam electron diffraction pattern). FIG. 42C shows a diffraction pattern of the CAAC-IGZO film. FIG. 42C shows a diffraction pattern obtained by the NBED method in which an electron beam is incident in the direction parallel to the substrate. The CAAC-IGZO film in FIG. 42C has an atomic ratio of In:Ga:Zn=4:2:3 or a neighborhood thereof. In the nanobeam electron diffraction method, electron diffraction is performed with a probe diameter of 1 nm.

As shown in FIG. 42C, a plurality of spots indicating c-axis alignment are observed in the diffraction pattern of the CAAC-IGZO film.

<<Structure of Oxide Semiconductor>>

Oxide semiconductors might be classified in a manner different from the one in FIG. 42A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, cobalt, magnesium, and antimony), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M, Zn) layer) are stacked. Indium and the element M can be replaced with each other. Therefore, indium may be contained in the (M, Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at or around 2θ=31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are symmetric with respect to a spot of the incident electron beam which passes through a sample (also referred to as a direct spot).

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Hence, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a diffraction pattern like a halo pattern is shown in a selected-area electron diffraction pattern of the nc-OS film obtained using an electron beam having a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

<<Composition of Oxide Semiconductor>>

Next, the CAC-OS will be described in detail. Note that the CAC-OS relates to the material composition.

[CAC-OS]

The CAC-OS refers to a composition of a material in which elements constituting a metal oxide are unevenly distributed with a size greater than or equal to 0.5 nm and less than or equal to nm, preferably greater than or equal to 1 nm and less than or equal to 3 nm, or a similar size, for example. Note that in the following description of a metal oxide, a state in which one or more types of metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 3 nm, or a similar size.

The CAC-OS also refers to a composition in which materials are separated into a first region and a second region to form a mosaic pattern, and the first regions are distributed in the film. This composition is hereinafter also referred to as a cloud-like composition. That is, the CAC-OS is a composite metal oxide having a composition in which the first regions and the second regions are mixed.

Here, the atomic ratios of In, Ga, and Zn to a metal element included in a CAC-OS in an In—Ga—Zn oxide are expressed as [In], [Ga], and [Zn], respectively. For example, the first region in the CAC-OS in the In—Ga—Zn oxide has [In] higher than that in the composition of the CAC-OS film. Moreover, the second region of the CAC-OS in the In—Ga—Zn oxide has [Ga] higher than that in the composition of the CAC-OS film. Alternatively, for example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (p), and excellent switching operation can be achieved An oxide semiconductor can have any of various structures that show various different properties. Two or more of an amorphous oxide semiconductor, a polycrystalline oxide semiconductor, an a-like OS, the CAC-OS, an nc-OS, and the CAAC-OS may be included in an oxide semiconductor of one embodiment of the present invention.

<Transistor Including Oxide Semiconductor>

Next, a transistor including the above oxide semiconductor will be described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charge trapped by the trap states in the oxide semiconductor takes a long time to disappear and might behave like fixed charge. A transistor whose channel formation region is formed in an oxide semiconductor having a high density of trap states has unstable electrical characteristics in some cases.

In order to obtain stable electrical characteristics of the transistor, reducing the concentration of impurities in the oxide semiconductor is effective. In order to reduce the impurity concentration in the oxide semiconductor, the impurity concentration in a film that is adjacent to the oxide semiconductor is preferably reduced. Examples of impurities include hydrogen, nitrogen, an alkali metal, an alkaline earth metal, iron, nickel, and silicon.

<Impuriy>

The influence of impurities in the oxide semiconductor will be described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration measured by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Accordingly, a transistor including an oxide semiconductor that contains alkali metal or alkaline earth metal tends to become normally-on. Thus, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor including, as a semiconductor, an oxide semiconductor that contains nitrogen tends to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom generates an electron serving as a carrier. Thus, a transistor including an oxide semiconductor that contains hydrogen tends to have normally-on characteristics. For this reason, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

Note that this embodiment can be combined with any of the other embodiments in this specification as appropriate.

Embodiment 8

This embodiment will show a semiconductor wafer provided with the semiconductor device or the like described in the foregoing embodiment and examples of an electronic component including the semiconductor device.
<Semiconductor Wafer>

First, an example of a semiconductor wafer provided with a semiconductor device or the like is described with reference to FIG. 43A.

Figure 43A:
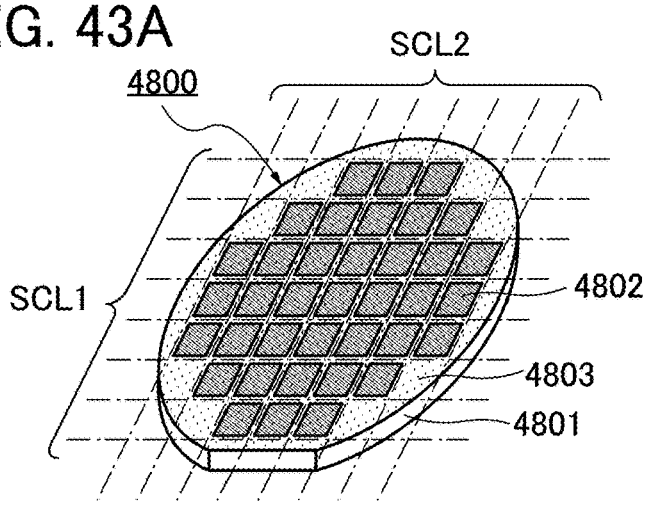
FIG. 43A is a perspective view illustrating an example of a semiconductor wafer.

A semiconductor wafer 4800 illustrated in FIG. 43A includes a wafer 4801 and a plurality of circuit portions 4802 provided on the top surface of the wafer 4801. A portion without the circuit portions 4802 on the top surface of the wafer 4801 is a spacing 4803 that is a region for dicing.

The semiconductor wafer 4800 can be formed by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

Next, a dicing step is performed. The dicing is carried out along scribe lines SCL1 and scribe lines SCL2 (sometimes referred to as dicing lines or cutting lines) indicated by dashed-dotted lines. To perform the dicing step easily, the spacing 4803 is preferably arranged such that a plurality of scribe lines SCL1 are parallel to each other, a plurality of scribe lines SCL2 are parallel to each other, and the scribe lines SCL1 and the scribe lines SCL2 intersect each other perpendicularly.

Figure 43B:
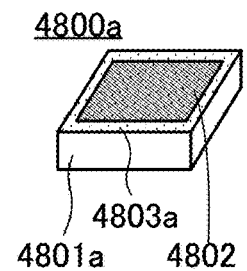
FIG. 43B is a perspective view illustrating an example of a chip.

With the dicing step, a chip 4800a illustrated in FIG. 43B can be cut out from the semiconductor wafer 4800. The chip 4800a includes a wafer 4801a, the circuit portion 4802, and a spacing 4803a. Note that it is preferable to make the spacing 4803a as small as possible. Here, it is preferred that the width of the spacing 4803 between adjacent circuit portions 4802 be substantially the same as the width of the scribe line SCL1 or the scribe line SCL2.

The shape of the element substrate of one embodiment of the present invention is not limited to the shape of the semiconductor wafer 4800 illustrated in FIG. 43A. The element substrate may be a rectangular semiconductor wafer, for example. The shape of the element substrate can be changed as appropriate, depending on a process for fabricating an element and an apparatus for fabricating the element.
<Electronic Component>

Figure 43C:
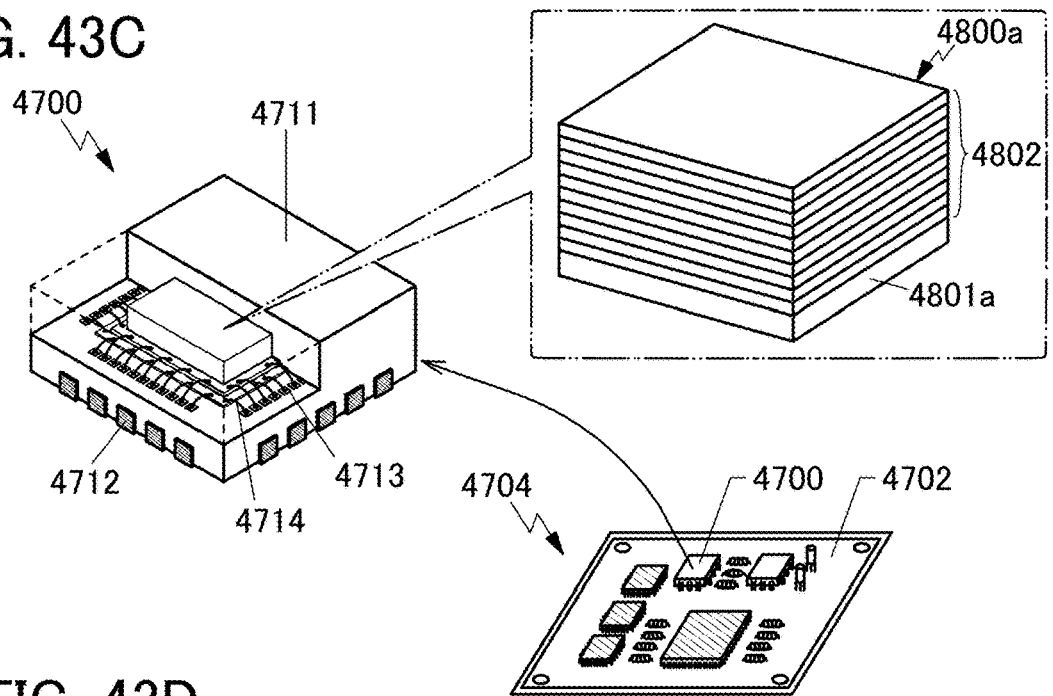
FIGS. 43C and 43D are perspective views illustrating examples of electronic components.

FIG. 43C is a perspective view of an electronic component 4700 and a substrate (a circuit board 4704) on which the electronic component 4700 is mounted. The electronic component 4700 in FIG. 43C includes the chip 4800a in a mold 4711. Note that the chip 4800a illustrated in FIG. 43C has a structure in which the circuit portions 4802 are stacked. To illustrate the inside of the electronic component 4700, some portions are omitted in FIG. 43C. The electronic component 4700 includes a land 4712 outside the mold 4711. The land 4712 is electrically connected to an electrode pad 4713, and the electrode pad 4713 is electrically connected to the chip 4800a via a wire 4714. The electronic component 4700 is mounted on a printed circuit board 4702, for example. A plurality of such electronic components are combined and electrically connected to each other on the printed circuit board 4702; thus, the circuit substrate 4704 is completed.

Figure 43D:
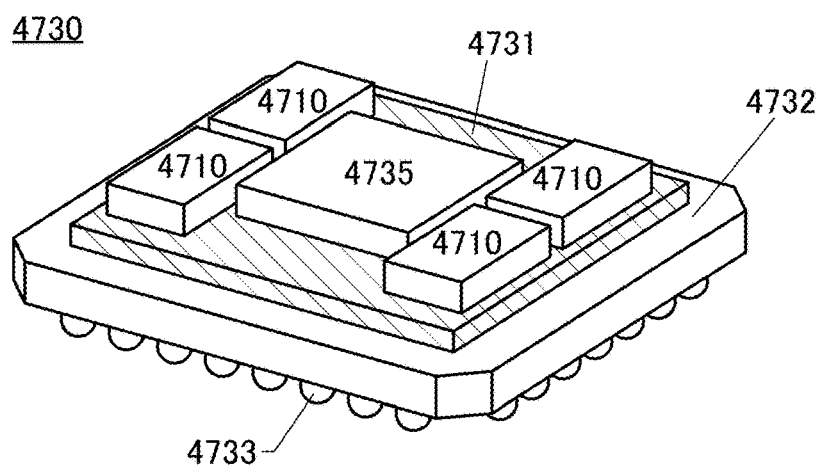

FIG. 43D is a perspective view of an electronic component 4730. The electronic component 4730 is an example of a system-in-package (SiP) or a multi-chip module (MCM). In the electronic component 4730, an interposer 4731 is provided over a package substrate 4732 (printed circuit board), and a semiconductor device 4735 and a plurality of semiconductor devices 4710 are provided over the interposer 4731.

The electronic component 4730 includes the semiconductor device 4710. Examples of the semiconductor devices 4710 include the semiconductor device described in the foregoing embodiment and a high bandwidth memory (HBM). Moreover, an integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings have a single-layer structure or a multi-layer structure. The interposer 4731 has a function of electrically connecting an integrated circuit provided on the interposer 4731 to an electrode provided on the package substrate 4732. Accordingly, the interposer is sometimes referred to as a redistribution substrate or an intermediate substrate. A through electrode may be provided in the interposer 4731 and used to electrically connect the integrated circuit and the package substrate 4732. In the case of using a silicon interposer, a through-silicon via (TSV) can also be used as the through electrode.

A silicon interposer is preferably used as the interposer 4731. The silicon interposer can be manufactured at lower cost than an integrated circuit because it is unnecessary to provide an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, minute wirings are required to be formed densely on an interposer on which an HBM is mounted. For this reason, a silicon interposer is preferably used as the interposer on which an HBM is mounted.

In an SiP or MCM using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided thereon is less likely to occur. It is preferable to use a silicon interposer especially for a 2.5D package (2.5D mounting) in which a plurality of integrated circuits are arranged side by side on an interposer.

A heat sink (radiator plate) may be provided to overlap with the electronic component 4730. When a heat sink is provided, the heights of integrated circuits provided on the interposer 4731 are preferably the same. For example, in the electronic component 4730 described in this embodiment, the heights of the semiconductor devices 4710 and the semiconductor device 4735 are preferably the same.

An electrode 4733 may be provided on the bottom of the package substrate 4732 to mount the electronic component 4730 on another substrate. FIG. 43D illustrates an example in which the electrode 4733 is formed of a solder ball. Solder balls are provided in a matrix on the bottom of the package substrate 4732, whereby a ball grid array (BGA) can be achieved. Alternatively, the electrode 4733 may be formed of a conductive pin. When conductive pins are provided in a matrix on the bottom of the package substrate 4732, a pin grid array (PGA) can be achieved.

The electronic component 4730 can be mounted on another substrate in a variety of manners other than a BGA and a PGA. For example, a staggered pin grid array (SPGA), a land grid array (LGA), a quad flat package (QFP), a quad flat J-leaded package (QFJ), or a quad flat non-leaded package (QFN) can be employed.

Note that this embodiment can be combined with any of the other embodiments in this specification as appropriate.

Embodiment 9

Figure 44:
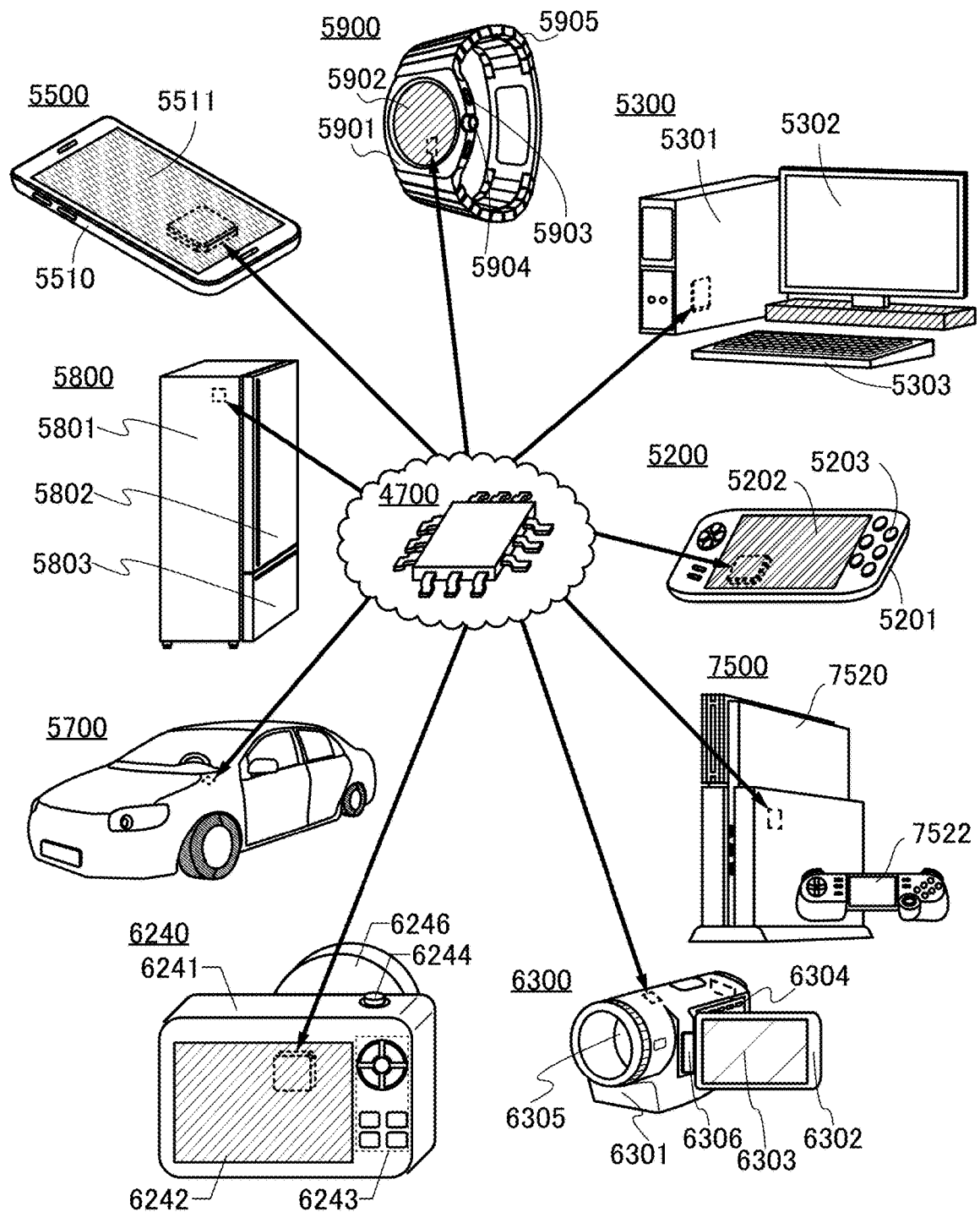
FIG. 44 is a perspective view illustrating examples of electronic devices.

This embodiment will show examples of electronic devices each including the semiconductor device described in the above embodiment. FIG. 44 illustrates electronic devices each including the electronic component 4700 that includes the semiconductor device.

[Mobile Phone]

An information terminal 5500 illustrated in FIG. 44 is a mobile phone (a smartphone), which is a type of information terminal. The information terminal 5500 includes a housing 5510 and a display portion 5511. As input interfaces, a touch panel and a button are provided in the display portion 5511 and the housing 5510, respectively.

With use of the semiconductor device described in the above embodiment, the information terminal 5500 can execute an application utilizing artificial intelligence. Examples of the application utilizing artificial intelligence include an application for interpreting a conversation and displaying its content on the display portion 5511; an application for recognizing letters, figures, and the like input to the touch panel of the display portion 5511 by a user and displaying them on the display portion 5511; and an application for biometric authentication using fingerprints, voice prints, or the like. With use of the semiconductor device described in the above embodiment, the information terminal 5500 can execute the above application with low power consumption.

[Wearable Terminal]

FIG. 44 illustrates a watch-type information terminal 5900 as an example of a wearable terminal. The information terminal 5900 includes a housing 5901, a display portion 5902, an operation button 5903, an operator 5904, and a band 5905.

The wearable terminal can execute an application utilizing artificial intelligence with use of the semiconductor device described in any of the above embodiments, like the information terminal 5500. Examples of the application utilizing artificial intelligence include an application that manages the health condition of the user of the wearable terminal and a navigation system that selects the optimal route and navigates the user on the basis of the input of the destination. The information terminal 5900 including the semiconductor device of the above described embodiments can execute the above described applications and systems with low power consumption.

[Information Terminal]

FIG. 44 also illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with use of the semiconductor device described in the above embodiment, like the information terminal 5500 described above. Examples of the application utilizing artificial intelligence include design-support software, text correction software, and software for automatic menu generation. Furthermore, with use of the desktop information terminal 5300, novel artificial intelligence can be developed.

Although FIG. 44 illustrates a smartphone and a desktop information terminal as examples of the electronic device, one embodiment of the present invention can also be applied to information terminals other than a smartphone, a desktop information terminal, and a wearable terminal. Examples of information terminals other than a smartphone, a desktop information terminal, and a wearable terminal include a personal digital assistant (PDA), a laptop information terminal, and a workstation.

[Household Appliance]

FIG. 44 illustrates an electric refrigerator-freezer 5800 as an example of a household appliance. The electric refrigerator-freezer 5800 includes a housing 5801, a refrigerator door 5802, and a freezer door 5803.

When the semiconductor device described in the above embodiment is used in the electric refrigerator-freezer 5800, the electric refrigerator-freezer 5800 with artificial intelligence can be obtained. Utilizing the artificial intelligence enables the electric refrigerator-freezer 5800 to have a function of automatically making a menu based on foods stored in the electric refrigerator-freezer 5800 and food expiration dates, or a function of automatically controlling the temperature to be appropriate for the foods stored in the electric refrigerator-freezer 5800, and the like.

Here, an electric refrigerator-freezer is described as an example of a household appliance; other examples of household appliances include a vacuum, a microwave oven, an electric oven, a rice cooker, a water heater, an induction heating (IH) cooker, a water server, a heating-cooling combination appliance such as an air conditioner, a washing machine, a drying machine, and an audio visual appliance.

[Game Machine]

FIG. 44 illustrates a portable game machine 5200 as an example of a game machine. The portable game machine 5200 includes a housing 5201, a display portion 5202, and a button 5203.

FIG. 44 illustrates a stationary game machine 7500 as another example of a game machine. The stationary game machine 7500 includes a main body 7520 and a controller 7522. The controller 7522 can be connected to the main body 7520 with or without a wire. Although not illustrated in FIG. 44, the controller 7522 can include a display portion that displays a game image, a touch panel or a stick serving as an input interface besides the button, a rotating knob, a sliding knob, and the like. The shape of the controller 7522 is not limited to that in FIG. 44 and may be changed variously in accordance with the genres of games. For example, in a shooting game such as a first person shooter (FPS) game, a gun-shaped controller having a trigger button can be used. As another example, in a music game or the like, a controller having a shape of a music instrument, audio equipment, or the like can be used. Furthermore, the stationary game machine may include a camera, a depth sensor, a microphone, and the like so that the game player can play a game using a gesture and/or a voice instead of a controller.

Videos displayed on the game machine can be output with a display device such as a television device, a personal computer display, a game display, and a head-mounted display.

The portable game machine 5200 including the semiconductor device described in any of the above embodiments can have low power consumption. Furthermore, heat generation from a circuit can be reduced owing to low power consumption; thus, the influence of heat generation on the circuit, the peripheral circuit, and the module can be reduced.

When the semiconductor device described in the above embodiment is used in the portable game machine 5200, the portable game machine 5200 with artificial intelligence can be obtained.

In general, the progress of a game, the actions and words of game characters, and expressions of a phenomenon in the game are programed in the game; however, the use of artificial intelligence in the portable game machine 5200 enables expressions not limited by the game program. For example, questions posed by the player, the progress of the game, time, and actions and words of game characters can be changed for various expressions.

The artificial intelligence can construct a virtual game player; thus, a game that needs a plurality of players can be played by only one human game player with the portable game machine 5200, with the use of a virtual game player constructed by the artificial intelligence as an opponent.

Although FIG. 44 illustrates the portable game machine as an example of a game machine, the electronic device of one embodiment of the present invention is not limited thereto. Examples of the electronic device of one embodiment of the present invention include a home stationary game machine, an arcade game machine installed in an entertainment facility (a game center, an amusement park, or the like), and a throwing machine for batting practice installed in sports facilities.

[Moving Vehicle]

The semiconductor device described in any of the above embodiments can be used for an automobile, which is a moving vehicle, and around the driver's seat in an automobile.

FIG. 44 illustrates an automobile 5700 as an example of a moving vehicle.

An instrument panel showing various kinds of information by displaying a speedometer, a tachometer, a mileage, a fuel meter, a gearshift indicator, air-conditioning settings, and the like is provided around the driver's seat in the automobile 5700. In addition, a display apparatus showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, thereby providing a high level of safety. That is, displaying an image taken by the imaging device provided on the exterior of the automobile 5700 eliminates blind areas and enhances safety.

Since the semiconductor device described in the above embodiment can be used as the components of artificial intelligence, the semiconductor device can be used for the automatic driving system of the automobile 5700. The semiconductor device can also be used for a system for navigation, risk prediction, or the like. The display device may display navigation information, risk prediction information, and the like. Furthermore, with use of the semiconductor device, the automated driving system with low power consumption can be achieved; therefore, for example, in the case where the system is mounted on an electric vehicle, the power consumption by the system is reduced, and as a result, a mileage of the vehicle can be increased.

Although an automobile is described above as an example of a moving vehicle, moving vehicles are not limited to an automobile. Examples of moving vehicles include a train, a monorail train, a ship, and a flying object (a helicopter, an unmanned aircraft (a drone), an airplane, and a rocket), and these moving vehicles can include a system utilizing artificial intelligence when equipped with the semiconductor device of one embodiment of the present invention.

[Camera]

The semiconductor device described in any of the above embodiments can be used for a camera.

FIG. 44 illustrates a digital camera 6240 as an example of an imaging device. The digital camera 6240 includes a housing 6241, a display portion 6242, operation buttons 6243, a shutter button 6244, and the like. An attachable lens 6246 is attached to the digital camera 6240. Here, the lens 6246 of the digital camera 6240 is detachable from the housing 6241 for replacement; alternatively, the lens 6246 may be inseparable from the housing 6241. Moreover, the digital camera 6240 may be configured to be equipped with a stroboscope, a viewfinder, or the like.

The digital camera 6240 including the semiconductor device described in any of the above embodiments can have low power consumption. Furthermore, heat generation from a circuit can be reduced owing to low power consumption; thus, the influence of heat generation on the circuit, the peripheral circuit, and the module can be reduced.

Furthermore, when the semiconductor device described in the above embodiment is used for the digital camera 6240, the digital camera 6240 including artificial intelligence can be obtained. Utilizing the artificial intelligence enables the digital camera 6240 to have a function of automatically recognizing a subject such as a face or an object, a function of adjusting a focus on the subject, a function of automatically using a flash in accordance with environments, and a function of toning a taken image, for example.

[Video Camera]

The semiconductor device described in the above embodiment can be used for a video camera.

FIG. 44 illustrates a video camera 6300 that is an example of an imaging device. The video camera 6300 includes a first housing 6301, a second housing 6302, a display portion 6303, operation keys 6304, a lens 6305, and a joint 6306. The operation keys 6304 and the lens 6305 are provided for the first housing 6301, and the display portion 6303 is provided for the second housing 6302. The first housing 6301 and the second housing 6302 are connected to each other with the joint 6306, and the angle between the first housing 6301 and the second housing 6302 can be changed with the joint 6306. Videos displayed on the display portion 6303 may be switched in accordance with the angle at the joint 6306 between the first housing 6301 and the second housing 6302.

When a video taken by the video camera 6300 is recorded, the video needs to be encoded based on a data recording format. With use of artificial intelligence, the video camera 6300 can perform the pattern recognition by artificial intelligence in encoding of the images. The pattern recognition is used to calculate a difference in the human, the animal, the object, and the like between continuously taken image data, so that the data can be compressed. Furthermore, by applying the semiconductor device described in the above embodiment to the video camera 6300, power consumption needed for the above operation and the like of the video camera 6300 can be reduced.

[Expansion Device for Personal Computer]

The semiconductor device described in any of the above embodiments can be used for a calculator such as a personal computer (PC) and an expansion device for an information terminal.

Figure 45A:
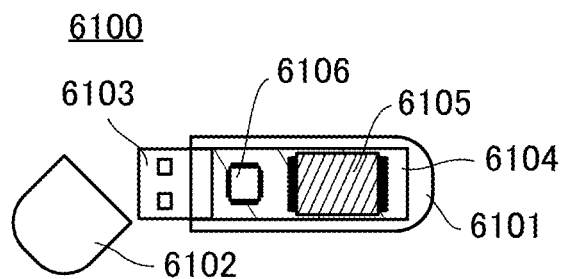
FIGS. 45A to 45C are perspective views illustrating electronic devices.

FIG. 45A illustrates, as an example of the expansion device, a portable expansion device 6100 that is externally attached to a PC and includes a chip capable of arithmetic processing. The expansion device 6100 can perform arithmetic processing using the chip when connected to the PC with a universal serial bus (USB), for example. FIG. 45A illustrates the portable expansion device 6100; however, the expansion device of one embodiment of the present invention is not limited to this and may be a relatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device or the like described in the above embodiment. For example, the substrate 6104 is provided with a chip 6105 (e.g., the semiconductor device described in the above embodiment, the electronic component 4700, and a memory chip) and a controller chip 6106. The USB connector 6103 serves as an interface for connection to an external device.

The use of the expansion device 6100 for a PC and the like can increase the arithmetic processing properties of the PC. Thus, a PC with insufficient processing capability can perform arithmetic operation of artificial intelligence, moving image processing, and the like.

[Broadcasting System]

The semiconductor device described in the above embodiment can be used for a broadcasting system.

Figure 45B:
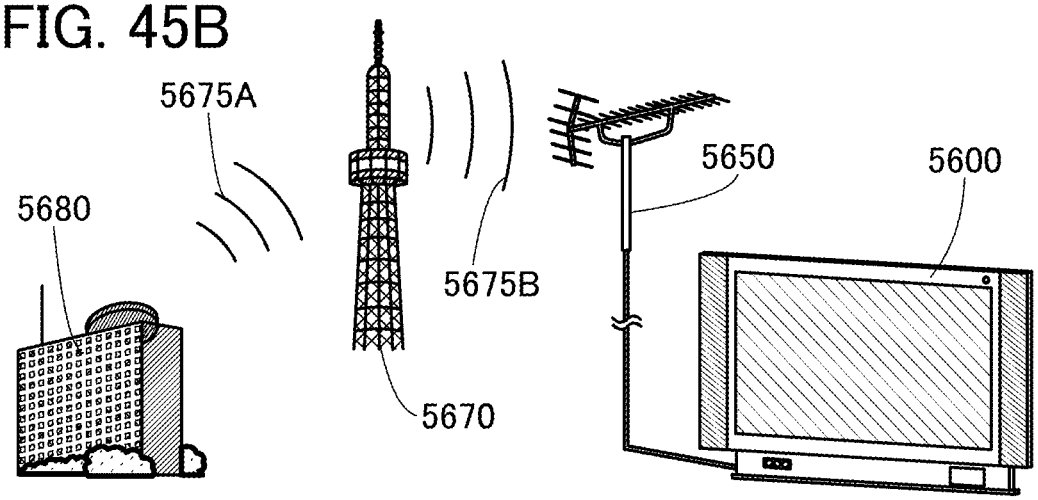

FIG. 45B schematically illustrates data transmission in a broadcasting system. Specifically, FIG. 45B illustrates a path in which a radio wave (a broadcast signal) transmitted from a broadcast station 5680 is delivered to a television receiver (TV) 5600 at home. The TV 5600 includes a receiving device (not illustrated), and the broadcast signal received by an antenna 5650 is transmitted to the TV 5600 through the receiving device.

Although an ultra-high frequency (UHF) antenna is shown as the antenna 5650 in FIG. 45B, a BS/110° CS antenna, a CS antenna, or the like can also be used.

A radio wave 5675A and a radio wave 5675B are broadcast signals for terrestrial broadcasting; a radio wave tower 5670 amplifies the received radio wave 5675A and transmits the radio wave 5675B. Each household can view terrestrial broadcasting on the TV 5600 by receiving the radio wave 5675B with the antenna 5650. Note that the broadcasting system is not limited to the terrestrial broadcasting illustrated in FIG. 45B and may be satellite broadcasting using an artificial satellite, data broadcasting using an optical line, or the like.

The above-described broadcasting system may utilize artificial intelligence by including the semiconductor device described in the above embodiment. When the broadcast data is transmitted from the broadcast station 5680 to the TV 5600 at home, the broadcast data is compressed by an encoder. The antenna 5650 receives the compressed broadcast data, and then the compressed broadcast data is decompressed by a decoder of the receiving device in the TV 5600. With use of the artificial intelligence, for example, a display pattern included in an image can be recognized in motion compensation prediction, which is one of the compressing methods for the encoder. In addition, in-frame prediction, for instance, can also be performed utilizing artificial intelligence. Furthermore, for example, when the broadcast data with low resolution is received and displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As an application of artificial intelligence in the TV 5600, a recording device with artificial intelligence may be provided in the TV 5600, for example. With such a structure, the artificial intelligence in the recording device can learn the user's preference, so that TV programs that suit the user's preference can be recorded automatically.

[Authentication System]

The semiconductor device described in the above embodiment can be used for an authentication system.

Figure 45C:
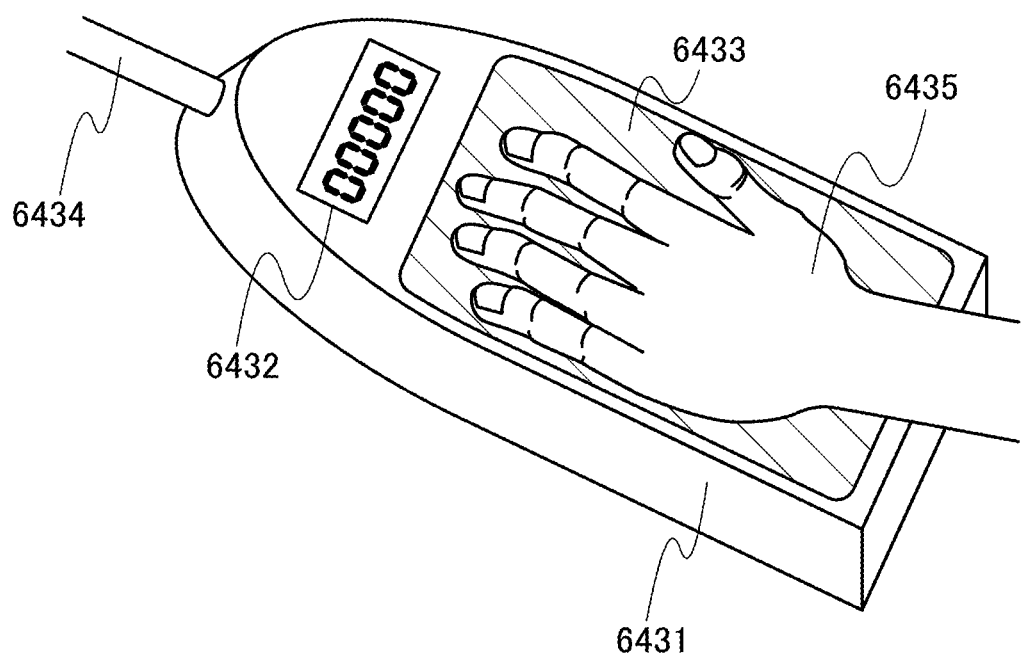

FIG. 45C illustrates a palm print authentication device that includes a housing 6431, a display portion 6432, a palm print reading portion 6433, and a wiring 6434.

In FIG. 45C, a palm print of a hand 6435 is obtained by a palm print authentication device. The obtained palm print is subjected to the pattern recognition utilizing artificial intelligence, so that personal authentication of the palm print can be performed. Accordingly, a system that performs highly secure authentication can be constructed. Without limitation to the palm print authentication device, the authentication system of one embodiment of the present invention may be a device that performs biological authentication by obtaining biological information of fingerprints, veins, faces, iris, voice prints, genes, physical constitutions, or the like.

[Alarm]

The semiconductor device described in the above embodiment can be used for an alarm.

Figure 46A:
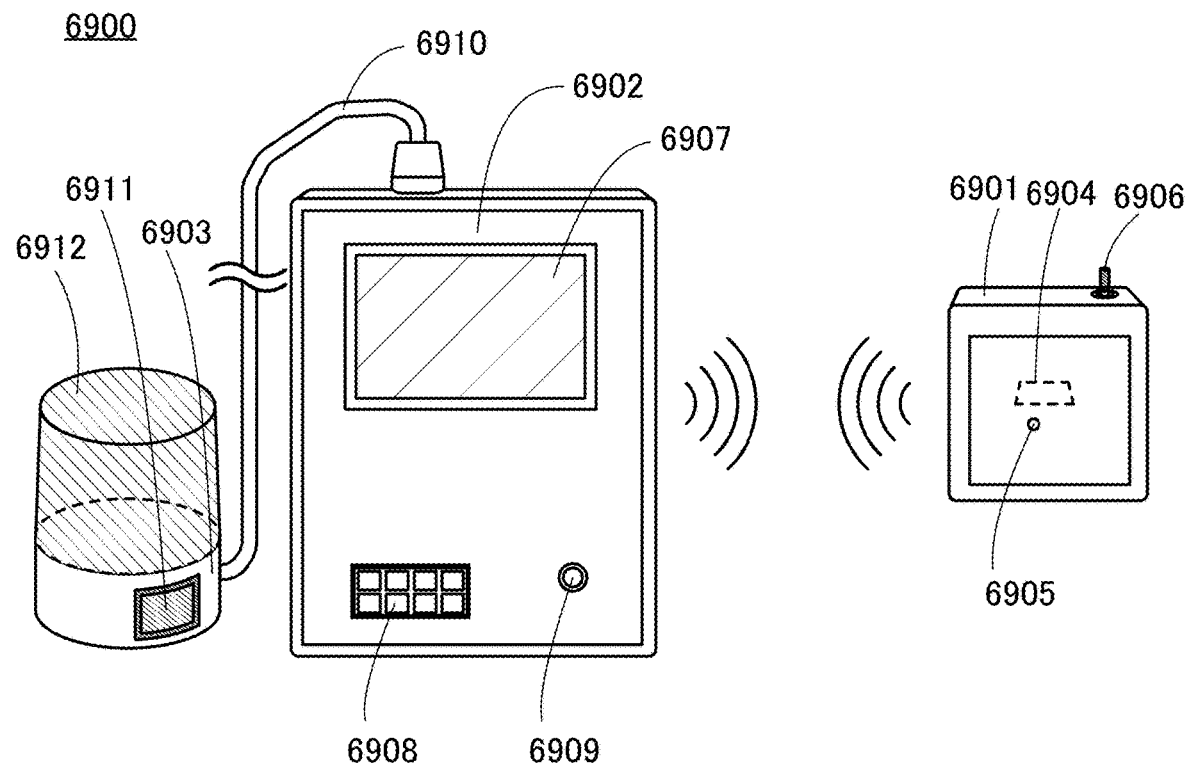
FIGS. 46A to 46C are schematic diagrams illustrating examples of electronic devices.

FIG. 46A illustrates an alarm 6900, which includes a sensor 6901, a receiver 6902, and a transmitter 6903.

The sensor 6901 includes a sensor circuit 6904, an air vent 6905, and an operation key 6906. The detection object that passes through the air vent 6905 is sensed with the sensor circuit 6904. The sensor circuit 6904 can be, for example, a detector in which water leakage, electric leakage, gas leakage, fire, the water level of a river that may overflow, the seismic intensity of an earthquake, a radiation, or the like is the detection object. In particular, in the case where the detection object includes smoke in a fire, gas leakage, a radiation, or the like, the odor sensor SMS described in Embodiment 4 can be used.

When the sensor circuit 6904 detects a detection object exceeding a predetermined value, for example, the sensor 6901 transmits the information to the receiver 6902. The receiver 6902 includes a display portion 6907, operation keys 6908, an operation key 6909, and a wiring 6910. The receiver 6902 controls the operation of the transmitter 6903 in accordance with information transmitted from the sensor 6901. The transmitter 6903 includes a speaker 6911 and a lighting device 6912. The transmitter 6903 has a function of raising an alarm in accordance with a command from the transmitter 6903. In FIG. 46A, the transmitter 6903 raises an alarm using warning sound from the speaker 6911 and warning light (e.g., red light) from the lighting device 6912; alternatively, the transmitter 6903 may give an alarm using any one of sound and light or another means.

When the sensor circuit functions as a fire alarm, the receiver 6902 may command fire preventive equipment such as a shutter to perform a predetermined operation when an alarm is given. Although FIG. 46A illustrates an example where signals are wirelessly transmitted and received between the receiver 6902 and the sensor 6901, signals may be transmitted and received via a wiring or the like. In addition, although FIG. 46A illustrates an example where a signal is transmitted from the receiver 6902 to the transmitter 6903 via the wiring 6910, a signal may be wirelessly transmitted. Furthermore, by using the odor sensor SMS described in Embodiment 4, what kind of burnable material is burning can be identified in some cases from the smoke generated by the fire. In particular, a method for extinguishing a fire is different depending on burnable materials; thus, to identify the burnable material causing a fire can lead to extinguishing the fire quickly.

[Robot]

The semiconductor device described in the above embodiment can be used for a robot.

Figure 46B:
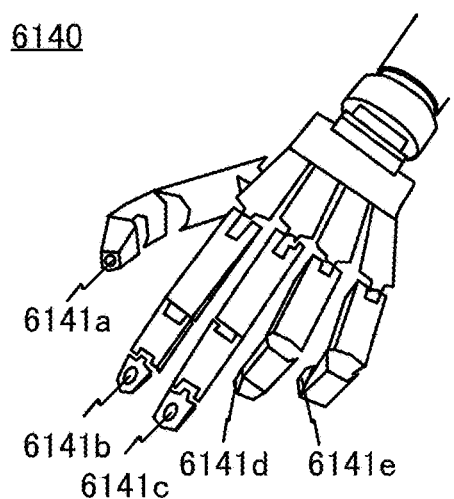

FIG. 46B illustrates an example of a robot. A robot 6140 includes tactile sensors 6141a to 6141e. The robot 6140 can grasp an object with use of the tactile sensors 6141a to 6141e. For example, the tactile sensors 6141a to 6141e have a function such that current flows through the object in response to a contact area at the time of touching the object, and the robot 6140 can recognize that the robot 6140 grasps the object, from the amount of flowing current.

Figure 46C:
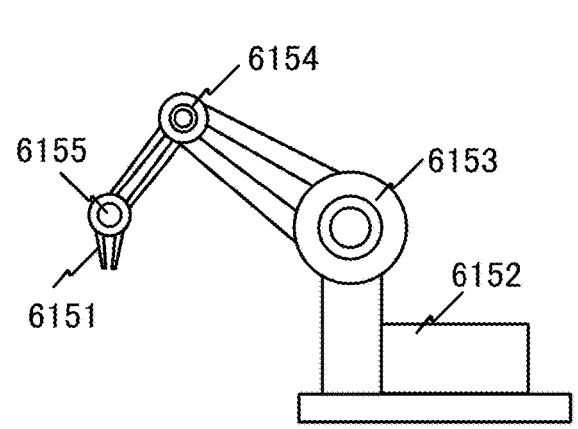

FIG. 46C illustrates an example of an industrial robot. The industrial robot preferably includes a plurality of drive shafts to control the driving range minutely. An example in which an industrial robot 6150 includes a functional portion 6151, a control portion 6152, a drive shaft 6153, a drive shaft 6154, and a drive shaft 6155 is illustrated. The functional portion 6151 preferably includes a sensor such as an image detection module.

The functional portion 6151 preferably has one or more functions of grabbing, cutting, welding, applying, and bonding targets, for example. The productivity of the industrial robot 6150 is increased in proportion to an increase in the response. In order that the industrial robot 6150 can operate precisely, a sensor that senses a minute current or the like is preferably provided.

Note that this embodiment can be combined with any of the other embodiments in this specification as appropriate.

Example 1

To verify that a product-sum operation of the first data and the second data with the configuration of the arithmetic circuit MAC1, the arithmetic circuit MAC1A, the arithmetic circuit MAC2, or the arithmetic circuit MAC3 is properly performed, a circuit was actually fabricated, and the circuit was subjected to measurement.

<OS Transistor>

First, an OS transistor included in a fabricated circuit is described. As described in the above embodiment, the band gap of an oxide semiconductor included in an OS transistor is made larger than that of silicon used in a transistor, so that the off-state current of the OS transistor can be reduced. In an OS transistor including a back gate, the threshold voltage can be controlled with application of a potential to the back gate.

Figure 48:
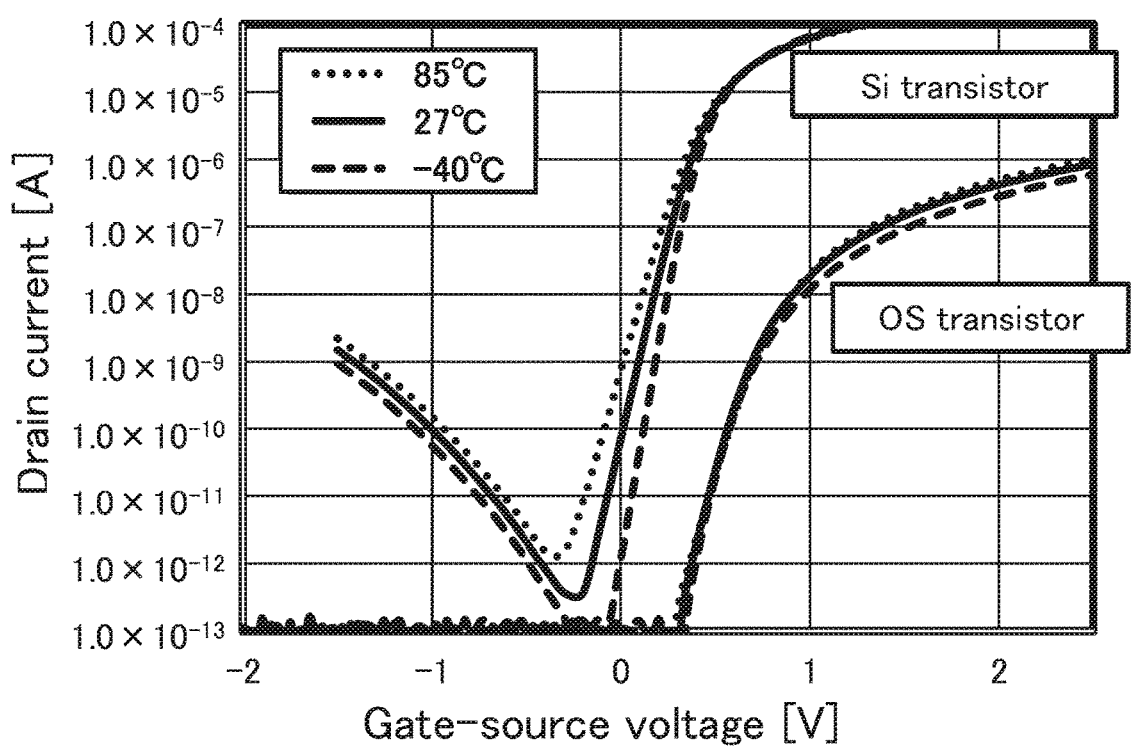
FIG. 48 is a graph showing drain current vs gate-source voltage characteristics of OS transistors and Si transistors.

For example, even when the threshold voltage of the OS transistor varies due to temperature changes, the threshold voltage of the OS transistor can be corrected with application of an appropriate potential to the back gate. FIG. 48 is a graph showing the drain current vs gate-source voltage characteristics of OS transistors (with a channel length of 350 nm and a channel width of 350 nm) at −40° C., 27° C., and 85° C. The potentials given to the back gate were 0.35 V, 0.0 V, and −0.3 V at −40° C., 27° C., and 85° C., respectively. For comparison, FIG. 48 also shows the drain current vs gate-source voltage characteristics of n-channel Si transistors (with a channel length of 60 nm and a channel width of 120 nm).

As shown in FIG. 48, temperature dependence of the amount of drain current with respect to the gate-source voltage can be decreased at each temperature, by application of an appropriate potential to the back gate of the OS transistor. In addition, from FIG. 48, it can be confirmed that the off-state current amount of the OS transistor is smaller than that of the n-channel Si transistor.

OS transistors can be formed with one or both of a chemical vapor deposition method and a physical vapor deposition method, which enables the OS transistors to be stacked over a CMOS circuit formed on a semiconductor substrate using silicon as its materials, for example. In other words, a semiconductor device where OS transistors are formed to be monolithically stacked over a CMOS circuit can be fabricated.

<Multiplication Circuit>

Figure 49:
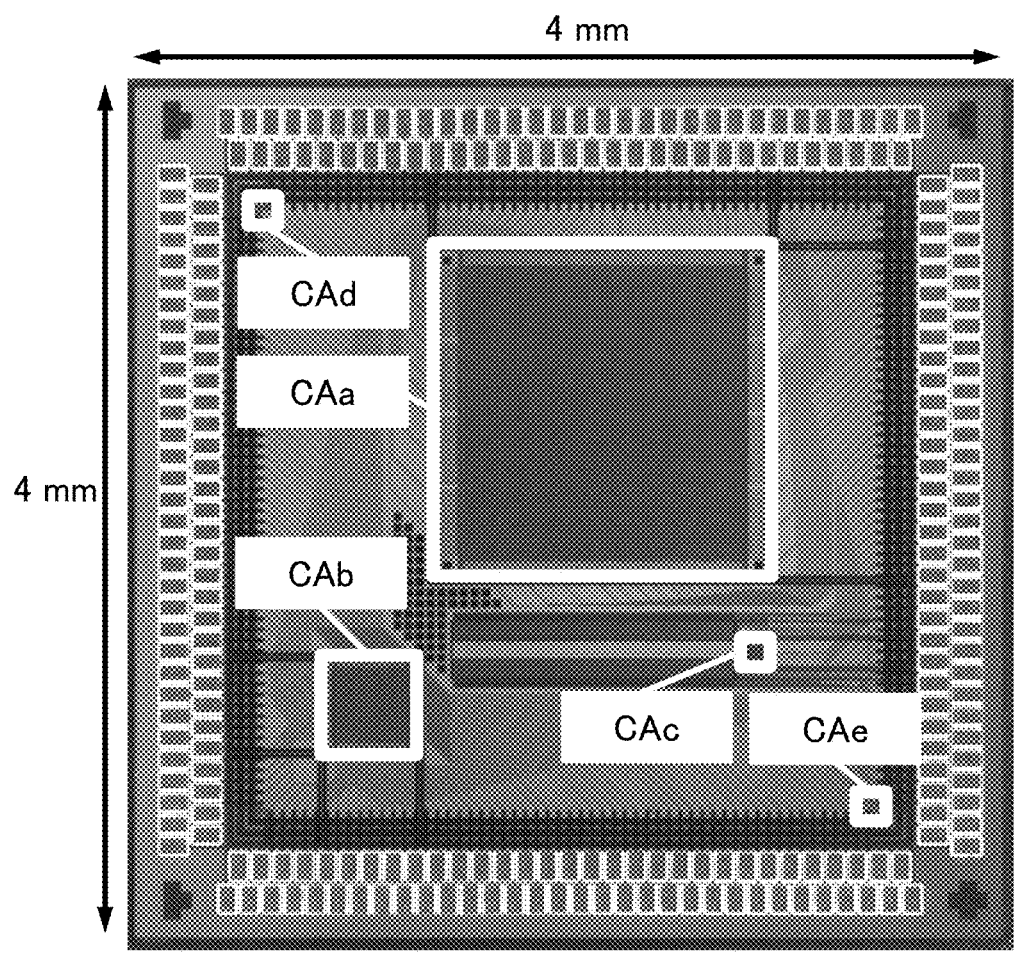
FIG. 49 is a top-view photograph of a die including an arithmetic circuit.

A prototyped die where an arithmetic circuit was formed on a semiconductor substrate was fabricated. FIG. 49 is a photo image of a top surface of the die actually fabricated.

In FIG. 49, the die includes a region CAa, a region CAb, a region CAc, a region CAd, and a region CAe. The region CAa includes a cell array where the cells IM are arranged in a matrix of 128 rows and 128 columns; the region CAb includes a cell array where the cells IM are arranged in a matrix of 32 rows and 32 columns; the region CAc includes a cell array where the cells IM are arranged in a matrix of 4 rows and 4 columns; the region CAd includes one cell IM; and the region CAe includes one cell IM.

Figure 47:
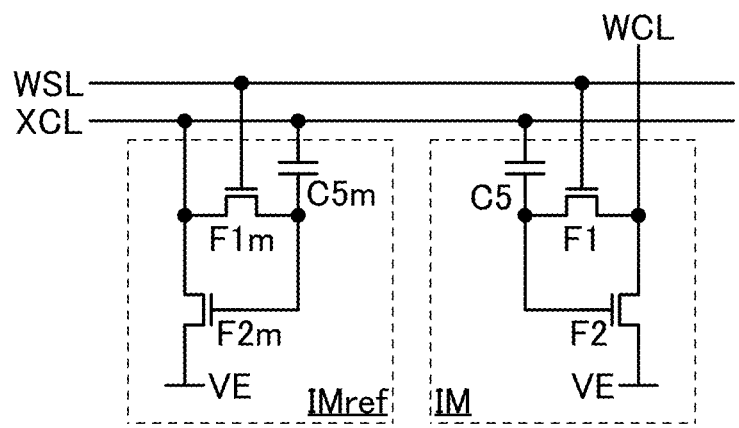
FIG. 47 is a circuit diagram showing an arithmetic circuit prototyped.

FIG. 47 illustrates part of a configuration of the arithmetic circuit actually fabricated. The cell IM and the cell IMref illustrated in FIG. 47 correspond to the cell IM and the cell IMref provided in one row of the cell array CA in FIG. 2, respectively. Thus, the cell IM and the cell IMref in FIG. 47 are electrically connected to the wiring WSL in the same row, and the cell IM and the cell IMref in FIG. 47 are electrically connected to the wiring XCL in the same row. In addition, for the circuit configurations of the cell IM and the cell IMref in FIG. 47, the descriptions of the arithmetic circuit MAC1 in FIG. 2 are referred to.

As the sizes of each of the transistor F1, the transistor F2, the transistor F1m, and the transistor F2m included in the cell IM and the cell IMref, the channel length was 350 nm, and the channel width was 350 nm.

As described in Embodiment 1, an appropriate voltage is applied to the source, the drain, and the gate of each of the transistor F2 and the transistor F2m in FIG. 47 so that the transistor F2 and the transistor F2m operate in the subthreshold region, i.e., a region in which a drain current exponentially changes with respect to a change in gate voltages.

In addition, a potential supplied by the wiring VE was set to a ground potential of 0 V.

First, a high-level potential is input to the wiring WSL to turn on the transistor F1 and the transistor F1m. Then, a current $WI_{W0}$ which is W times as large as a reference current $I_{W0}$ is input to the wiring WCL and a reference current $I_{X0}$ is input to the wiring XCL. At this time, the gate voltage of the transistor F1 is set in a self-determining manner at a voltage which can make the current $WI_{W0}$ flow between the source and the drain of the transistor F1, and the gate voltage of the transistor F1m is set in a self-determining manner at a voltage which can make the current $I_{X0}$ flow between the source and the drain of the transistor F1m. After the gate voltage of each of the transistor F1 and the transistor F1m is determined, a low-level potential is input to the wiring WSL to turn off the transistor F1 and the transistor F1m, and the gate voltage of each of the transistor F1 and the transistor F1m is held. Note that these operations correspond to the operations from Time T12 to Time T14 in the timing chart in FIG. 9, and are hereinafter referred to as the first operation.

Next, a current $I_X = XI_{X0}$ which is X times larger than the reference current $I_{X0}$ is input to the wiring XCL and a constant voltage $V_d$ is input to the wiring WCL. At this time, the voltage of the wiring XCL changes, so that the gate voltage of the transistor F1 is changed due to the capacitive coupling of the capacitor C5. At this time, the current flowing between the source and the drain of the transistor F1 is a current $I_Y = YI_{W0}$ which is Y times larger than a reference current $I_{W0}$. In addition, since the transistor F1 and the transistor F2 operate in the subthreshold region, $YI_{W0} = WXI_{W0}$ can be achieved. That is, Y is the product of W and X Note that these operations correspond to the operations in the period from Time T21 to Time T23 in the timing chart in FIG. 9 and are hereinafter referred to as the second operation.

<<Multiplication Characteristics>>

Figure 50A:
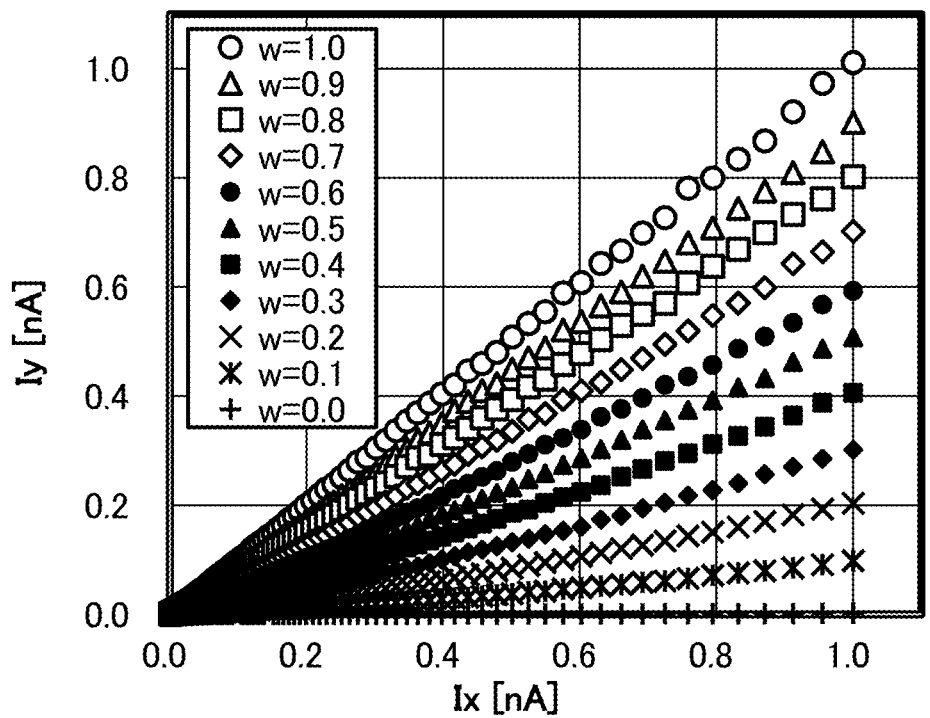
FIG. 50A is a graph showing multiplication characteristics of an arithmetic circuit prototyped.

Here, $I_X$-$I_Y$ characteristics were measured with the conditions that $I_{W0}$ was 1 nA, $I_{X0}$ was 1 nA, Vd was 1 V, and W and X were swept from 0.0 to 1.0 by 0.1. FIG. 50A shows $I_X$-$I_Y$ characteristics of the measurement results. In the second operation after the first operation of determining W, $I_Y$ particularly shows the median of currents flowing between the source and the drain of the transistor F1 measured 30 times. A variation σ of $I_Y$ was less than 0.1 nA.

From the $I_X$-$I_Y$ characteristics in FIG. 50A, the correlation coefficient of $I_Y$ and X with each value of W was estimated to be 0.969 or more. From this, it can be said that the multiplication characteristics of W and X (Y=WX) of the circuit in FIG. 47 are favorable.

<<Retention Characteristics>>

Figure 50B:
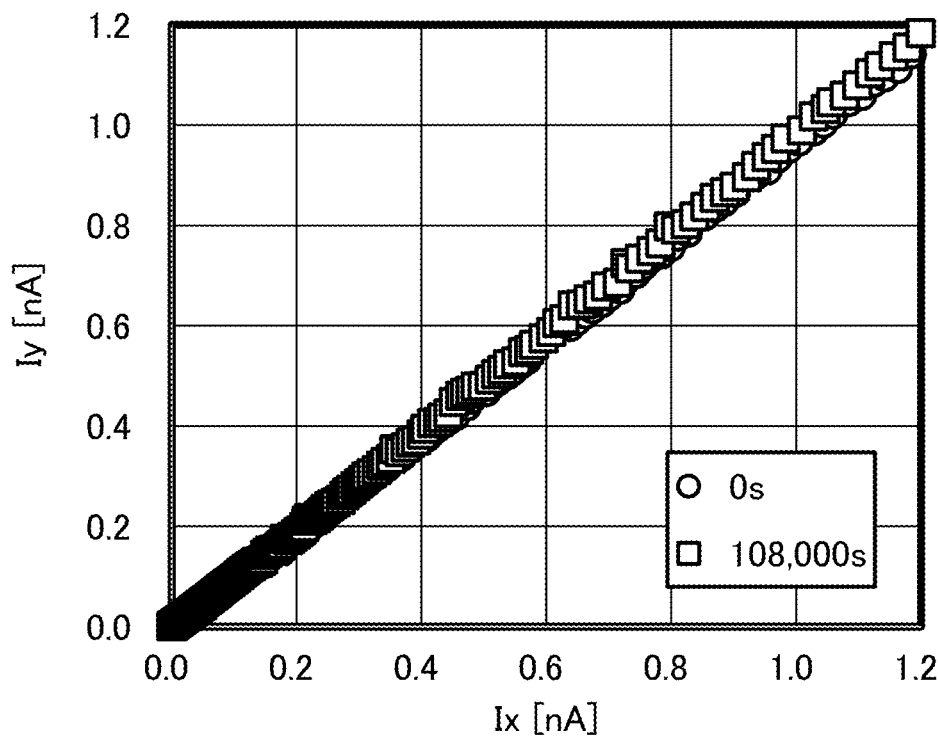
FIG. 50B is a graph showing retention characteristics of the arithmetic circuit prototyped.

To examine retention characteristics of the circuit illustrated in FIG. 47, $I_X$-$I_Y$ characteristics were measured just after the first operation (at 0 s) with W=1.0 and 108000 s after the first operation. FIG. 50B shows the $I_X$-$I_Y$ characteristics of the measurement results. As illustrated in FIG. 50B, the amount of change in $I_Y$ from just after the first operation (at 0 s) to 108000 s after the first operation was less than 3%. From this, it can be said that the retention characteristics of the circuit in FIG. 47 is preferable.

<<Difference in Element Variation Due to Current Writing and Voltage Writing>>

The above-described first operation and second operation are operations in which a desirable current is supplied to the wiring WCL and the wiring XCL to perform multiplication of W and X (hereinafter referred to as a current-writing method and described as Current writing in the diagram); an operation in which a voltage is written to each gate of the transistor F1 and the transistor F1m to perform multiplication of W and X (hereinafter referred to as a voltage-writing method and described as Voltage writing in the diagram) can be performed in principle. Here, the generation degree of element variation σ was studied in the current-writing method and the voltage writing method.

Note that to measure the element variation σ, 16 circuits illustrated in FIG. 47 were prepared and multiplication with the current-writing method and multiplication with the volt-age-writing method were performed in each circuit.

Figure 51A:
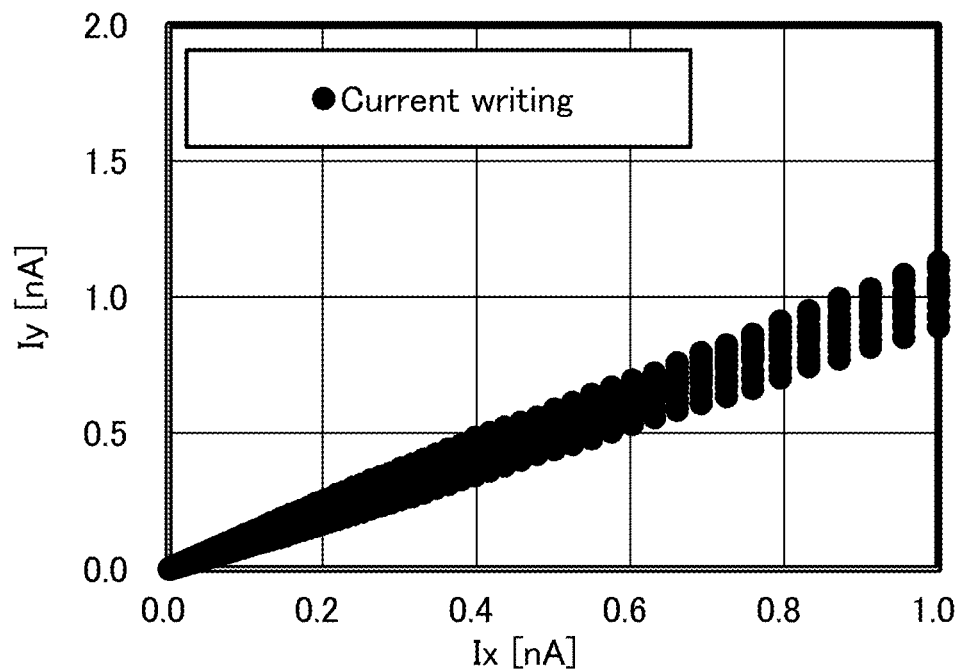
FIG. 51A is a graph showing multiplication characteristics, measured by a current writing method, of an arithmetic circuit prototyped.
Figure 51B:
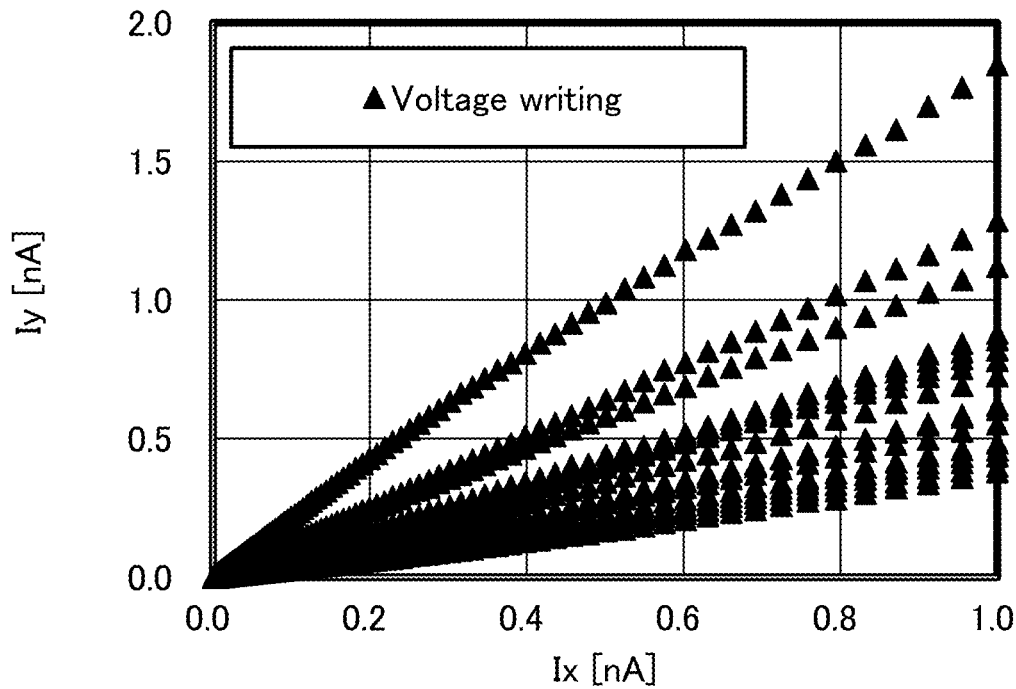
FIG. 51B is a graph showing multiplication characteristics, measured by a voltage writing method, of the arithmetic circuit prototyped.

FIG. 51A shows $I_X$-$I_Y$ characteristics when multiplication with the current-writing method is performed on the 16 circuits in FIG. 47; FIG. 51B shows $I_X$-$I_Y$ characteristics when multiplication with the voltage-writing method is performed on the 16 circuits in FIG. 47. According to the results in FIGS. 51A and 51B, a variation σ of $I_Y$ in the elements with the voltage-writing method is 39%, and a variation σ of $I_Y$ in the elements with the current-writing method is 7%. That is, it was confirmed that variations of elements of the circuit in FIG. 47 can be decreased with a multiplication operation with the current-writing method compared to the case of the voltage-writing operation.

Figure 52:
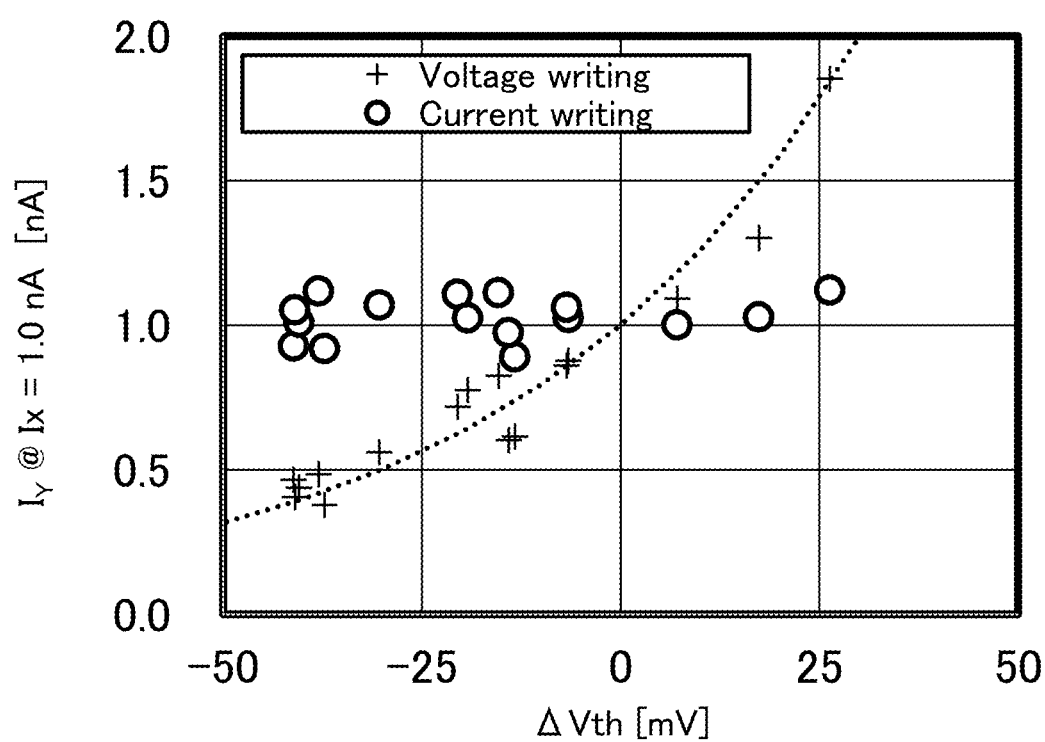
FIG. 52 is a graph showing a relation between output currents and threshold voltage differences, measured by voltage writing and current writing methods, in an arithmetic circuit prototyped.

Next, the dependence of the element variation σ of $I_Y$ on a difference $\Delta V_{th}$ of the threshold voltages of the transistor F1 and the transistor F1m in the elements was studied. FIG. 52 is a graph showing the relation between $\Delta V_{th}$ and $I_Y$ in the elements with $I_X$ of 1.0 nA. The threshold voltage of the transistor F1 in each element is Val, the threshold voltage of the transistor F1m in each element is $V_{thm}$, and the difference between the threshold voltages of the transistor F1 and the transistor F1m is $\Delta V_{th} = V_{thm} - V_{th}$.

In the case of a voltage-writing method, as shown in FIG. 52, the element variation σ can be approximated as the exponential function of ΔVth. Specifically, $I_Y$ in the voltage-writing method was fitted with an exponential function ($I_Y = 10^{\Delta I/th/0.100}$) with a subthreshold slope (S value) of 100 mV. An element variation of $\Delta V_{th}$ was measured and the result was $\Delta V_{th} = \pm 21$ mV. This is substituted for the fitted exponential function; $I_Y$ becomes 0.62 A or 1.62, and the difference from $I_Y$ when $\Delta V_{th} = 0$ is $\Delta I_Y = -0.38$ or 0.62. The element variation σ in $I_Y$ with the voltage-writing method is 39%; thus, the absolute value of the amount of change $\Delta I_Y = -0.38$ from $I_Y$ when $\Delta V_{th} = 0$ was approximately close to this. That is, it can be found that a variation of ΔVth in elements of 21 mV is reflected to σ. The variation σ in $I_Y$ of elements with the current-writing method is 7%; thus, the amount of change from $I_Y$ when $\Delta V_{th} = 0$ is $\Delta I_Y = 0.07$. Here, $1-0.07=10^{\Delta I/th/0.100}$ is solved for $\Delta V_{th}$, and $\Delta V_{th}$ is 3 mV. FIG. 52 shows that the variation of $I_Y$ in elements can be corrected with the current-writing method because the variation σ in elements is reduced to about ±3 mV when converted into $\Delta V_{th}$ of a fitted exponential function.

<Current Circuit>

Since the transistor F1 included in the cell IM operates in the subthreshold region, the current amount of the reference currents $I_{W0}$ and $WI_{W0}$ flowing between the source and the drain of the transistor F1 is necessary to be more than or equal to $1.0×10^{-12}$ A and less than or equal to $1.0×10^{-8}$ A, for example. Similarly, since the transistor F1m included in the cell IMref operates in the subthreshold region, the current amount of the reference currents $I_{X0}$ and $XI_{X0}$ flowing between the source and the drain of the transistor F1m is necessary to be more than or equal to $1.0×10^{-12}$ A and less than or equal to $1.0×10^{-8}$ A, for example.

Figure 53A:
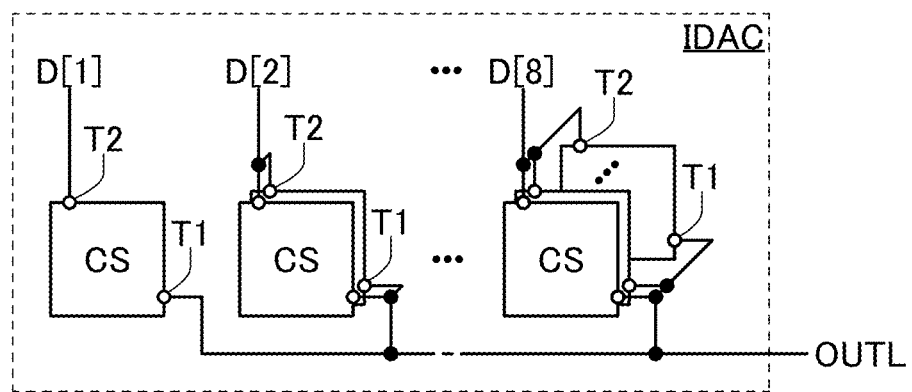
FIGS. 53A and 53B are circuit diagrams illustrating a circuit included an arithmetic circuit prototyped.
Figure 53B:
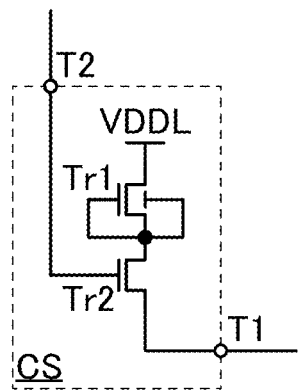

FIG. 53A and FIG. 53B illustrate actually-fabricated circuits capable of outputting a low current described above. A current circuit IDAC illustrated in FIG. 53A corresponds to the circuit WCS in FIG. 3A and the circuit XCS in FIG. 3C. Thus, for a circuit configuration of the current circuit IDAC in FIG. 53A, the descriptions of the circuit WCS in FIG. 3A and the circuit XCS in FIG. 3C are referred to.

The current circuit IDAC in FIG. 53A is configured to output a current to a wiring OUTL in response to 8-bit signals. Specifically, when the first-bit to eighth-bit values are input to a wiring D[1] to a wiring D[8], respectively, whereby it is decided whether the current source CS included in the current circuit IDAC outputs a current in response to the values. To a wiring D[s] (s is an integer more than or equal to 1 and less than or equal to 8), $2^{s-1}$ current source(s) CS is/are electrically connected. In the case where the current source CS outputs Lit as a current amount, for example, the current source CS electrically connected to the wiring D[s] outputs a current of $2^{s-1}×I_{ut}$ in total when a high-level potential is input to the wiring D[s]. Thus, the current circuit IDAC can output a current of the product of Lit and an integer from 1 to 256 in response to 8-bit signals.

The current source CS included in the current circuit IDAC in FIG. 53A is the current source CS illustrated in FIG. 53B, and the current source CS in FIG. 53B corresponds to the current source CS1 in FIG. 4A. Thus, for the current source CS in FIG. 53B, the descriptions of the current source CS1 in FIG. 4A can be referred to.

Each of the transistor Tr1 and the transistor Tr2 included in the current source CS in FIG. 53B has a channel length of 350 nm and a channel width of 350 nm.

As described in Embodiment 1, a current with an amount within a range where the transistor Tr1 operates in the subthreshold region flows between the first terminal and the second terminal of the transistor Tr1. In other words, the current Lit flowing from the current source CS can be a current with an amount within a range where the transistor Tr1 operates in the subthreshold region.

The potential supplied by the wiring VDDL is 2 V. The wiring OUTL is biased to 0.5 V. To the wiring D[1] to the wiring D[8], 0 V is supplied when data of each bit is "0", and 2 V is supplied when data of each bit is "1".

Figure 54A:
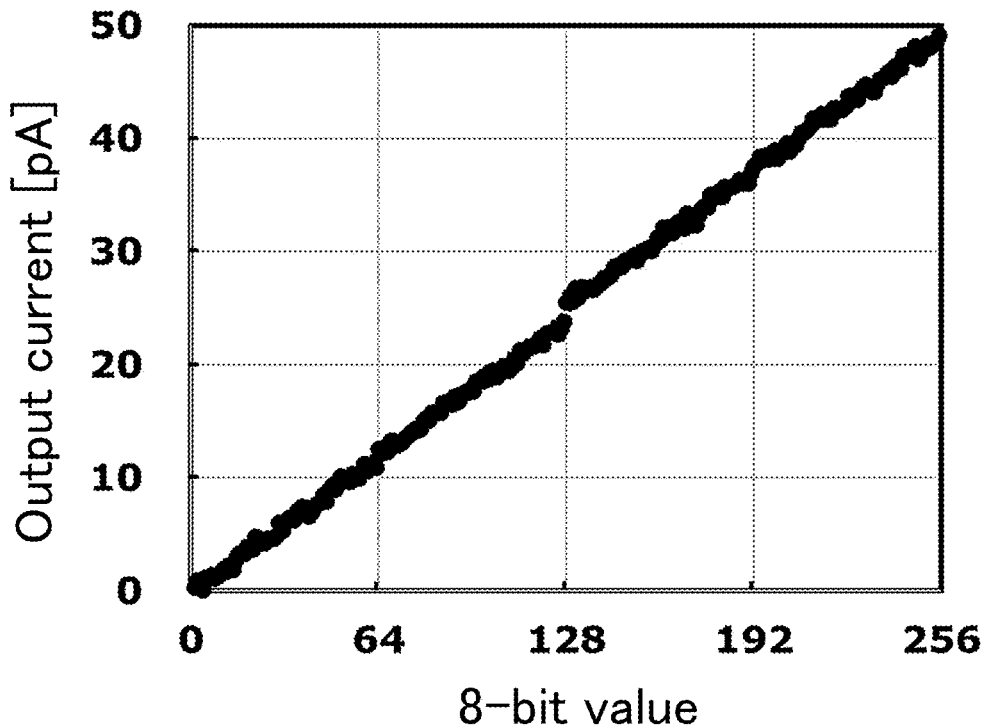
FIG. 54A is a graph showing output characteristics of a current circuit.

FIG. 54A is a graph showing output characteristics of a current output from the current circuit IDAC to the wiring OUTL when 8-bit signals are input to the current circuit IDAC. From the output characteristics in FIG. 54A, it is confirmed that the current circuit in FIG. 53A can output a current greater than or equal to $1.0×10^{-12}$ [A] and less than or equal to $5.0×10^{-11}$ [A] substantially linearly in response to 8-bit signals.

Figure 54B:
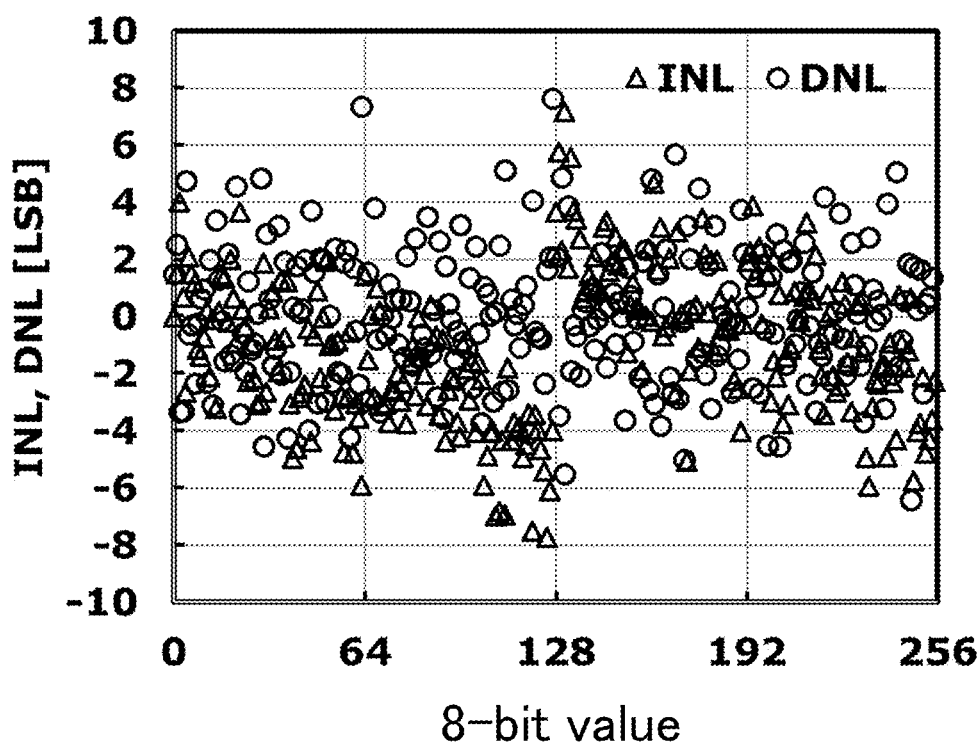
FIG. 54B is a graph showing currents INL and DNL output by the current circuit.

FIG. 54B shows integral non-linearity (INL) and differential non-linearity (DNL) of the current output from the current circuit IDAC to the wiring OUTL. From FIG. 54A and FIG. 54B, it is confirmed that the effective number of bits (ENOB) of the current circuit IDAC is 5.04 bit.

Example 2

To verify the performance of a neural network with the multiplication circuit in FIG. 47 and the current circuit IDAC in FIG. 53A described in Example 1, a calculation was performed by using a circuit simulator.

Figure 55:
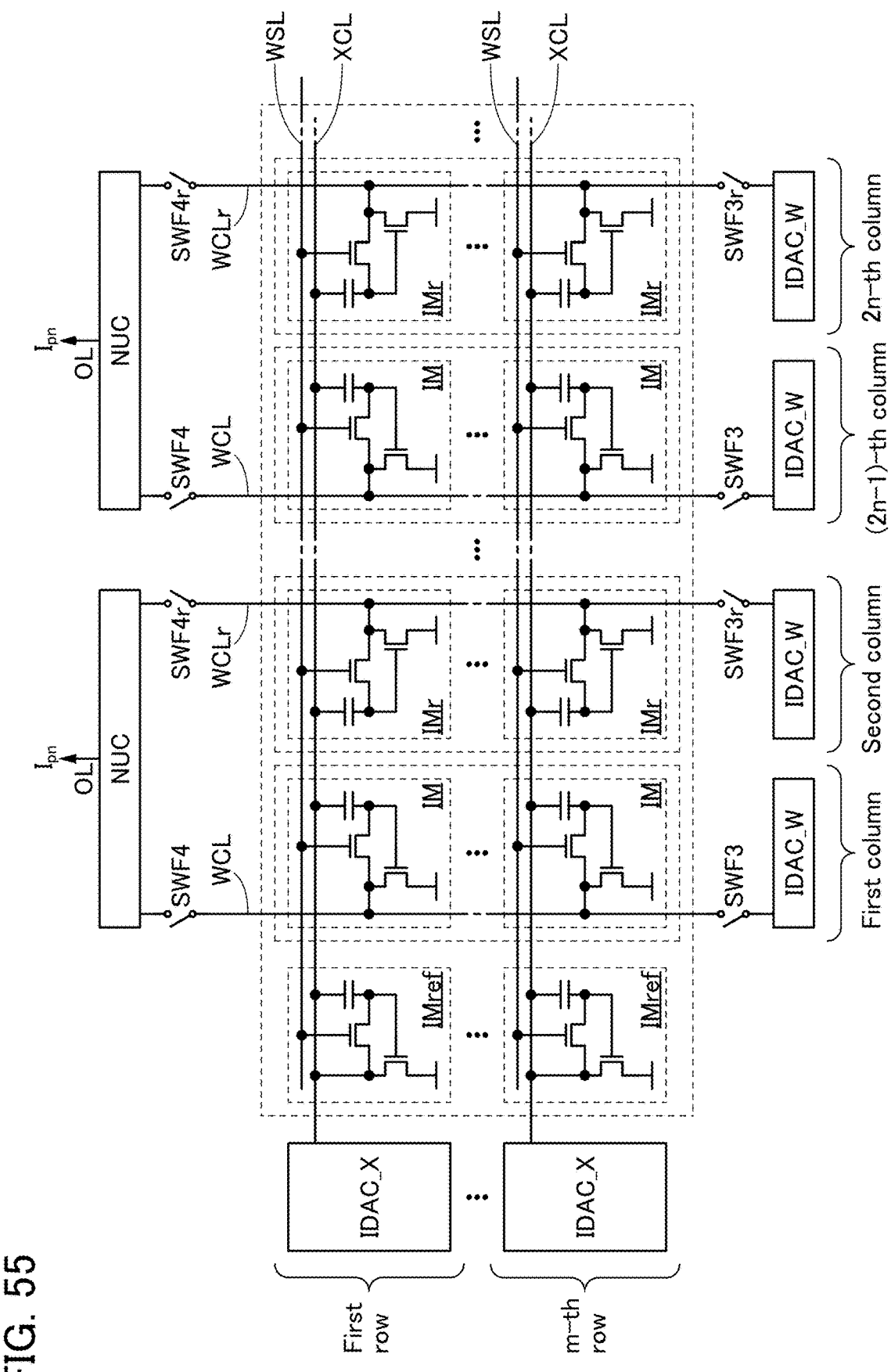
FIG. 55 is a circuit diagram showing conditions of circuit calculation.

First, a circuit configuration is described. FIG. 55 is a circuit configuration input to a circuit simulator which is based on the arithmetic circuit MAC2 in FIG. 10 described in the above embodiment. The cell IM (cell IMr) and the cell IMref in FIG. 55 correspond to the cell IM and the cell IMref in FIG. 47, respectively, and a circuit NUC corresponds to the converter circuit ITRZD shown in FIG. 10. A plurality of current circuits IDAC_X in FIG. 55 correspond to the circuit XCS (for example, the circuit XCS in FIG. 3C), and a plurality of current circuits IDAC W correspond to the circuit WCS (for example, the circuit WCS in FIG. 3A).

The circuit NUC includes a current source and a current mirror circuit and has a function of outputting, to the wiring OL, a difference of the amounts of current flowing through the wiring WCL and the wiring WCLr. For example, the circuit NUC corresponds to the converter circuit ITRZD4 in FIG. 14B or FIG. 14C.

Since the arithmetic circuit in FIG. 55 is configured based on the arithmetic circuit MAC2 in FIG. 10, a negative coefficient of weight as well as a positive coefficient of weight (first data) can be stored in the cell IM and the cell IMr. In the arithmetic circuit illustrated in FIG. 55, a current corresponding to the product-sum of a positive coefficient of weight and a neuron signal (second data) flows in the wiring WCL electrically connected to a plurality of cells IM, and a current corresponding to the product-sum of a negative coefficient of weight and the neuron signal flows in the wiring WCLr electrically connected to a plurality of cells IMr.

The circuit NUC outputs a difference current $I_{pn}$ between a current flowing in the wiring WCL and a current flowing in the wiring WCLr to the wiring OL using the current mirror circuit CM2.

Figure 57:
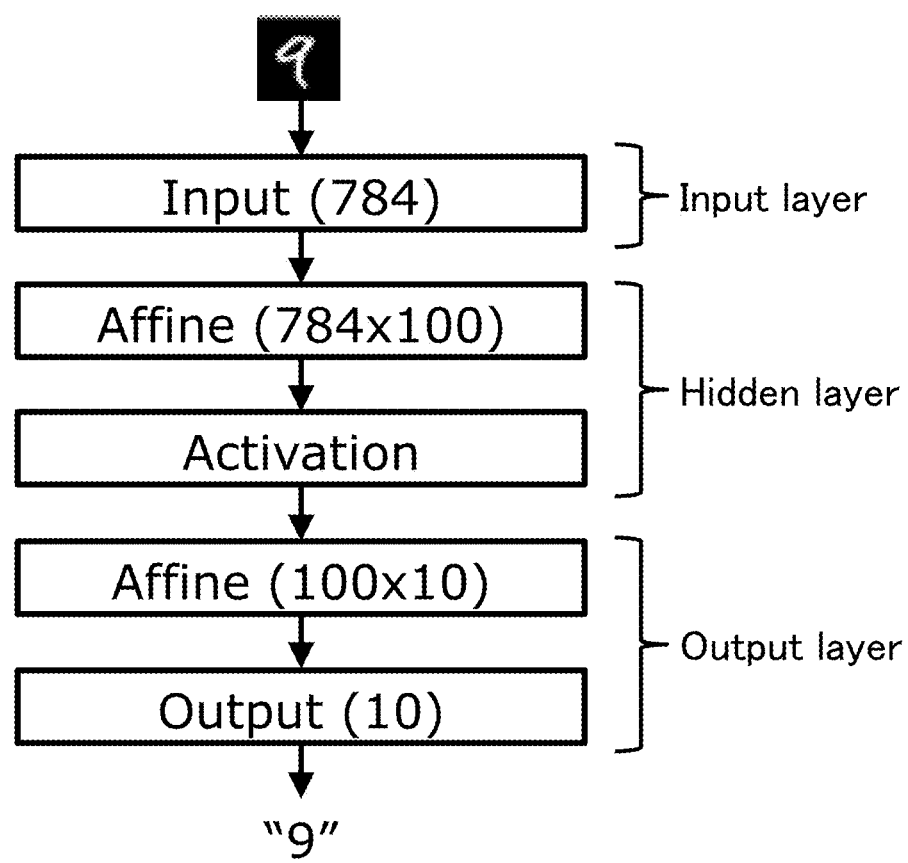
FIG. 57 is a diagram showing an example of a hierarchical neural network.

Next, the relation of the arithmetic circuit with a fully connected neural network in FIG. 57 is described. Note that the neural network is described on the assumption that it includes three layers as an input layer, a hidden layer, and an output layer.

In the input layer, the current circuit IDAC_X illustrated in FIG. 55 generates a current corresponding to the data input to the neural network and the current flows in the wiring XCL in each row. Then, the current $I_{pn}$ corresponding to a product-sum of the current and the coefficient of weight between neurons of the input layer and neurons of the hidden layer stored in the cell IM and the cell IMr is output to the wiring OL. That is, the current $I_{pn}$ corresponds to a signal output from the neuron of the hidden layer.

Thus, in the arithmetic circuit performing the product-sum of the coefficient of weight between neurons of the hidden layer and neurons of the output layer and a signal output by the neuron of the hidden layer, the signal output by the neuron of the hidden layer is not generated in the current circuit IDAC_X but input to the wiring XCL directly from the wiring OL.

Figure 56:
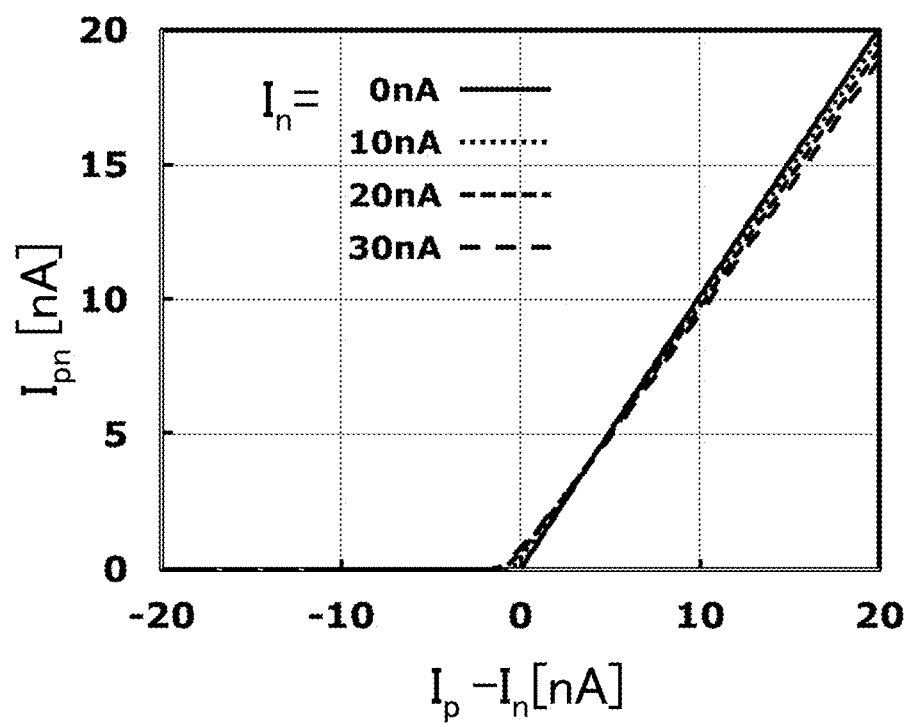
FIG. 56 is a graph showing output characteristics of an arithmetic circuit.

In addition to the structure, the threshold voltages of the transistor F2 and the transistor F2m included in the arithmetic circuit performing a product-sum of the coefficient of weight between neurons of the hidden layer and neurons of the output layer and the signal output from the hidden layer are, by approximately 0.2 V, higher than the threshold voltages of the transistor F2 and the transistor F2m included in the arithmetic circuit performing a product-sum of the coefficient of weight between neurons of the input layer and neurons of the hidden layer and the signal output from the input layer. Thus, it is confirmed with a calculation using a circuit simulator that the signal output from the neuron of the hidden layer (current $I_{pn}$) shows output characteristics shown in FIG. 56. In FIG. 56, the sum of currents flowing in the wiring WCL is $I_p$, and the sum of currents flowing in the wiring WCLr is $I_n$. In the case of the output characteristics in FIG. 56, the conditions of $I_n$ are 0 nA, 10 nA, 20 nA, and 30 nA. The output characteristics shown in FIG. 56 is output characteristics corresponding to a ReLU function. In other words, the circuit NUC can be a circuit capable of performing activation function operation as well as differential operation.

Next, simulation results of recognizing handwriting by using the MNIST database are described.

In the simulation of recognizing handwriting, the hierarchical neural network in FIG. 57 was used. The neural network illustrated in FIG. 57 is a three-layer fully connected neural network where the input layer includes 784 neurons, the hidden layer includes 100 neurons, and the output layer includes 10 neurons. Note that FIG. 57 illustrates a case where "9" is input as a handwritten character.

In the first round of operation, the arithmetic circuit in FIG. 55 where m is 784 and n is 100 was used because the number of neurons in the input layer is 784 and the number of neurons in the hidden layer is 100. In the second round of operation, the arithmetic circuit in FIG. 55 where m is 100 and n is 10 was used because the number of neurons in the hidden layer is 100 and the number of neurons in the output layer is 10.

In the simulation, variation in the current-writing methods in FIG. 51A and FIG. 52 is taken into consideration. A model calculation was performed on this neural network, and the following results were obtained. The inference accuracy is 92.6%; the current consumption is 2.1 µA; and the arithmetic efficiency is 3780 TOPS/W. From the results, it can be said that handwriting recognition using a neural network including the arithmetic circuit shown in FIG. 55 has a sufficient recognition accuracy.

As reference, Table 5 below shows comparison between the arithmetic circuit developed by the present applicant and the arithmetic circuits developed by other study groups (A to C) and the like.

TABLE 5

|  | Simulation in this example | A | B | C |
|---|---|---|---|---|
| Technology | 350-nm OS | 180-nm CMOS | 40-nm CMOS | 65-nm CMOS |
| Weight storage | OS-FET | eFlash | ReRAM | SRAM |
| Weight retention | More than 30 hours (for 3% degradation) | More than 7 months (for 13% degradation) | N.A. | (Volatile) |
| Input | Analog current | Analog current | Analog voltage | Digital data |
| Sensor direct-in | Yes | Difficult *2 | No *3 | No *3*4 |
| Accuacy(Dataset) | 92.6% *1 (MNIST) | 94.7% (MNIST) | 90.8% (MNIST) | 96% (MIT-CBCL) |
| Current/cell | 1 nA at the maximum | 1 µA at the maximum | 50 µA at the maximum | N.A. |
| Chip current | 2.1 µm at the maximum *1 | 5.6 mA | 9.0 mA | 6.8 mA |
| Efficiency | 3780 TOPS/W *1 | N.A. | 66.5 TOPS/W | 3.125 TOPS/W |

*1 Evaluation of handwriting recognition with MNIST
*2 Requiring an additional sensor large in size (e.g., photodiode with a large light-receiving area)
*3 Requiring a current-voltage converter circuit additionally
*4 Requiring an analog-digital converter circuit additionally In Table 5, described data of the group A is cited from X. Guo et al., IEDM 2017, p. 151, described data of the group B is cited from R. Mochida et al., VLSI, 2018, p. 175, and described data of the group C is cited from S. K. Gonugondla, et al., ISSCC, 2018, p. 490.

This application is based on Japanese Patent Application Serial No. 2022-080383 filed with Japan Patent Office on May 16, 2022, the entire contents of which are hereby incorporated by reference.

What is claimed is:

1. A semiconductor device comprising:
a first layer comprising a first cell, a first circuit, a second circuit, and a third circuit; and
a second layer comprising a second cell, a fourth circuit, and a fifth circuit,
wherein the first layer is located below the second layer,
wherein the first cell comprises a first transistor,
wherein the second cell comprises a second transistor,
wherein the first circuit is configured to convert a first data that is a digital data into a first analog current and configured to input the first analog current into the first cell,
wherein the second circuit is configured to convert a second data that is a digital data into a second analog current and configured to input the second analog current into the first cell,
wherein the fourth circuit is configured to convert a third data that is a digital data into a third analog current,
wherein the first cell is configured to retain a first potential corresponding to the first analog current at a gate of the first transistor and configured to set a current flowing between a source and a drain of the first transistor to a first current corresponding to the first potential,
wherein the second cell is configured to retain a third potential corresponding to the third analog current at a gate of the second transistor and configured to set a current flowing between a source and a drain of the second transistor to a third current corresponding to the third potential,
wherein the second circuit is configured to change the first potential retained in the first cell into a second potential by inputting the second analog current into the first cell,
wherein the first cell is configured to change the first current flowing between the source and the drain of the first transistor into a second current in accordance with the change of the first potential into the second potential, wherein the third circuit is configured to generate a fourth analog current corresponding to the second current and configured to input the fourth analog current into the second cell, so that the third potential retained in the second cell is changed into a fourth potential, wherein the second cell is configured to change the third current flowing between the source and the drain of the second transistor into a fourth current in accordance with the change of the third potential into the fourth potential, and wherein the fifth circuit is configured to generate a fifth analog current corresponding to the fourth current.

2. The semiconductor device according to claim 1,
wherein each of the first transistor and the second transistor comprises an oxide semiconductor in a channel formation region,
wherein the oxide semiconductor comprises at least one of indium, zinc, and an element M, and
wherein the element M is at least one of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, cobalt, magnesium, and antimony.

3. The semiconductor device according to claim 2,
wherein an amount of each of the first current and the second current is an amount of current flowing when the first transistor operates in a subthreshold region, and
wherein an amount of each of the third current and the fourth current is an amount of current flowing when the second transistor operates in a subthreshold region.

4. A semiconductor device comprising:
a first layer comprising a first cell, a first circuit, and a third circuit;
a second layer comprising a second cell, a fourth circuit, and a fifth circuit; and
a third layer comprising an optical sensor,
wherein the third layer is located above the first layer,
wherein the first layer is located above the second layer,
wherein the first cell comprises a first transistor,
wherein the second cell comprises a second transistor,
wherein the first circuit is configured to convert a first data that is a digital data into a first analog current and configured to input the first analog current into the first cell,
wherein the optical sensor is configured to generate a second analog current when receiving light and configured to input the second analog current into the first cell,
wherein the fourth circuit is configured to convert a third data that is a digital data into a third analog current, wherein the first cell is configured to retain a first potential corresponding to the first analog current at a gate of the first transistor and configured to set a current flowing between a source and a drain of the first transistor to a first current corresponding to the first potential, wherein the second cell is configured to retain a third potential corresponding to the third analog current at a gate of the second transistor and configured to set a current flowing between a source and a drain of the second transistor to a third current corresponding to the third potential, wherein the optical sensor is configured to change the first potential retained in the first cell into a second potential by inputting the second analog current into the first cell, wherein the first cell is configured to change the first current flowing between the source and the drain of the first transistor into a second current in accordance with the change of the first potential into the second potential, wherein the third circuit is configured to generate a fourth analog current corresponding to the second current and configured to input the fourth analog current into the second cell, so that the third potential retained in the second cell is changed into a fourth potential, wherein the second cell is configured to change the third current flowing between the source and the drain of the second transistor into a fourth current in accordance with the change of the third potential into the fourth potential, and wherein the fifth circuit is configured to generate a fifth analog current corresponding to the fourth current.

5. The semiconductor device according to claim 4,
wherein each of the first transistor and the second transistor comprises an oxide semiconductor in a channel formation region,
wherein the oxide semiconductor comprises at least one of indium, zinc, and an element M, and
wherein the element M is at least one of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, cobalt, magnesium, and antimony.

6. The semiconductor device according to claim 5,
wherein an amount of each of the first current and the second current is an amount of current flowing when the first transistor operates in a subthreshold region, and
wherein an amount of each of the third current and the fourth current is an amount of current flowing when the second transistor operates in a subthreshold region.

* * * * *